(12) United States Patent
Fukushima et al.

(10) Patent No.: US 12,032,289 B2
(45) Date of Patent: Jul. 9, 2024

(54) POLYMER, CHEMICALLY AMPLIFIED RESIST COMPOSITION AND PATTERNING PROCESS

(71) Applicant: Shin-Etsu Chemical Co., Ltd., Tokyo (JP)

(72) Inventors: Masahiro Fukushima, Joetsu (JP); Masayoshi Sagehashi, Joetsu (JP); Emiko Ono, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 348 days.

(21) Appl. No.: 17/022,368

(22) Filed: Sep. 16, 2020

(65) Prior Publication Data

US 2021/0096465 A1  Apr. 1, 2021

(30) Foreign Application Priority Data

Sep. 26, 2019 (JP) ................................ 2019-175739

(51) Int. Cl.
| | | |
|---|---|---|
| G03F 7/038 | (2006.01) | |
| C08F 212/14 | (2006.01) | |
| C08F 220/28 | (2006.01) | |
| C08F 220/40 | (2006.01) | |
| C09D 125/18 | (2006.01) | |
| C09D 133/08 | (2006.01) | |
| C09D 133/14 | (2006.01) | |
| G03F 7/039 | (2006.01) | |

(52) U.S. Cl.
CPC .......... *G03F 7/0388* (2013.01); *C08F 212/24* (2020.02); *C08F 220/283* (2020.02); *C08F 220/40* (2013.01); *C09D 125/18* (2013.01); *C09D 133/08* (2013.01); *C09D 133/14* (2013.01); *G03F 7/039* (2013.01)

(58) Field of Classification Search
CPC combination set(s) only.
See application file for complete search history.

(56) References Cited

U.S. PATENT DOCUMENTS

| 10,649,330 | B2 | 5/2020 | Arai et al. | |
|---|---|---|---|---|
| 2009/0111053 | A1* | 4/2009 | Yamashita | G03F 7/0395 430/326 |
| 2016/0168296 | A1* | 6/2016 | Hatakeyama | C08F 220/282 430/326 |
| 2016/0229940 | A1 | 8/2016 | Hatakeyama et al. | |
| 2016/0231652 | A1 | 8/2016 | Hatakeyama | |
| 2017/0205709 | A1* | 7/2017 | Hatakeyama | C07C 69/635 |
| 2017/0369616 | A1 | 12/2017 | Hatakeyama et al. | |
| 2018/0149973 | A1 | 5/2018 | Arai et al. | |

FOREIGN PATENT DOCUMENTS

| JP | 2008-268741 A | 11/2008 |
|---|---|---|
| JP | 2013-53196 A | 3/2013 |
| JP | 5692229 B2 | 4/2015 |
| JP | 2016141796 A | 8/2016 |
| JP | 2018-92159 A | 6/2018 |
| TW | I578102 B | 4/2017 |
| TW | 201805269 A | 2/2018 |
| WO | 2013031878 A1 | 3/2013 |

OTHER PUBLICATIONS

Machine translation of TW I578102 B, published on Apr. 11, 2017 (Year: 2017).*
Machine translation of TW201805269 A, published on Feb. 16, 2018 (Year: 2018).*
Machine translation of WO 2013/031878, published on Mar. 7, 2013 (Year: 2013).*
Office Action dated Oct. 19, 2021, issued in counterpart TW Application No. 109132808. (5 pages).
Office Action dated Jul. 9, 2021, issued in counterpart TW application No. 109132808. (5 pages).
Office Action dated May 31, 2022, issued in counterpart JP Application No. 2019-175739, with English translation. (8 pages).

* cited by examiner

*Primary Examiner* — Anca Eoff
(74) *Attorney, Agent, or Firm* — WHDA, LLP

(57) ABSTRACT

A polymer comprising recurring units having a multiple bond-containing acid labile group, recurring units having a phenolic hydroxyl group, and recurring units adapted to generate an acid upon exposure is used to formulate a resist composition, which exhibits a high sensitivity, low LWR and improved CDU when processed by lithography using EUV of wavelength 13.5 nm.

10 Claims, No Drawings

POLYMER, CHEMICALLY AMPLIFIED RESIST COMPOSITION AND PATTERNING PROCESS

CROSS-REFERENCE TO RELATED APPLICATION

This non-provisional application claims priority under 35 U.S.C, § 119(a) on Patent Application No. 2019-175739 filed in Japan on Sep. 26, 2019, the entire contents of which are hereby incorporated by reference.

TECHNICAL FIELD

This invention relates to a polymer, a chemically amplified resist composition, and a pattern forming process using the resist composition.

BACKGROUND ART

The currently increasing integration density of integrated circuits requires pattern formation to a smaller feature size. In the lithography process of forming patterns with a feature size of 0.2 μm or less, chemically amplified resist compositions utilizing acid as catalyst are mostly used. For exposure, high-energy radiation such as UV, deep UV or EB is used as the energy source. The EB lithography utilized as the ultrafine processing technology is indispensable for the processing of photomask blanks to produce photomasks for use in semiconductor device fabrication.

Polymers containing abundant aromatic skeletons with acidic side chains, for example, polyhydroxystyrene are useful as the resist material for KrF excimer laser lithography, but not used as the resist material for ArF excimer laser lithography because of substantial absorption of light near to wavelength 200 nm. The above polymers are yet important, because of high etching resistance, as the resist materials for the EB lithography and EUV lithography which are promising for forming patterns of smaller size than the processing limit of ArF excimer laser.

In positive tone resist materials for the EB lithography and resist materials for the EUV lithography, a base polymer having on a phenol side chain an acidic functional group masked with an acid labile protective group is often used in combination with a photoacid generator. Under the catalysis of an acid generated from the photoacid generator upon exposure to high-energy radiation, the protective group is deprotected so that the polymer may become solubilized in alkaline developer. Tertiary alkyl, tert-butoxycarbonyl, and acetal groups are mainly used as the acid labile protective group. On use of acetal and similar protective groups requiring relatively small activation energy for deprotection, one advantage is that a resist film having a high sensitivity is obtained. Unless the diffusion of the generated acid is fully suppressed, however, deprotection reaction can take place even in the unexposed region of the resist film. There arise problems like degradation of LER and a loss of CDU.

For the control of resist sensitivity and pattern profile, various improvements are made through a choice and combination of components in a resist composition and selection of processing conditions. One of such improvements addresses the diffusion of acid that has a significant impact on the resolution of chemically amplified resist compositions. Enormous studies are made on the problem of acid diffusion that largely affects sensitivity and resolution.

For the purpose of enhancing the sensitivity of resist compositions, Patent Documents 1 to 4 disclose attempts to introduce a multiple bond into an acid labile group on a base polymer. By introducing a double or triple bond, the resist performance is improved to some extent, but not to a satisfactory extent.

CITATION LIST

Patent Document 1: JP-B 5692229
Patent Document 2: JP-A 2013-053196
Patent Document 3: JP-A 2018-092159 (U.S. Pat. No. 10,649,330)
Patent Document 4: JP-A 2008-268741

SUMMARY OF INVENTION

While many chemically amplified resist compositions utilizing acid as catalyst are known, there is the desire for a resist composition which has a higher sensitivity and is improved in the LWR of line patterns or the CDU of hole patterns.

An object of the invention is to provide a polymer, a resist composition comprising the polymer, and a pattern forming process using the resist composition, the resist composition exhibiting a high sensitivity and reduced LWR or improved CDU when processed by the lithography using EB or EUV of wavelength 13.5 nm.

The inventors have found that using a polymer comprising recurring units having an acid labile group containing a multiple bond, reclining units having a phenolic hydroxyl group, and recurring units adapted to generate an acid upon exposure, a chemically amplified resist composition can be formulated which exhibits a high sensitivity, improved CDU, high contrast, improved resolution, and wide process margin.

In one aspect, the invention provides a polymer comprising recurring units having an acid labile group containing a multiple bond, recurring units having a phenolic hydroxyl group, and recurring units adapted to generate an acid upon exposure.

Preferably, the recurring units having an acid labile group containing a multiple bond have the formula (a).

(a)

Herein $R^A$ is each independently hydrogen, fluorine, methyl or trifluoromethyl. $X^1$ is a single bond, phenylene group, naphthylene group or (backbone)-C(=O)—O—$X^{11}$—, wherein $X^{11}$ is a $C_1$-$C_{10}$ aliphatic hydrocarbylene group which may contain a hydroxyl moiety, ether bond, ester bond or lactone ring, or a phenylene or naphthylene group. $A^{L1}$ is an acid labile group having the formula (a1) or (a2):

(a1)

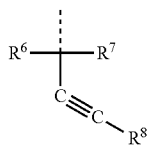
(a2)

wherein $R^1$ to $R^8$ are each independently hydrogen or a $C_1$-$C_{20}$ hydrocarbyl group which may contain a heteroatom, with the proviso that not both $R^1$ and $R^2$ are hydrogen at the same time and not both $R^6$ and $R^7$ are hydrogen at the same time, a pair of $R^1$ and $R^2$, $R^1$ and $R^3$, $R^1$ and $R^4$, $R^3$ and $R^4$, $R^4$ and $R^5$, $R^6$ and $R^7$, or $R^6$ and $R^8$ may bond together to form an aliphatic ring with the carbon atom(s) to which they are attached or the carbon atoms to which they are attached and the intervening carbon atom.

Preferably, the recurring units having a phenolic hydroxyl group have the formula (b).

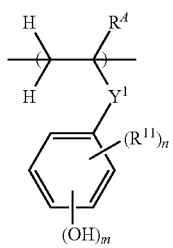
(b)

Herein $R^A$ is as defined above, $Y^1$ is a single bond or (backbone)-C(=O)—O—, $R^{11}$ is halogen, cyano, a $C_1$-$C_{20}$ hydrocarbyl group which may contain a heteroatom, $C_1$-$C_{20}$ hydrocarbyloxy group which may contain a heteroatom, $C_2$-$C_{20}$ hydrocarbylcarbonyl group which may contain a heteroatom, $C_2$-$C_{20}$ hydrocarbylcarbonyloxy group which may contain a heteroatom, or $C_2$-$C_{20}$ hydrocarbyloxycarbonyl group which may contain a heteroatom, m is an integer of 1 to 4, n is an integer of 0 to 4, and $1 \leq m+n \leq 5$.

Preferably, the recurring units adapted to generate an acid upon exposure have the formula (c1), (c2) or (c3).

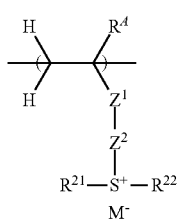
(c1)

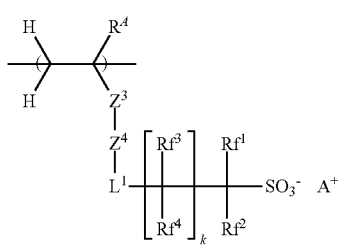
(c2)

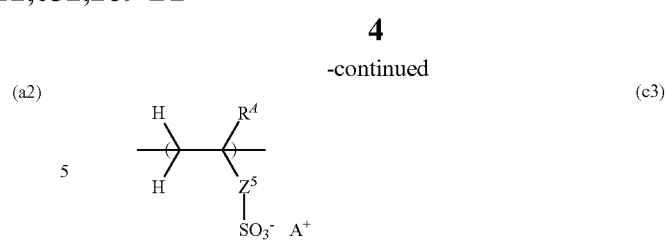
(c3)

Herein $R^A$ is as defined above. $Z^1$ is a single bond or phenylene group. $Z^2$ is a single bond, —C(=O)—O—$Z^{21}$—, —C(=O)—NH—$Z^{21}$— or —O—$Z^{21}$—, wherein $Z^{21}$ is a $C_1$-$C_6$ aliphatic hydrocarbylene group, phenylene group or a divalent group obtained from combination thereof, which may contain a carbonyl moiety, ester bond, ether bond or hydroxyl moiety. $Z^3$ is a single bond, phenylene, naphthylene, or (backbone)-C(=O)—O—$Z^{31}$—, wherein $Z^{31}$ is a $C_1$-$C_{10}$ aliphatic hydrocarbylene group which may contain a hydroxyl moiety, ether bond, ester bond or lactone ring, or phenylene or naphthylene group. $Z^4$ is a single bond or —$Z^{41}$—C(=O)—O—, wherein $Z^{41}$ is a $C_1$-$C_{20}$ hydrocarbylene group which may contain a heteroatom, $Z^5$ is a single bond, methylene, ethylene, phenylene, fluorinated phenylene, —C(=O)—O—$Z^{51}$—, —X(=O)—NH—$Z^{51}$—, wherein $Z^{51}$ is a $C_1$-$C_6$ aliphatic hydrocarbylene group or phenylene group, which may contain a carbonyl moiety, ester bond, ether bond or hydroxyl moiety. $R^{21}$ and $R^{22}$ are each independently a $C_1$-$C_{20}$ hydrocarbyl group which may contain a heteroatom, $R^{21}$ and $R^{22}$ may bond together to form a ring with the sulfur atom to which they are attached. $L^1$ is a single bond, ether bond, ester bond, carbonyl group, sulfonic acid ester bond, carbonate bond or carbamate bond. $Rf^1$ and $Rf^2$ are each independently fluorine or a $C_1$-$C_6$ fluoroalkyl group. $Rf^3$ and $Rf^4$ are each independently hydrogen, fluorine or a $C_1$-$C_6$ fluoroalkyl group. M- is a non-nucleophilic counter ion. A+ is an onium cation, and k is an integer of 0 to 3.

More preferably, A+ is a cation having the formula (c4) or (c5).

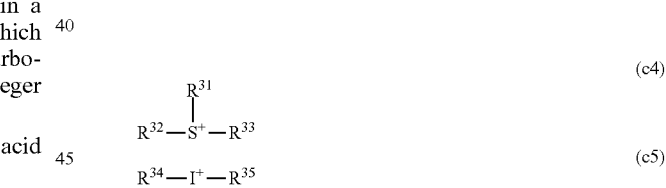
(c4)

(c5)

Herein $R^{31}$, $R^{32}$ and $R^{33}$ are each independently a $C_1$-$C_{20}$ hydrocarbyl group which may contain a heteroatom, $R^{31}$ and $R^{32}$ may bond together to form a ring with the sulfur atom to which they are attached, $R^{34}$ and $R^{35}$ are each independently a $C_1$-$C_{20}$ hydrocarbyl group which may contain a heteroatom.

The polymer may further comprise recurring units having the formula (d1) or (d2).

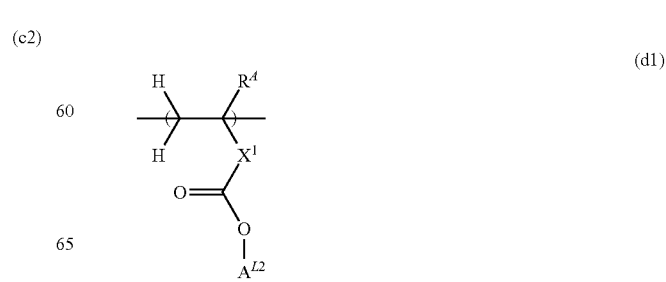
(d1)

-continued

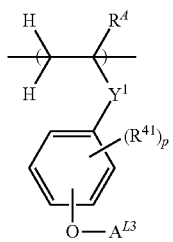

(d2)

Herein $R^A$, $X^1$, and $Y^1$ are as defined above. $A^{L2}$ and $A^{L3}$ are each independently an acid labile group free of multiple bond. $R^{41}$ is halogen, cyano, a $C_1$-$C_{20}$ hydrocarbyl group which may contain a heteroatom, $C_1$-$C_{20}$ hydrocarbyloxy group which may contain a heteroatom, $C_2$-$C_{20}$ hydrocarbylcarbonyl group which may contain a heteroatom, $C_2$-$C_{20}$ hydrocarbylcarbonyloxy group which may contain a heteroatom or $C_2$-$C_{20}$ hydrocarbyloxycarbonyl group which may contain a heteroatom, and p is an integer of 0 to 4.

The polymer may further comprise reclining units having the formula (e).

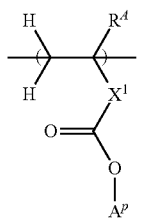

(e)

Herein $R^A$ and $X^1$ are as defined above. $A^P$ is hydrogen or a polar group containing at least one structure selected from among hydroxyl (other than phenolic hydroxyl), cyano, carbonyl, carboxyl, ether bond, ester bond, sulfonic acid ester bond, carbonate bond, lactone ring, sultone ring, and carboxylic anhydride.

In another aspect, the invention provides a resist composition comprising the polymer defined above.

The resist composition may further comprise an organic solvent, a photoacid generator, a quencher, and/or a surfactant which is insoluble or substantially insoluble in water and soluble in an alkaline developer and/or a surfactant which is insoluble or substantially insoluble in water and an alkaline developer.

In a further aspect, the invention provides a process for forming a pattern comprising the steps of applying the resist composition defined above to a substrate to form a resist film thereon, exposing the resist film to high-energy radiation, and developing the exposed resist film in a developer.

Typically, the high-energy radiation is i-line, KrF excimer laser, ArF excimer laser, EB, or EUV of wavelength 3 to 15 nm.

Advantageous Effects of Invention

Using a polymer comprising recurring units having an acid labile group containing a multiple bond recurring units having a phenolic hydroxyl group, and recurring units adapted to generate an acid upon exposure, there can be formulated a resist composition which exhibits a high sensitivity improved CDU, high contrast, improved resolution, and wide process margin.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line designates a valence bond, Me stands for methyl, and Ac for acetyl.

The abbreviations and acronyms have the following meaning,

| | |
|---|---|
| EB: | electron beam |
| EUV: | extreme ultraviolet |
| Mw: | weight average molecular weight |
| Mn: | number average molecular weight |
| Mw/Mn: | molecular weight dispersity |
| GPC: | gel permeation chromatography |
| PEB: | post-exposure bake |
| PAG: | photoacid generator |
| LWR: | line width roughness |
| CDU: | critical dimension uniformity |

Polymer

One embodiment of the invention is a polymer comprising recurring units having an acid labile group containing a multiple bond, recurring units having a phenolic hydroxyl group, and recurring units adapted to generate an acid upon exposure.

Reclining Unit (a)

The polymer contains recurring units (a) having an acid labile group containing a multiple bond. Preferably the recurring units (a) have the formula (a).

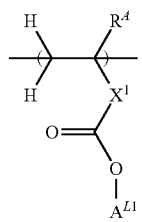

(a)

In formula (a), $R^A$ is each independently hydrogen, fluorine, methyl or trithoromethyl.

$X^1$ is a single bond, phenylene group, naphthylene group or (backbone)-C(=O)—O—$X^{11}$—. $X^{11}$ is a $C_1$-$C_{10}$ aliphatic hydrocarbylene group which may contain a hydroxyl moiety, ether bond, ester bond or lactone ring, or a phenylene naphthylene group.

The aliphatic hydrocarbylene group may be saturated or unsaturated and straight, branched or cyclic. Examples thereof include alkanediyl groups such as methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7- diyl, octane-1,8-diyl, nonane-1,9-diyl, and decane-1,10-diyl; cyctoalkanediyl groups such as cyclopropanediyl, cyclobutanediyl, cyclopentanediyl, and cyclohexanediyl; divalent polycyclic saturated hydrocarbon groups such as adamantanediyl and norbornanediyl; and mixtures thereof.

Examples of the structure having for wherein $X^1$ is a variant are shown below, but not limited thereto. Herein $R^A$ and $A^{L1}$ are defined herein.

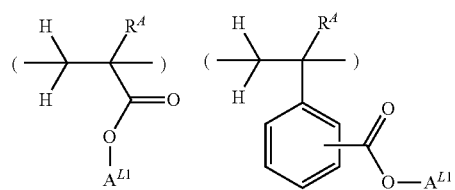
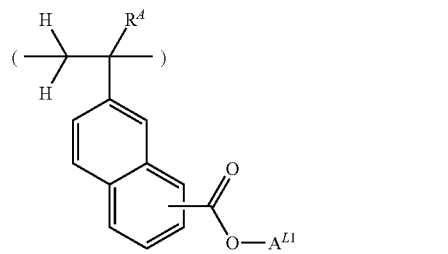
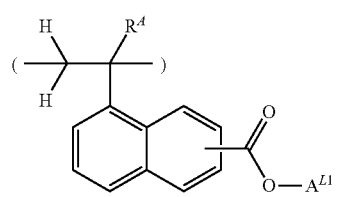
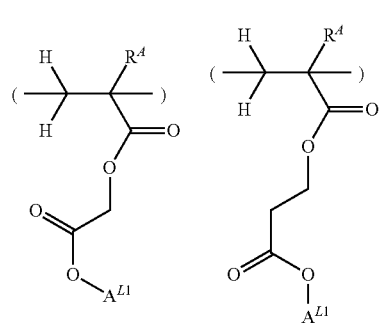
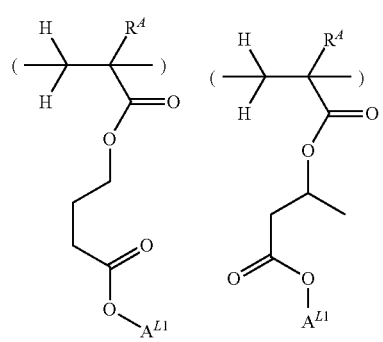

-continued

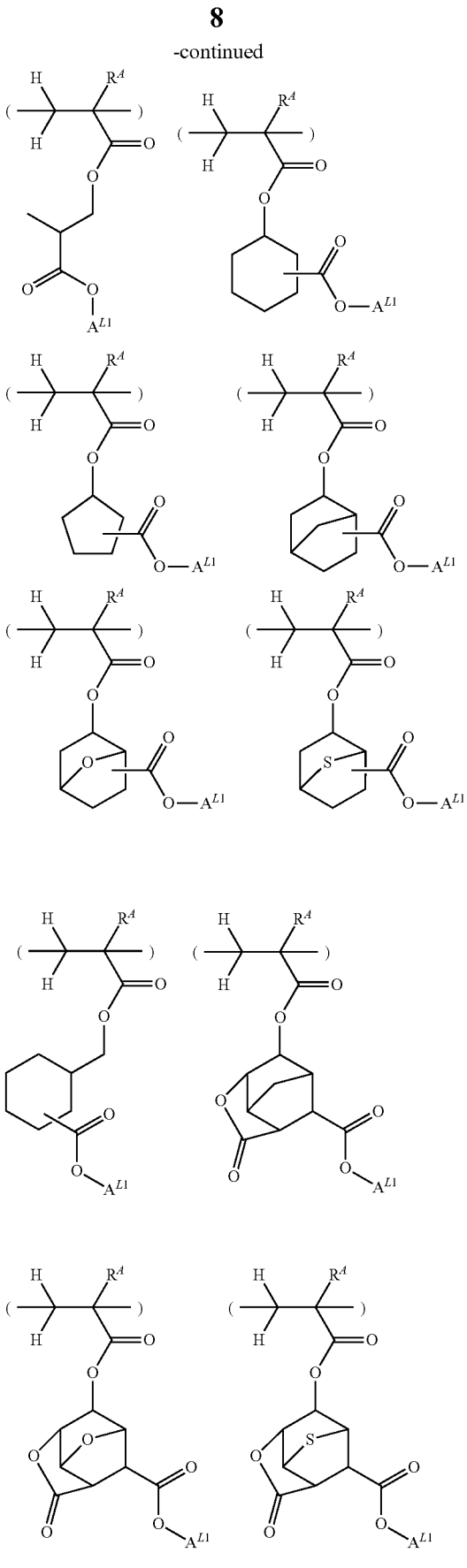

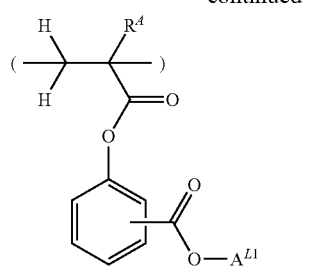
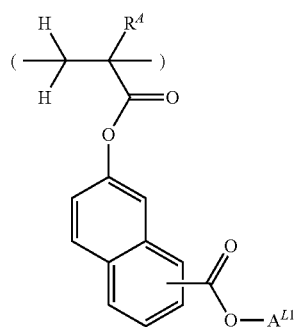
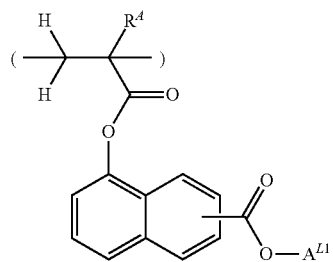
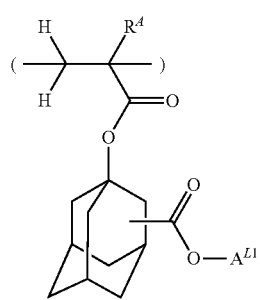
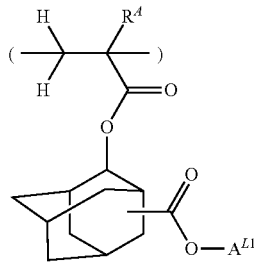
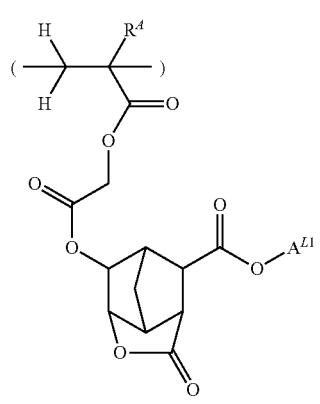
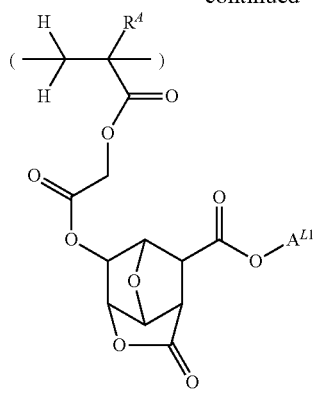
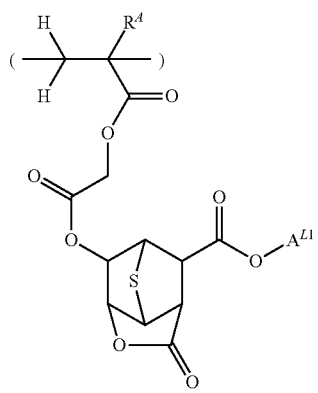
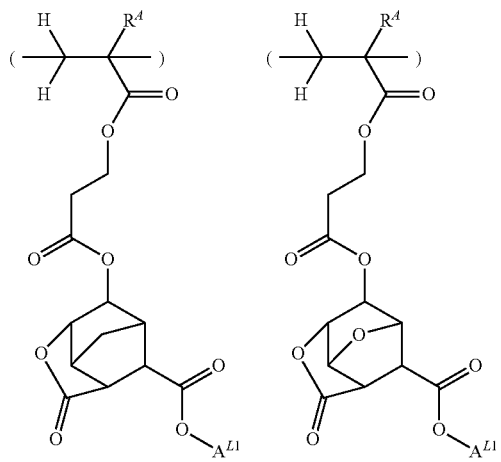
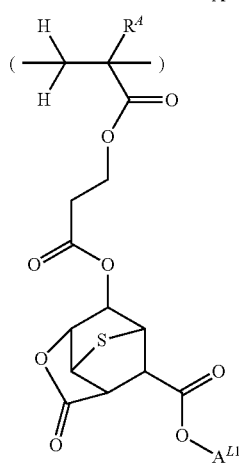

In formula (a), $A^{L1}$ is an acid labile group having the formula (a1) or (a2).

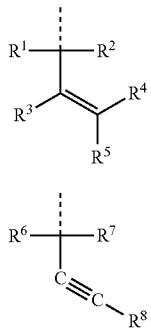

In formulae (a1) and (a2), $R^1$ to $R^8$ are each independently hydrogen or a $C_1$-$C_{20}$ hydrocarbyl group which may contain a heteroatom, with the proviso that not both $R^1$ and $R^2$ are hydrogen at the same time and not both $R^6$ and $R^7$ are hydrogen at the same time.

The hydrocarbyl group may be saturated or unsaturated and straight, branched or cyclic. Suitable hydrocarbyl groups include alkyl groups such as methyl, ethyl, propyl, isopropyl, n-butyl, sec-butyl, tert-butyl, tert-pentyl, n-pentyl, n-hexyl, n-octyl, 2-ethylexyl, n-nonyl, n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, adamantylmethyl; and aryl groups such as phenyl, naphthyl, anthracenyl. In the hydrocarbyl groups, some hydrogen may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, thioether bond, ester bond, sulfonic acid ester bond, carbonate bond, carbamate bond, amide bond, imide bond, lactone ring, sultone ring, thiolactone ring, lactam ring, sultam ring, carboxylic anhydride (—C(=O)—O—C(=O)—) or haloalkyl moiety. Inter alia, $R^3$ to $R^5$ are preferably hydrogen, and $R^8$ is preferably a $C_1$-$C_{20}$ hydrocarbyl group which may contain a heteroatom.

A pair of $R^1$ and $R^2$, $R^1$ and $R^3$, $R^1$ and $R^4$, $R^3$ and $R^4$, $R^4$ and $R^5$, $R^6$ and $R^7$, or $R^6$ and $R^8$ may bond together to form an aliphatic ring with the carbon atom(s) to which they are attached or the carbon atoms to which they are attached and the intervening carbon atom. Examples of the ring that $R^1$ and $R^2$, taken together, form include cyclopropane, cyclobutane, cyclopentane, cyclohexane, norbornane and adamantane rings. Examples of the ring that $R^1$ and $R^3$, taken together, form include cyclopropane, cyclobutane, cyclopentane, and cyclohexane rings. Examples of the ring that $R^1$ and $R^4$, taken together, form include cyclobutene, cyclopentene, and cyclohexene rings. Examples of the ring that $R^3$ and $R^4$, taken together, form include cyclopropene, cyclobutene, cyclopentene, and cyclohexene rings. Examples of the ring that $R^4$ and $R^5$, taken together, form include cyclopropane, cyclobutane, cyclopentane, cyclohexane, norbornane and adamantane rings. Examples of the ring that $R^6$ and $R^7$, taken together, form include cyclopropane, cyclobutane, cyclopentane, cyclohexane, norbornane and adamantane rings. Examples of the ring that $R^6$ and $R^8$, taken together, form include cyclopentyne and cyclohexyne rings.

Examples of the recurring unit (a) having an acid labile group of formula (a1) are shown below, but not limited thereto. Herein $R^A$ is as defined above.

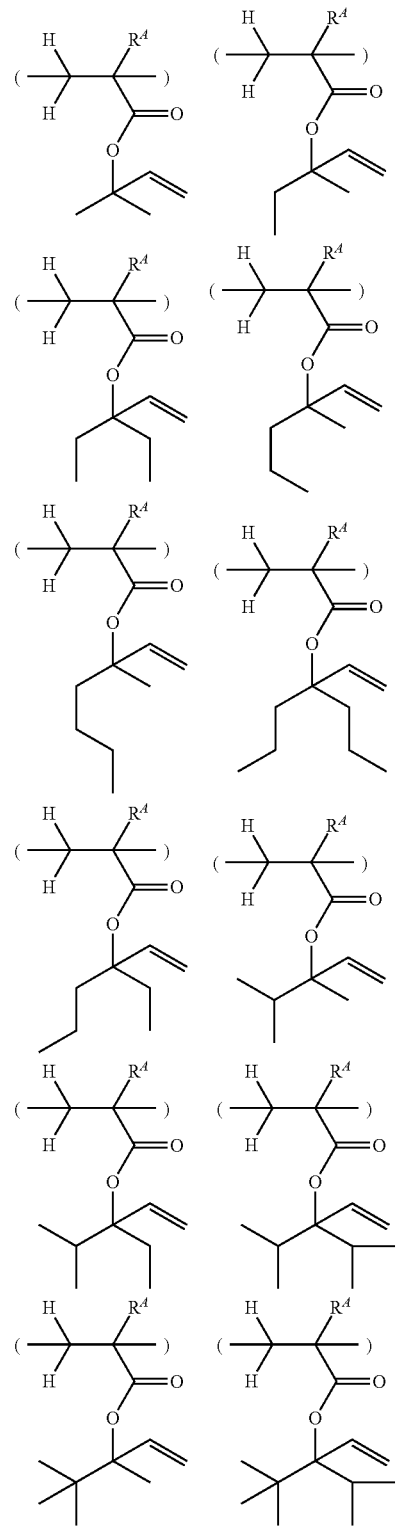

-continued
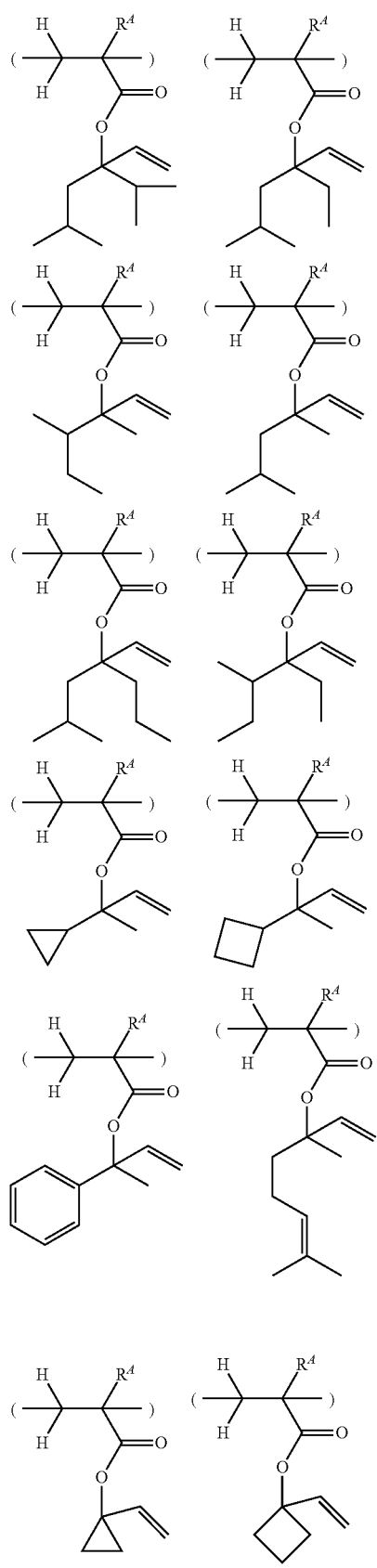
-continued
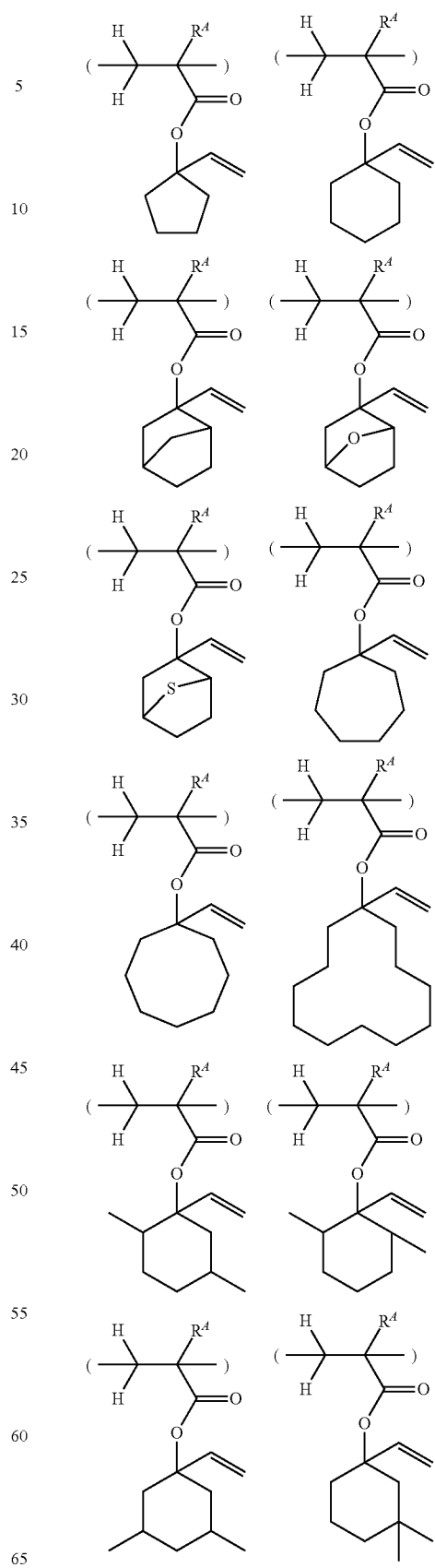

-continued
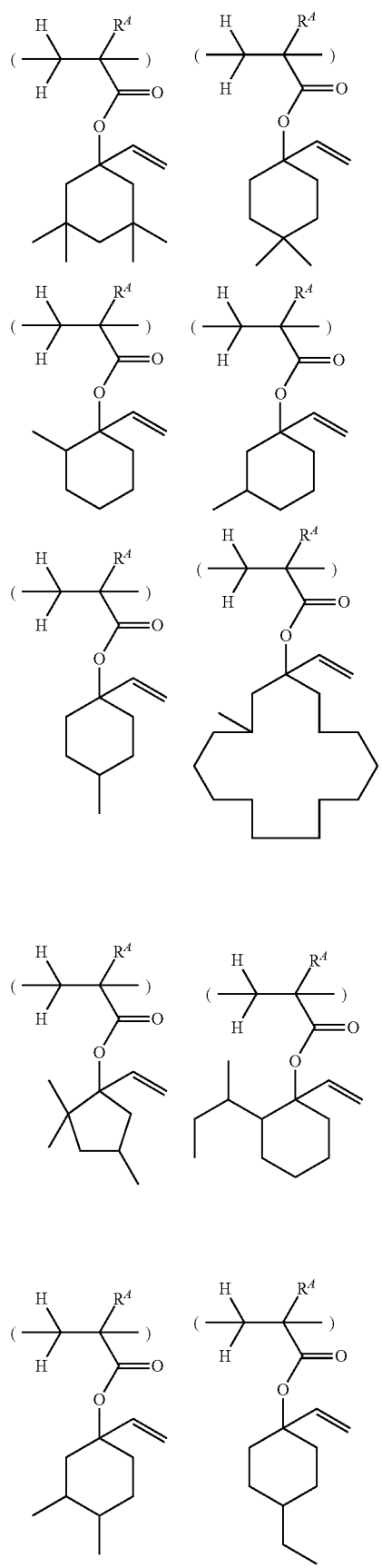
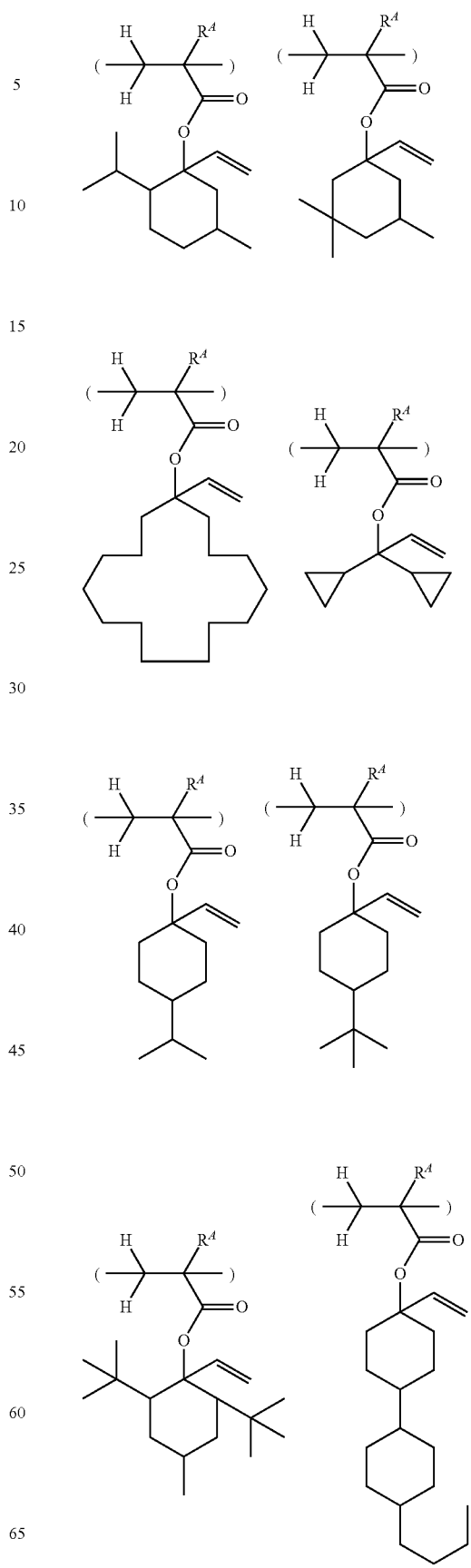

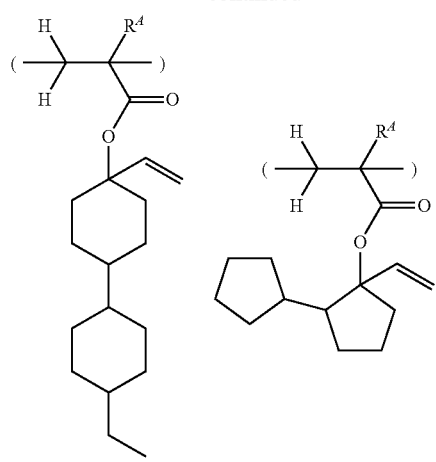
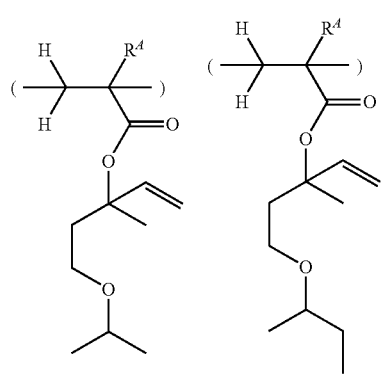
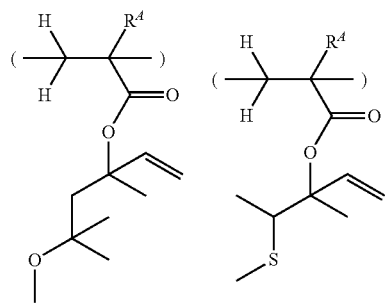
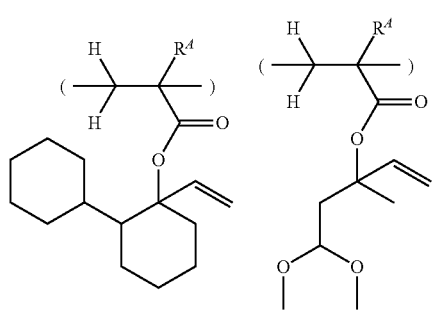
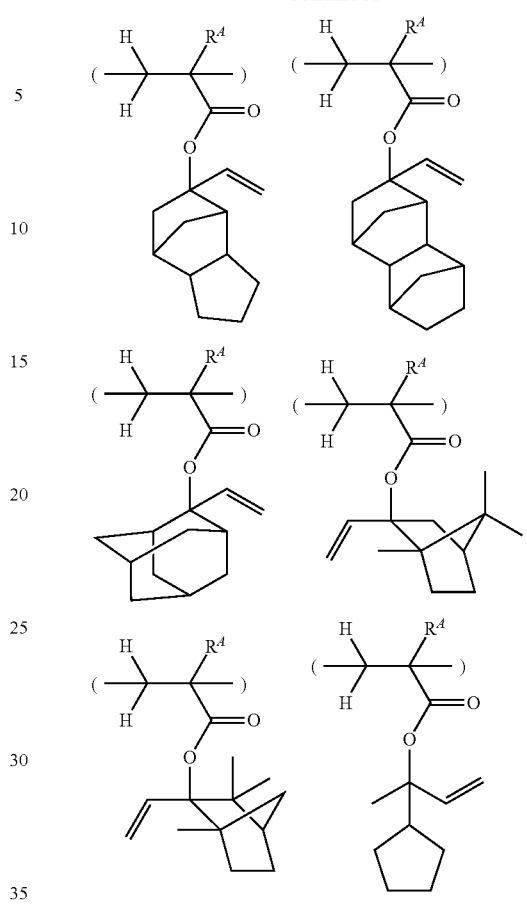
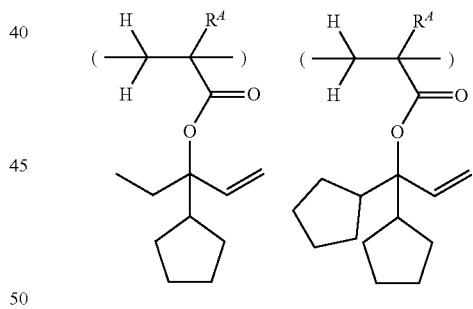
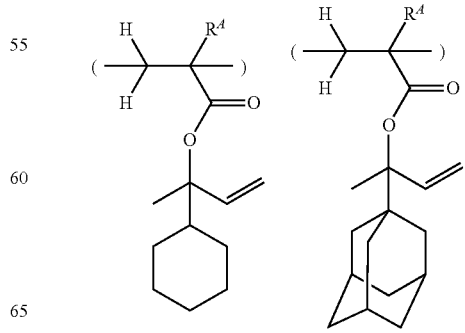

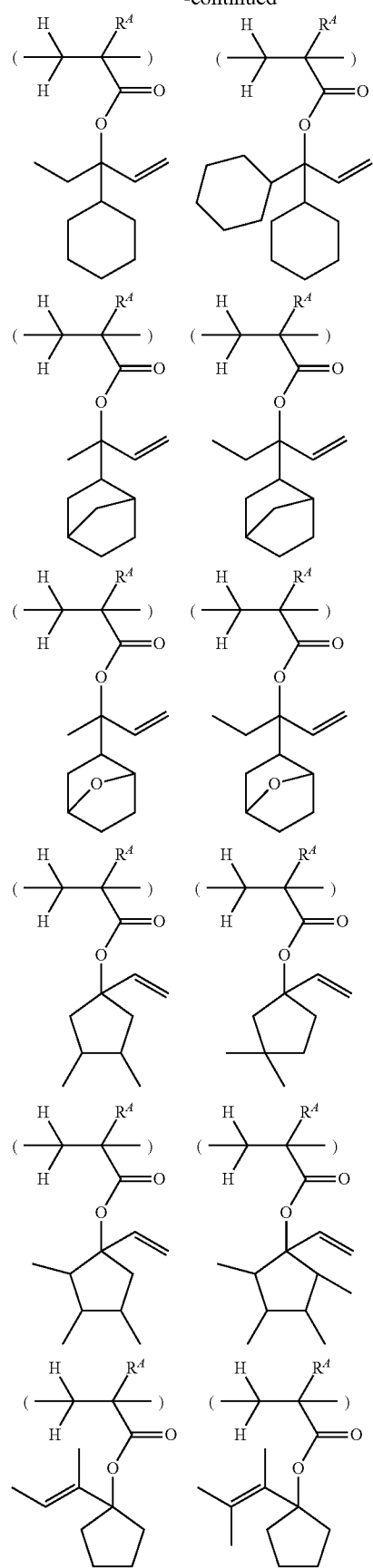
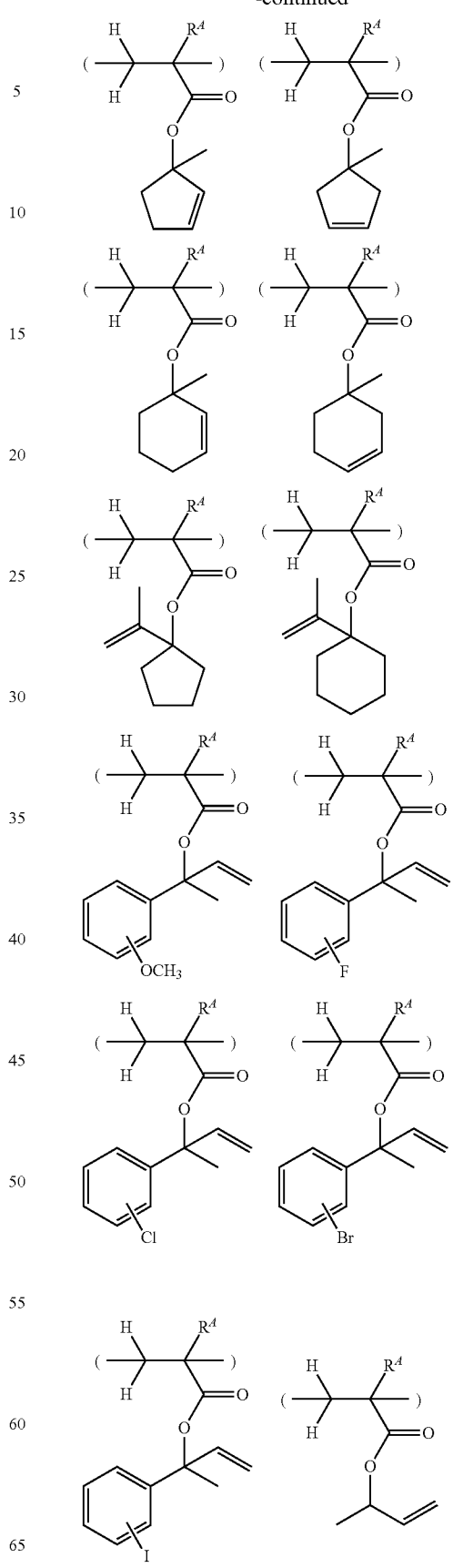

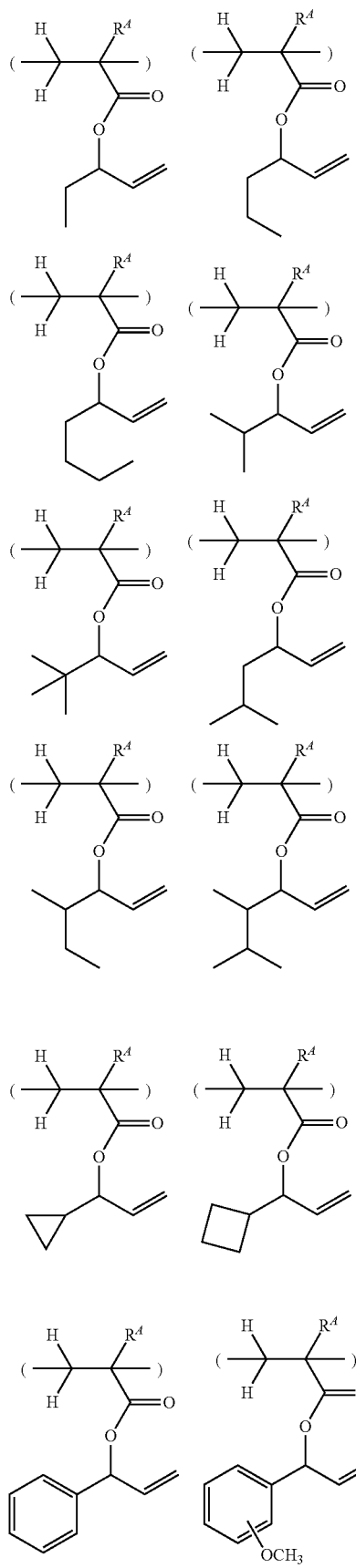
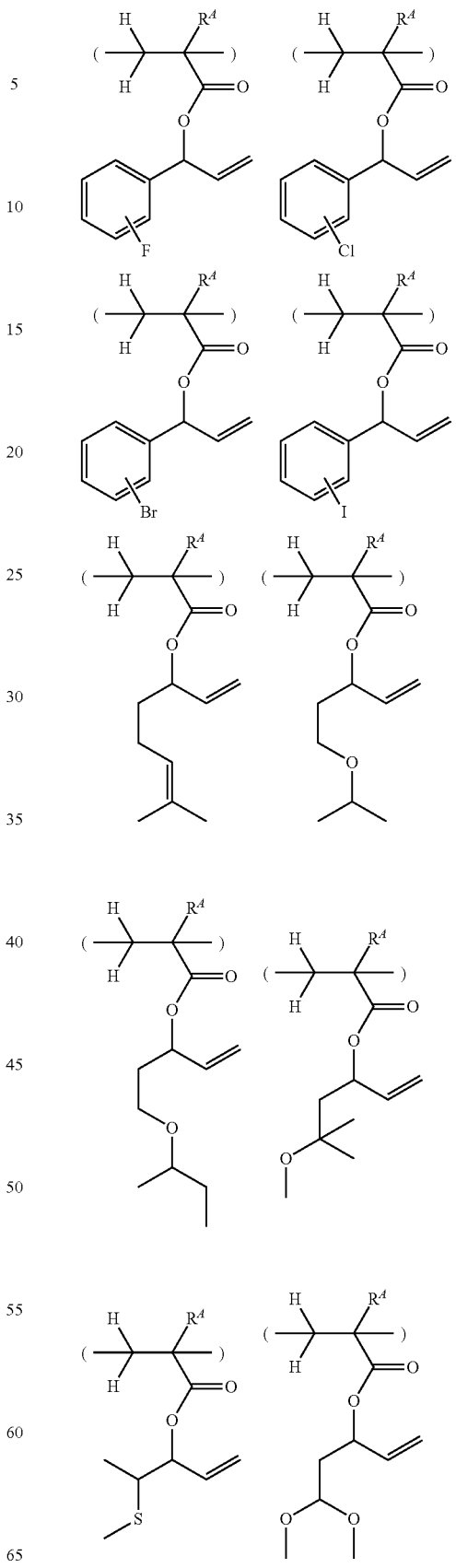

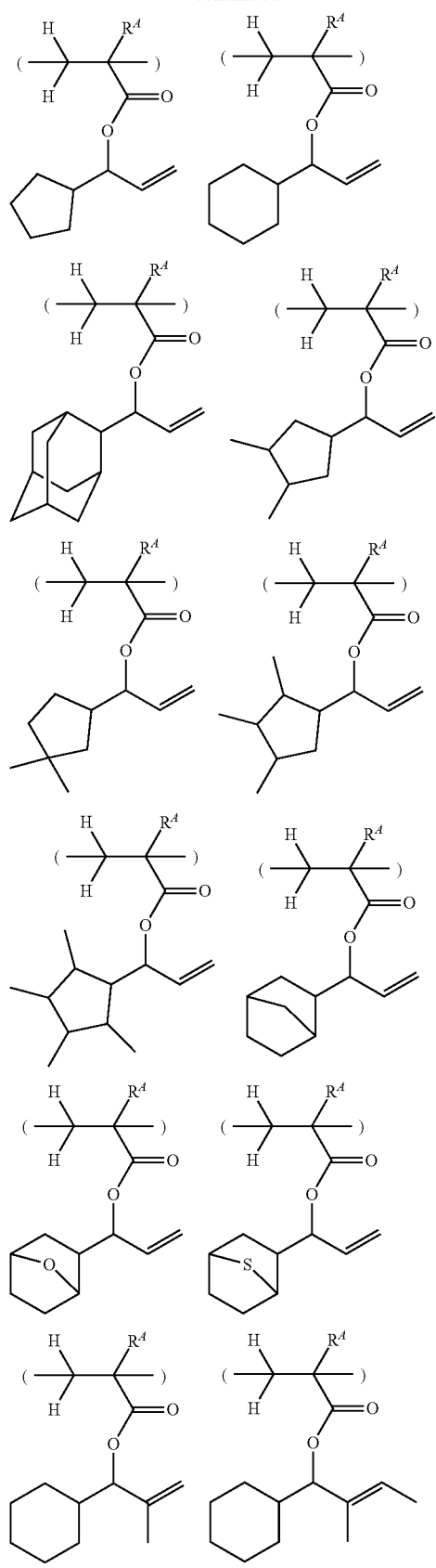
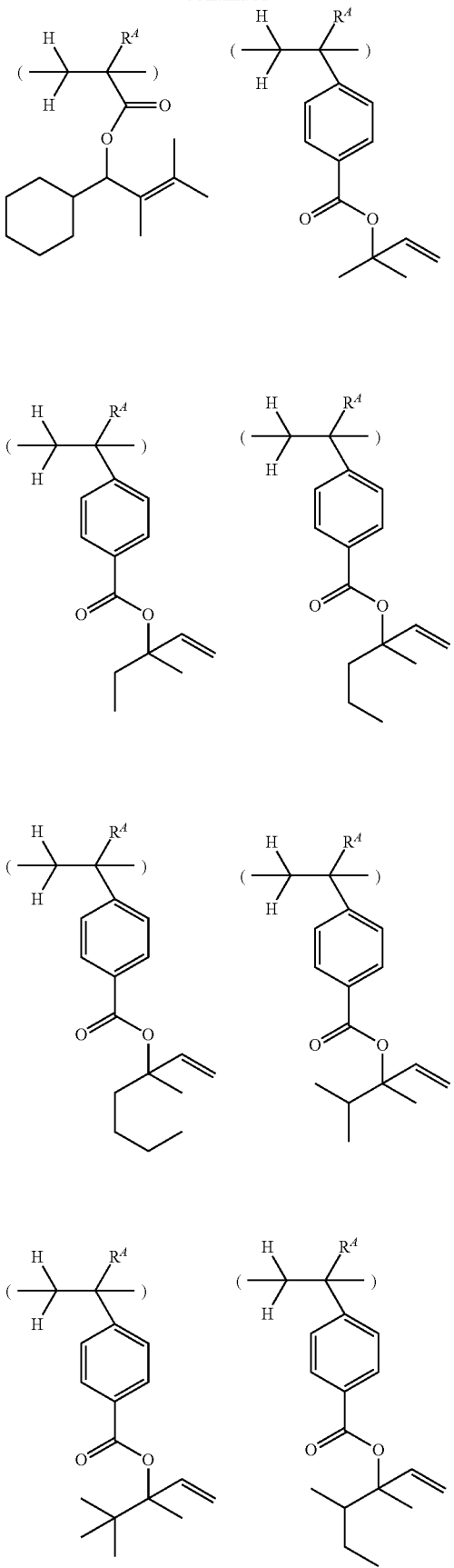

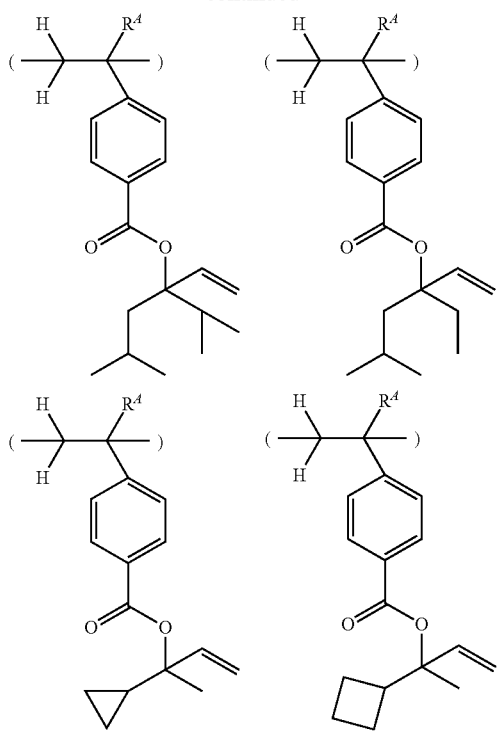
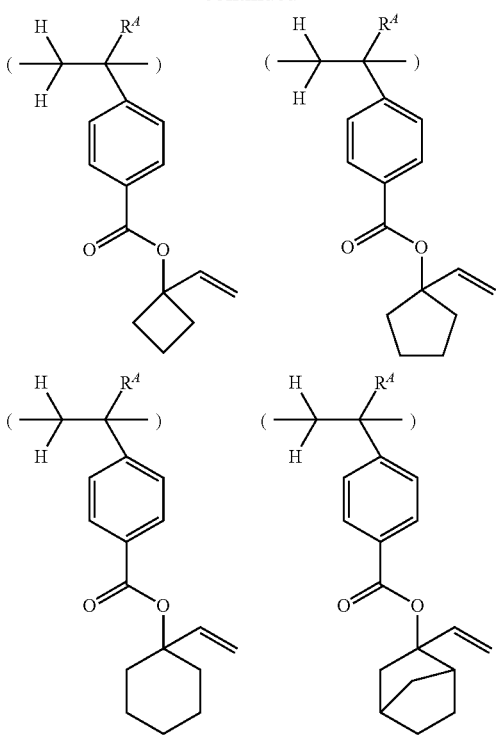
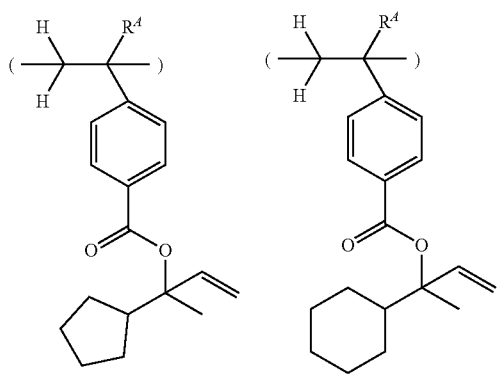
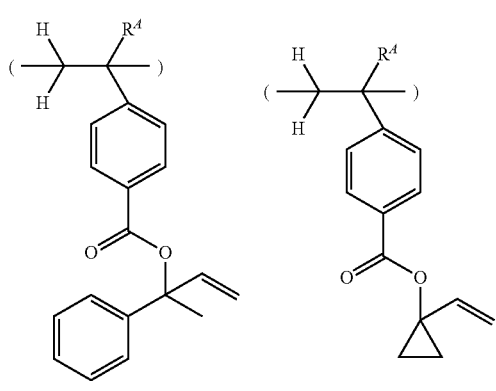
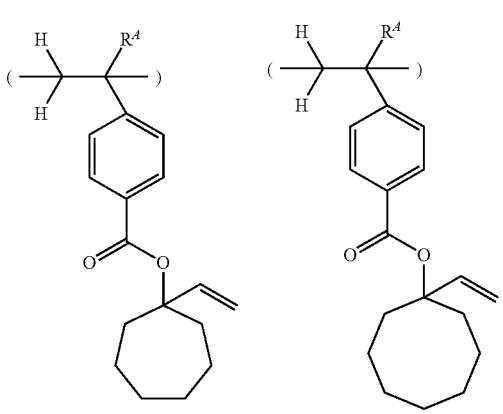

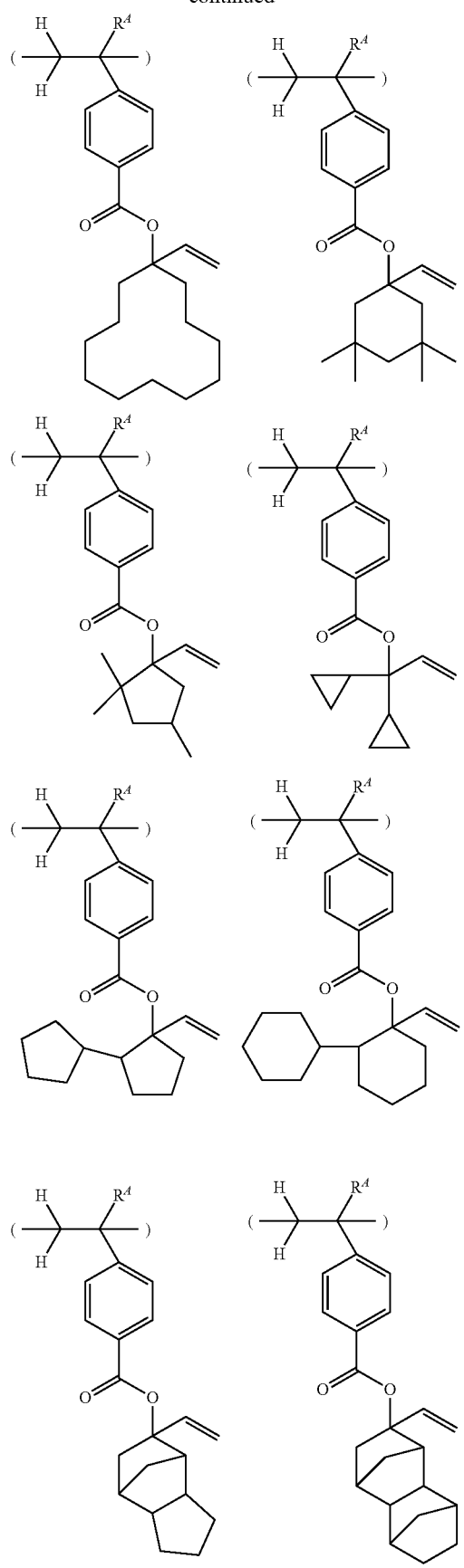
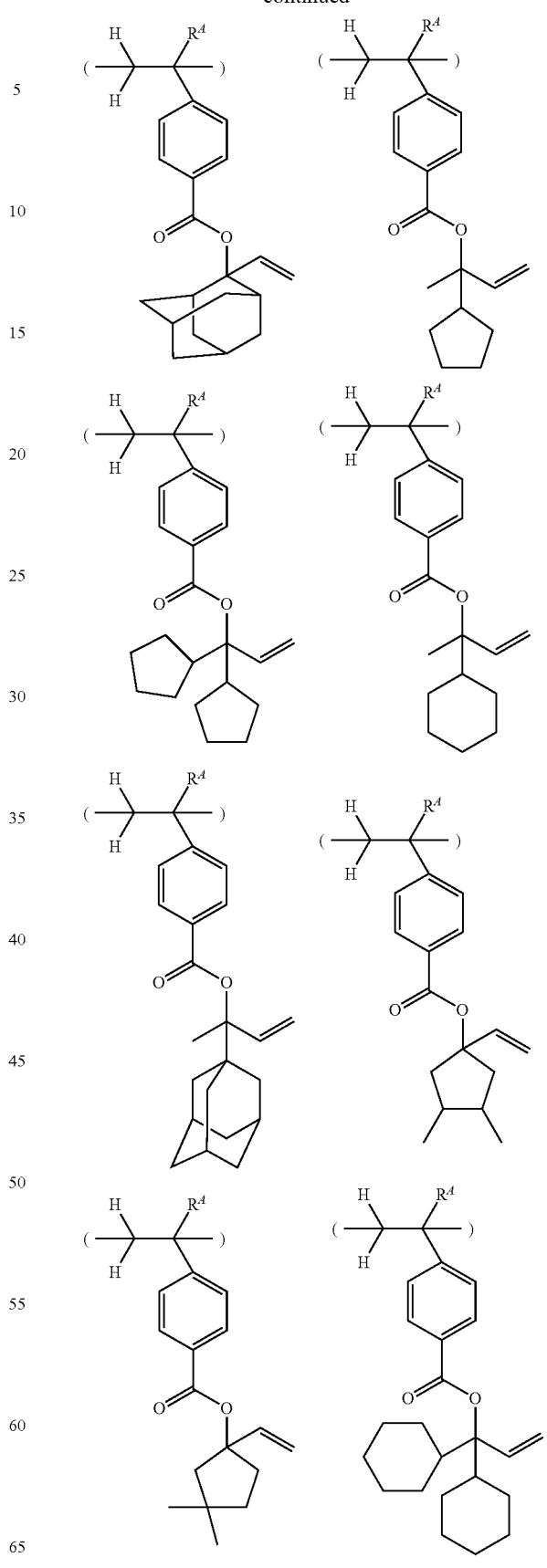

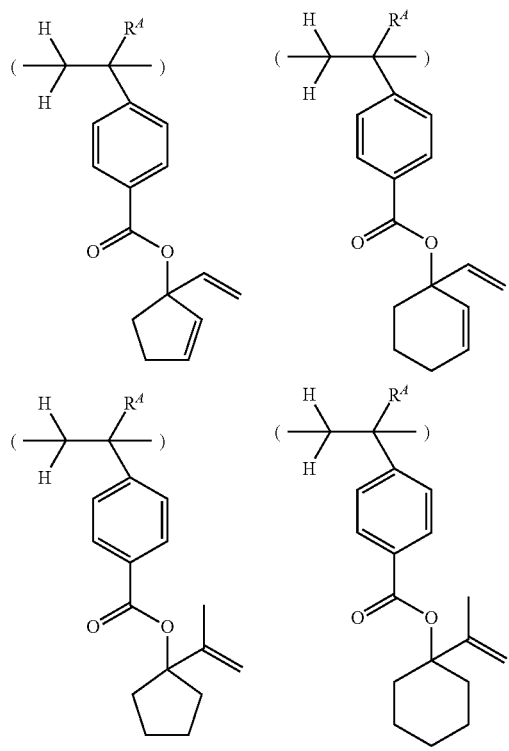
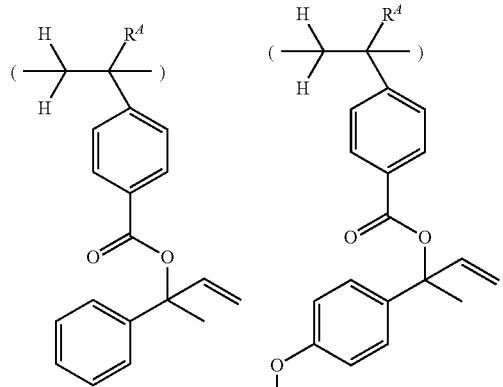
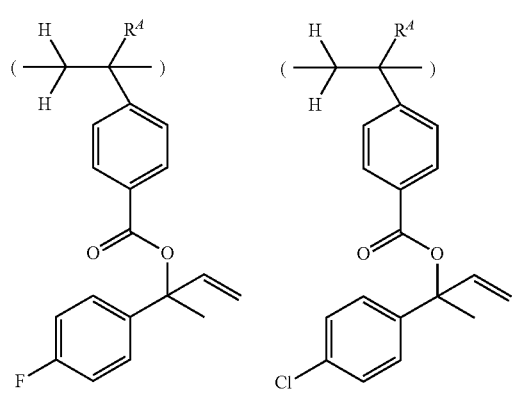
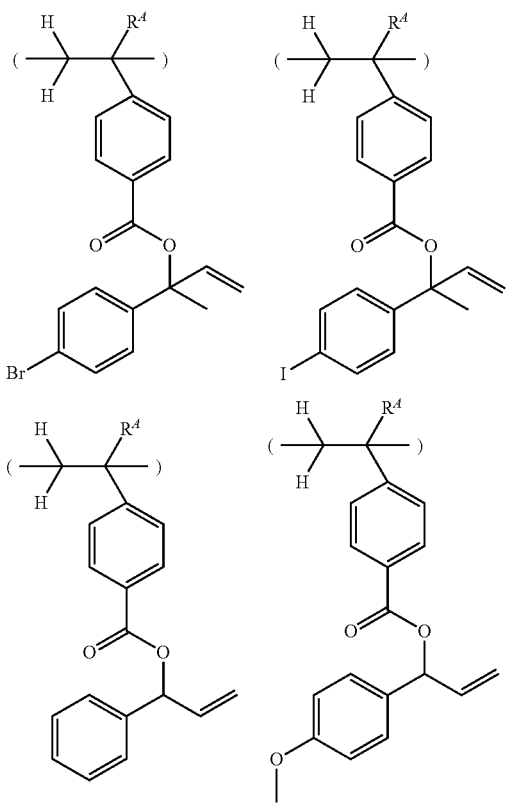
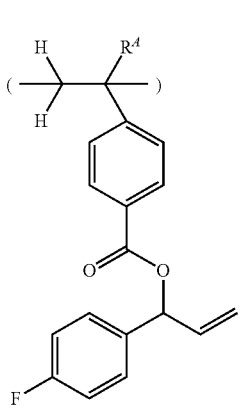
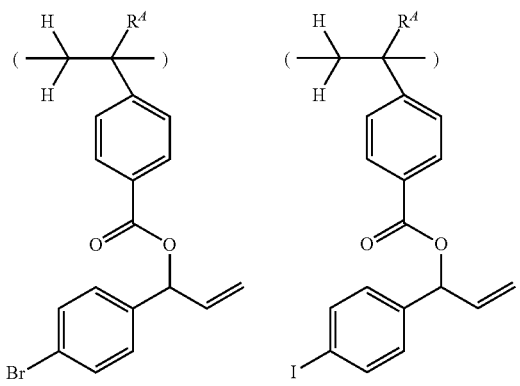

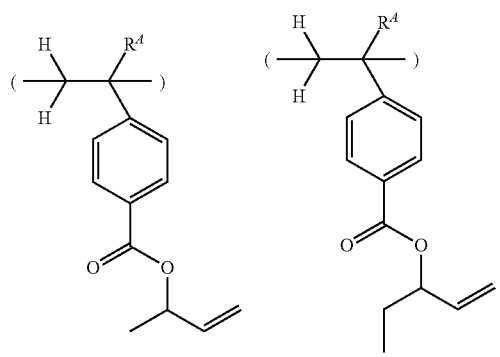
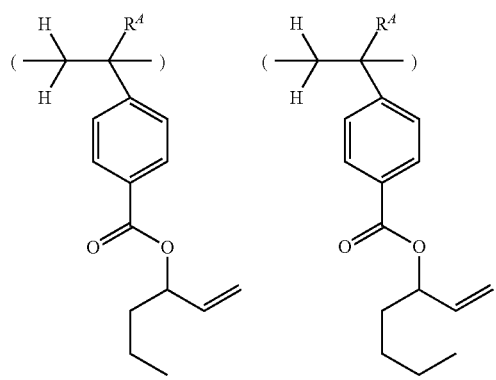
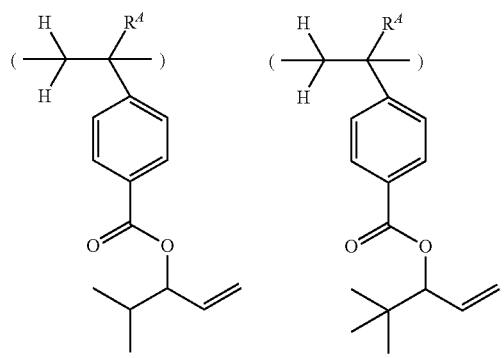
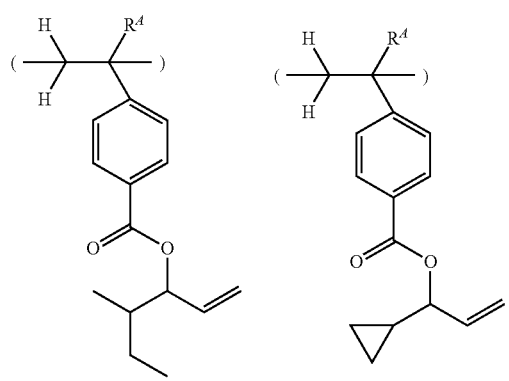
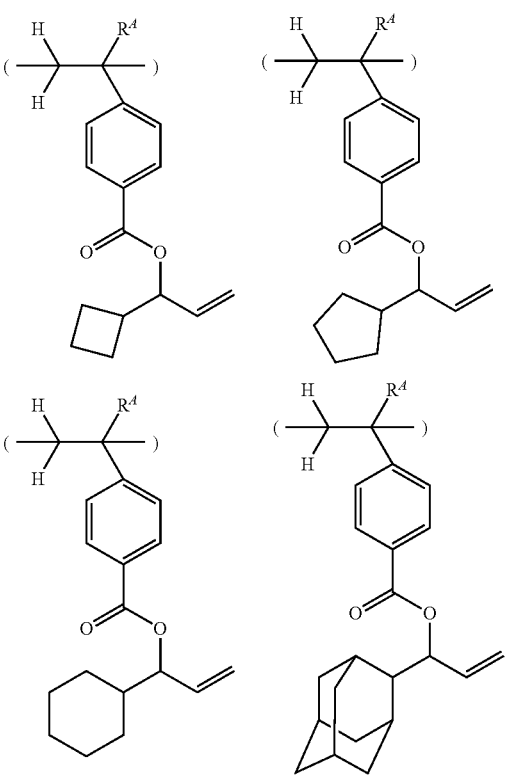
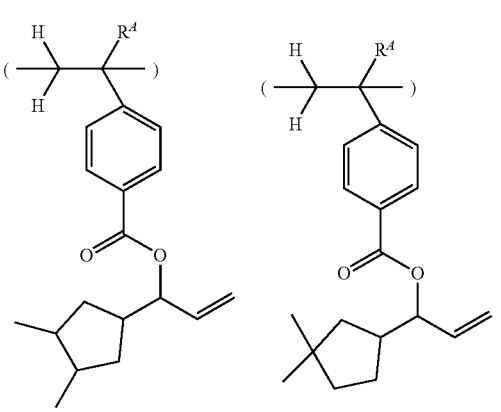
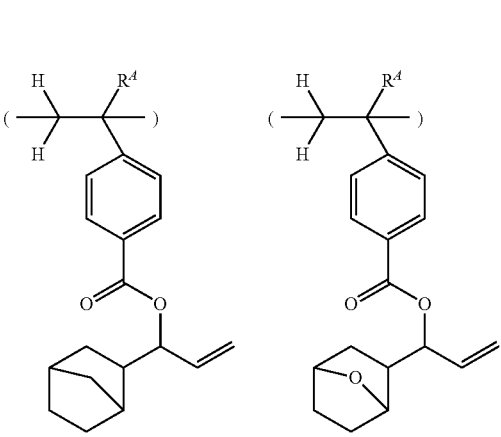

-continued
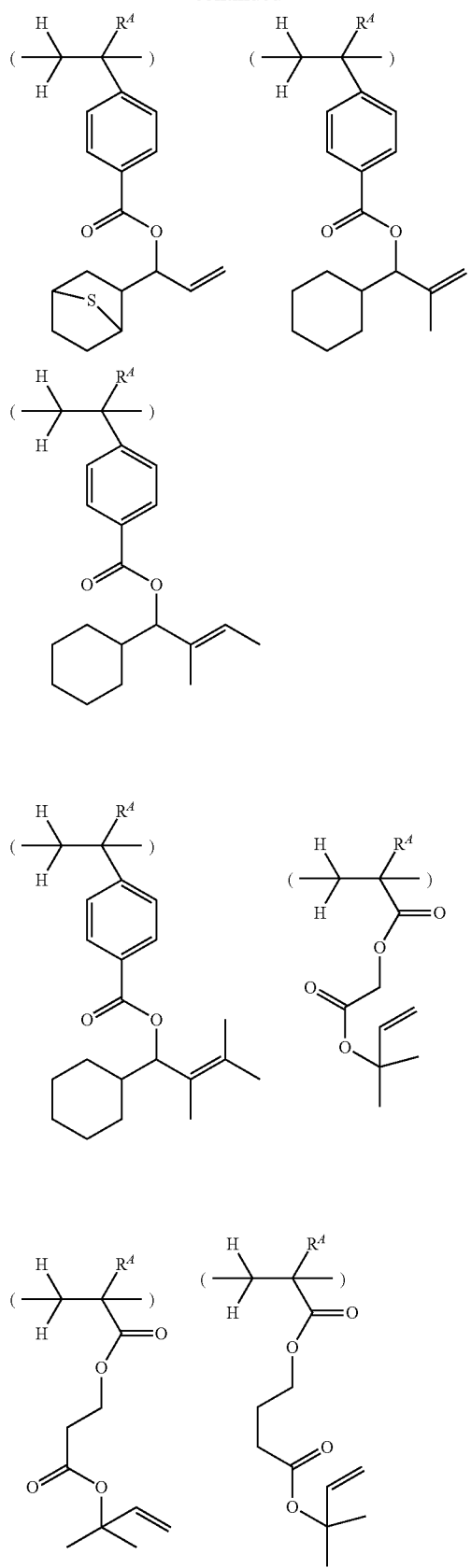
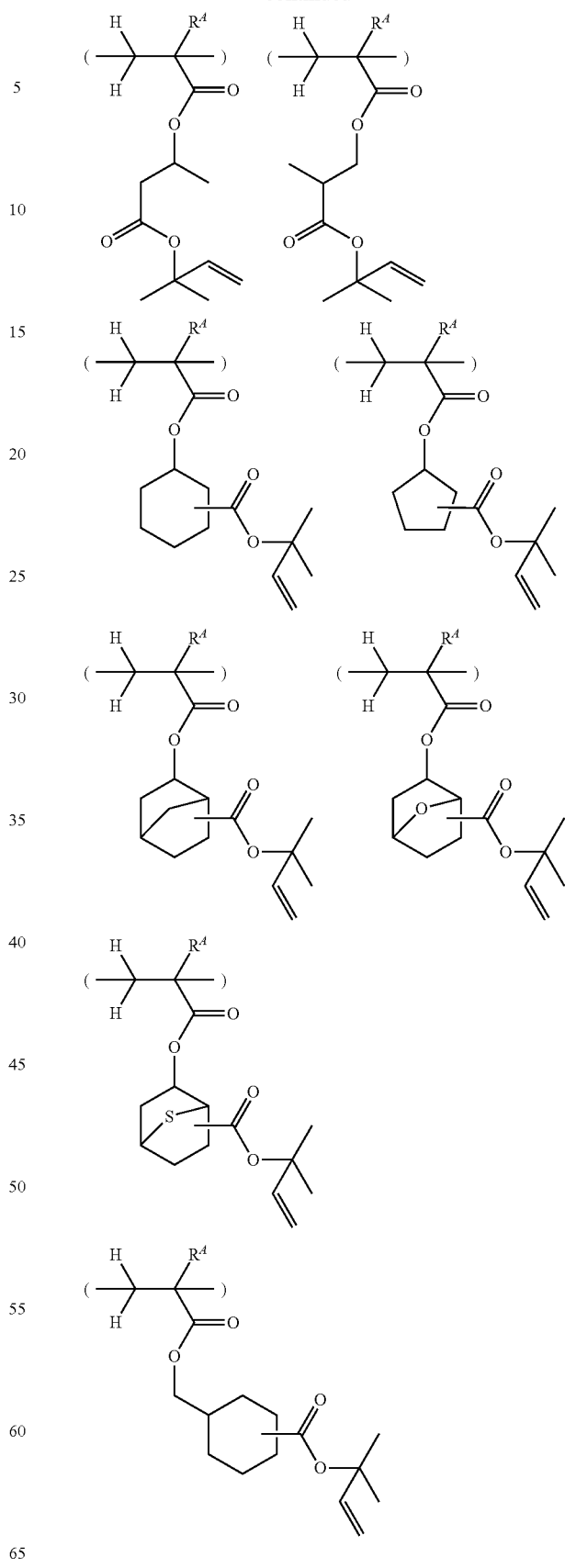

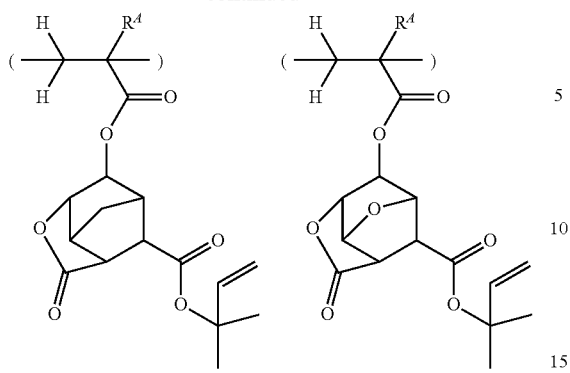
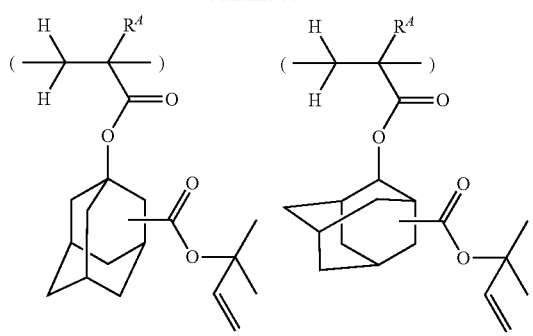
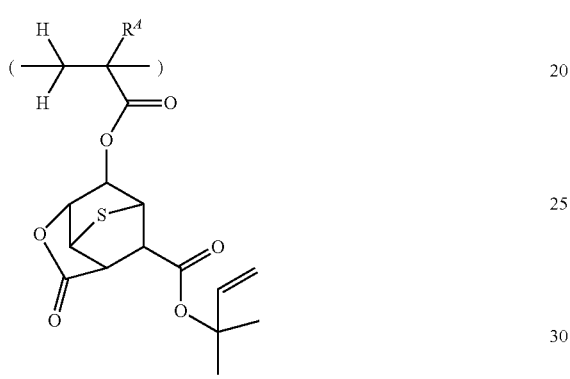
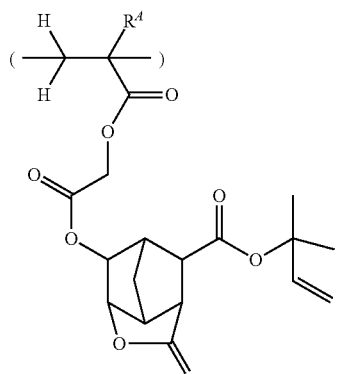
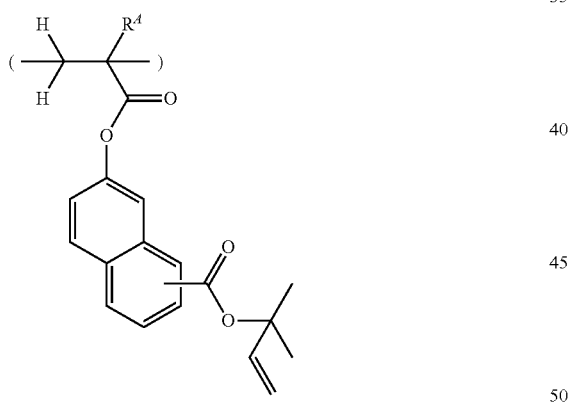
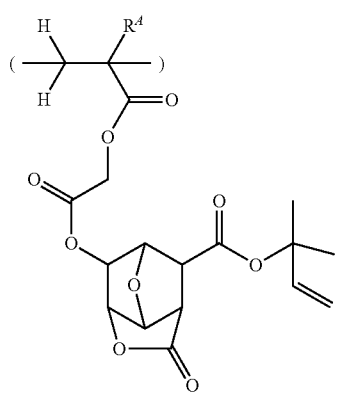
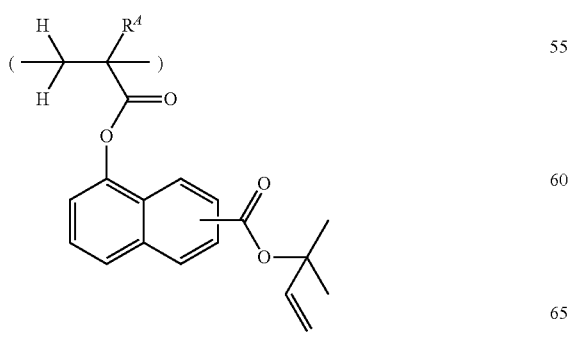
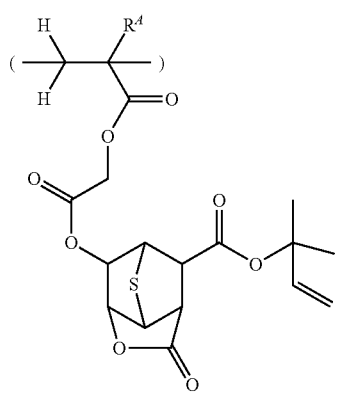

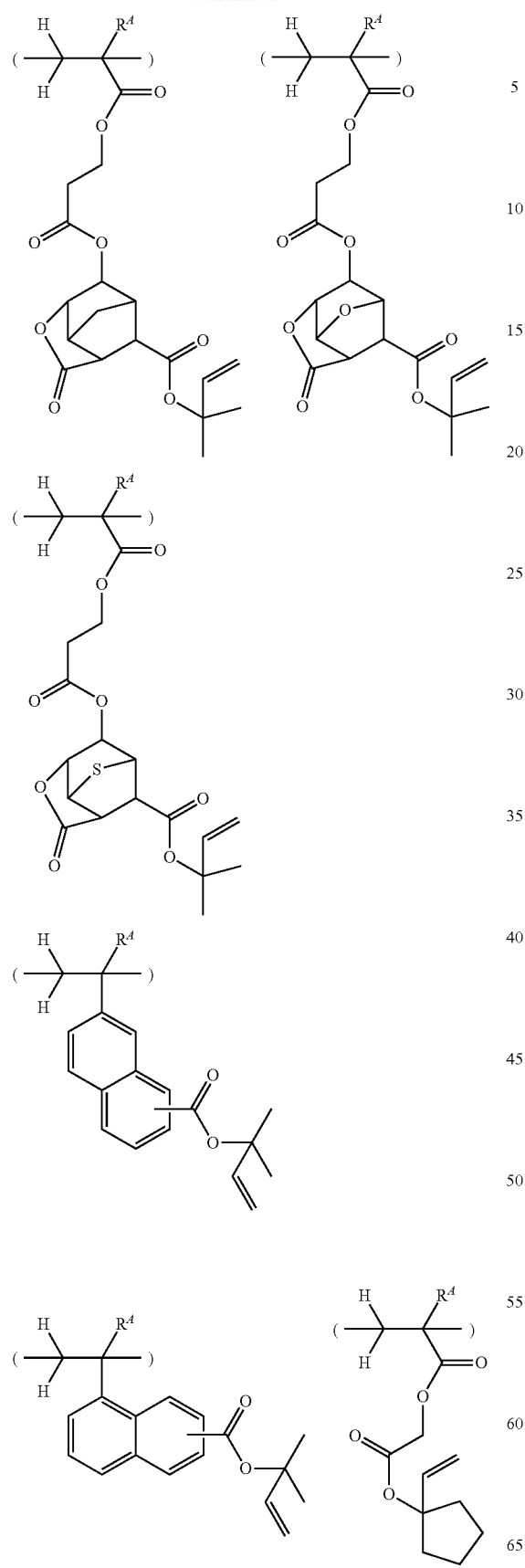
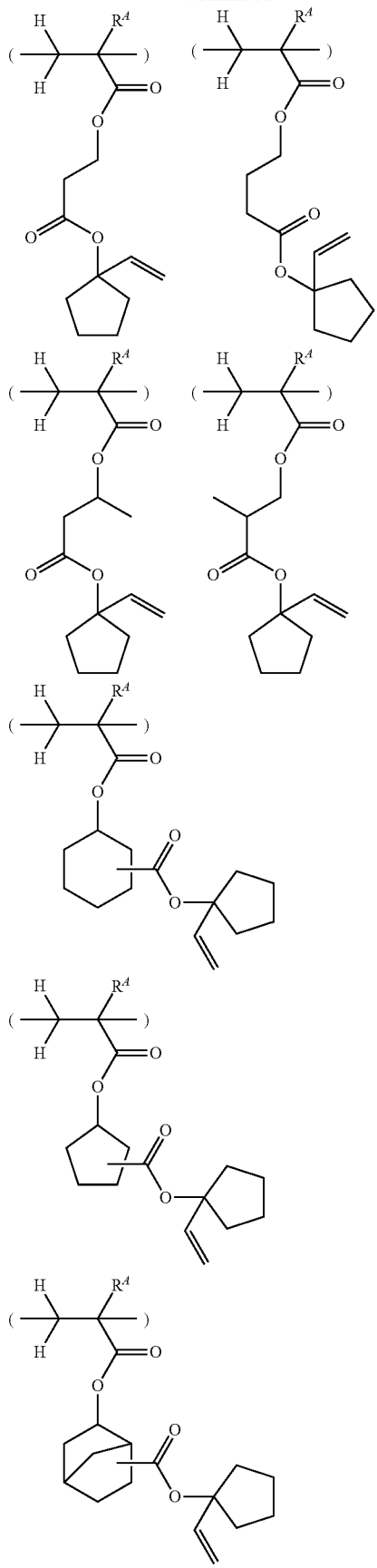

-continued
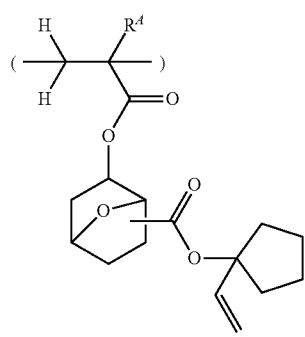
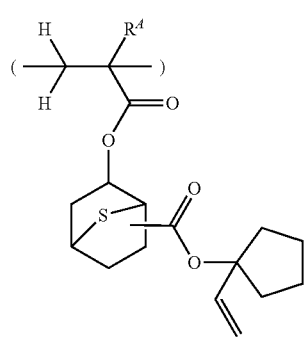
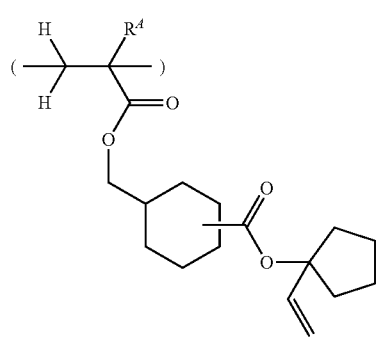
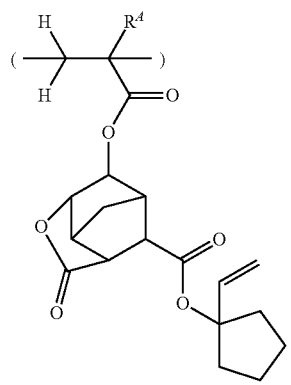
-continued
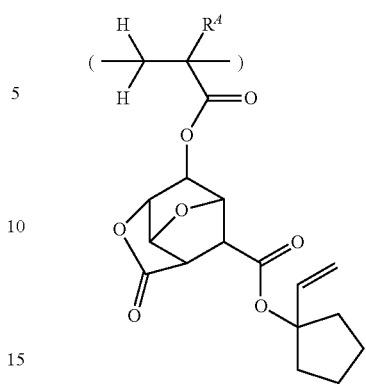
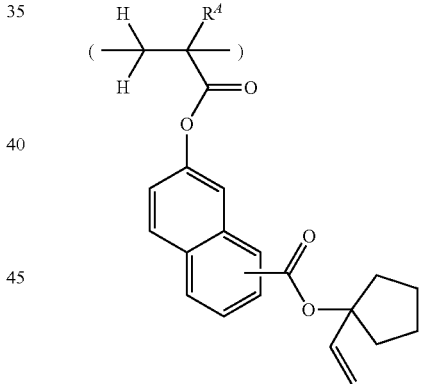
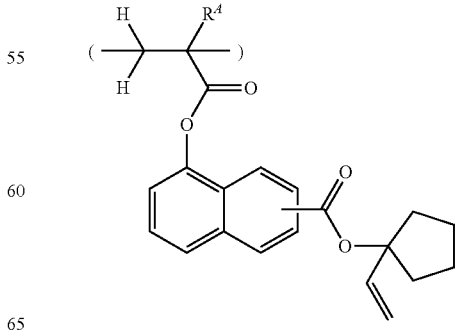

41
-continued
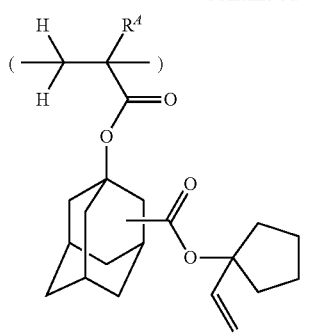
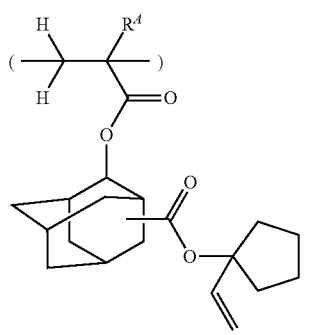
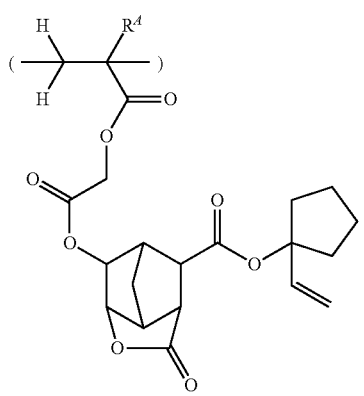
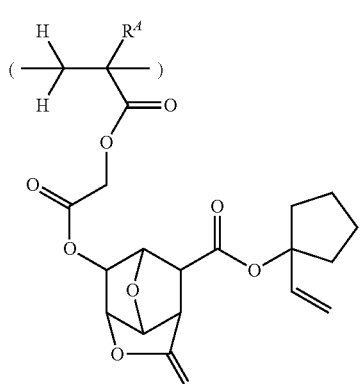
42
-continued
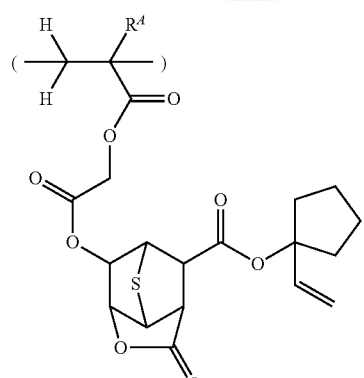
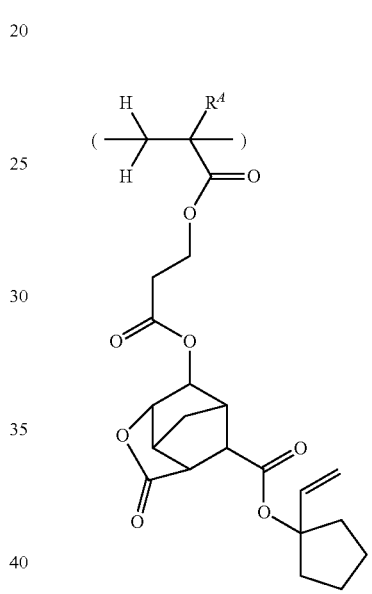
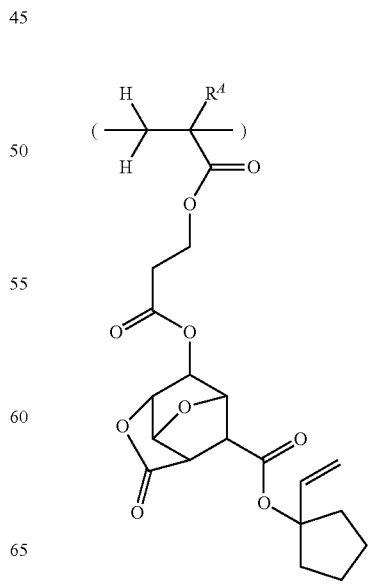

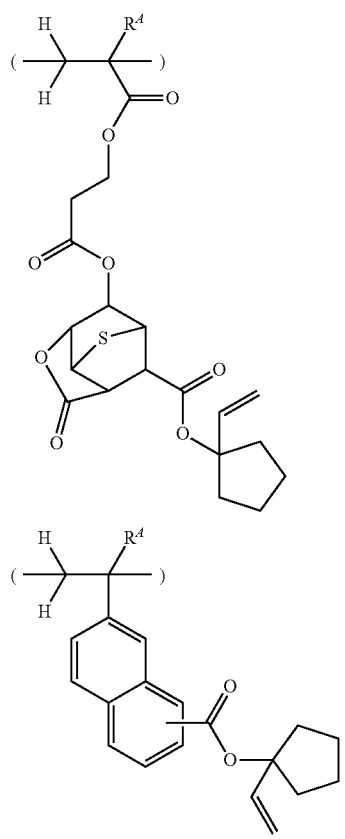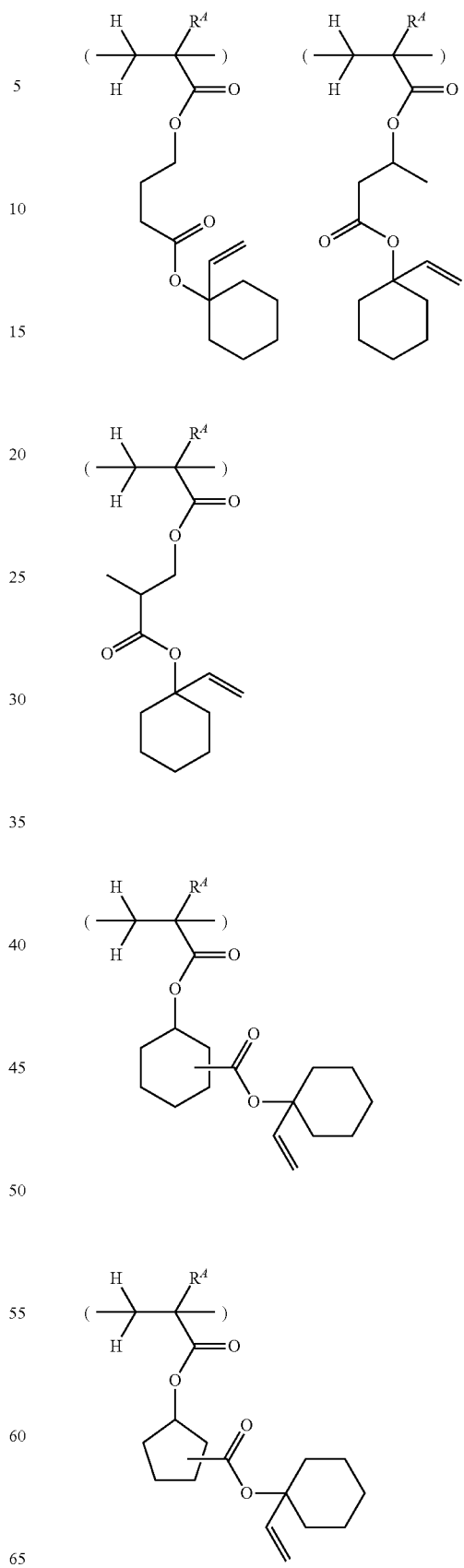

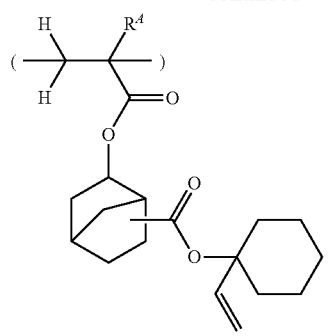
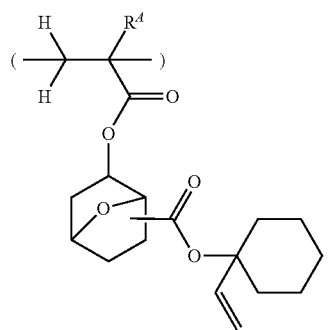
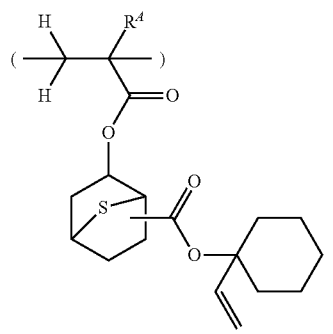
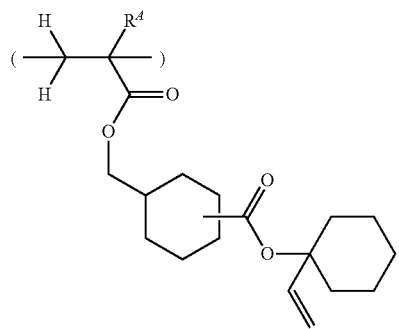
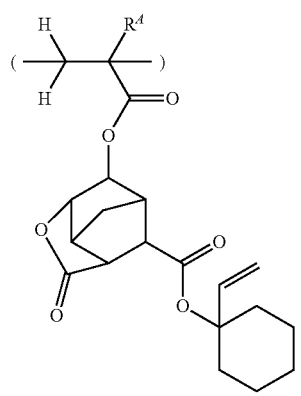
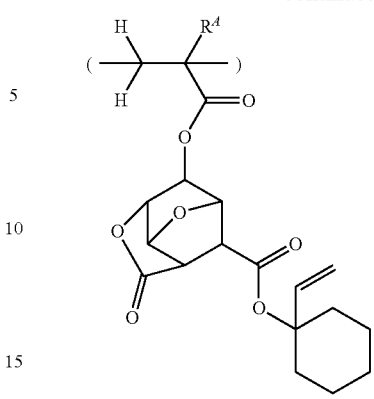
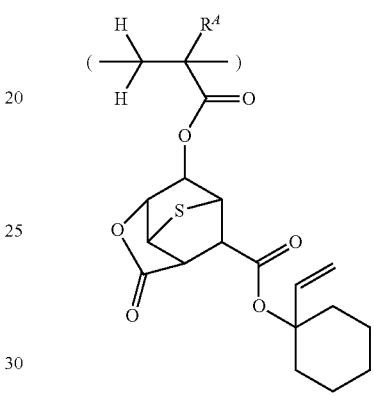
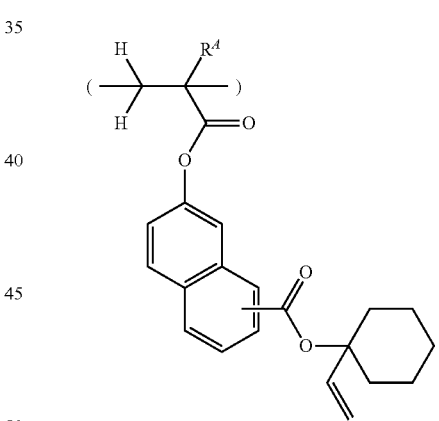
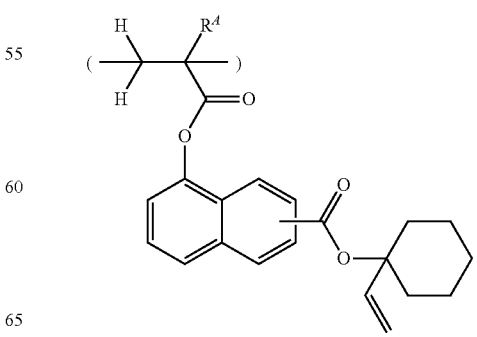

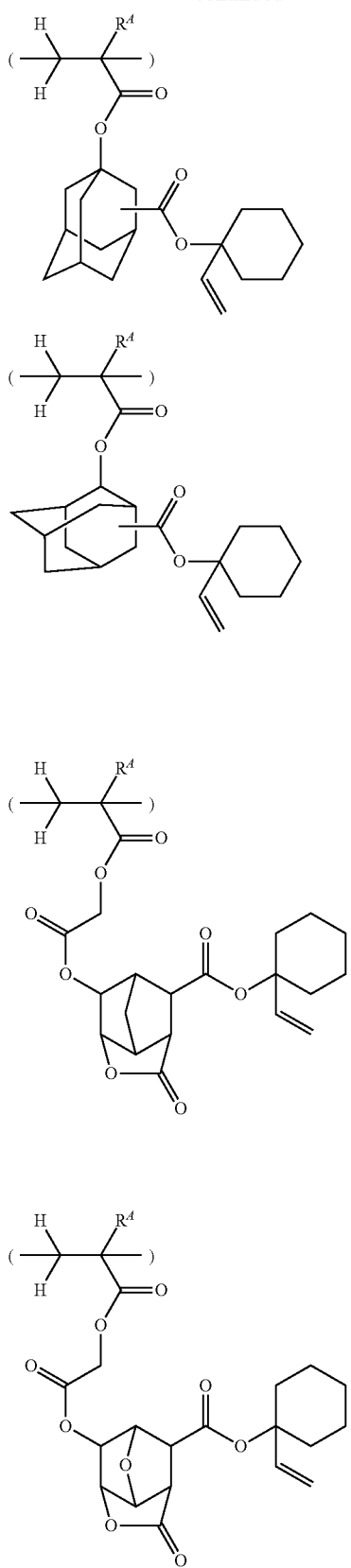
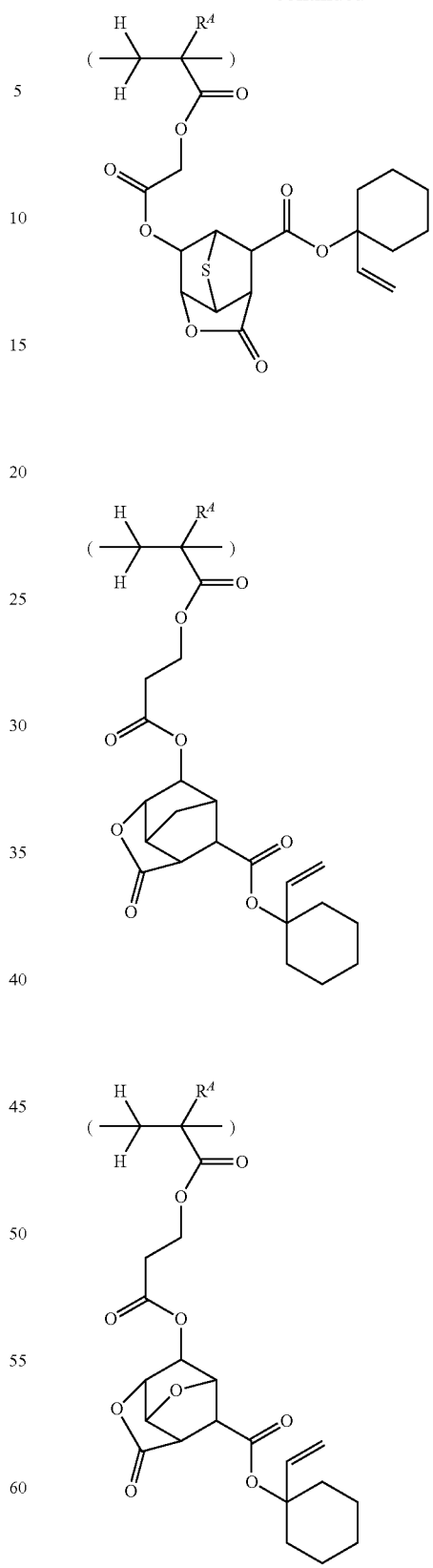

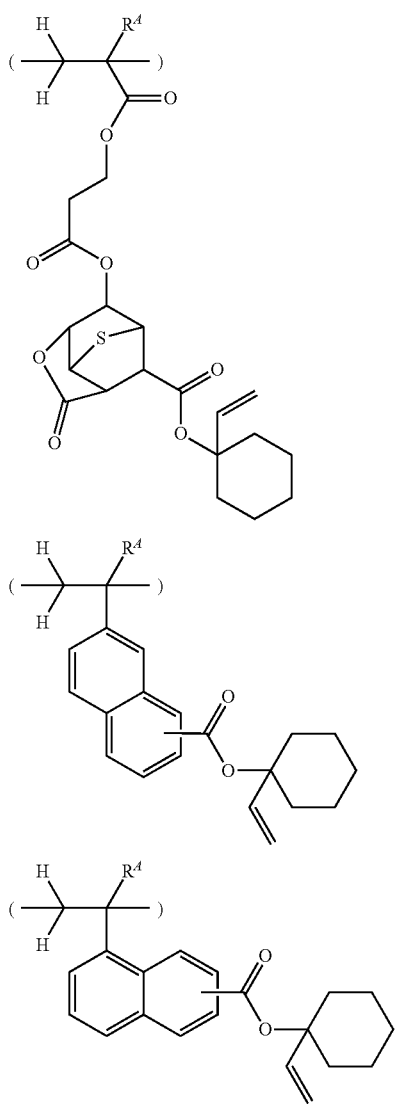
Examples of the recurring unit (a) having a acid labile group of formula (a2) are shown below, but not limited thereto. Herein $R^A$ is a defined above.
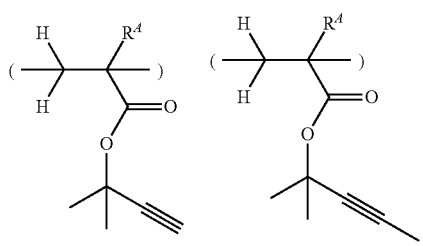
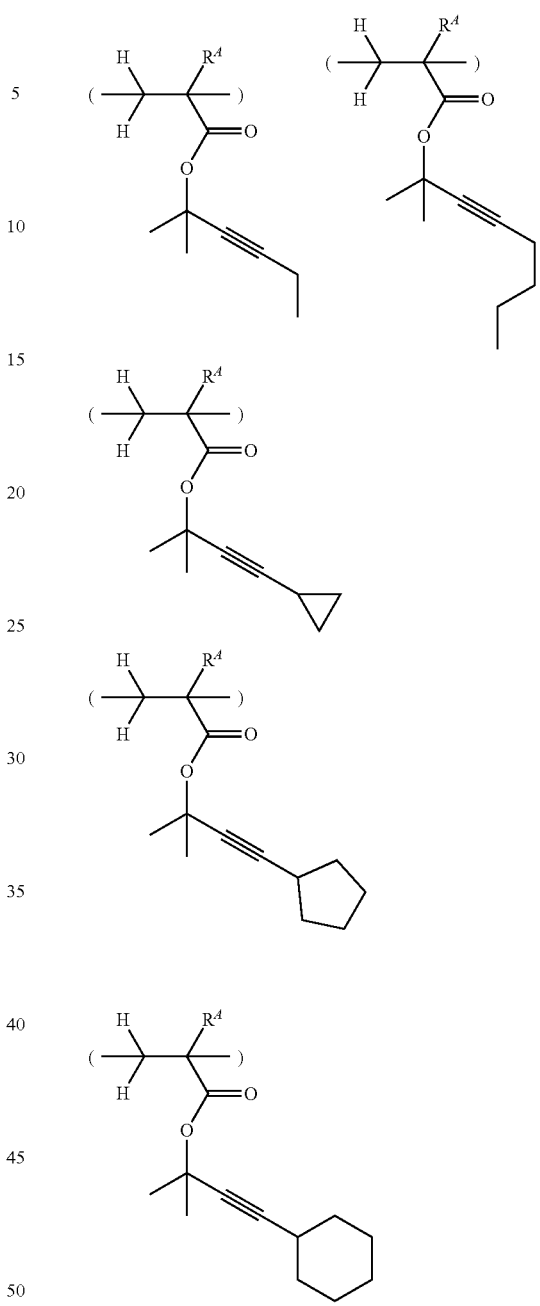

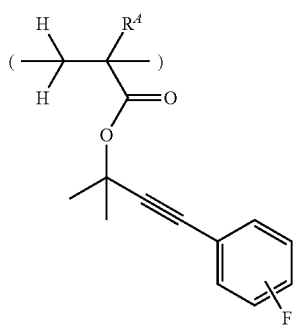
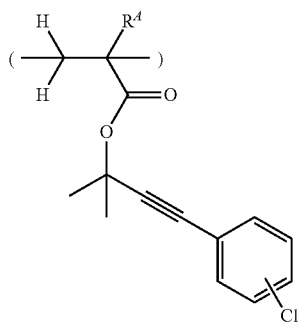
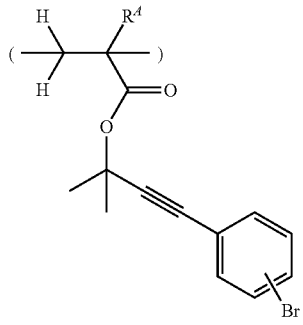
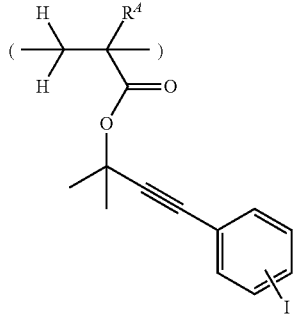
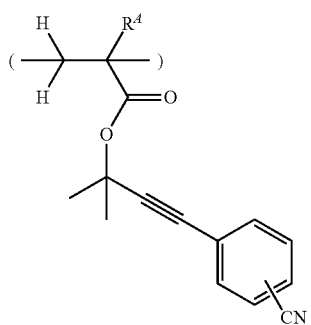
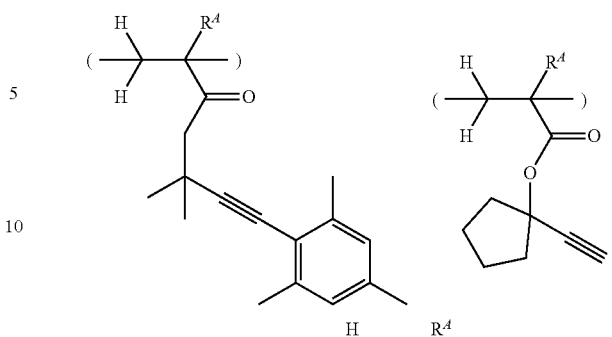
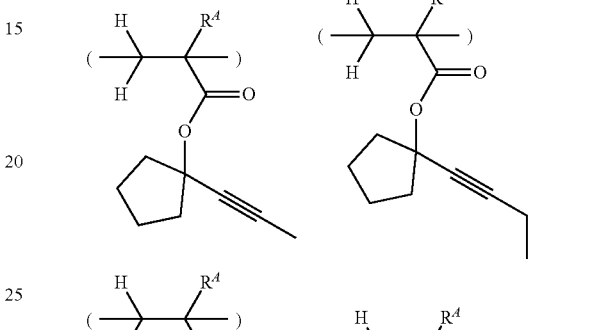
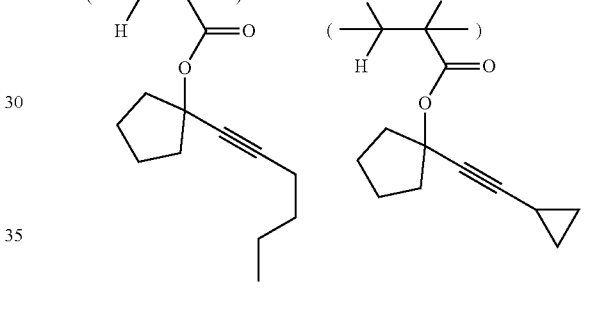
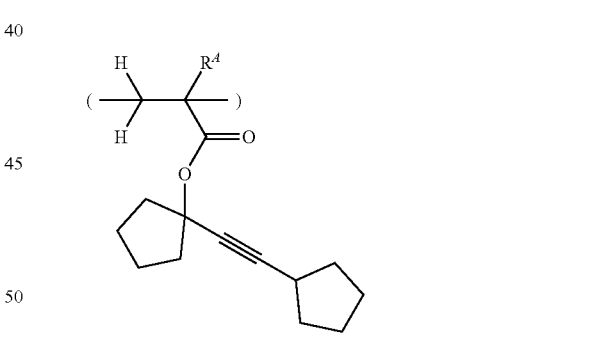
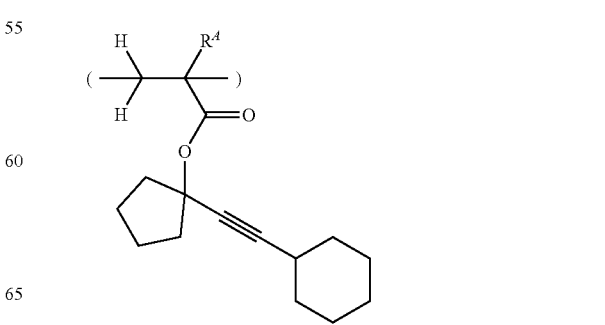

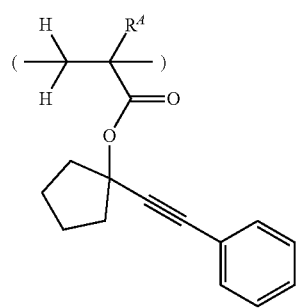
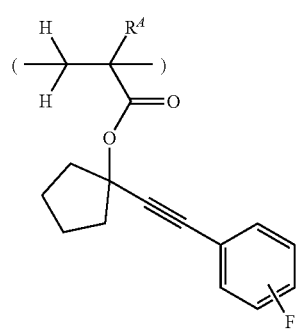
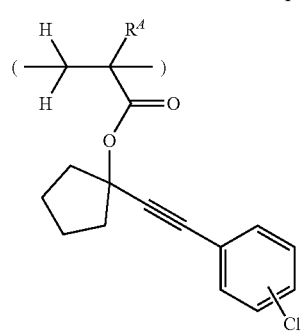
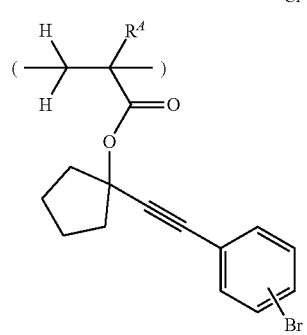
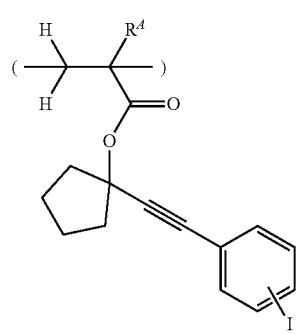
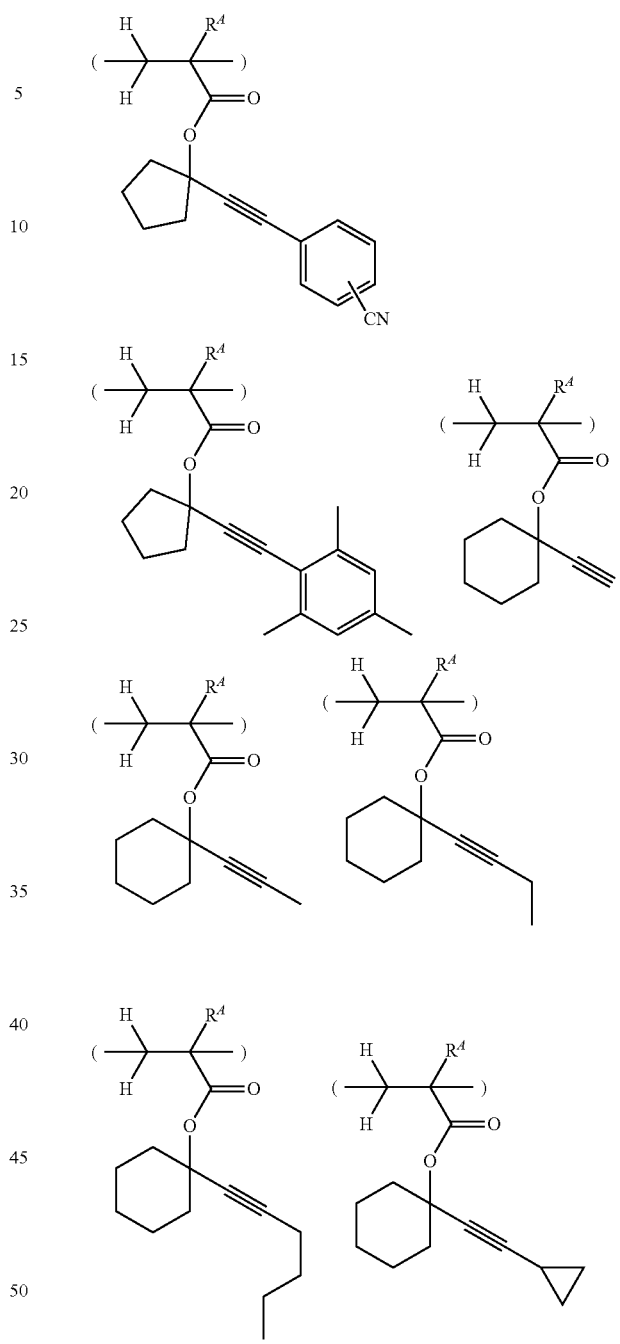

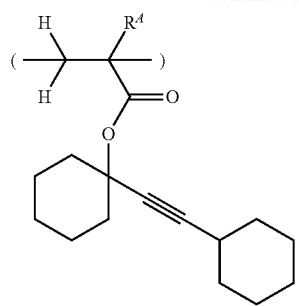
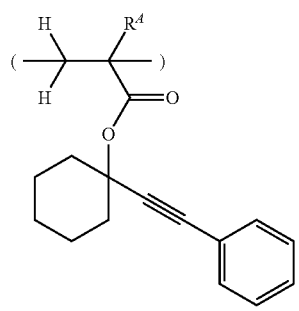
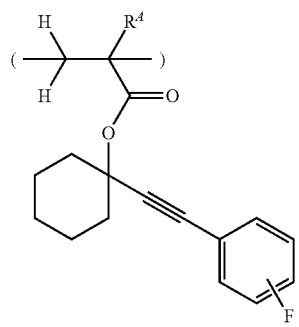
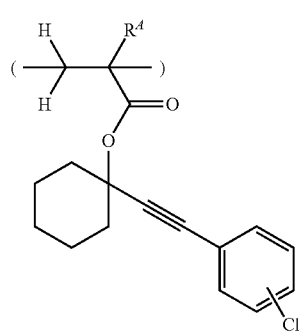
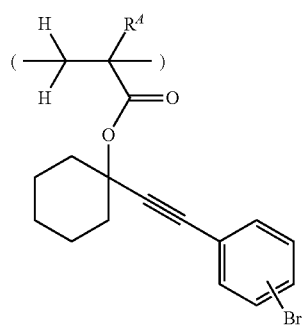
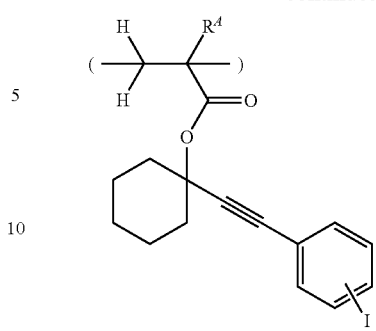
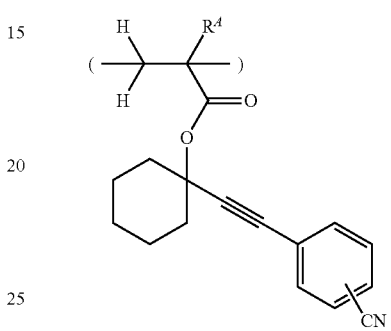
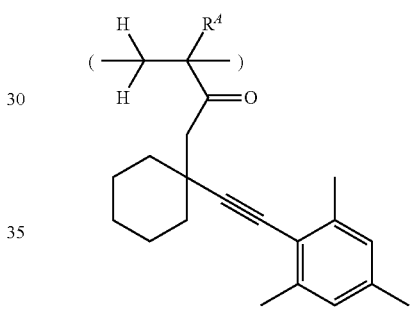
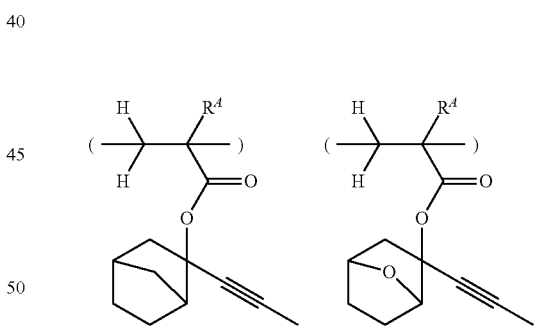
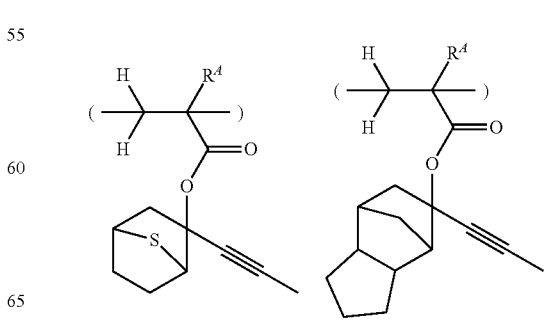

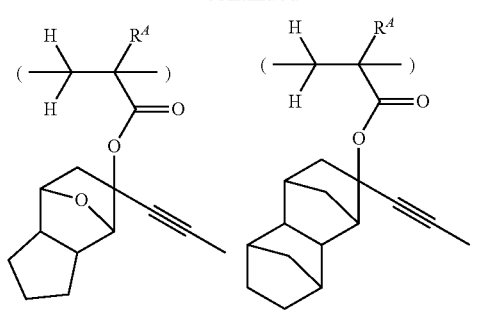
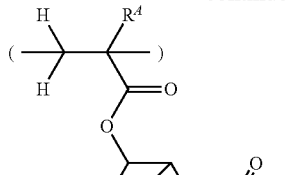
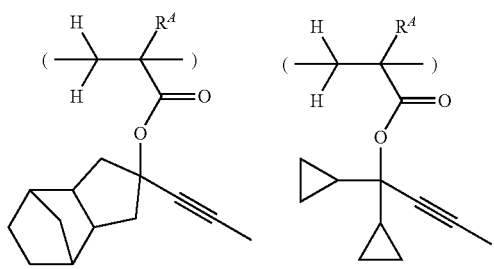
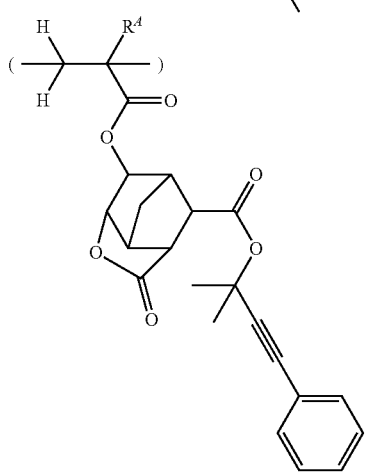
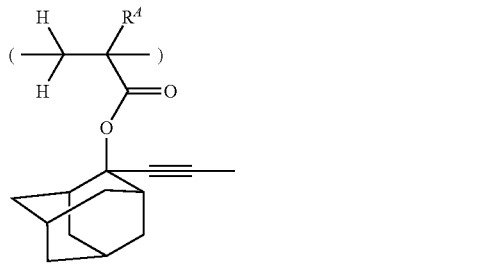
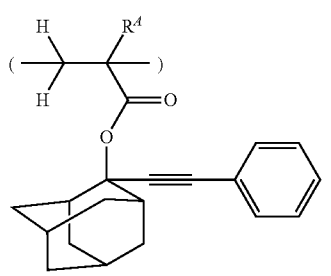
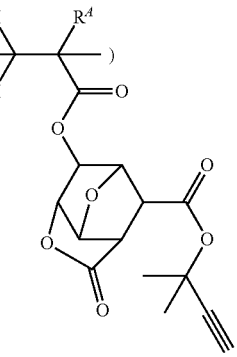
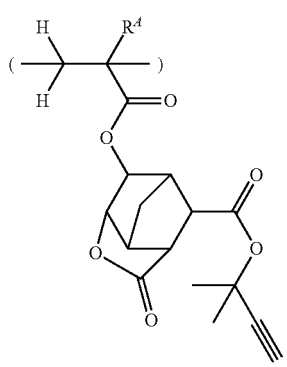
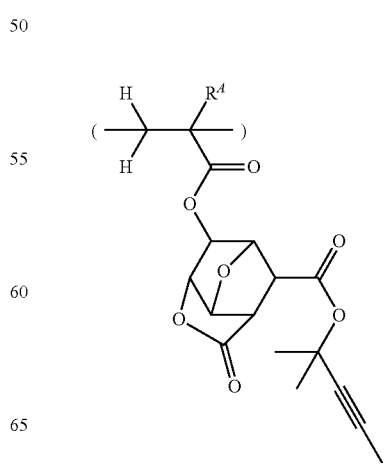

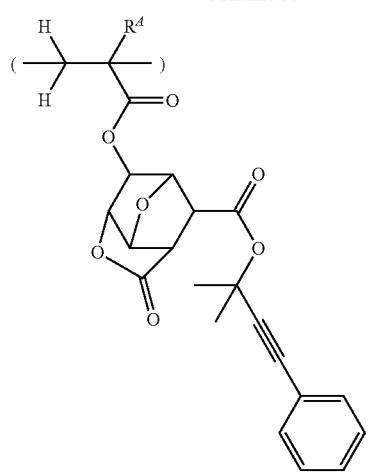
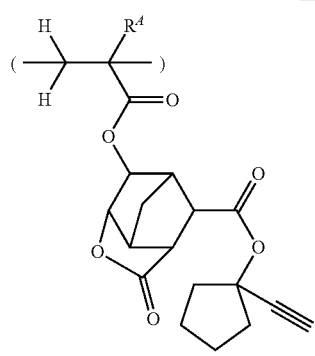
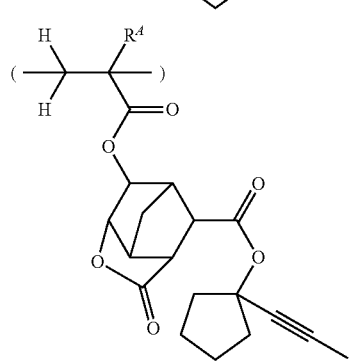
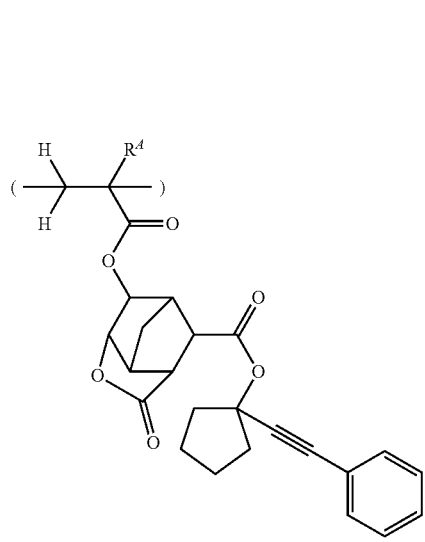
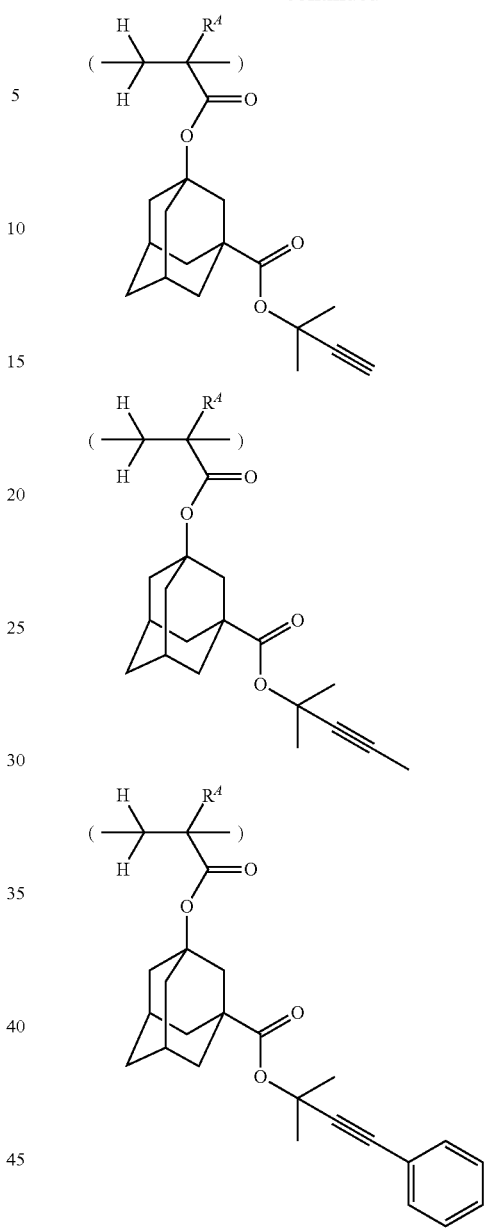

-continued
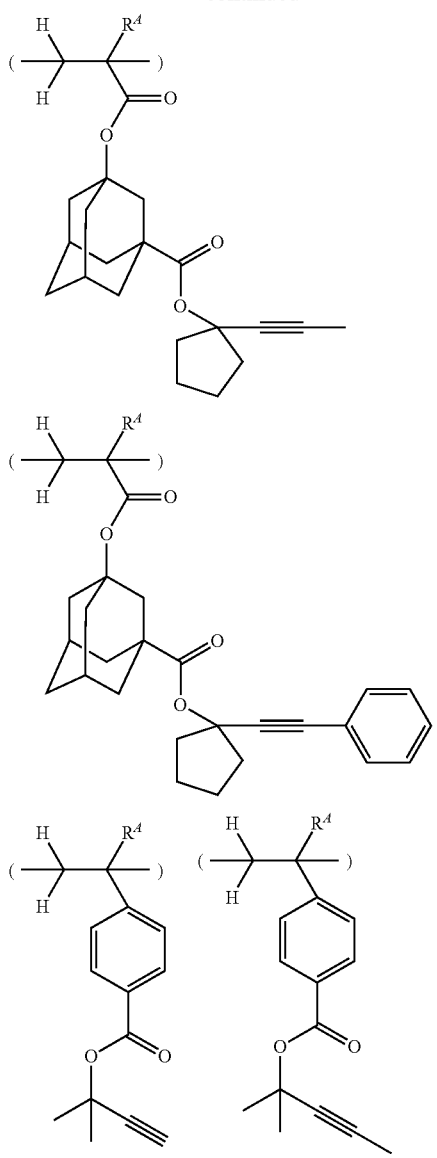
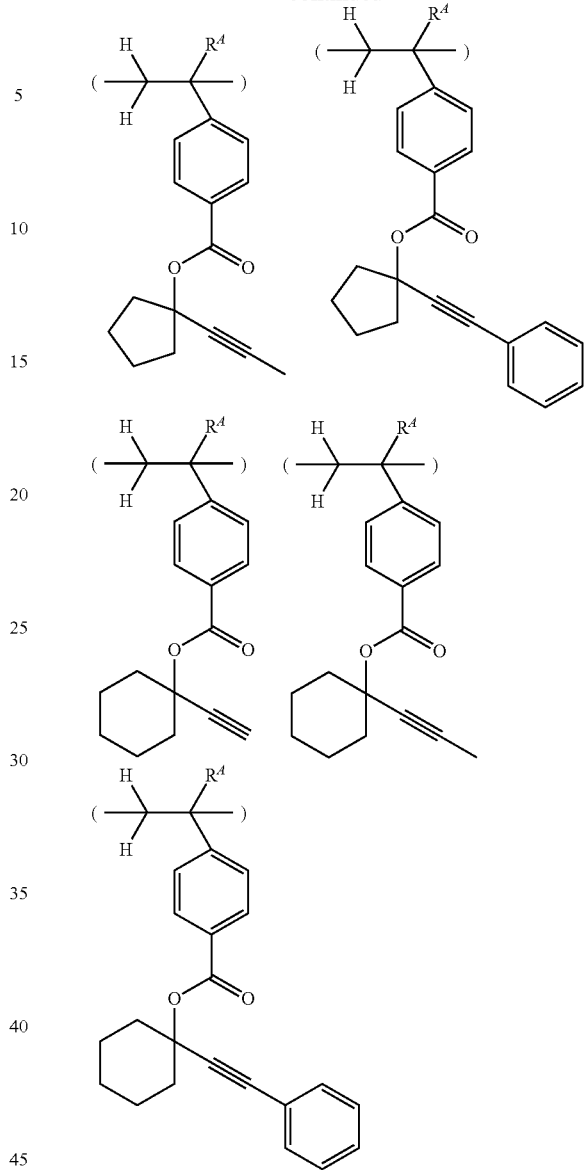
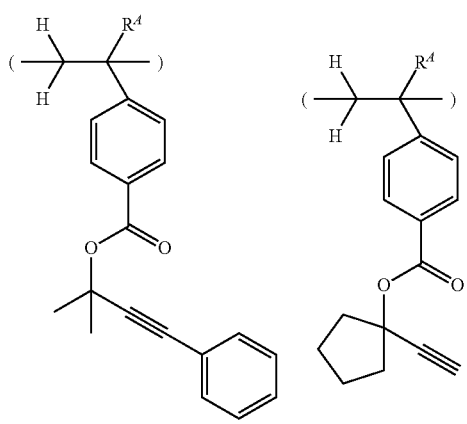
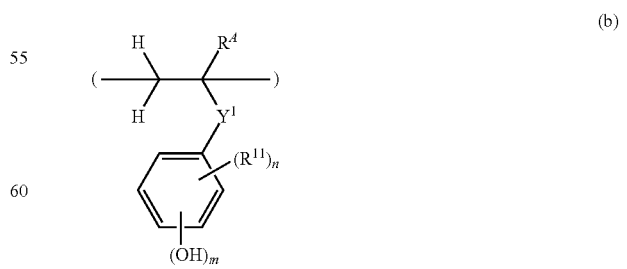
Reaming Unit (b)
The polymer also contains recurring units (b) having a phenolic hydroxyl group. Preferably the recurring units (b) have the formula (b).
In formula (b), $R^A$ is as defined above. $Y^1$ is a single bond or (backbone)-C(=O)—O—. $R^{11}$ is halogen, cyano, a $C_1$-$C_{20}$ hydrocarbyl group which may contain a heteroatom, $C_1$-$C_{20}$ hydrocarbyloxy group which may contain a heteroatom, $C_2$-$C_{20}$ hydrocarbylcarbonyl group which may contain a heteroatom, $C_2$-$C_{20}$ hydrocarbylcarbonyloxy group which may contain a heteroatom, or $C_2$-$C_{20}$ hydrocarbyloxycarbonyl group which may contain a heteroatom, m is an integer of 1 to 4, n is an integer of 0 to 4, and $1 \leq m+n \leq 5$.

The hydrocarbyl group $R^{11}$ may be saturated or unsaturated and straight, branched or cyclic. Examples thereof are as exemplified above for $R^1$ to $R^8$ in formulae (a1) and (a2). Examples of the hydrocarbyl moiety of the hydrocarbyloxy and by hydrocarbylcarbonyl groups are as exemplified above for $R^1$ to $R^5$ in formulae (a1) and (a2).

Examples of the recurring unit (b) are shown below, but not limited thereto. Herein $R^A$ is as defined above.

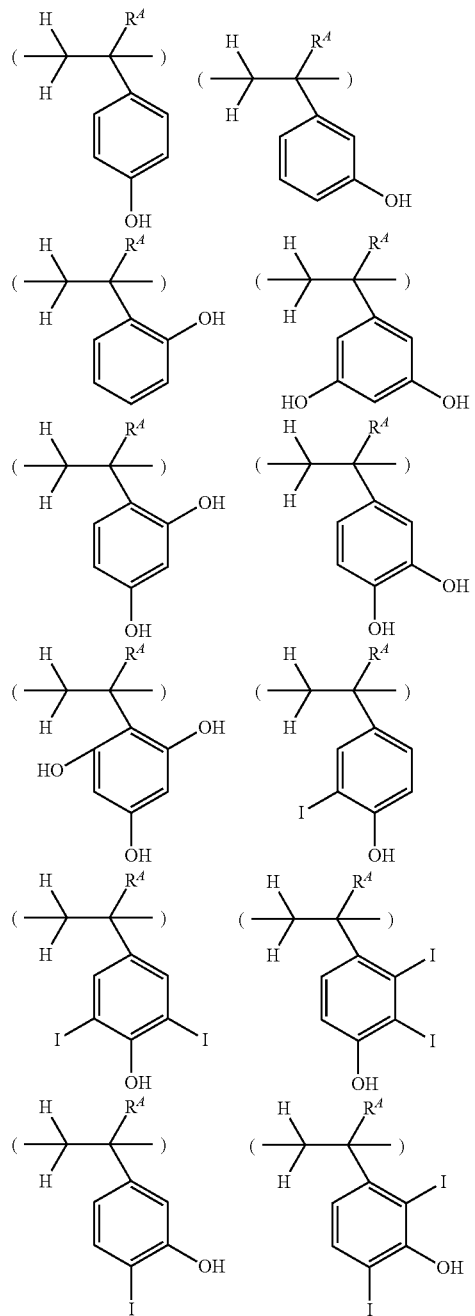

-continued

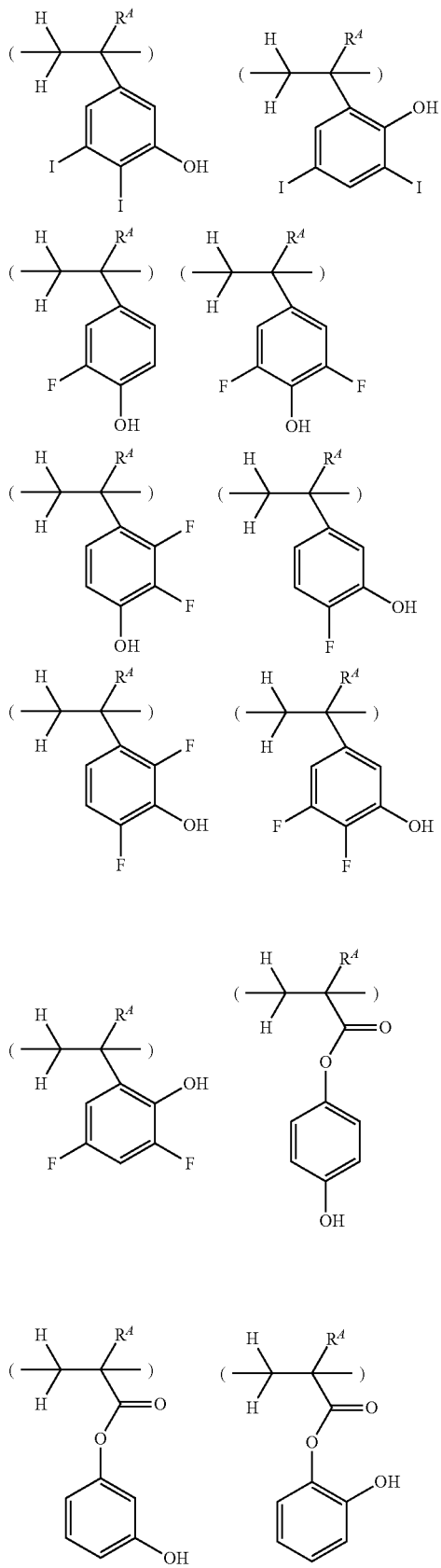

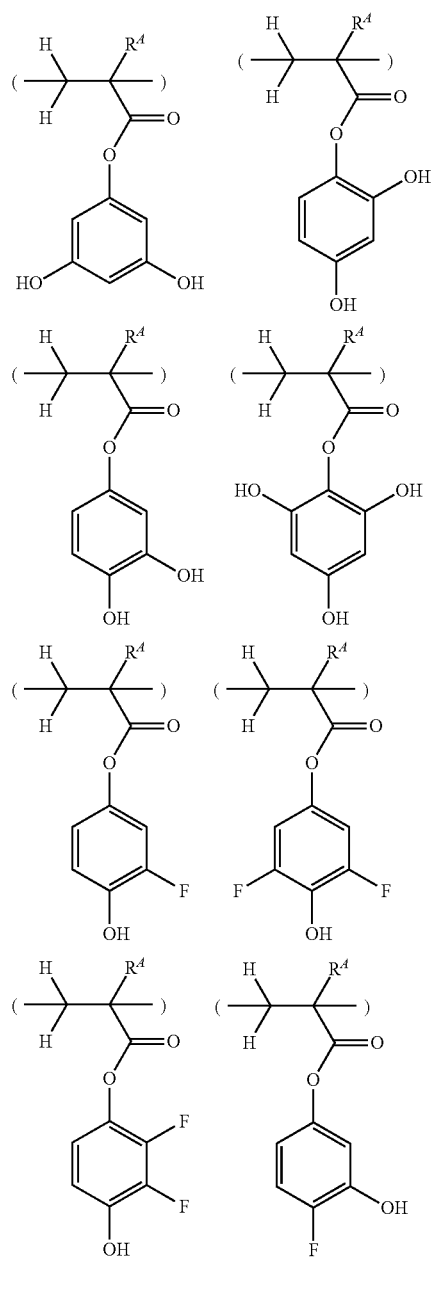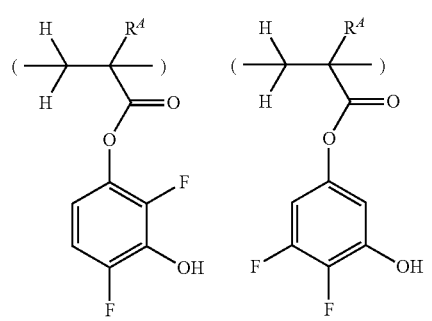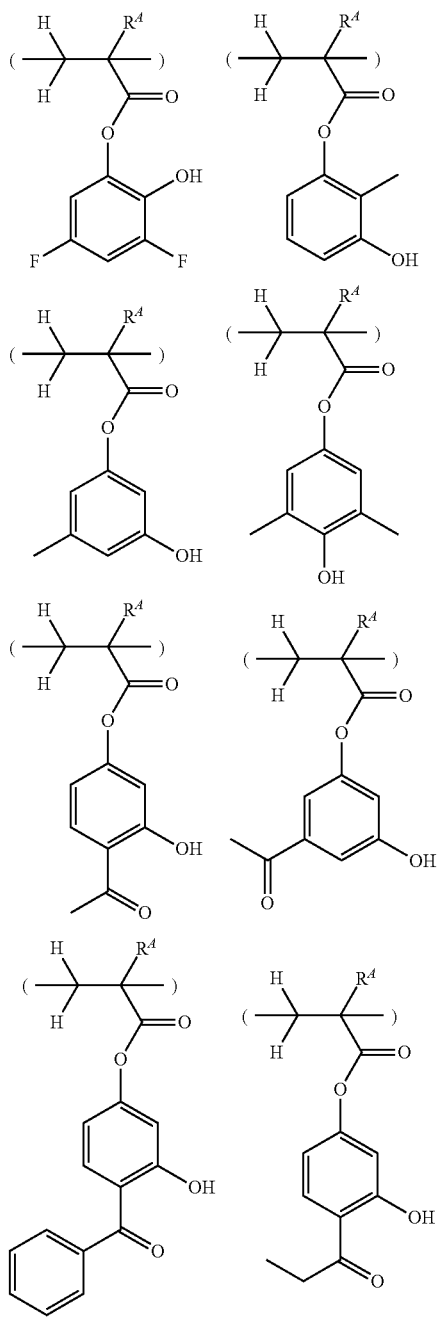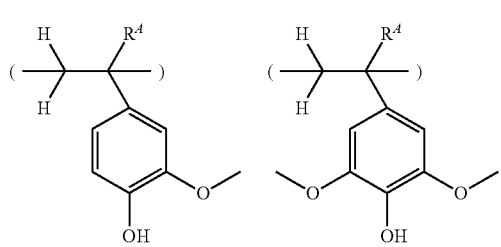

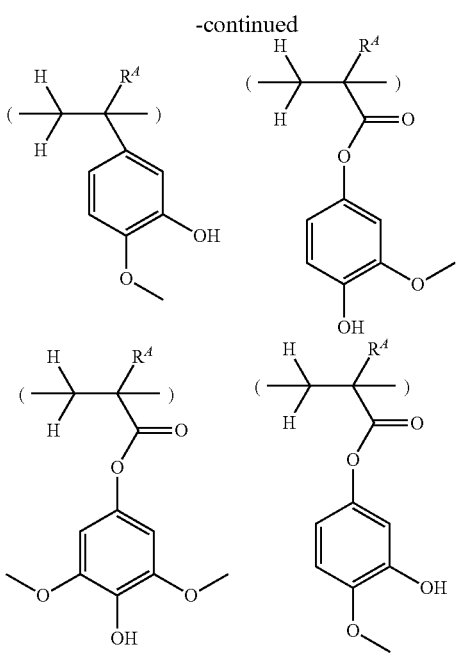

Recurring Unit (c)

The polymer also contains recurring units (c) adapted to generate an acid upon exposure. The preferred recurring units (c) include recurring units having the formula (c1), recurring units having the formula (c2), and recurring units having the formula (c3). These recurring units are also referred to as units (c1), (c2) and (c3), respectively.

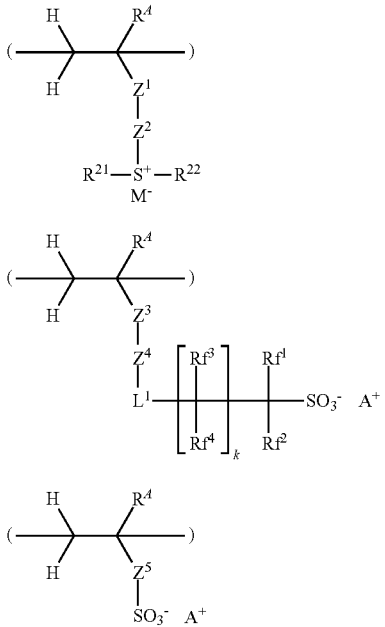

In formulae (c1) to (c3), $R^A$ is as defined above. $Z^1$ is a single bond or phenylene group. $Z^2$ is a single bond, —C(=O)—O—$Z^{21}$—, —C(=O)—NH—$Z^{21}$—, wherein $Z^{21}$ is a $C_1$-$C_6$ aliphatic hydrocarbylene group, phenylene group or a divalent group obtained from combination thereof, which may contain a carbonyl moiety, ester bond, ether bond or hydroxyl moiety. $Z^3$ is a single bond, phenylene, naphthylene, or (backbone)-C(=O)—O—$Z^{31}$—, wherein $Z^{31}$ is a $C_1$-$C_{10}$ aliphatic hydrocarbylene group which may contain a hydroxyl moiety, ether bond, ester bond or lactone ring, or phenylene or naphthylene group. $Z^4$ is a single bond or —$Z^{41}$—C(=O)—O—, wherein $Z^{41}$ is a $C_1$-$C_{20}$ hydrocarbylene group which may, contain a heteroatom. $Z^5$ is a single bond, methylene, ethylene, phenylene, fluorinated phenylene, —C(=O)—O—$Z^{51}$—, —C(=O)—NH—$Z^{51}$— or —O—$Z^{51}$—, wherein $Z^{51}$ is a $C_1$-$C_6$ aliphatic hydrocarbylene group or phenylene group, which may contain a carbonyl moiety, ester bond, ether bond or hydroxyl moiety.

The aliphatic hydrocarbylene groups $Z^{21}$, $Z^{31}$ and $Z^{51}$ may be saturated or unsaturated and straight, branched, or cyclic. Examples thereof are as exemplified above for $X^{11}$ in formula (a).

The hydrocarbylene group $Z^{41}$ may be saturated or unsaturated and straight, branched or cyclic. Examples thereof are shown below, but not limited thereto.

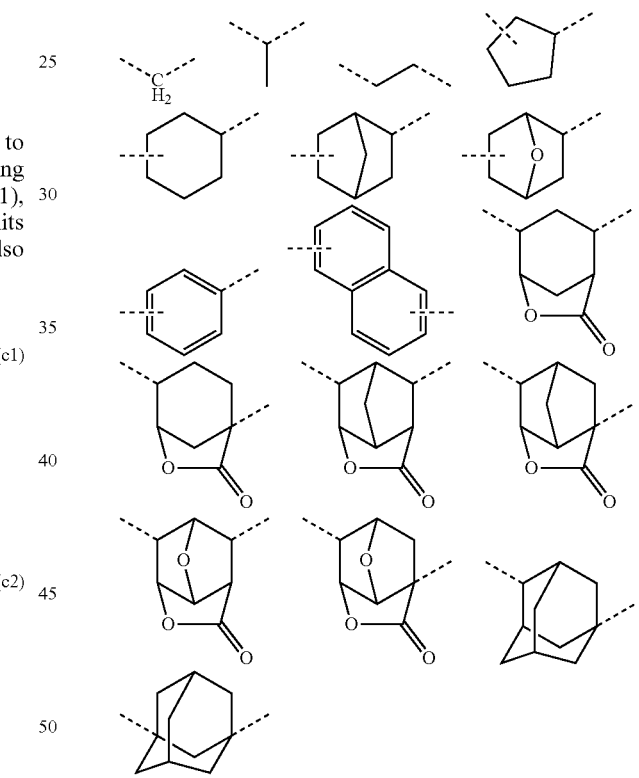

In formula (c11), $R^{21}$ and $R^{22}$ are each independently a $C_1$-$C_{20}$ hydrocarbyl group which may contain a heteroatom. The hydrocarbyl groups $R^{21}$ and $R^{22}$ may be saturated or unsaturated and straight, branched or cyclic. Examples thereof include alkyl groups such as methyl, ethyl, n-propyl, isopropyl, n-butyl, and tert-butyl; cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; alkenyl groups such as vinyl, allyl, propenyl, butenyl, and hexenyl; cyclic unsaturated hydrocarbyl groups such as cyclohexenyl; aryl groups such as phenyl, naphthyl and thienyl; aralkyl groups such as benzyl, 1-phenylethyl and 2-phenylethyl, and mixtures thereof. Inter alia, aryl groups are preferred. In the hydrocarbyl groups, some hydrogen may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety.

Also, $R^{21}$ and $R^{22}$ may bond together to form a ring with the sulfur atom to which they are attached. Examples of the ring are as exemplified above for the ring that $R^{31}$ and $R^{32}$, taken together, form with the sulfur atom in formula (c4).

In formula (c2), $L^1$ is a single bond, ether bond, ester bond, carbonyl group, sulfonic acid ester bond, carbonate bond or carbamate bond.

In formula (c2), $Rf^1$ and $Rf^2$ are each independently fluorine or a $C_1$-$C_6$ fluoroalkyl group. Preferably both $Rf^1$ and $Rf^2$ are fluorine because the generated acid has a high acid strength. $Rf^3$ and $Rf^4$ are each independently hydrogen, fluorine or a $C_1$-$C_6$ fluoroalkyl group. It is preferred for increased solvent solubility that at least one of $Rf^3$ and $Rf_4$ be trifluoromethyl.

In formula (c2), k is an integer of 0 to 3, preferably 1.

In formula (c1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylaulfonyl)imide, bis(perfluoroethylsulfonyl)imide and bis(perfluorobutylsulfonyl)imide, methide ions such tris(trifluoromethylsulfonyl)methide and tris(perfluoroethylsulfonyl)methide.

Also included are sulfonate anions having fluorine substituted at α-position as represented by the formula (c1-1) and sulfonate anions having fluorine substituted at α-position and trifluoromethyl at β-position as represented by the formula (c1-2).

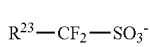  (c1-1)

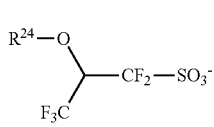  (c1-2)

In formula (c1-1), $R^{23}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic, and examples thereof are as will be exemplified later for the hydrocarbyl group $R^{105}$ in formula (1A').

In formula (c1-2), $R^{24}$ is hydrogen, or a $C_1$-$C_{30}$ hydrocarbyl group, $C_2$-$C_{30}$ hydrocarbylcarbonyl group or $C_6$-$C_{20}$ aryloxy group, which may contain an ether bond, ester bond, carbonyl moiety or lactone ring. The hydrocarbyl group and hydrocarbyl moiety of the hydrocarbylcarbonyl group may be saturated or unsaturated and straight, branched or cyclic, and examples thereof are as will be exemplified later for the hydrocarbyl group $R^{105}$ in formula (1A').

Examples of the cation in the recurring unit (c1) are shown below, but not limited thereto. Herein $R^A$ is as defined above.

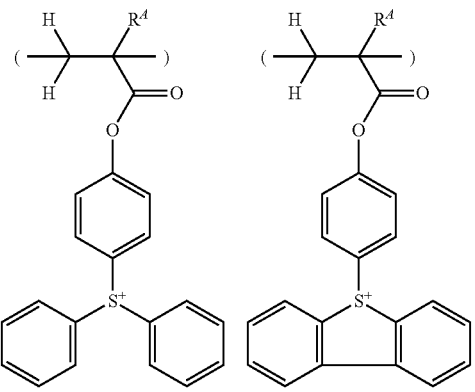

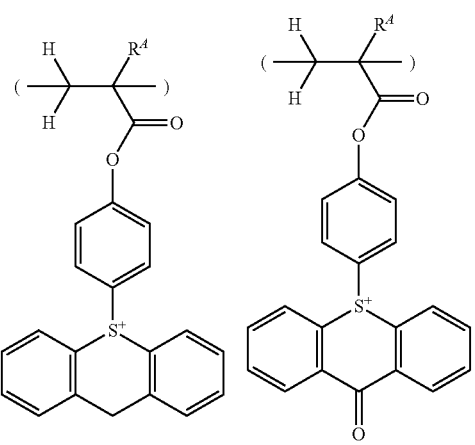

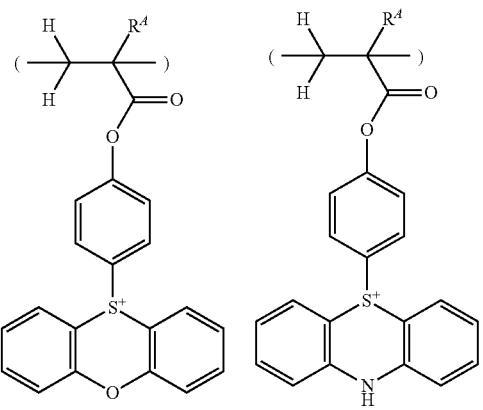

71
-continued
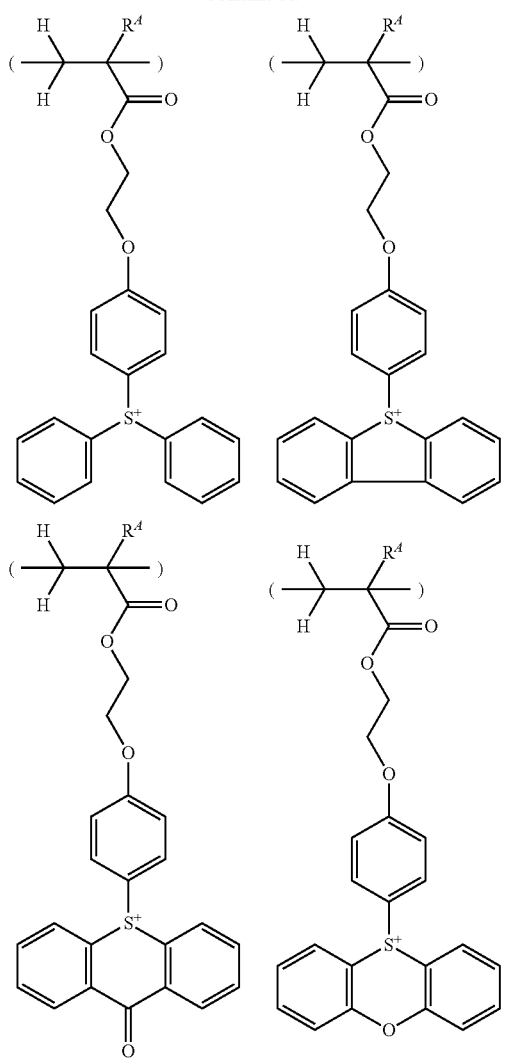
72
-continued
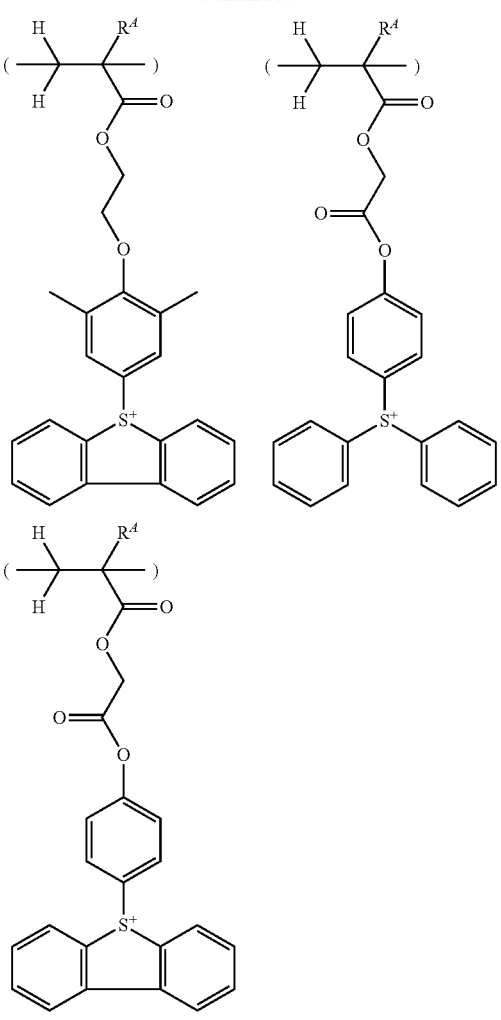
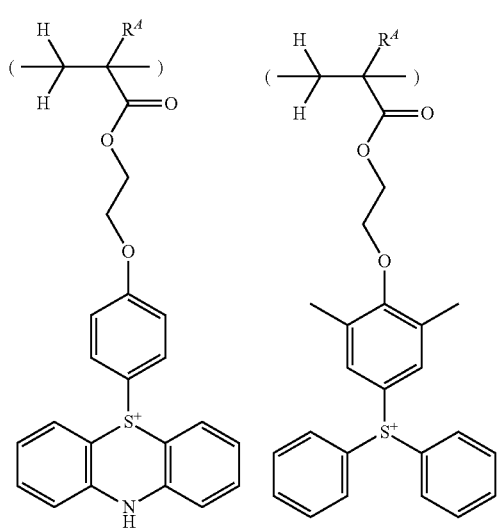

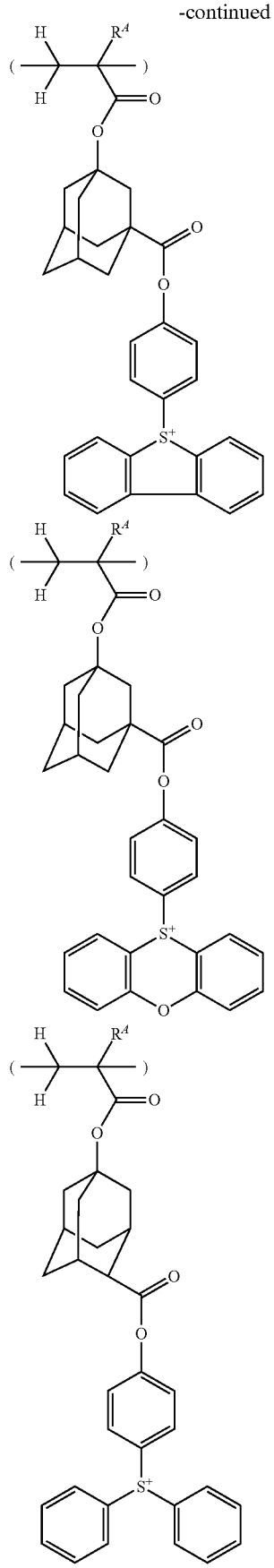
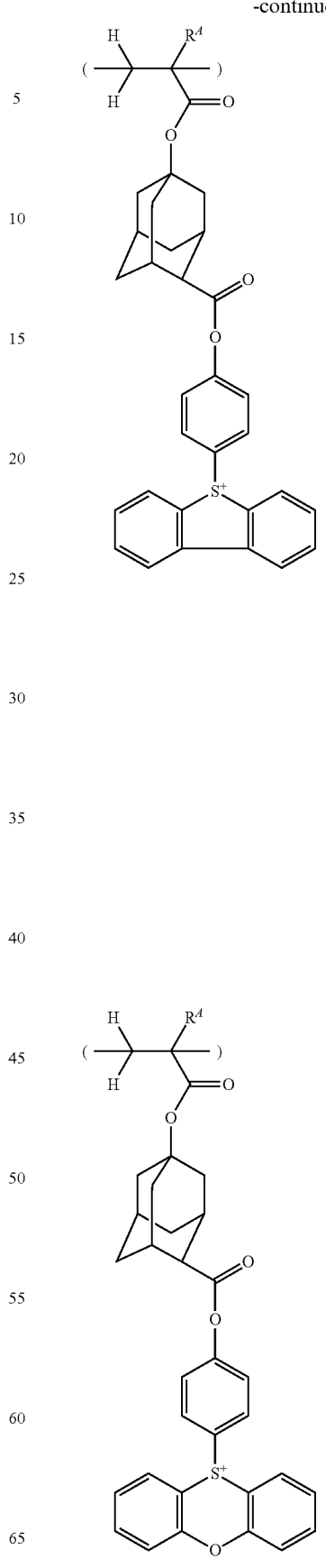

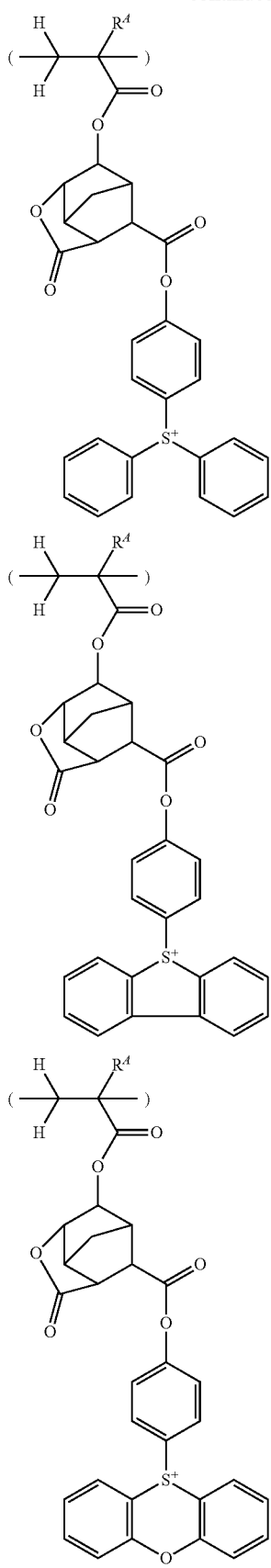
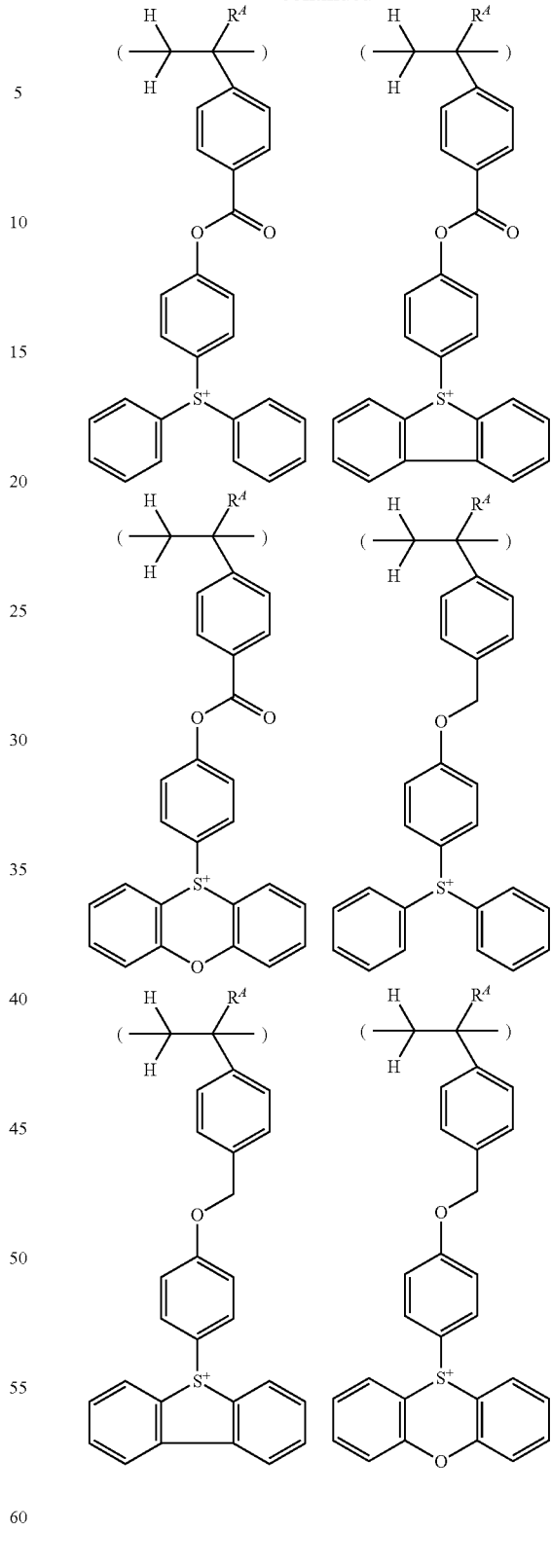
Examples of the anion in the teeming unit (c2) are shown below, but not limited thereto. Herein $R^A$ is as defined above.

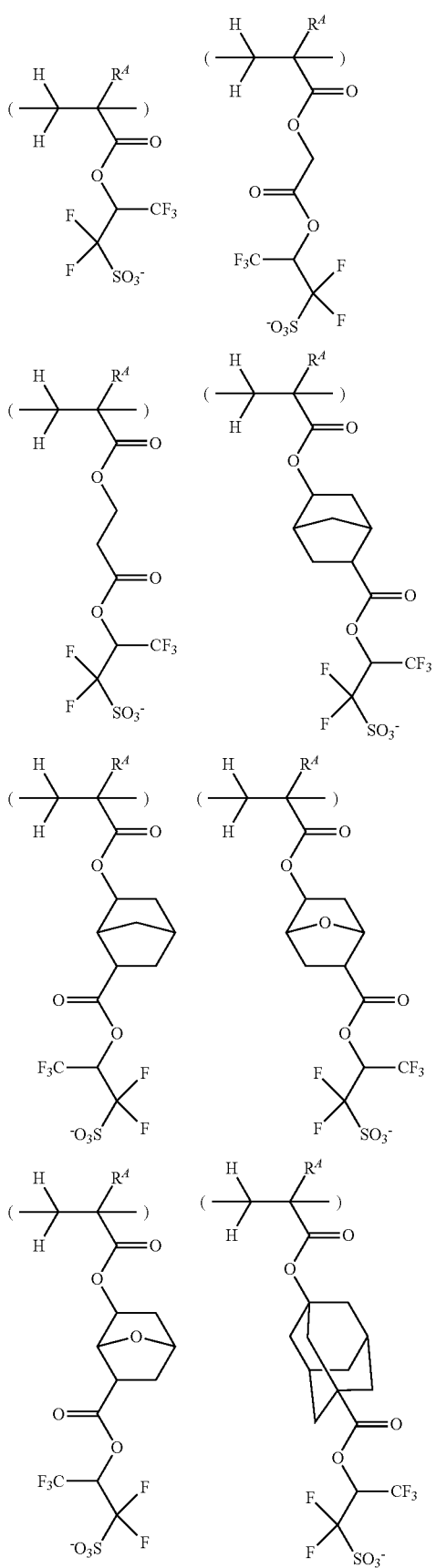
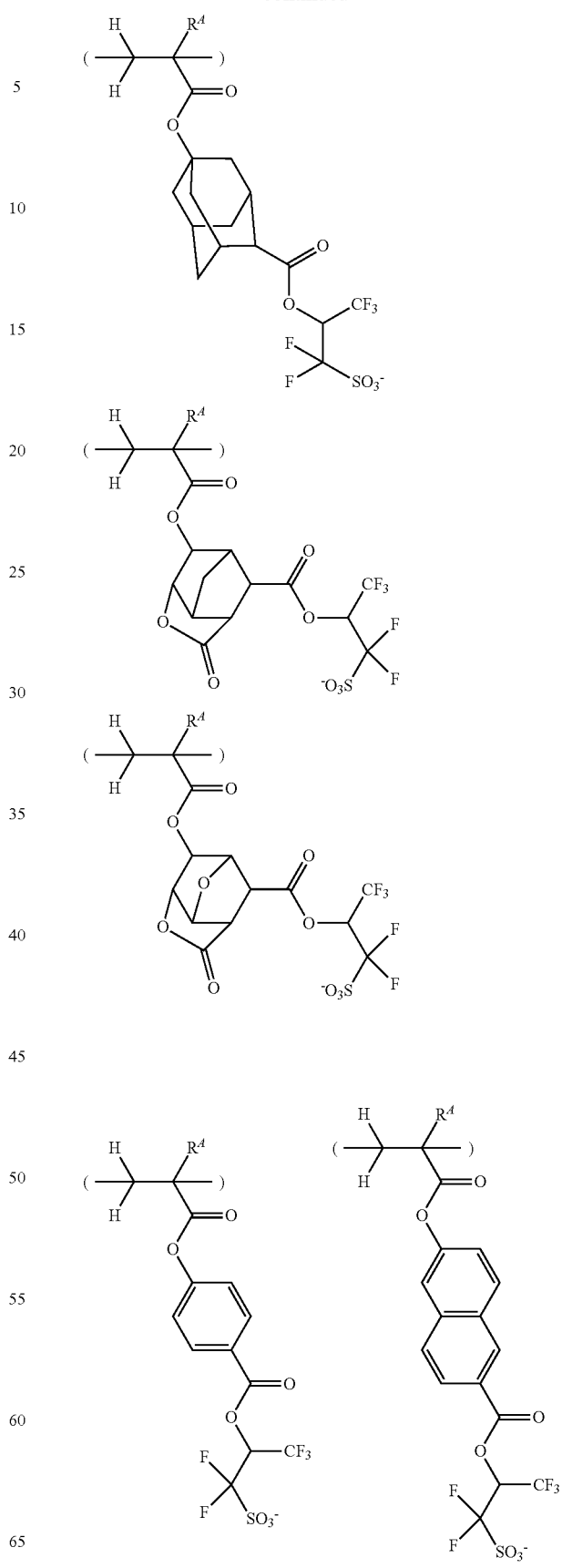
-continued

-continued
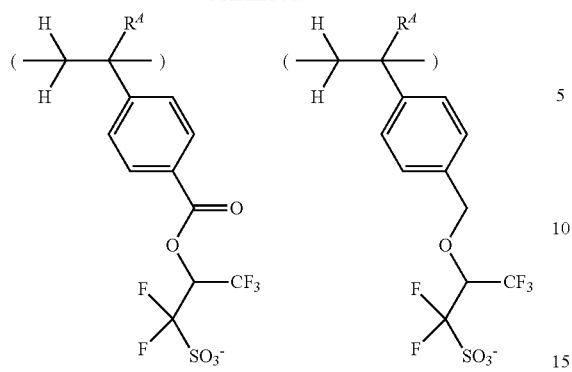
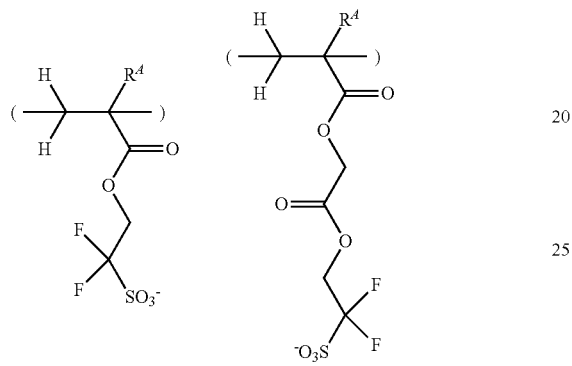
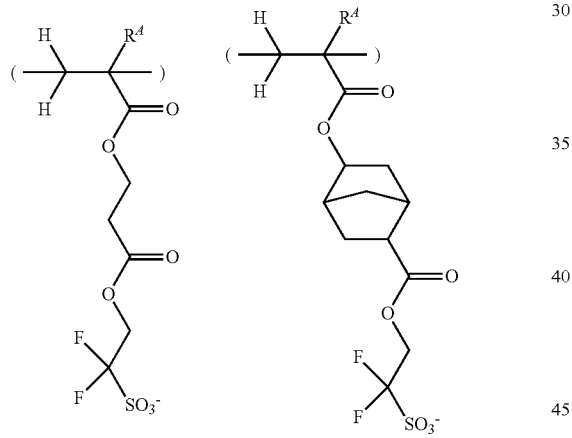
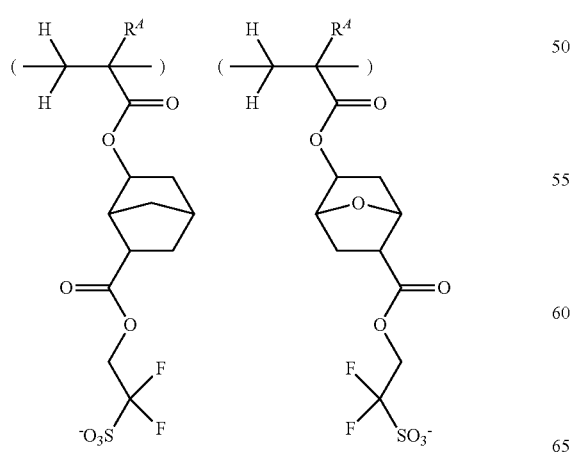
-continued
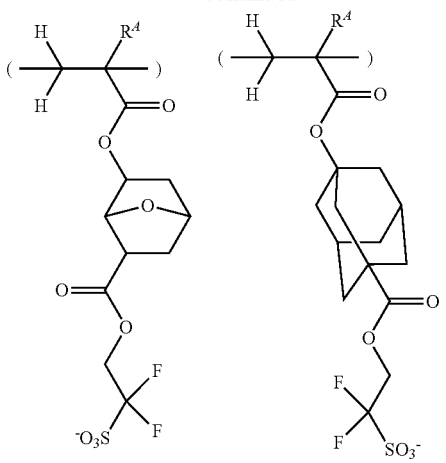
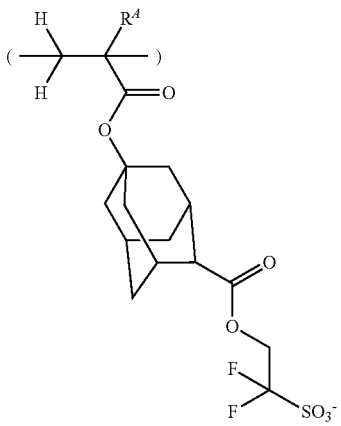
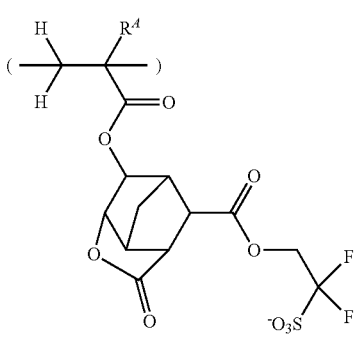
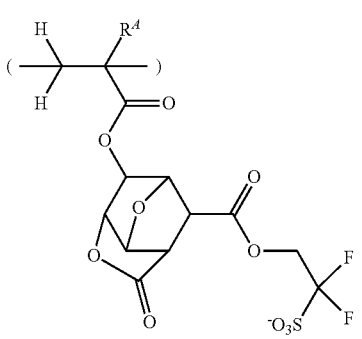

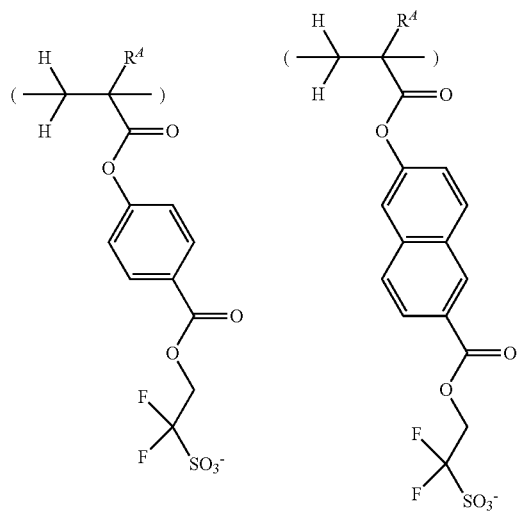
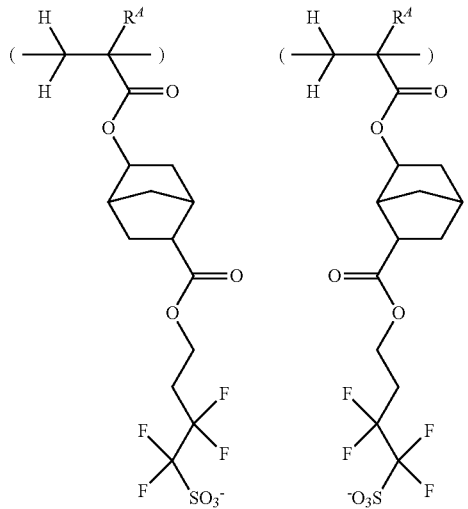
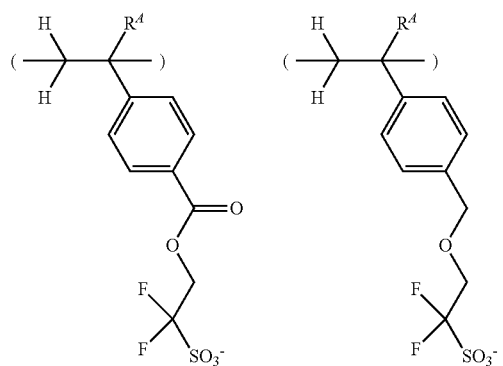
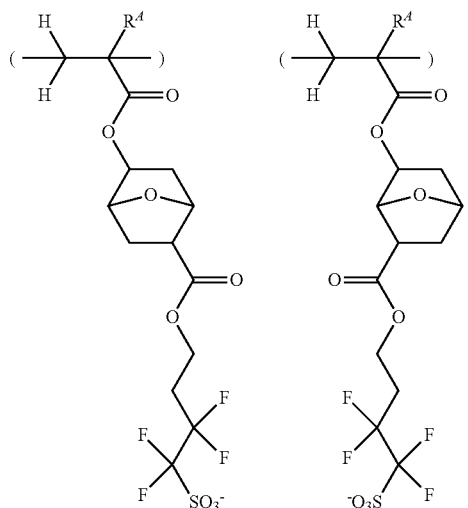
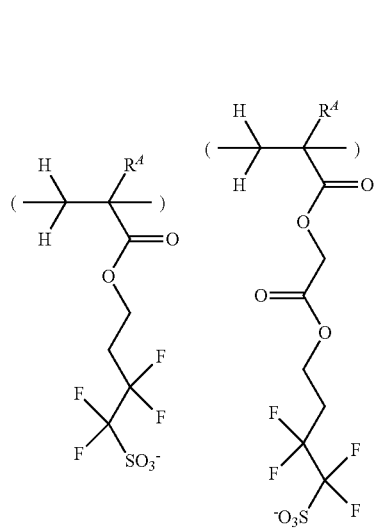
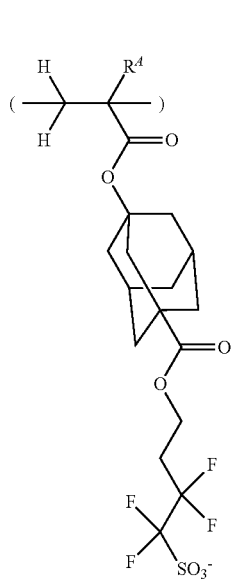

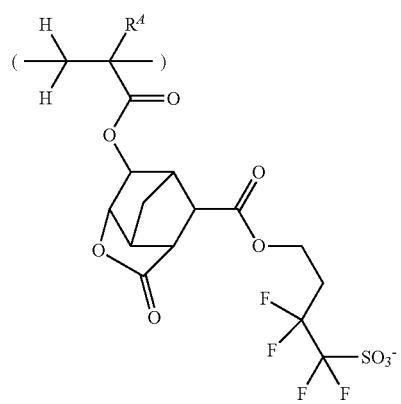
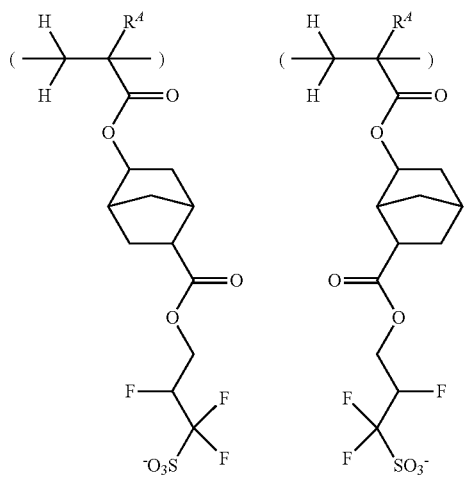
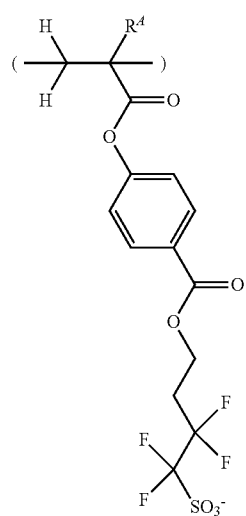
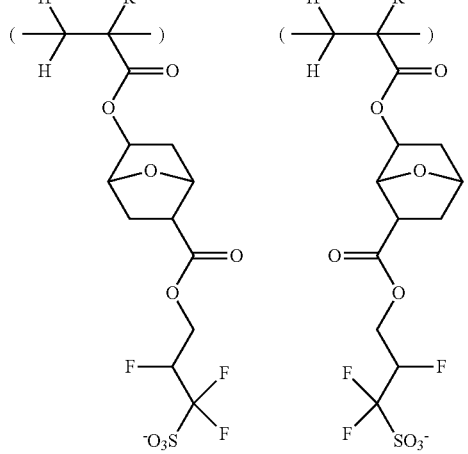
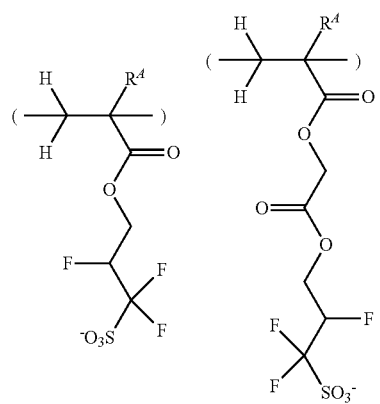
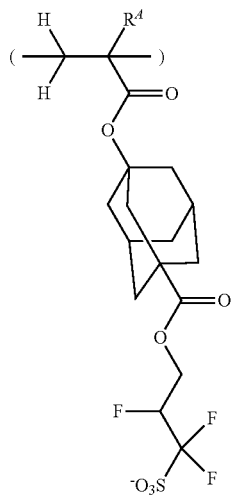

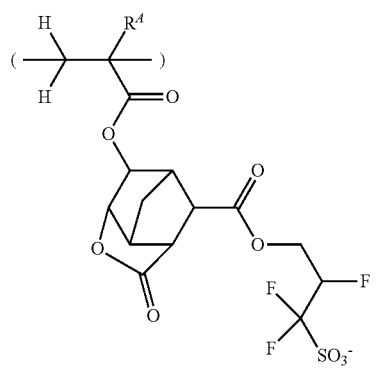
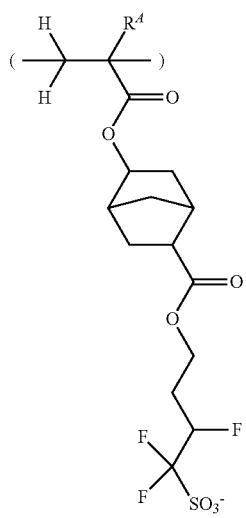
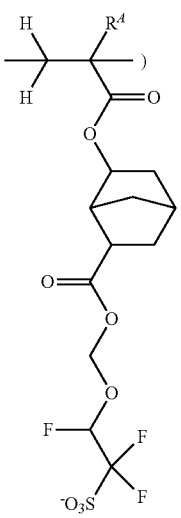
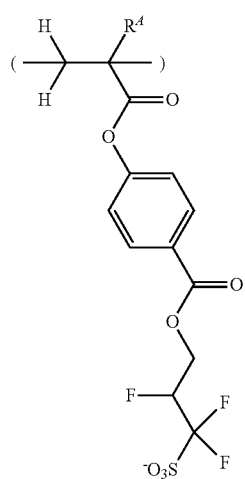
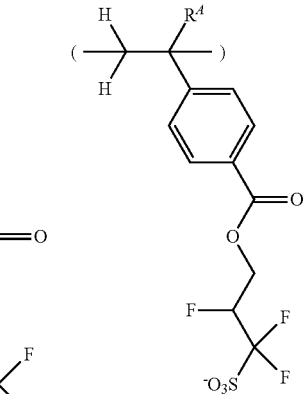
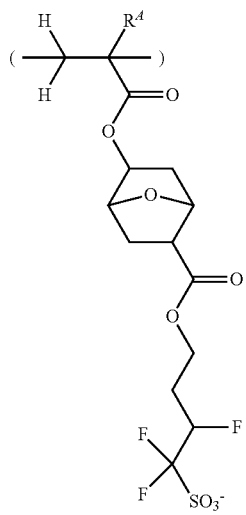
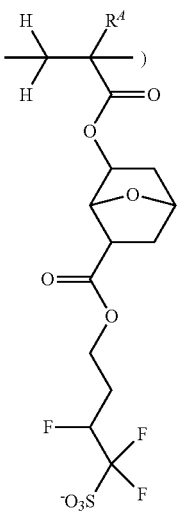
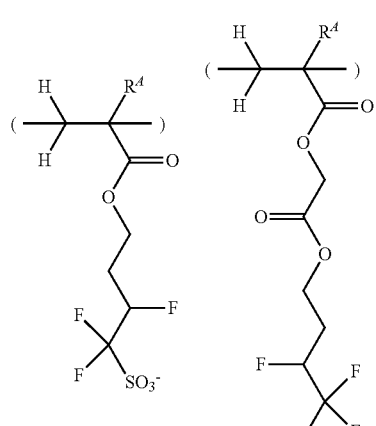
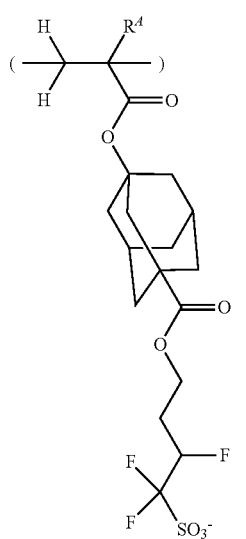

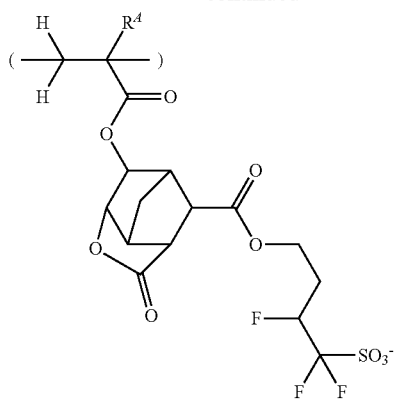
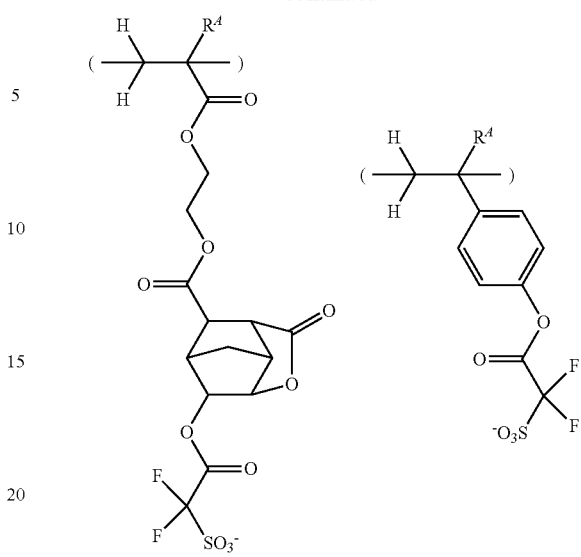
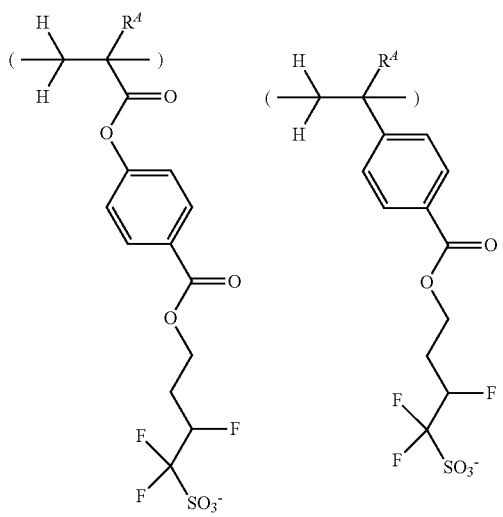
Examples of the anion in the teeming unit (c3) are shown below, but not limited thereto. Herein $R^A$ is as defined above.
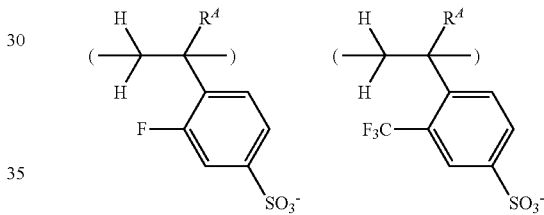
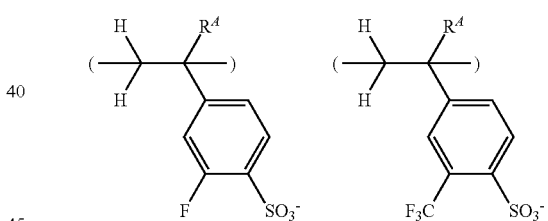
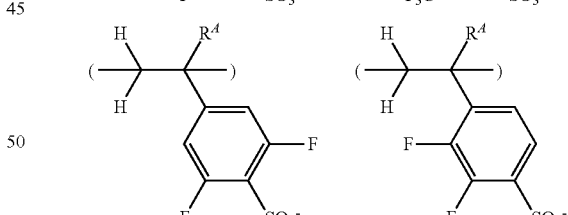
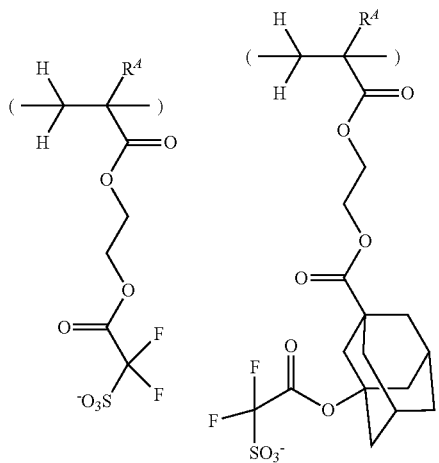
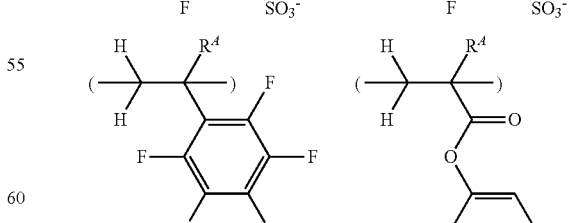
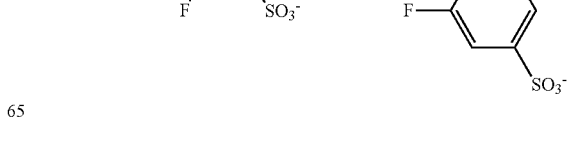

-continued

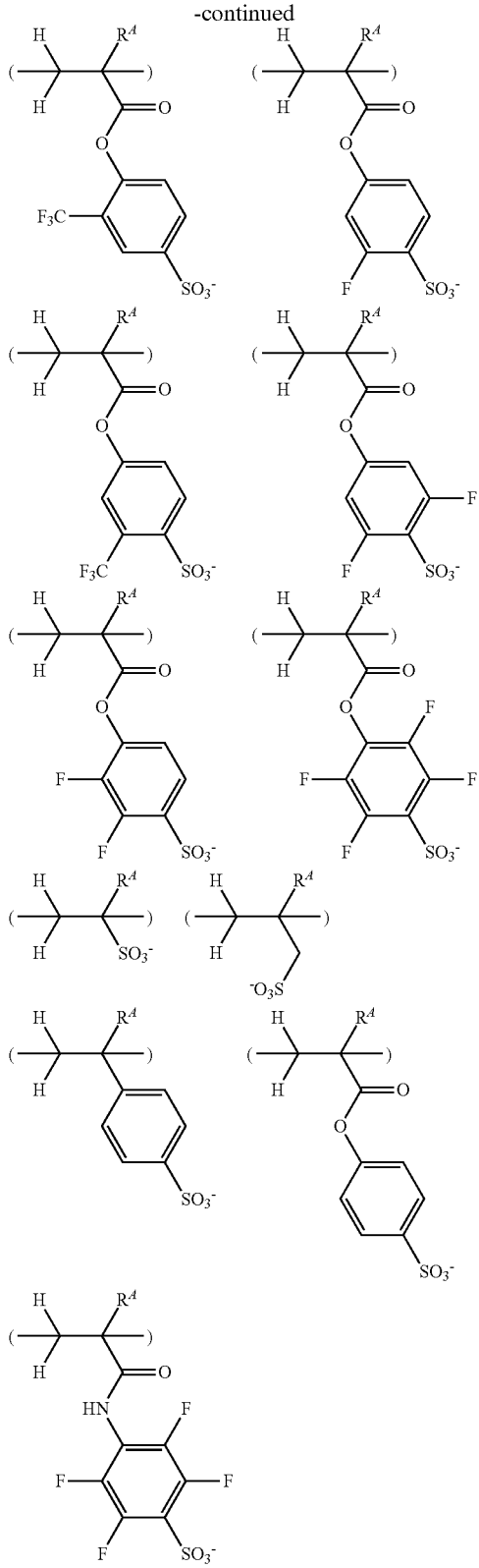

In formulae (c2 and c3), A⁺ is an onium cation. Suitable onium cations include ammonium, sulfonium and iodonium cations, with the sulfonium and iodonium cations being preferred. More preferred are sulfonium cations having the formula (c4) and iodonium cations having the formula (c5).

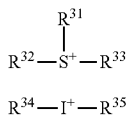

(c4)

(c5)

In formulae (c4) and (c5), $R^{31}$ to $R^{35}$ are each independently a $C_1$-$C_{20}$ hydrocarbyl group which may contain a heteroatom. The hydrocarbyl group may be saturated or unsaturated and straight, branched or cyclic. Examples thereof include alkyl groups such as methyl, ethyl, n-propyl, isopropyl, n-butyl, and tert-butyl; cyclic saturated hydrocarbyl groups such as cyclopropyl, cyclopentyl, cyclohexyl, cyclopropylmethyl, 4-methylcyclohexyl, cylcohexylmethyl, norbornyl, and adamantyl; alkenyl groups such as vinyl, allyl, propenyl, butenyl and hexenyl; cyclic unsaturated hydrocarbyl groups such as cyclohexenyl; aryl groups such as phenyl, naphthyl, and thienyl; aralkyl groups such as benzyl, 1-phenylethyl and 2-phenylethyl, and mixtures thereof. Inter alia, aryl groups are preferred. In the hydrocarbyl groups, some hydrogen may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety.

Also $R^{31}$ and $R^{32}$ may bond together to form a ring with the sulfur atom to which they are attached. Examples of the sulfonium cation having formula (c4) wherein $R^{31}$ and $R^{32}$ form a ring are shown below.

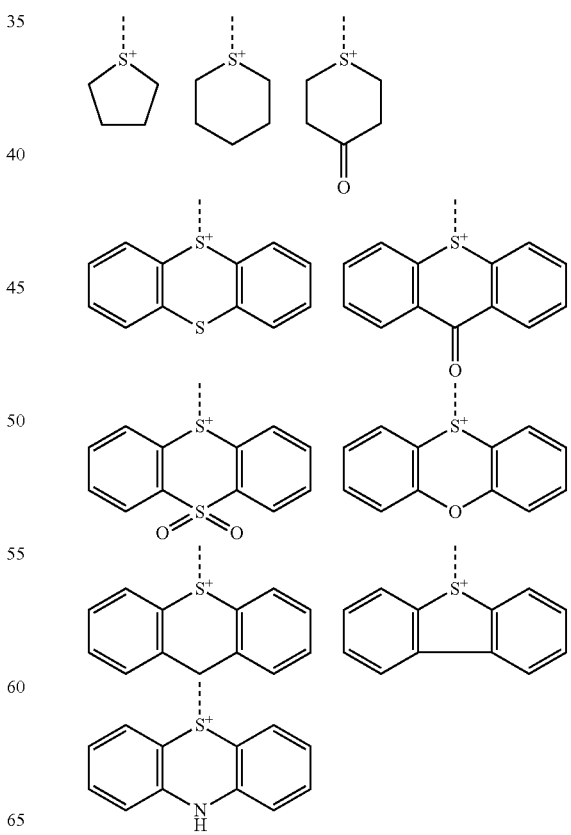

Herein the broken line designates an attachment to $R^{33}$.
Examples of the sulfonium cation having formula (c4) are shown below, but not limited thereto.
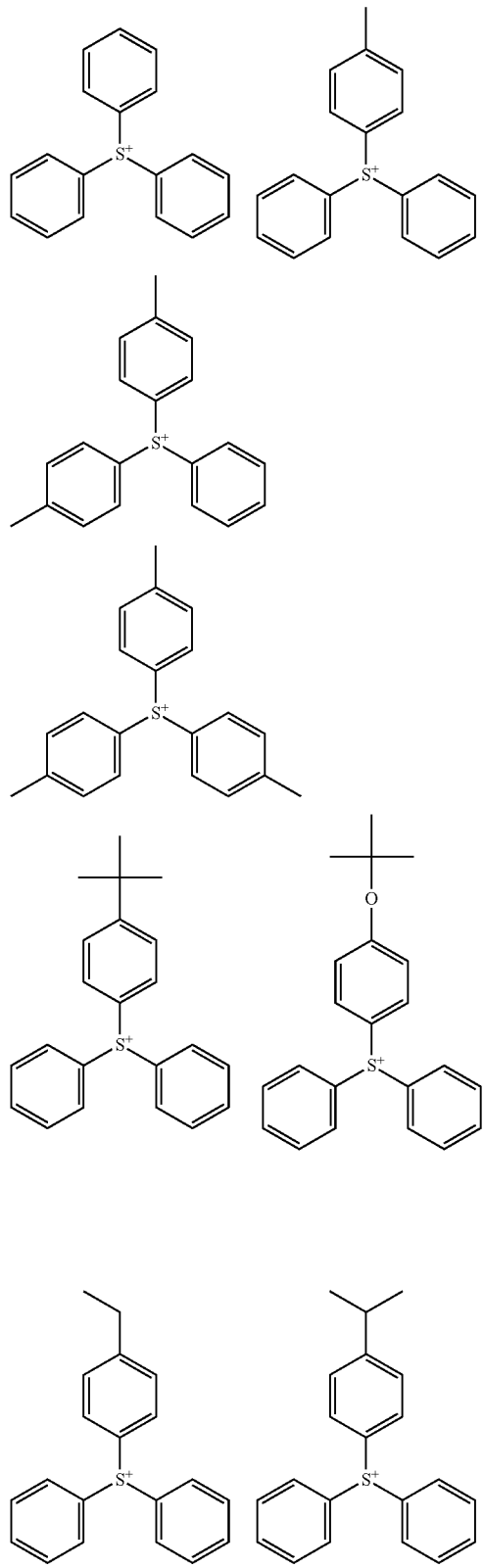
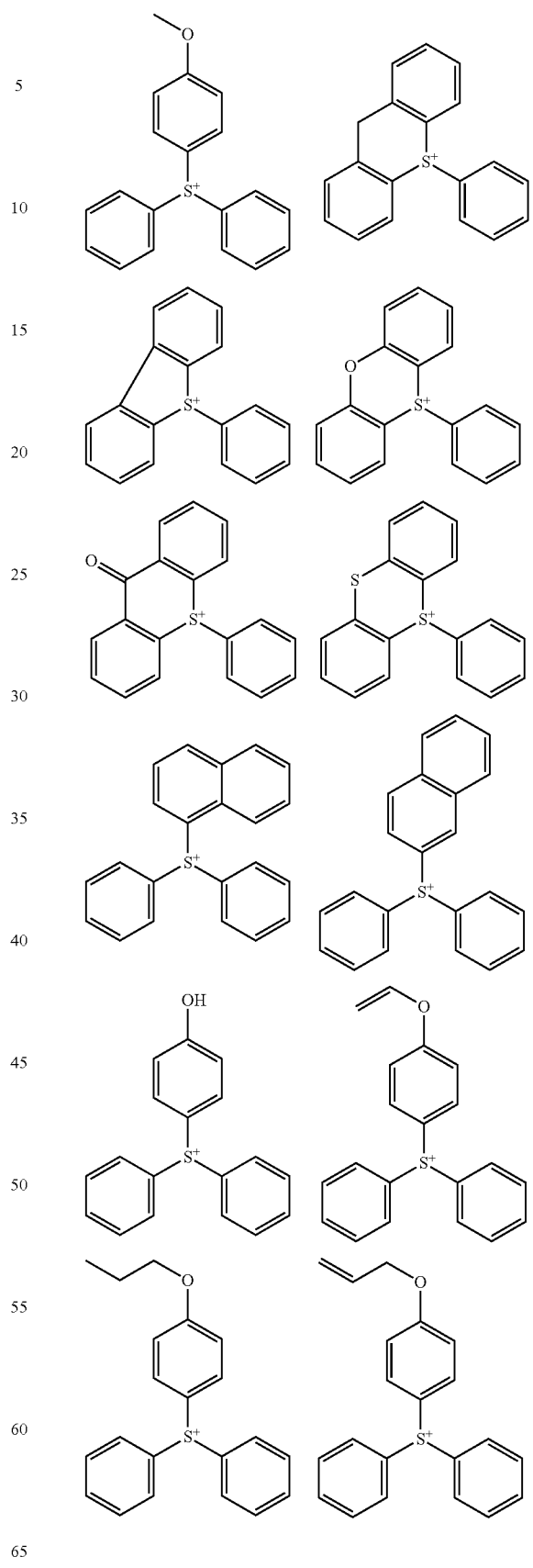
-continued

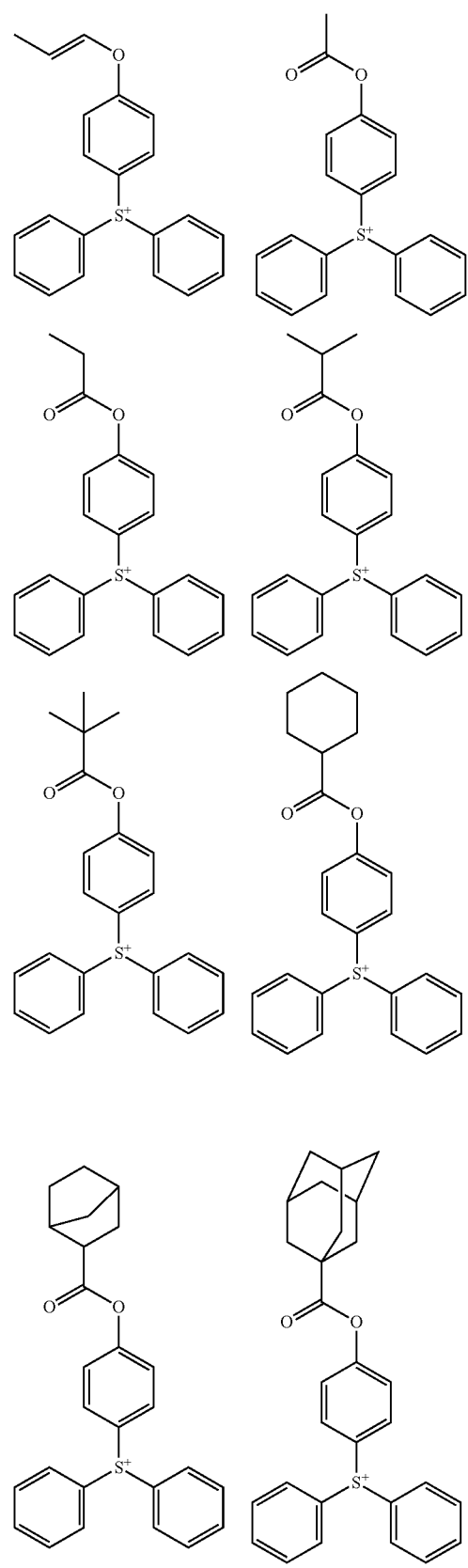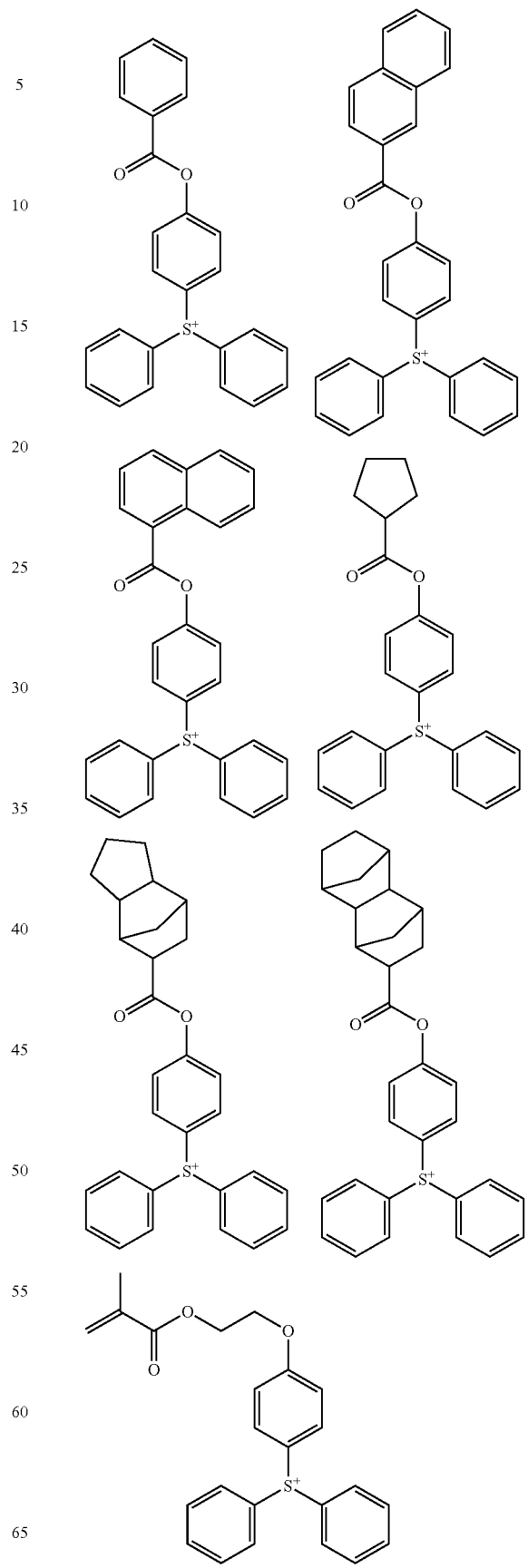

95
-continued
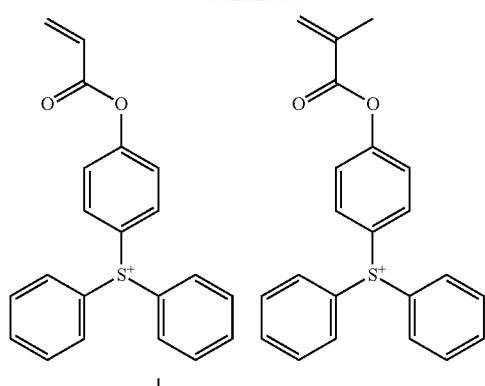
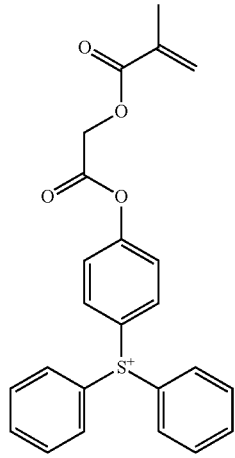
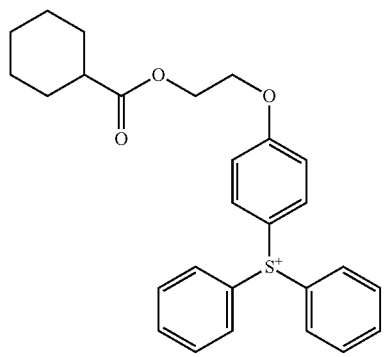
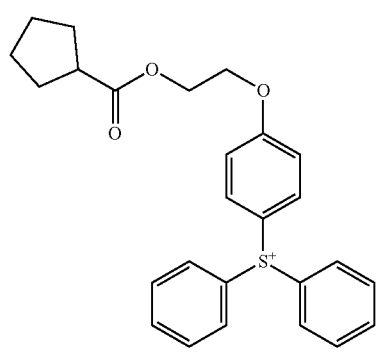
96
-continued
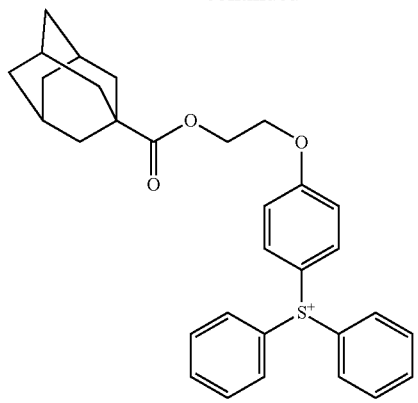
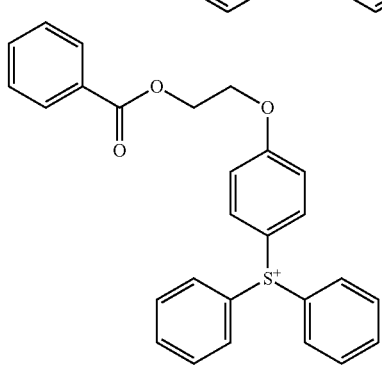
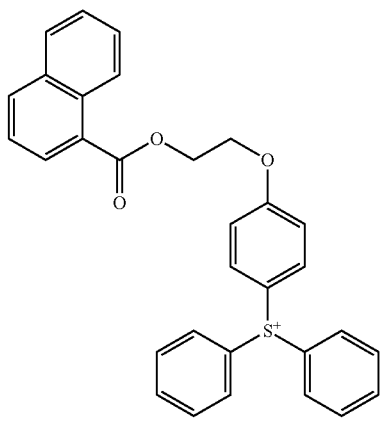
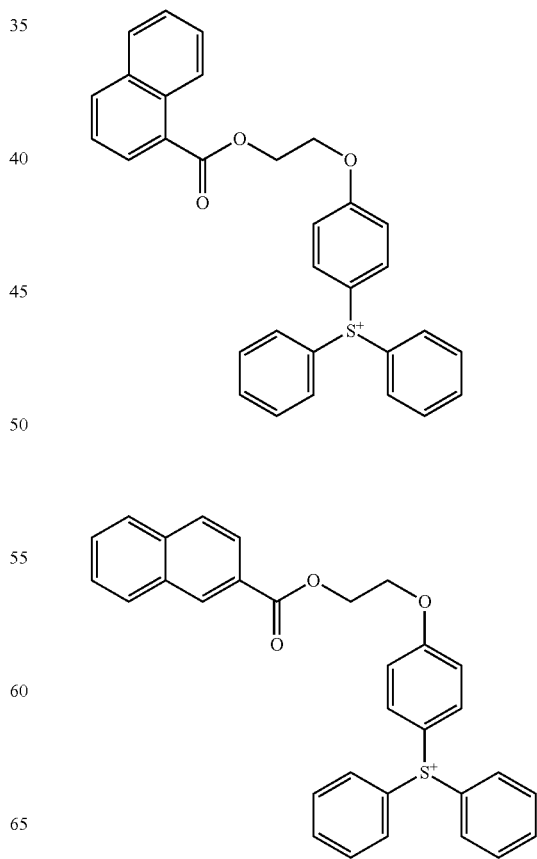

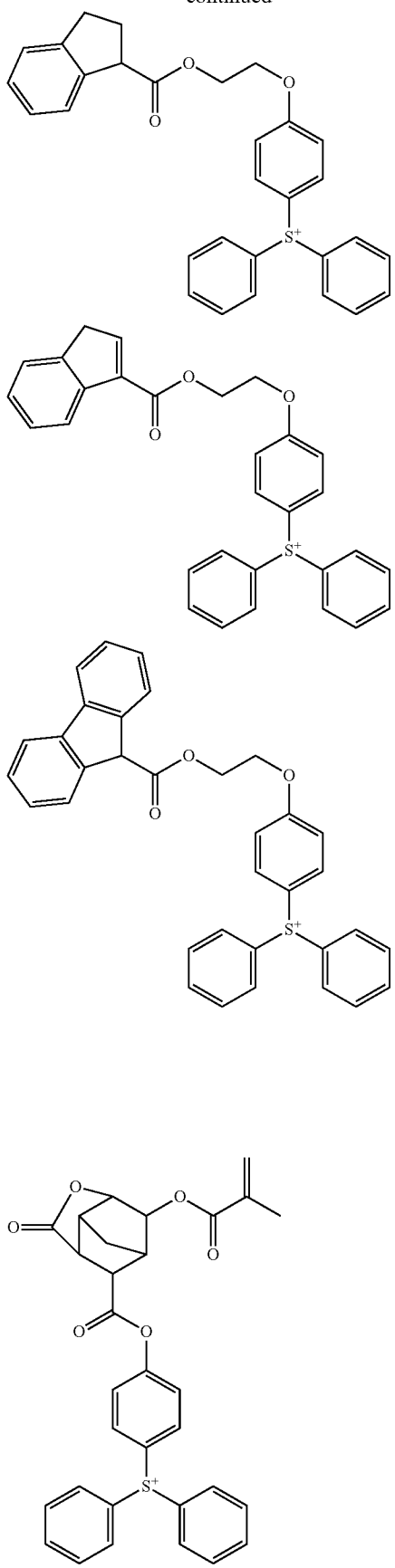
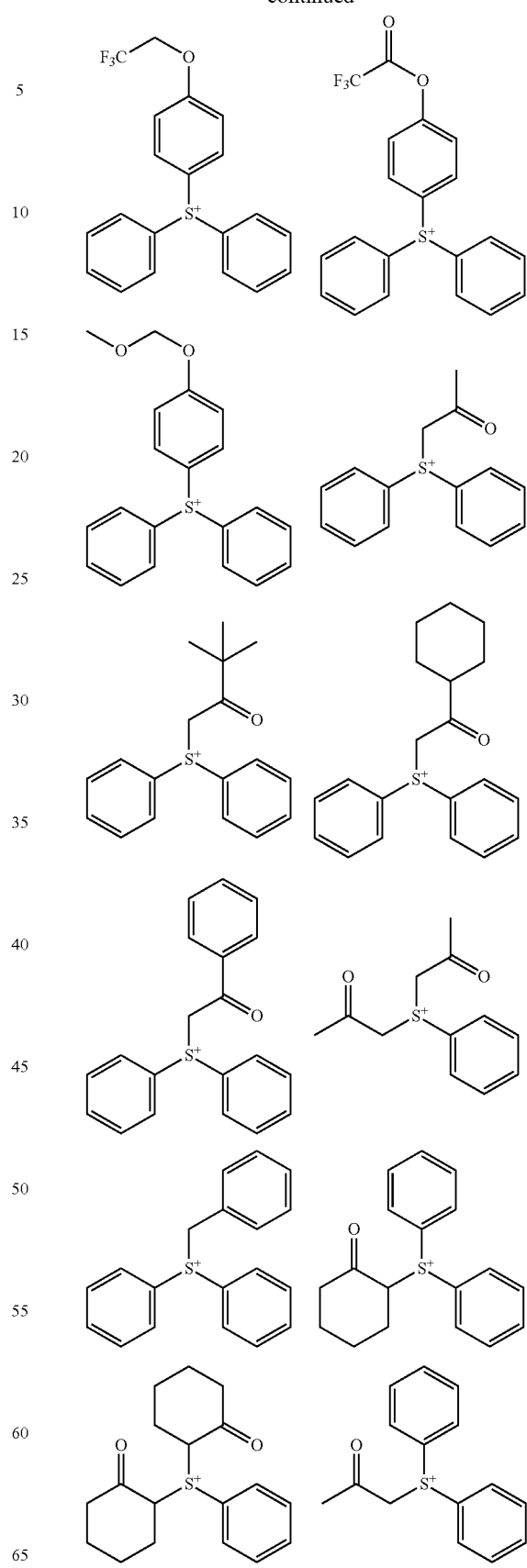

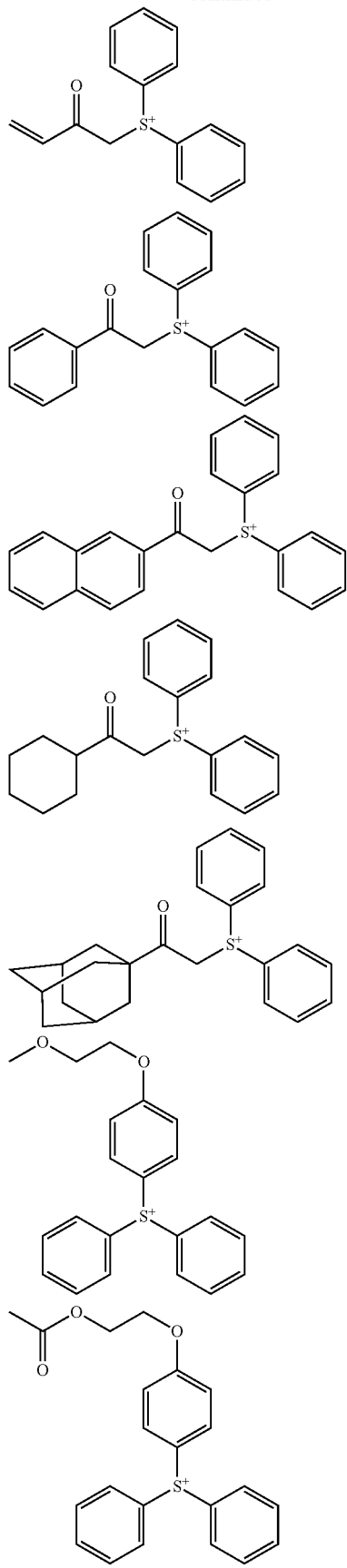
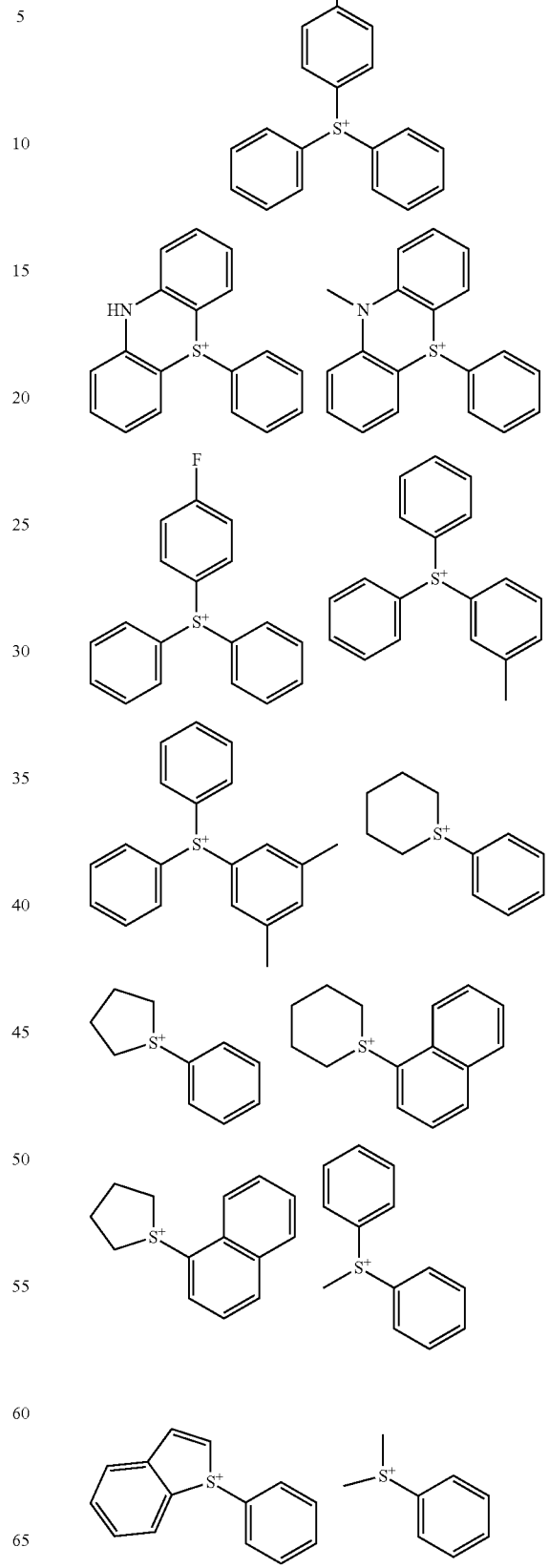

101
-continued
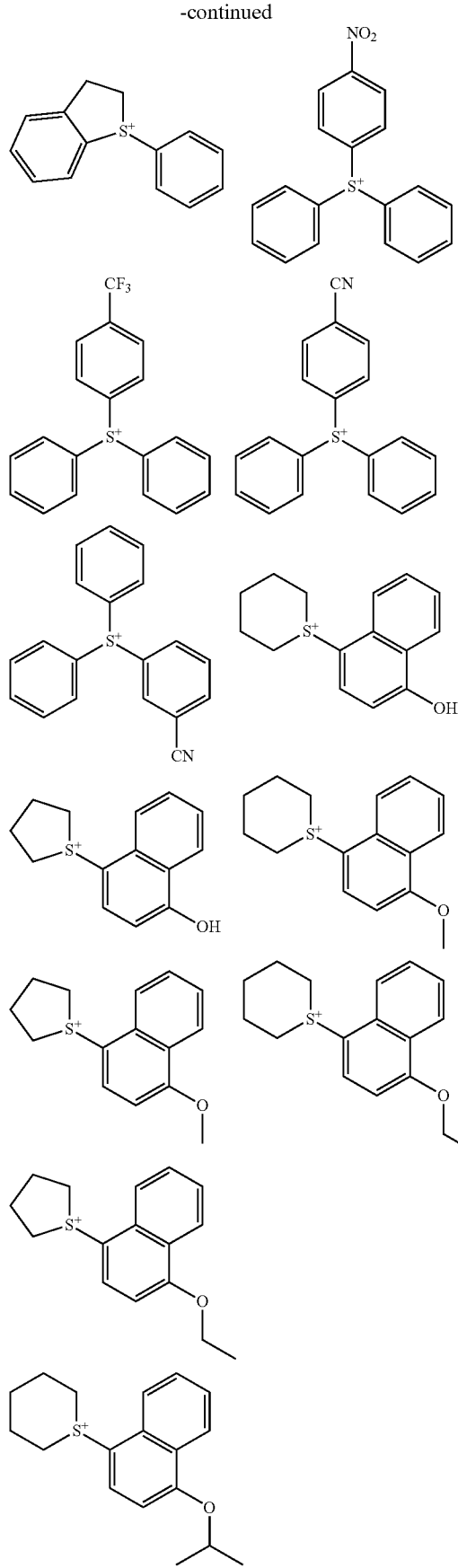
102
-continued
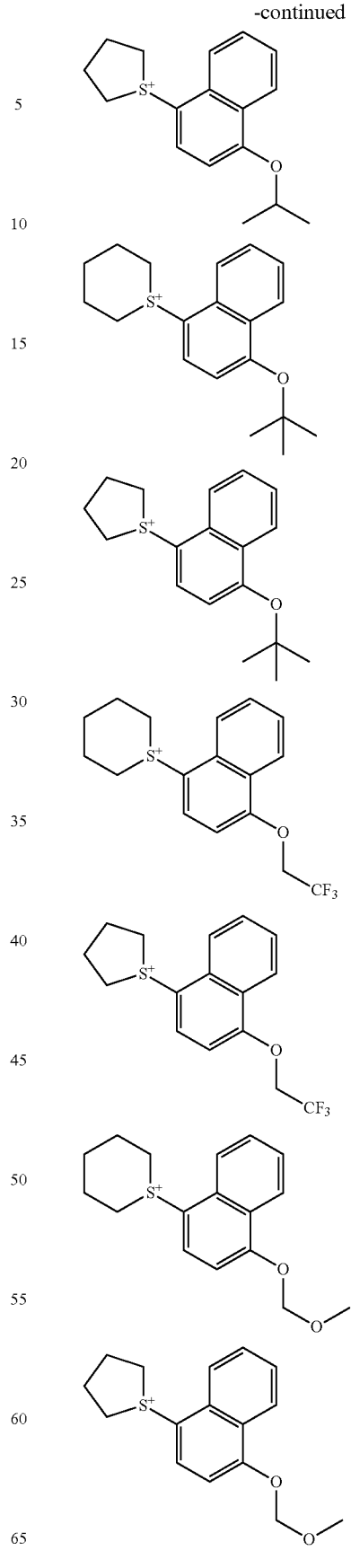

103
-continued
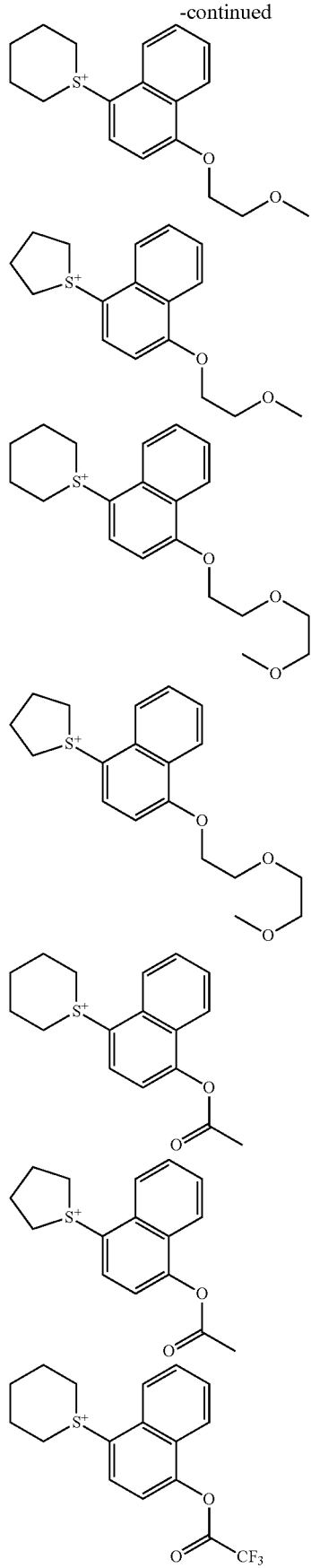
104
-continued
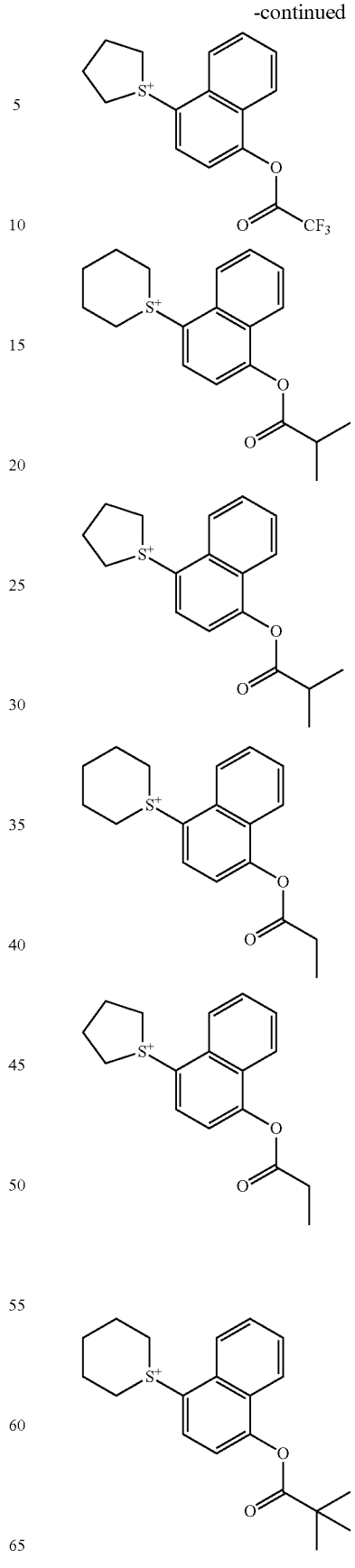

105
-continued
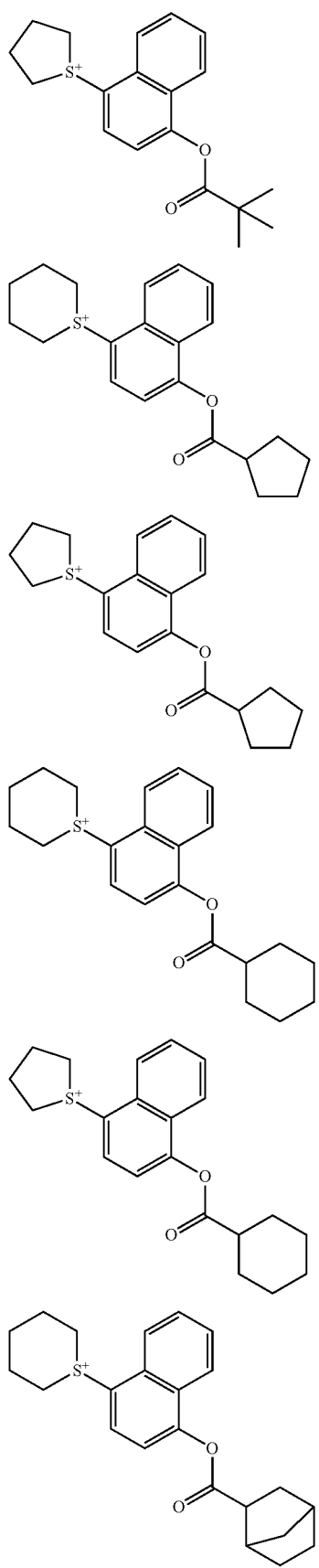
106
-continued
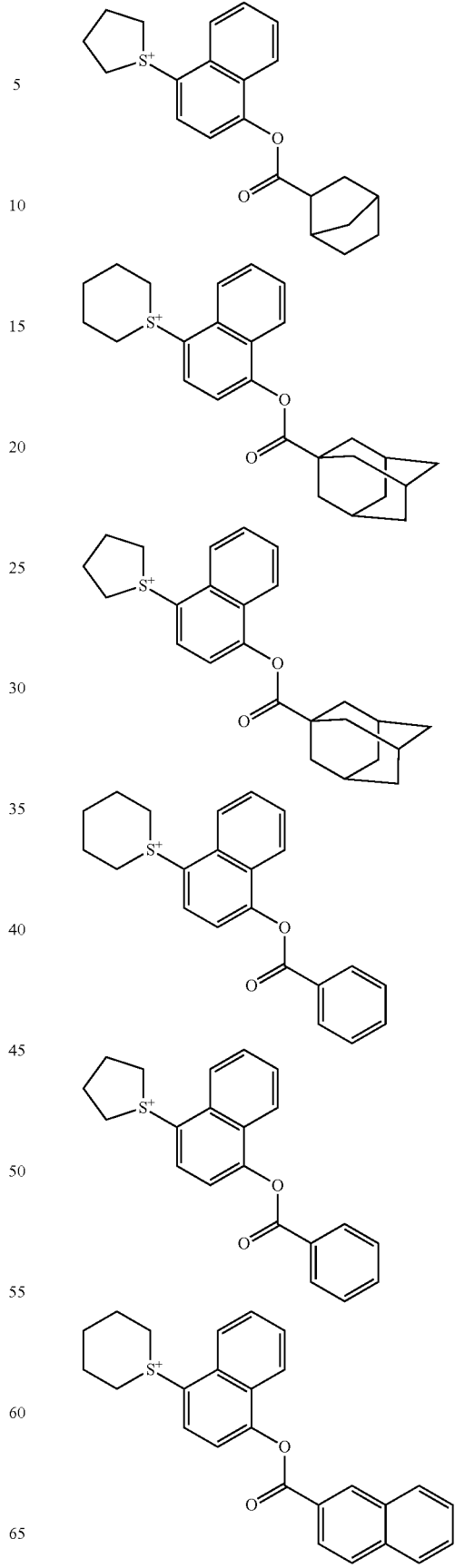

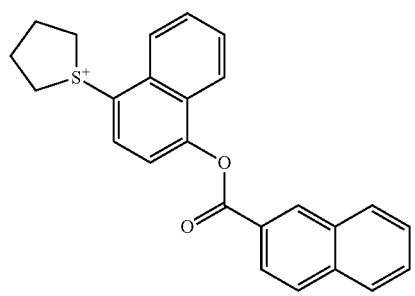
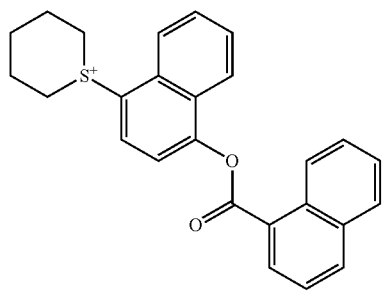
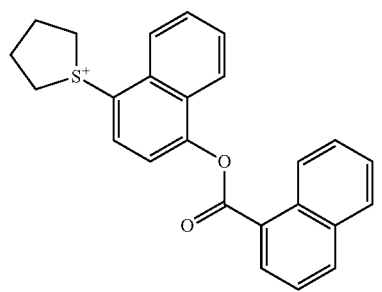
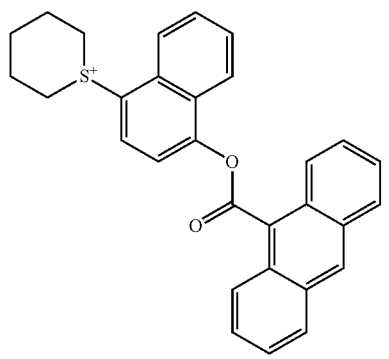
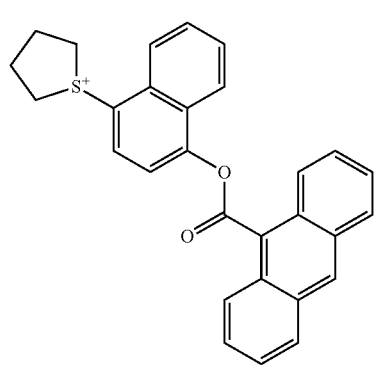
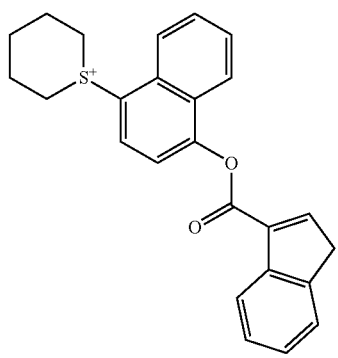
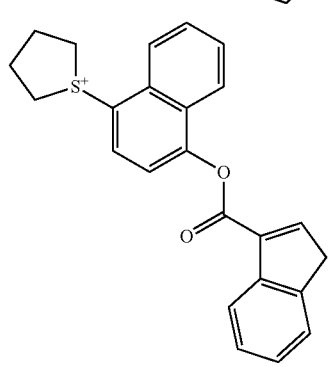
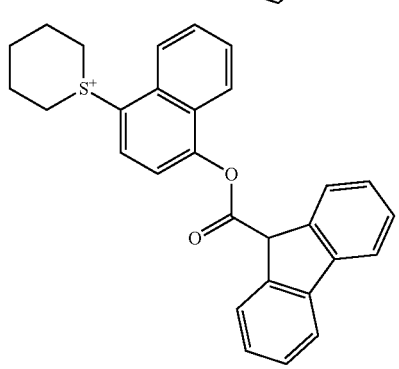
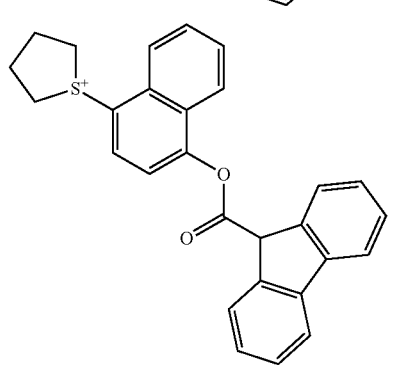
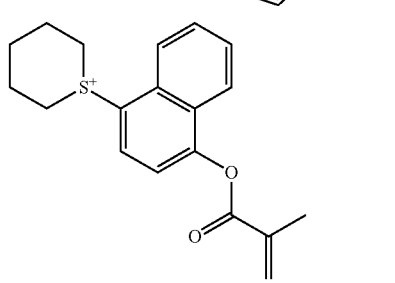

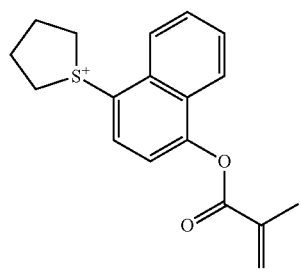
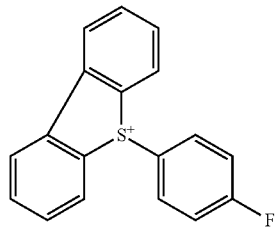
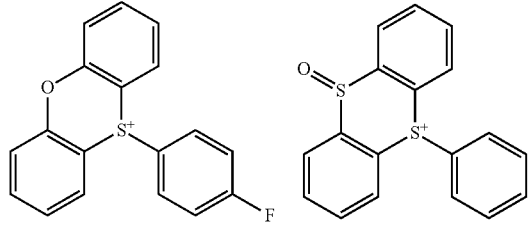
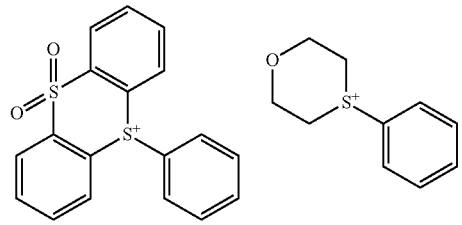
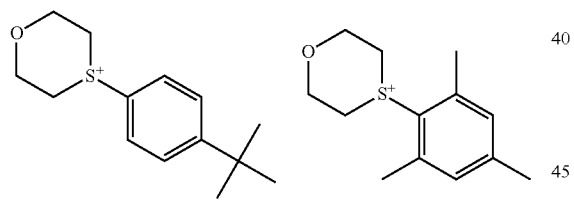
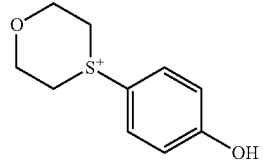
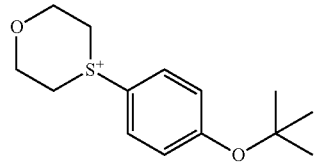
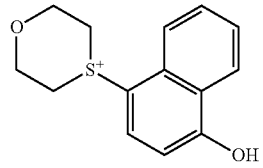
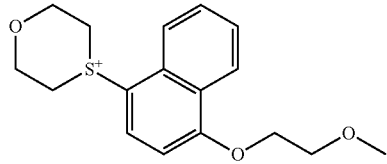
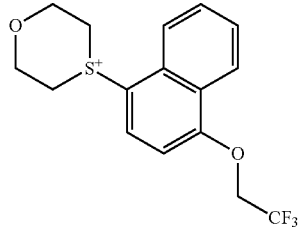
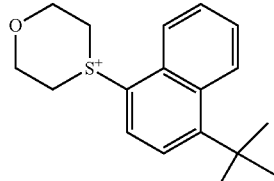
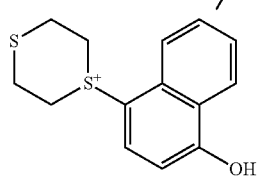
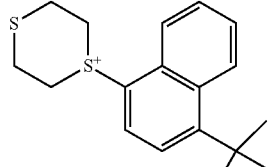
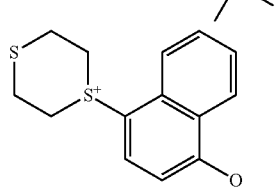
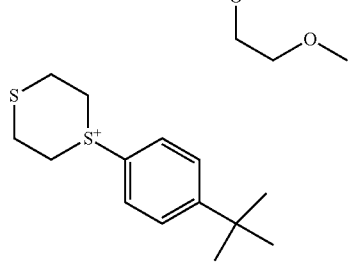
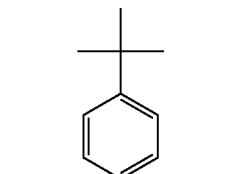
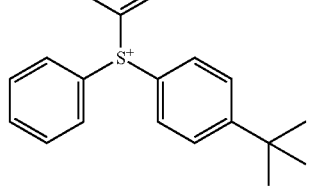

111
-continued
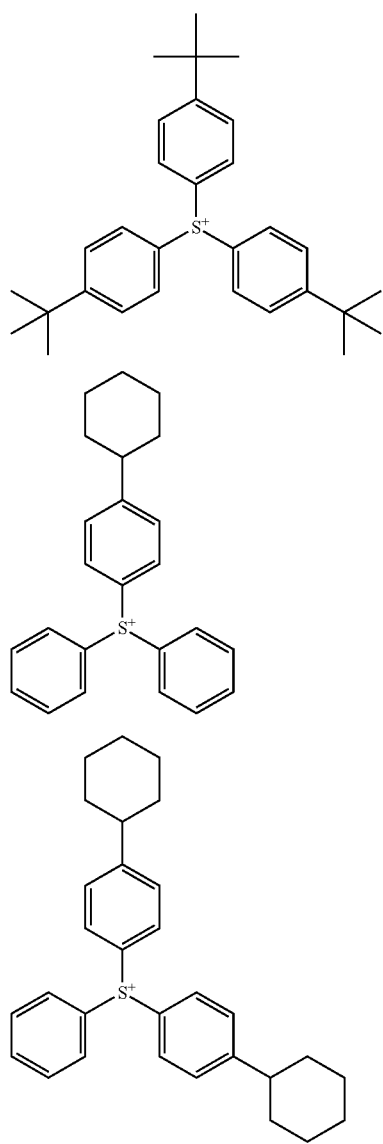
112
-continued
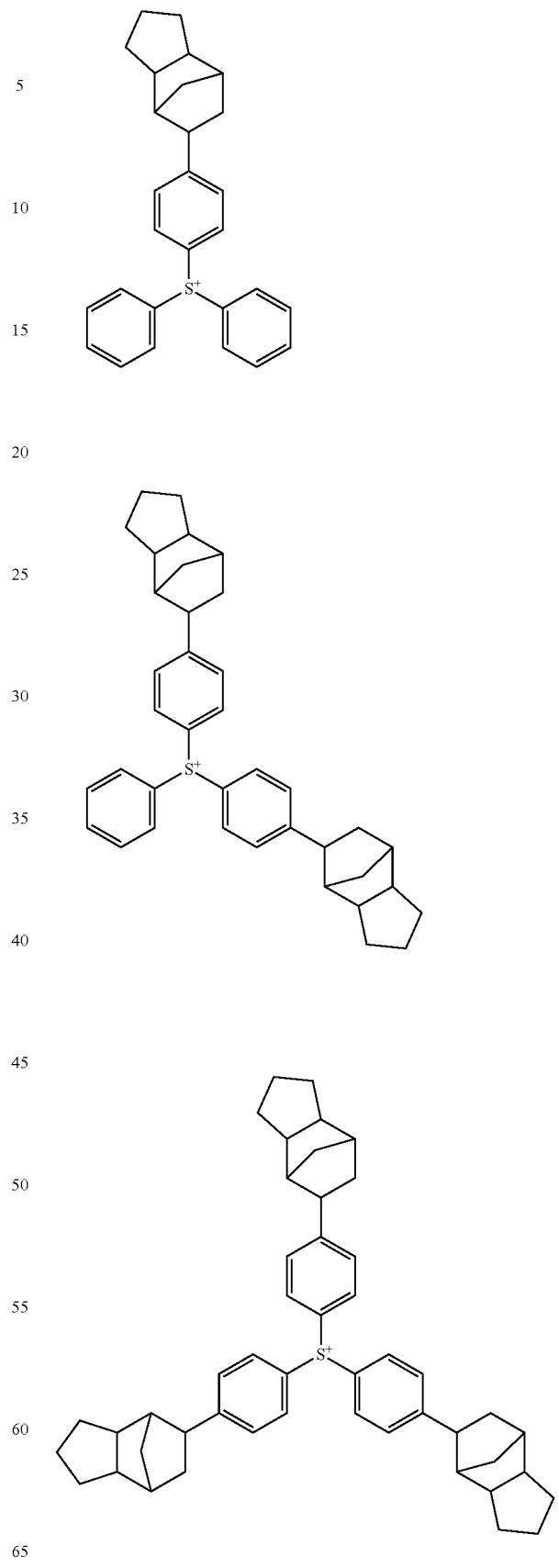

113
-continued
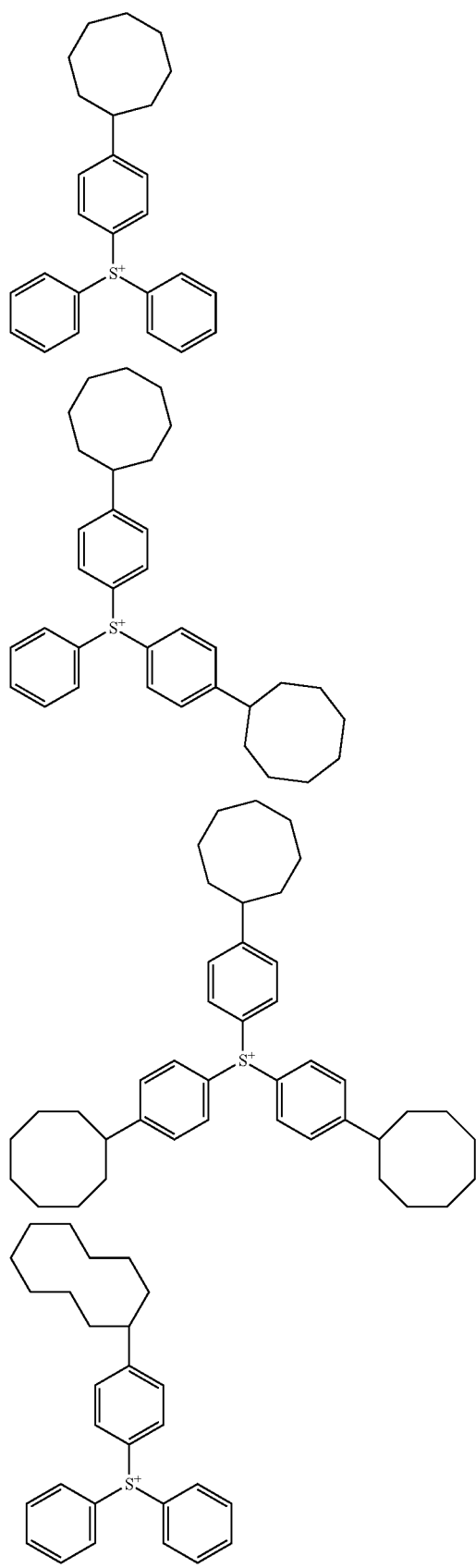
114
-continued
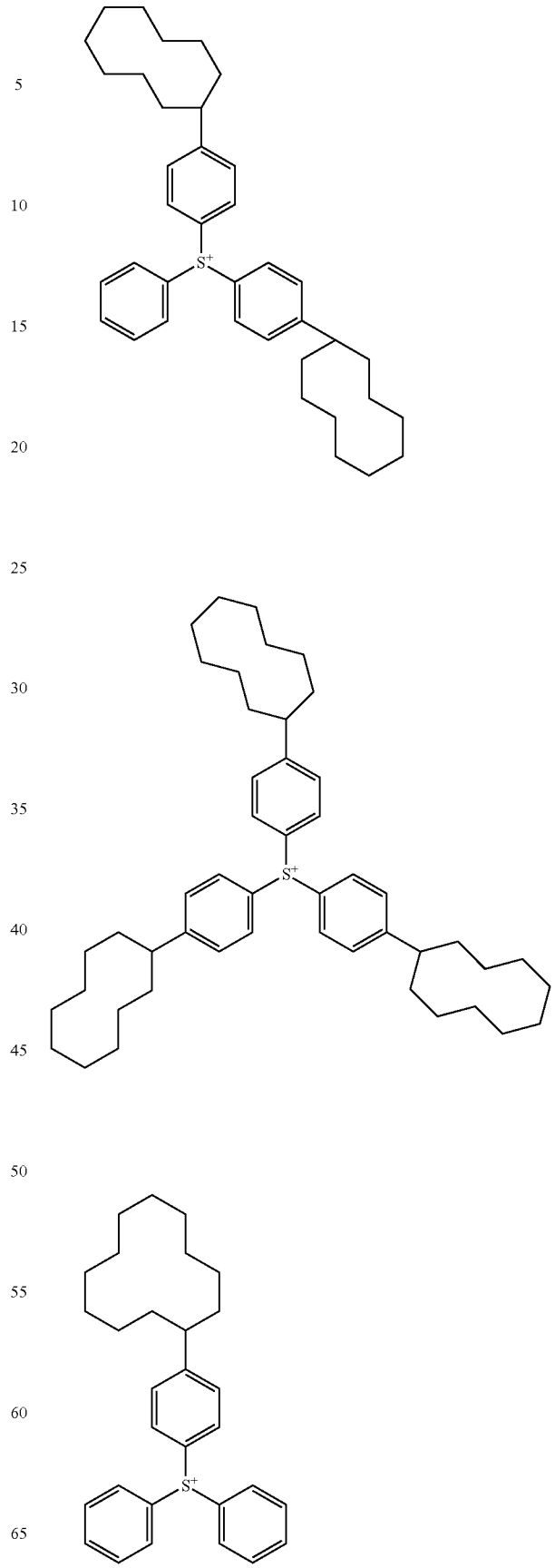

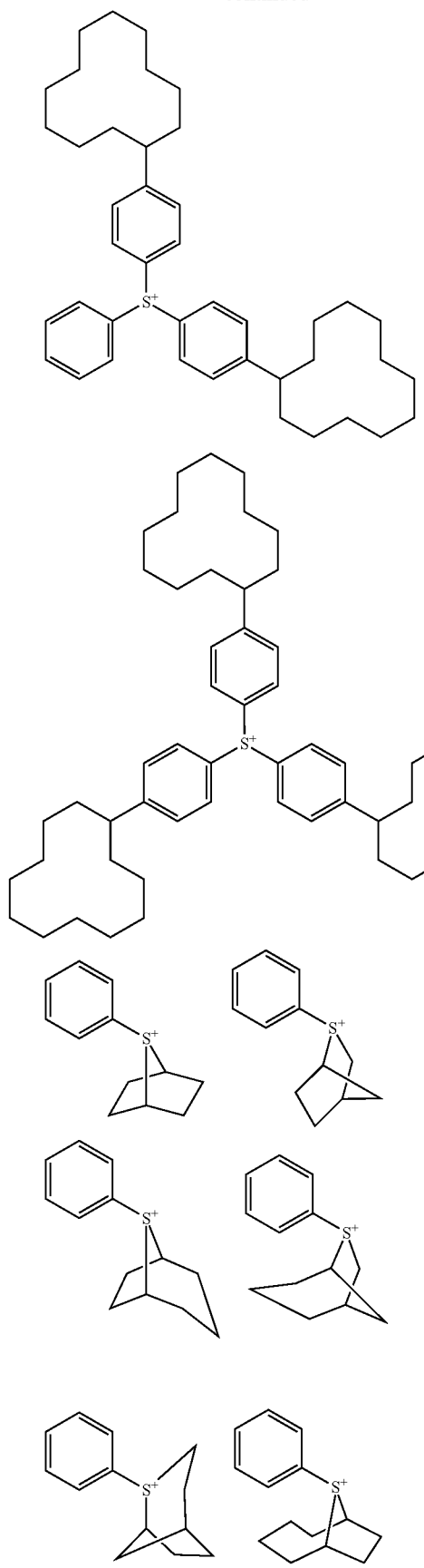

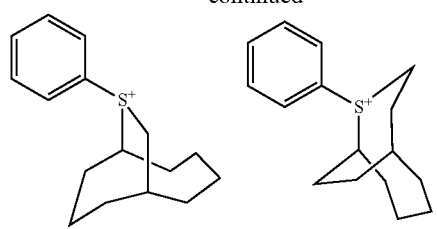
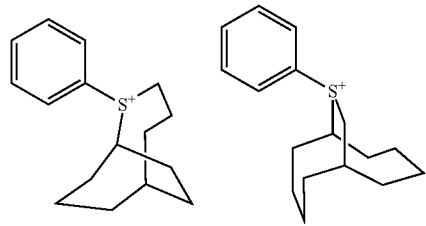
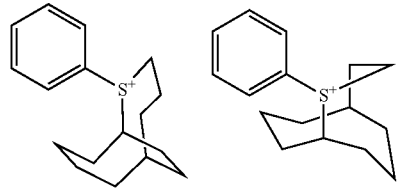
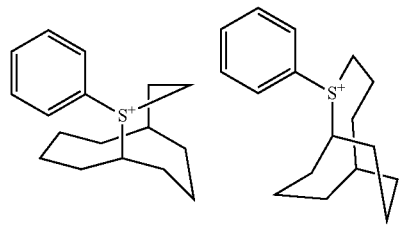
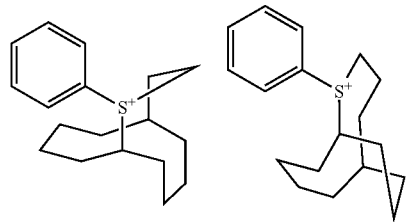
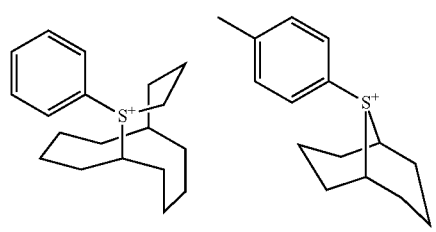
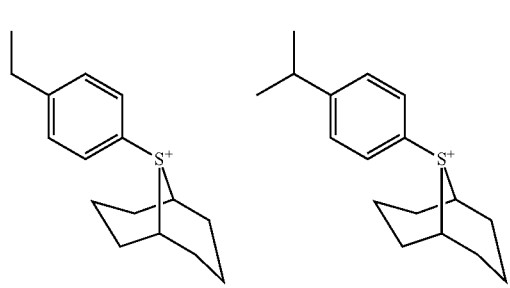
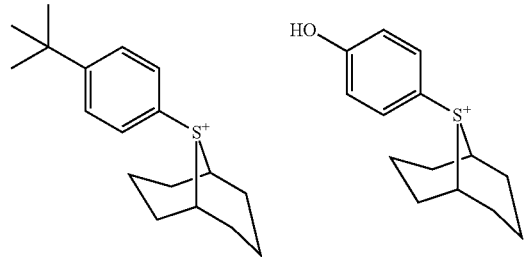
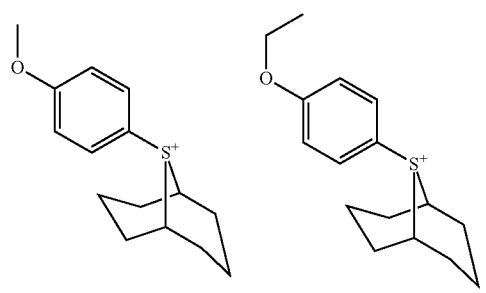
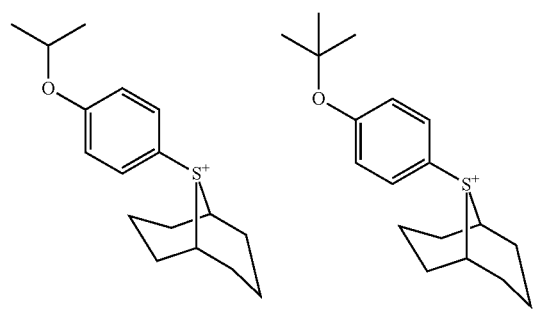
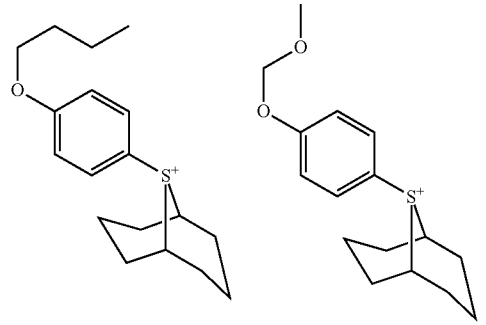
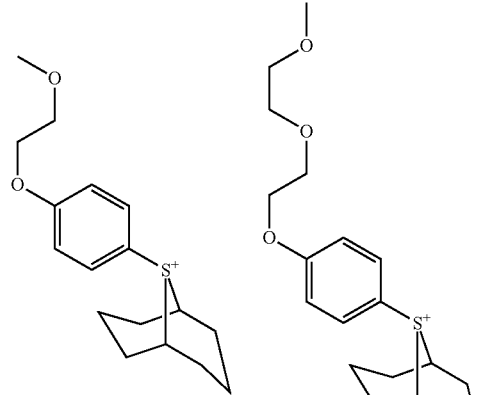

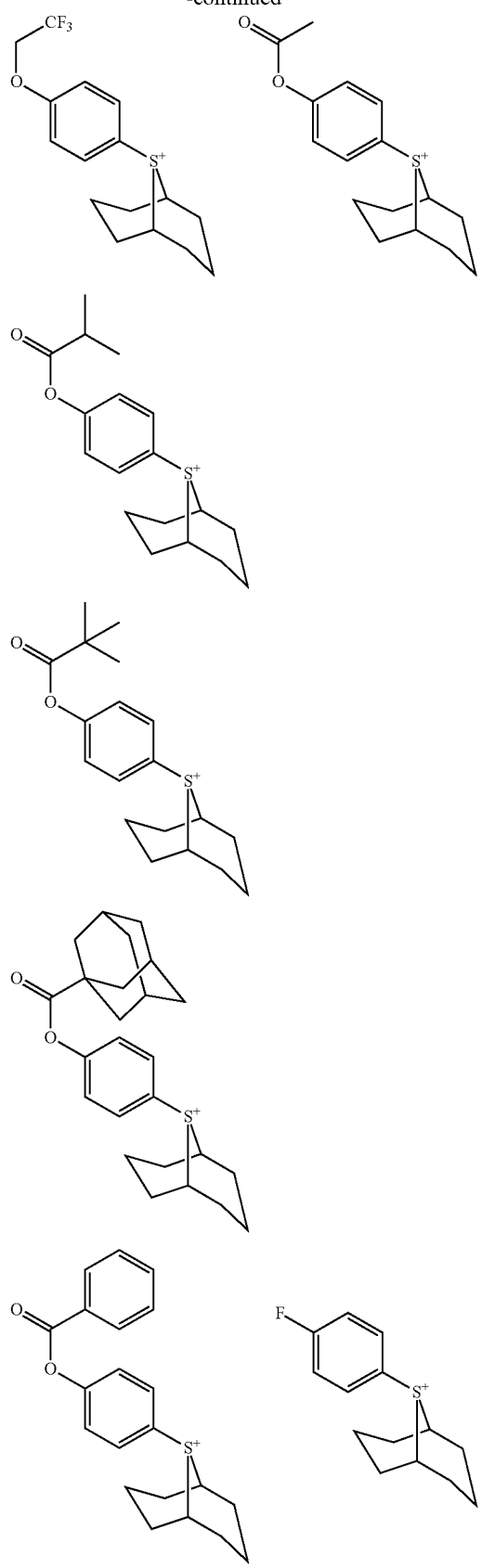
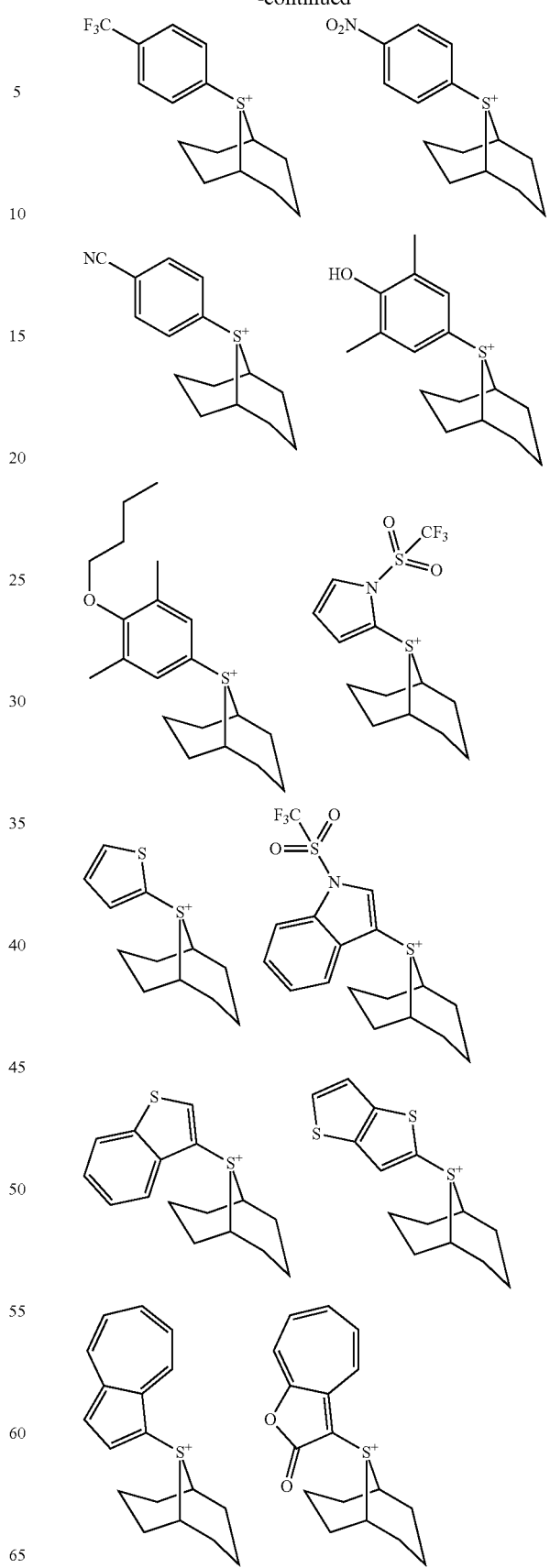

121
-continued
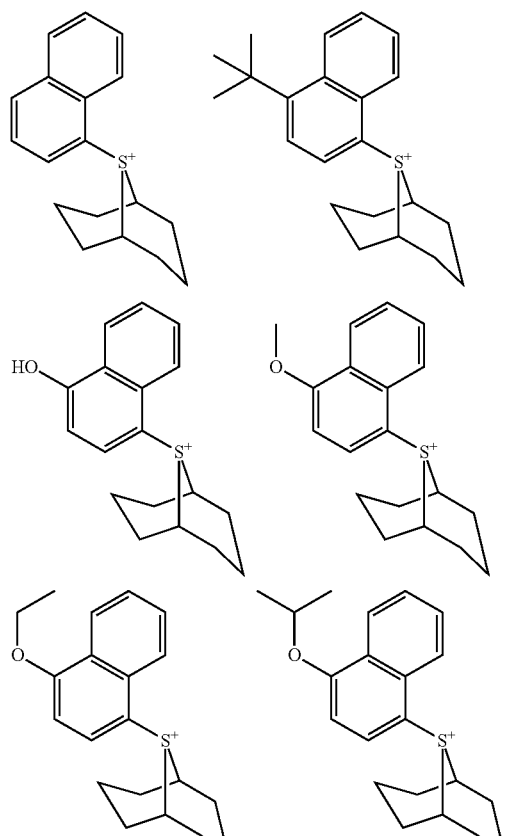
122
-continued
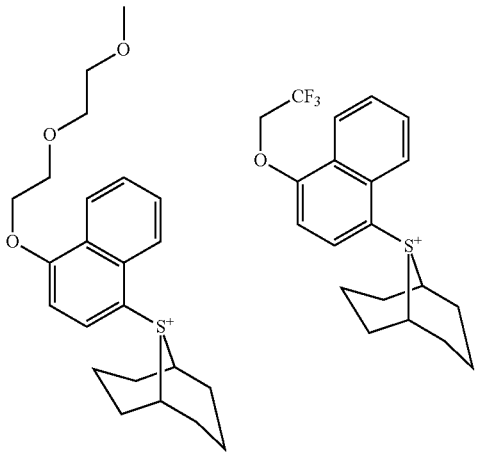
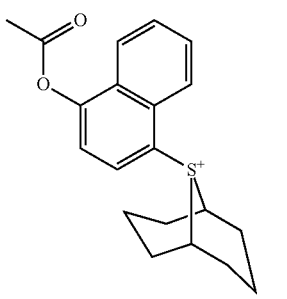
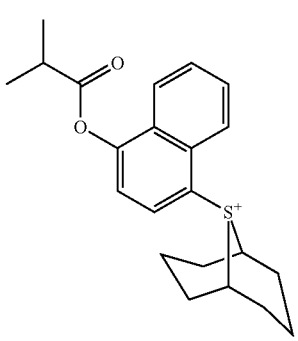
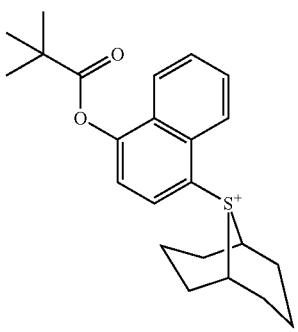

123
-continued
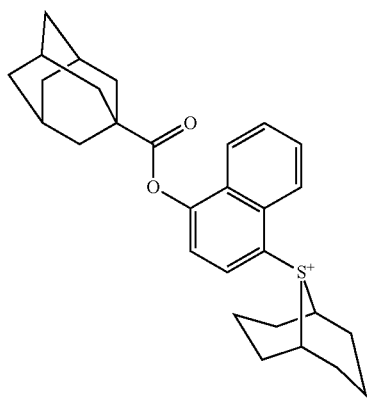
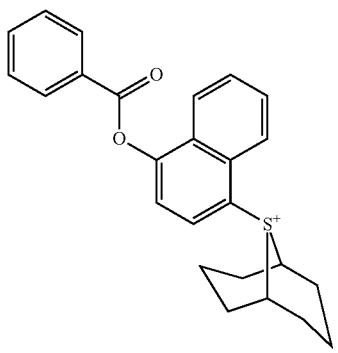
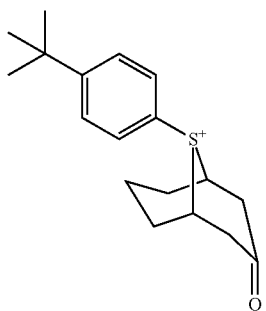
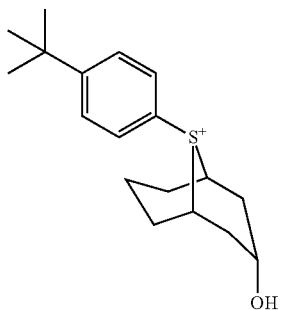
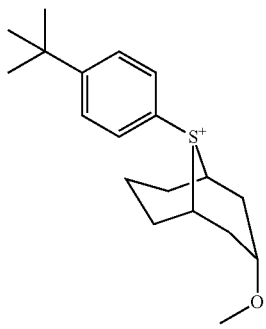
124
-continued
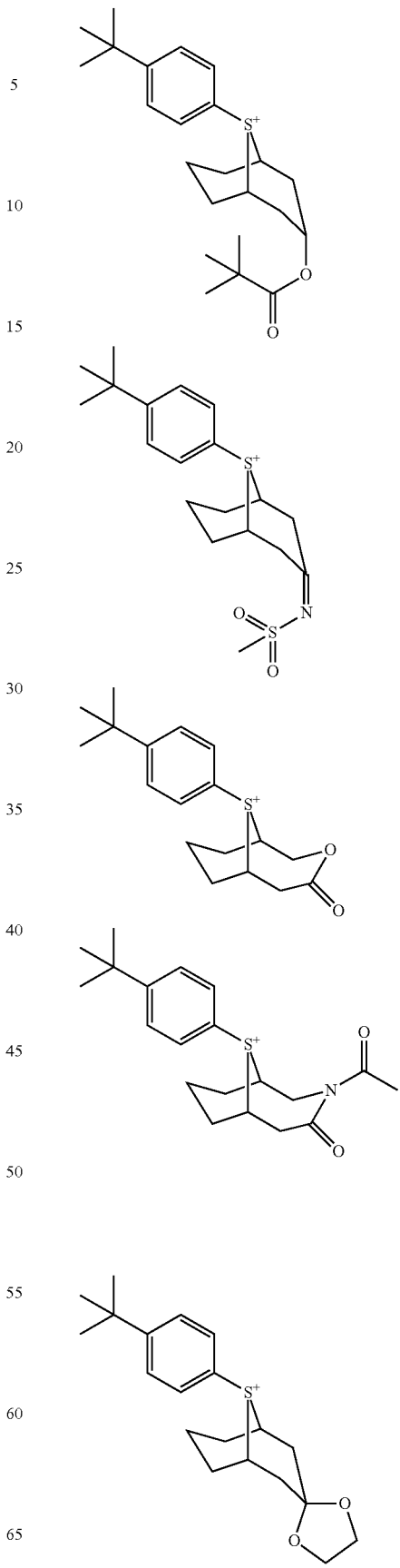

125
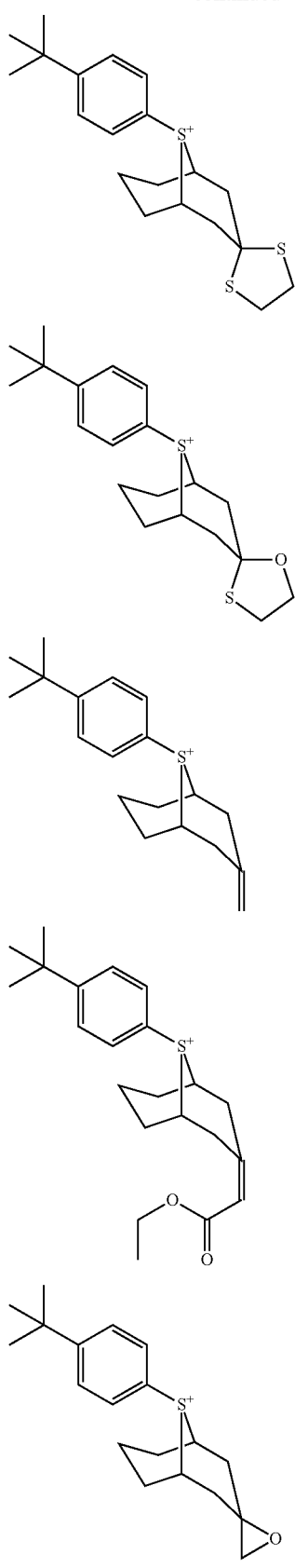
126
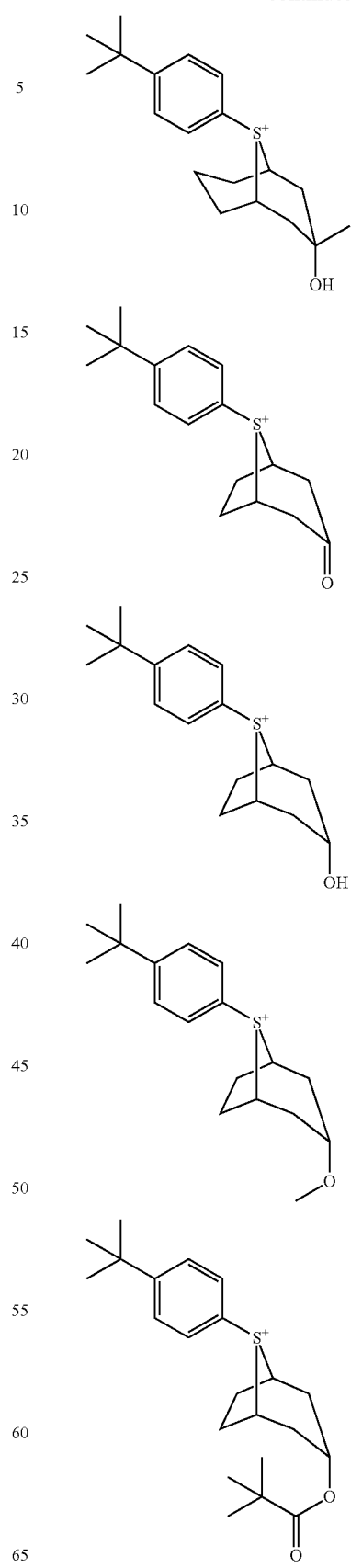

127
-continued
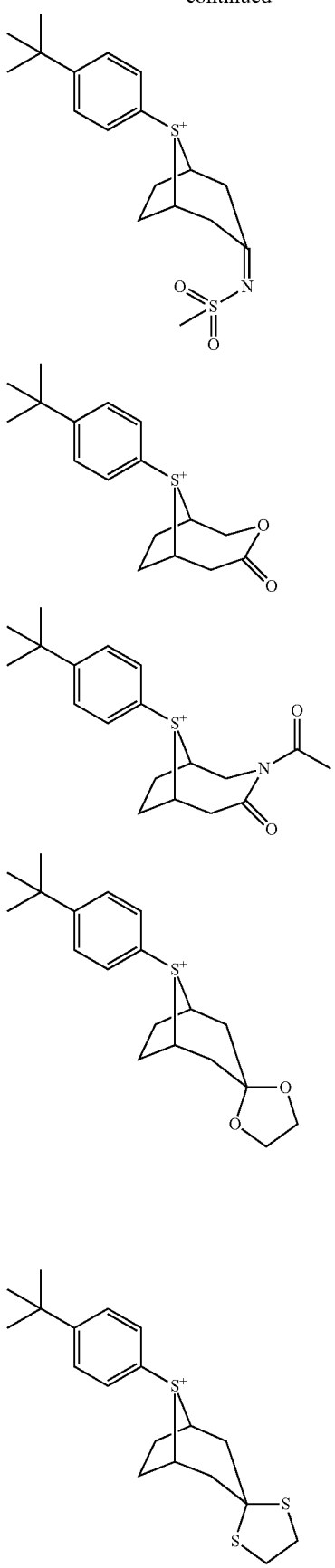
128
-continued
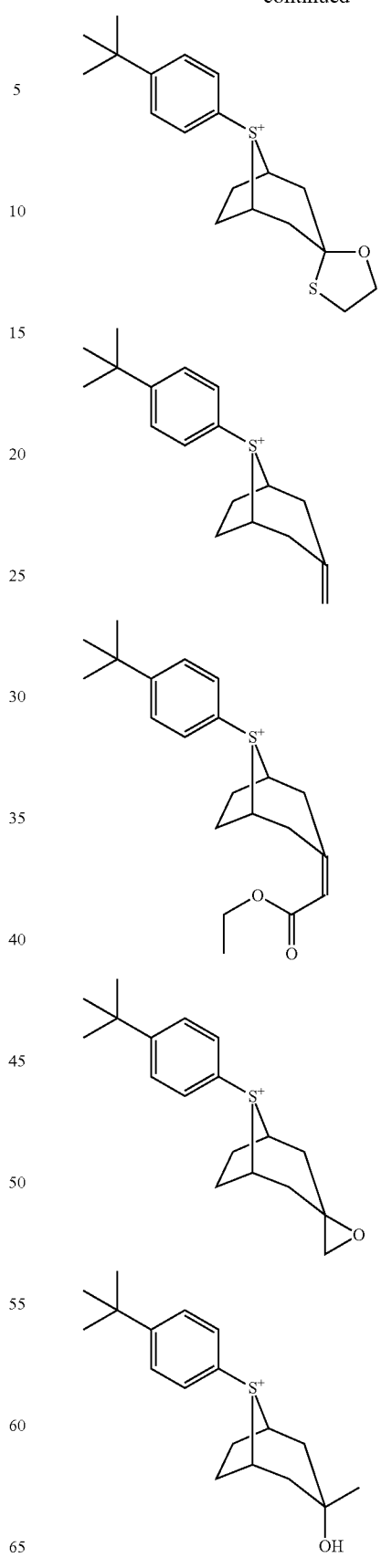

129
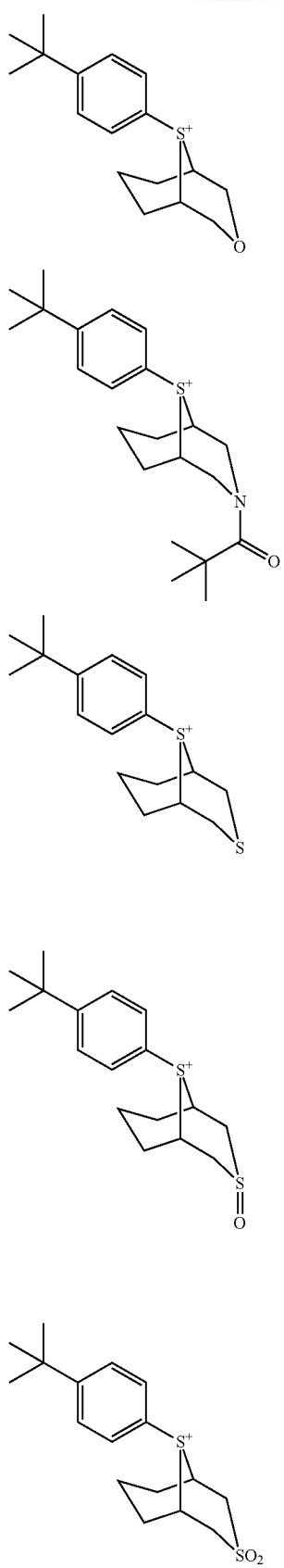
130
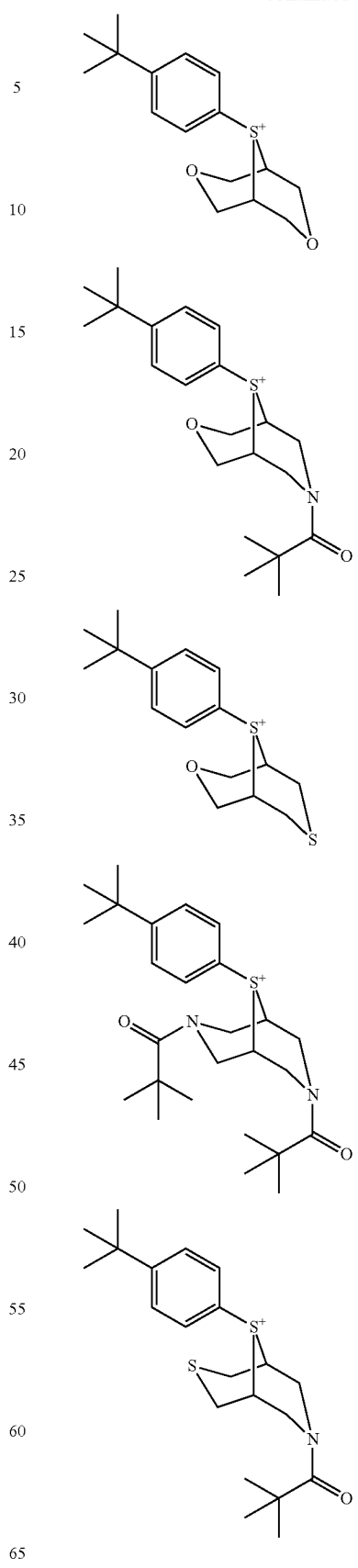

131
-continued
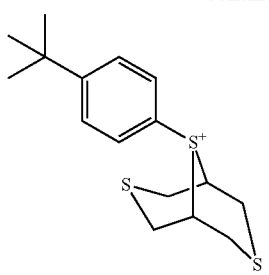
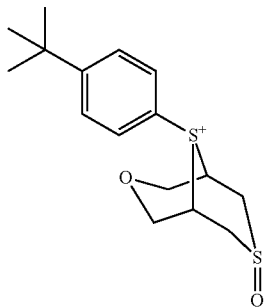
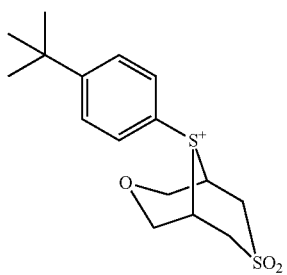
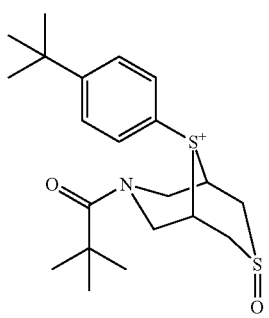
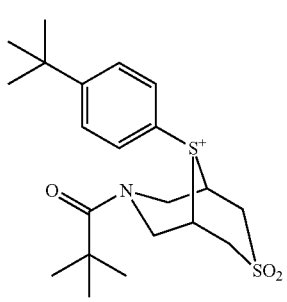
132
-continued
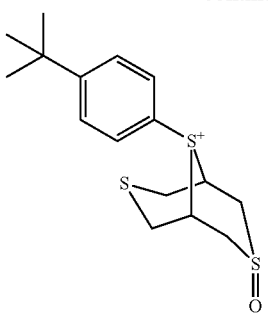
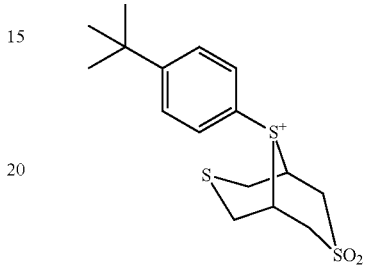
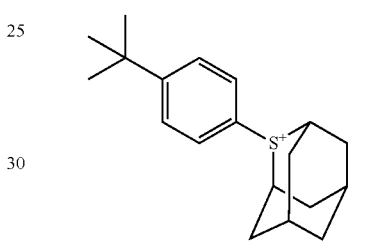
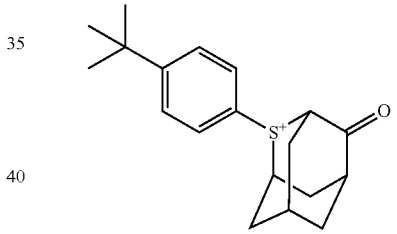
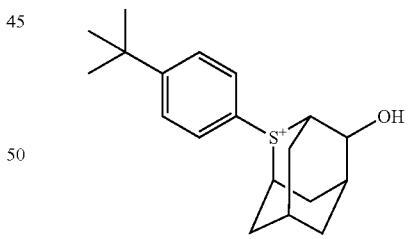
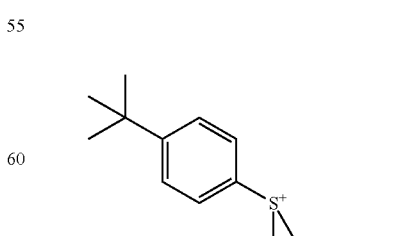

133
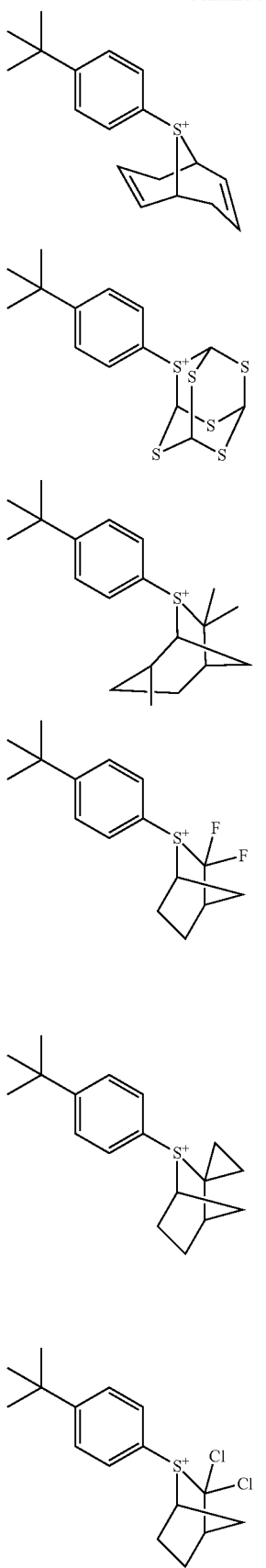
134
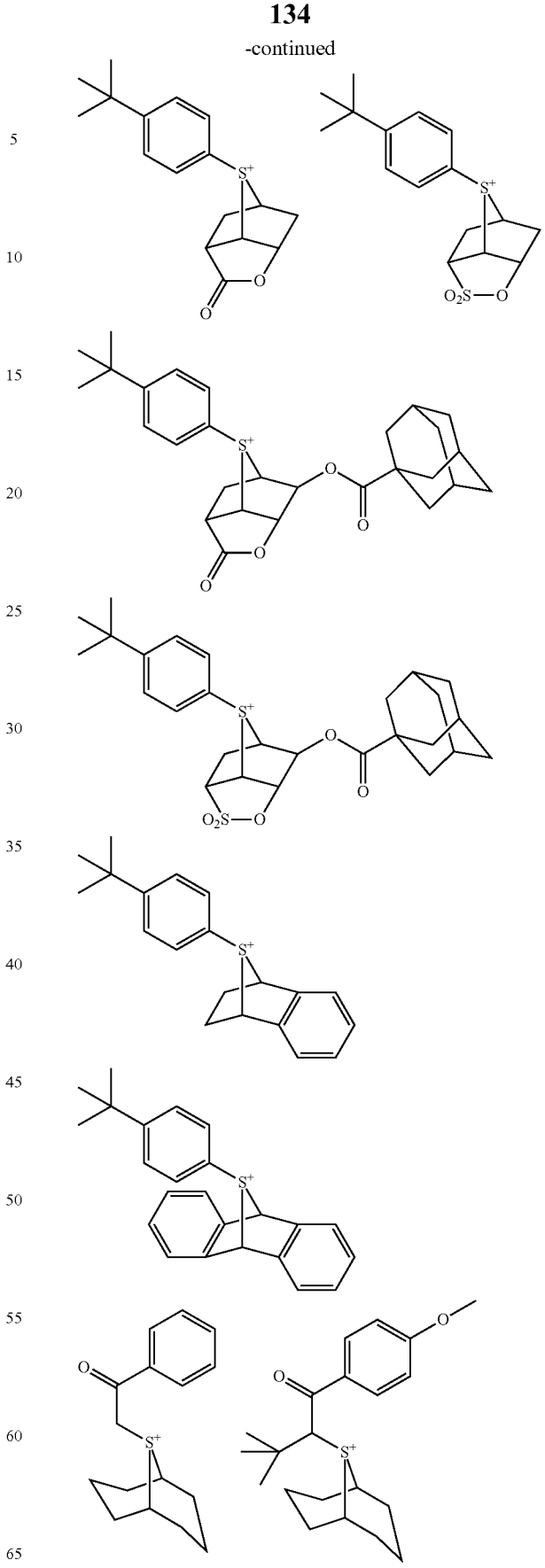

Examples of the iodonium cation having formula (c5) are shown below, but not limited thereto.

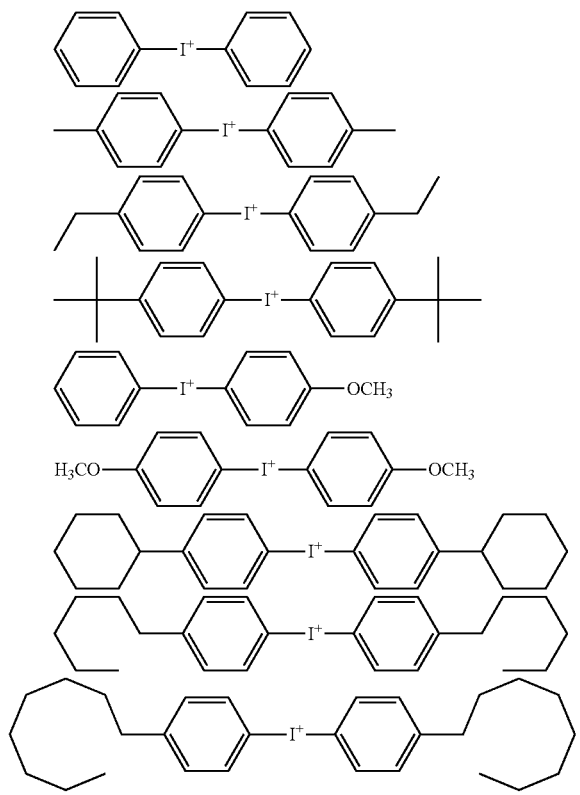

Illustrative structures of the recurring units having formulae (c1) to (c3) include arbitrary combinations of anions with cations, both exemplified above.

Of the recurring units (c), recurring units (c2) or (c3) are preferred in view of acid diffusion control, and recurring units (c2) are preferred in view of solvent solubility.

The polymer is characterized by comprising recurring units having an acid labile group containing a multiple bond, recurring units having a phenolic hydroxyl group, and recurring units adapted to generate an acid upon exposure. Upon exposure, the recurring units having a phenolic hydroxyl group generate secondary electrons, which are effectively conducted to the cation at the acid generating site whereby the sulfonium or iodonium cation is decomposed to generate the corresponding acid. Since the generated acid is bound to the polymer backbone, no excessive acid diffusion occurs. The recurring unit having an acid labile group containing a multiple bond forms a stable conjugated diene or conjugated enyne after elimination reaction. Since the conjugated diene of enyne is more reactive than ordinary acid labile groups of tertiary ester form, the resist film has an enhanced dissolution contrast in developer and an increased sensitivity. Also, since the double or triple bond has a smaller excluded volume than the single bond, the double or triple bond acts advantageously in forming fine size patterns. The synergy effect of three recurring units makes it possible to form a pattern with a high sensitivity and improved CDU.

The inventive polymer may further comprise recurring units of at least one type selected from recurring units having the formula (d1) and recurring units having the formula (d2). These units are also referred to as recurring units (d1) and (d2), respectively.

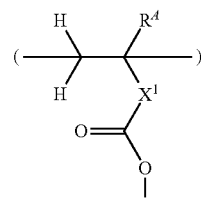

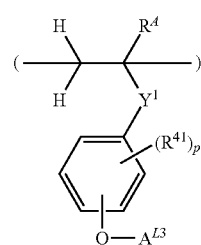

In formulae (d1) and (d2), $R^A$, $X^1$ and $Y^1$ are as defined above. $R^{41}$ is halogen, cyano, a $C_1$-$C_{20}$ hydrocarbyl group which may contain a heteroatom, $C_1$-$C_{20}$ hydrocarbyloxy group which may contain a heteroatom $C_2$-$C_{20}$ hydrocarbylcarbonyl group which may contain a heteroatom, $C_2$-$C_{20}$ hydrocarbyloxycarbonyloxy group which may contain a heteroatom, or $C_2$-$C_{20}$ hydrocarbyloxycarbonyl group which may contain a heteroatom. The subscript p is an integer of 0 to 4. $A^{L2}$ and $A^{L3}$ are each independently an acid labile group free of multiple bond.

Examples of the optionally heteroatom-containing $C_1$-$C_{20}$ hydrocarbyl, $C_1$-$C_{20}$ hydrocarbyloxy, $C_2$-$C_{20}$ hydrocarbylcarbonyl, $C_2$-$C_{20}$ hydrocarbylcarbonyloxy, or $C_2$-$C_{20}$ hydrocarbyloxycarbonyl group, represented by $R^{41}$, are as exemplified above for $R^{11}$ in formula (b).

The acid labile groups represented by $A^{L2}$ and $A^{L3}$ in formulae (d1) and (d2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

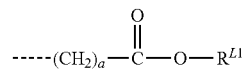

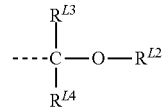

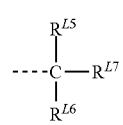

In formulae (AL-1) and (AL-2), $R^{L1}$ and $R^{L2}$ are each independently a $C_1$-$C_{40}$ saturated hydrocarbyl group which may contain a heteroatom such as oxygen, sulfur, nitrogen or fluorine. The saturated hydrocarbyl group may be straight, branched or cyclic. Preferred are $C_1$-$C_{20}$ saturated hydrocarbyl groups.

In formula (AL-1), "a" is an integer of 0 to 10, preferably 1 to 5.

In formula (AL-2), $R^{L3}$ and $R^{L4}$ are each independently hydrogen or a $C_1$-$C_{20}$ saturated hydrocarbyl group which may contain a heteroatom such as oxygen, sulfur, nitrogen or fluorine. The hydrocarbyl group may be straight, branched or cyclic. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ saturated hydrocarbyl group which may contain a heteroatom such as oxygen, sulfur, nitrogen or fluorine. The hydrocarbyl group may be straight, branched or cyclic. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

Examples of the recurring unit (d1) are shown below, but not limited thereto. $R^A$ and $A^{L2}$ are as defined above.

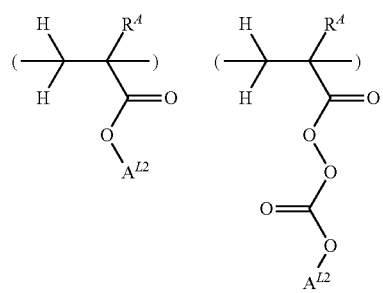
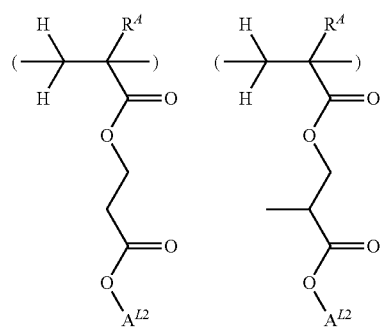
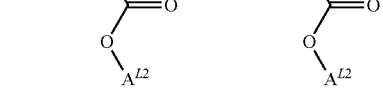
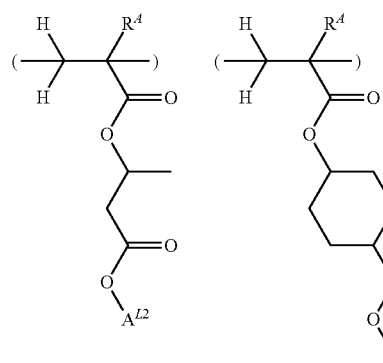
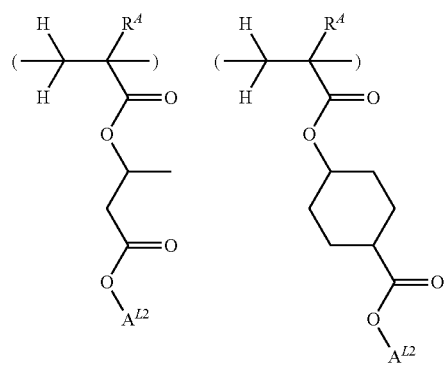

-continued

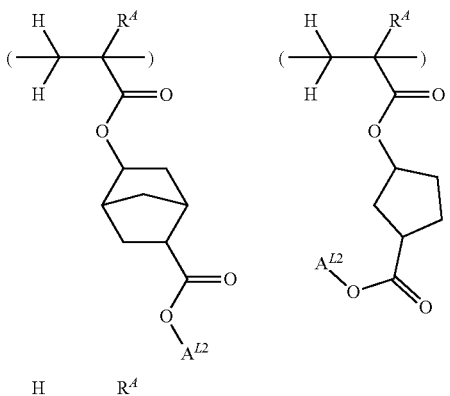
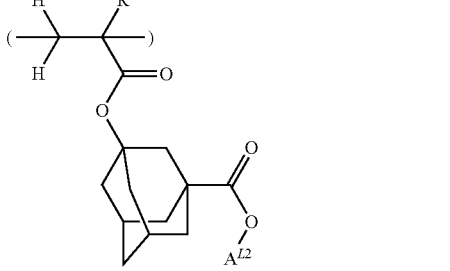
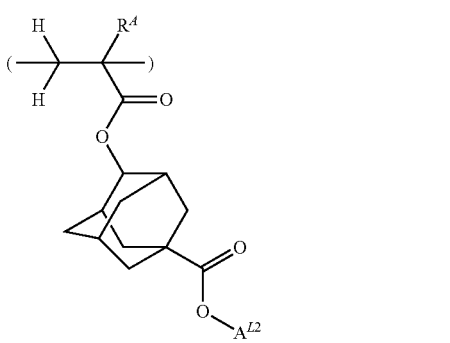
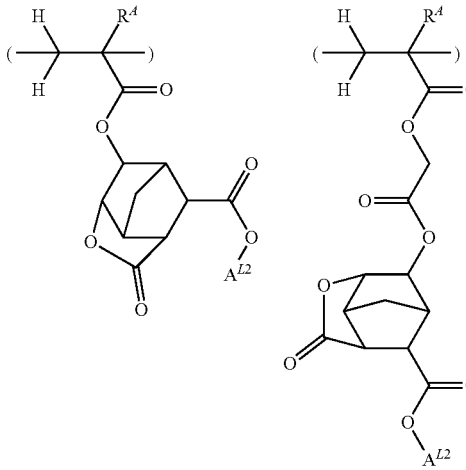

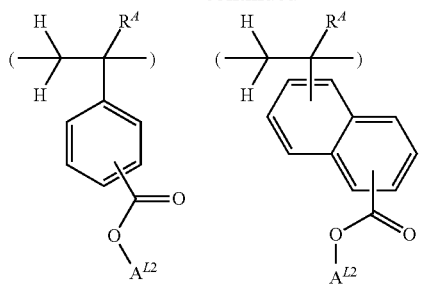
Examples of the recurring unit (d2) are shown below, but not limited thereto. $R^A$ and $A^{L3}$ are as defined above.
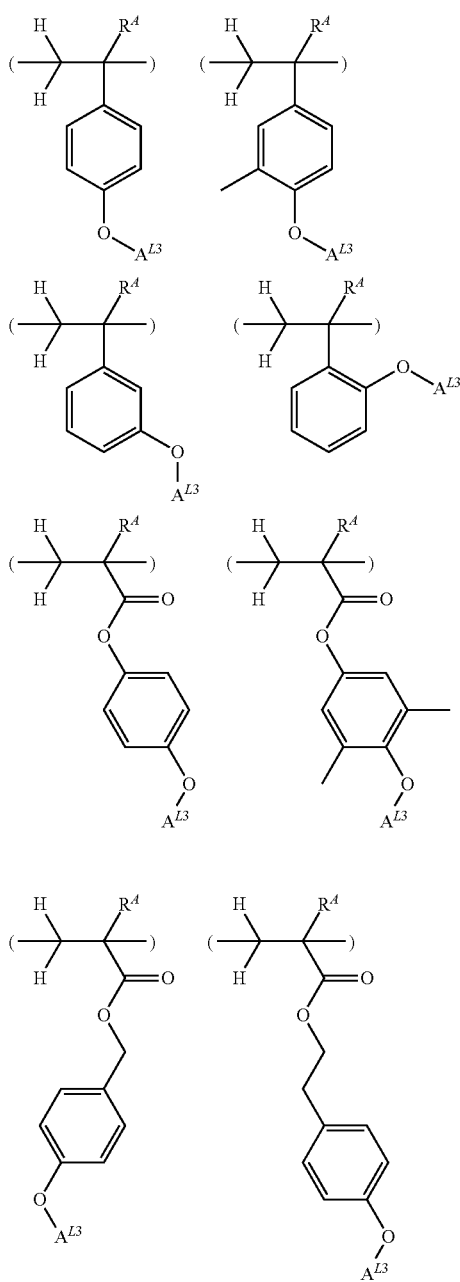
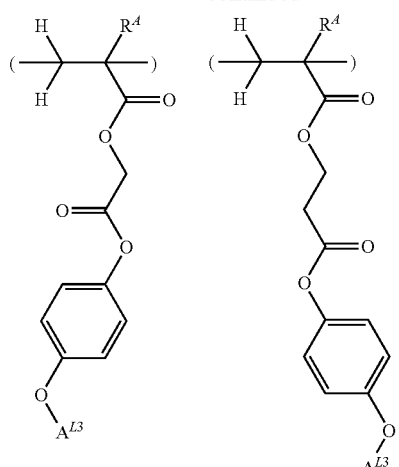
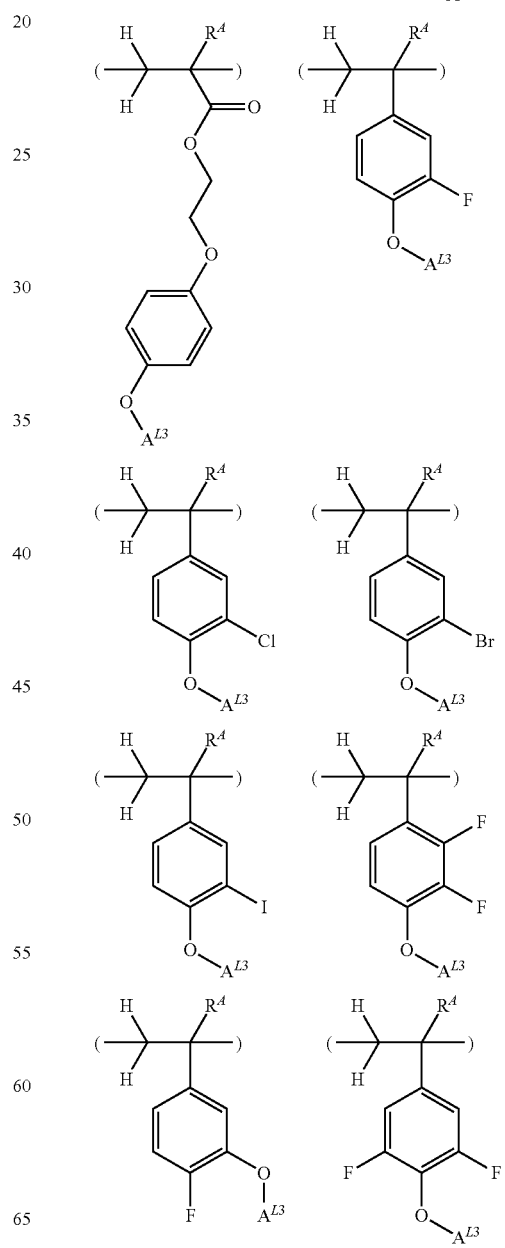

-continued

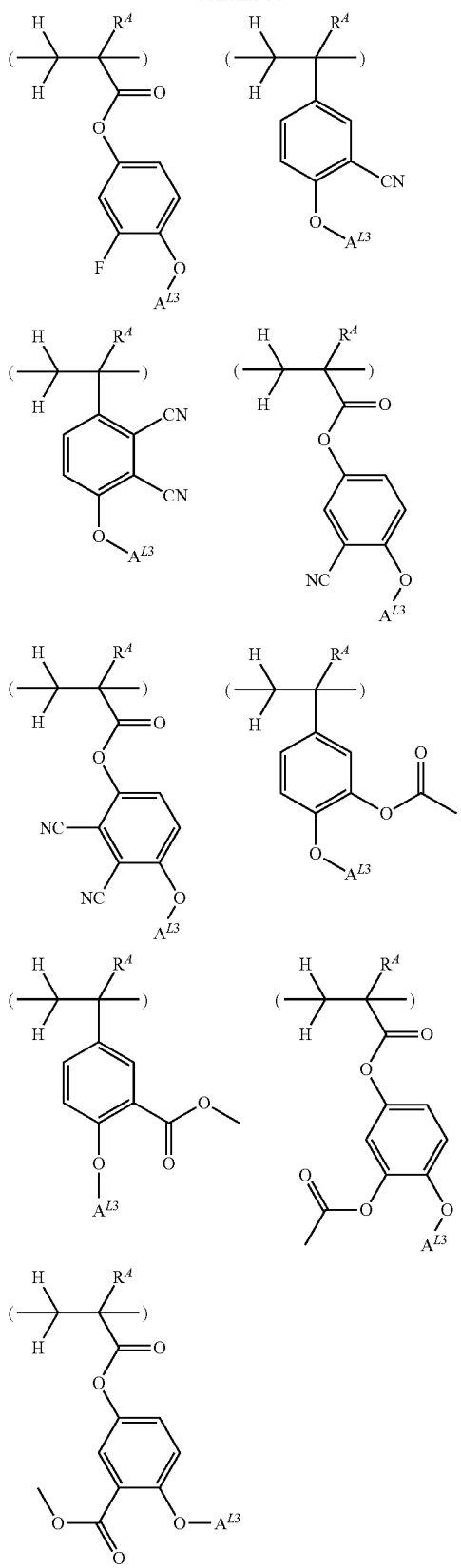

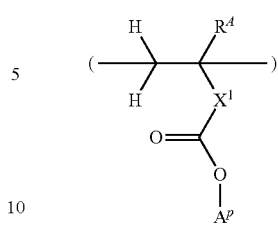

Herein $R^A$ and $X^1$ are as defined above. $A^P$ is hydrogen or a polar group containing at least one structure selected from the group consisting of hydroxyl (other than phenolic hydroxyl), cyano, carbonyl, carboxyl, ether bond, ester bond, sulfonic acid ester bond, carbonate bond, lactone ring, sultone ring, and carboxylic anhydride.

Examples of the recurring unit (e) are shown below, but not limited thereto. $R^A$ is as defined above.

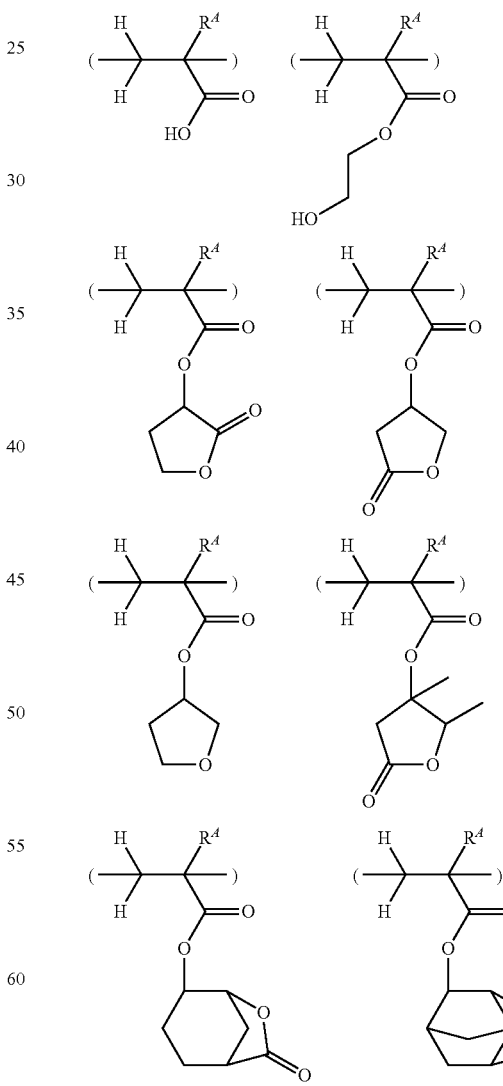

The polymer may further comprise recurring units having the formula (e), referred to as recurring units (e).

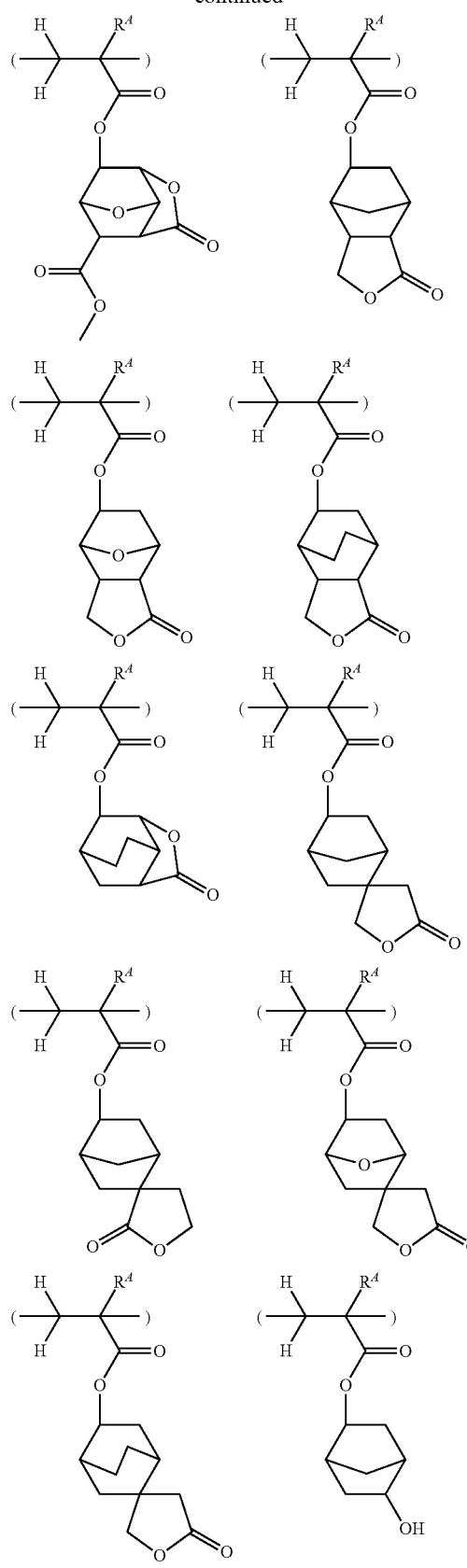
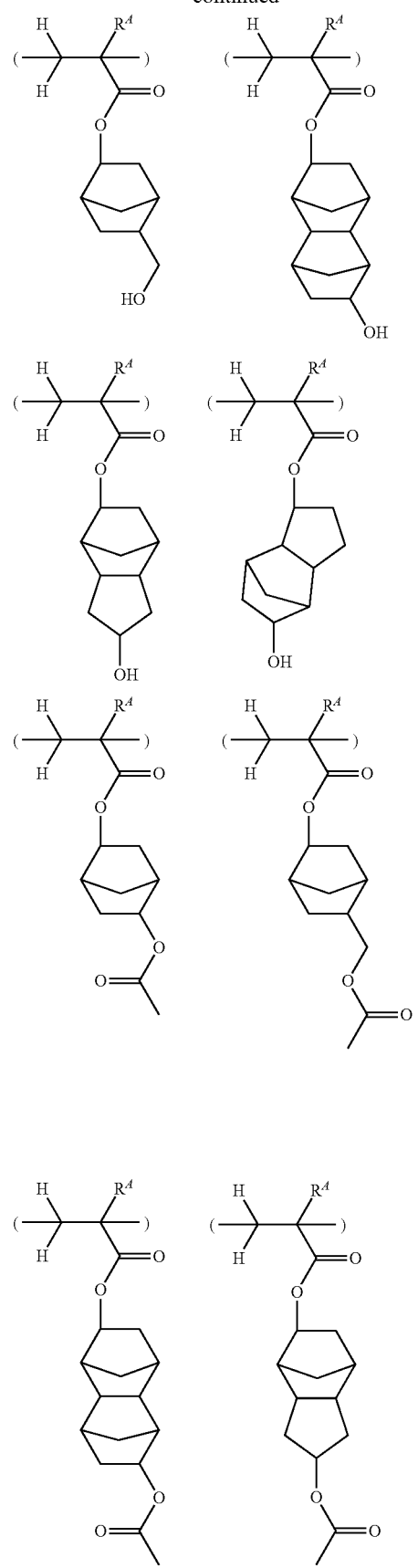

-continued
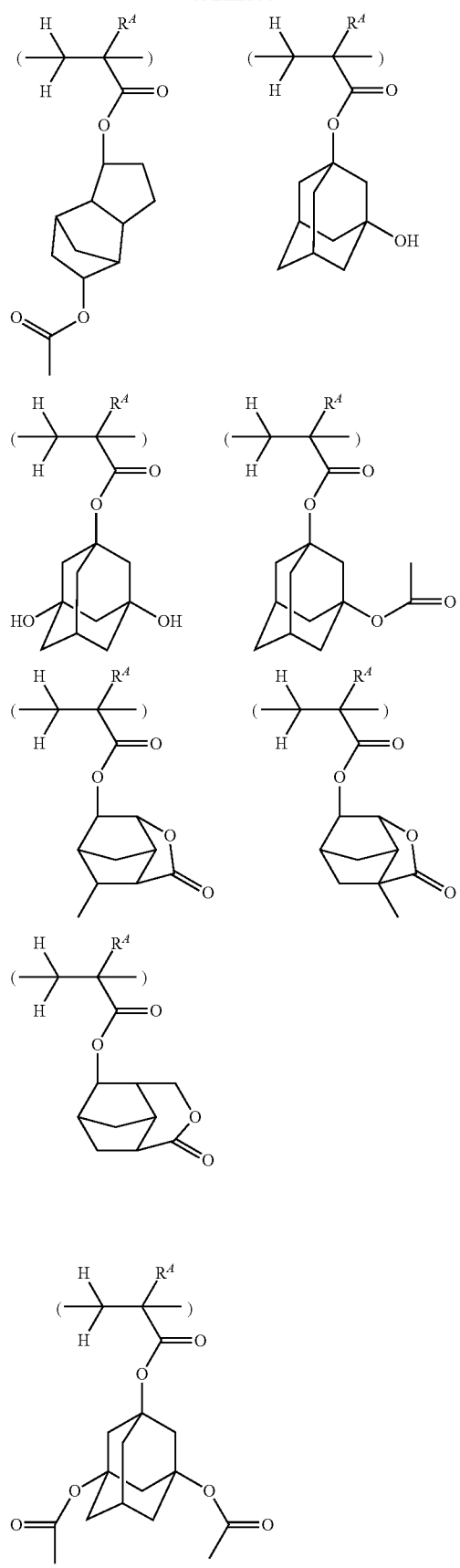
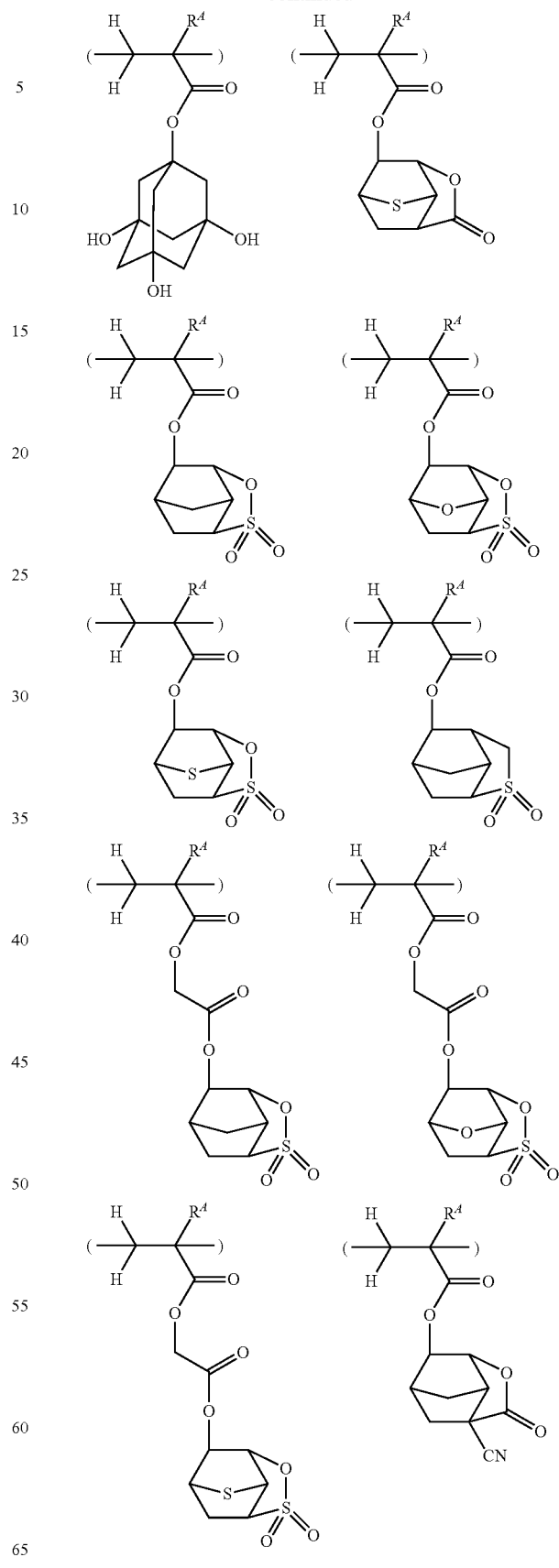

147
-continued
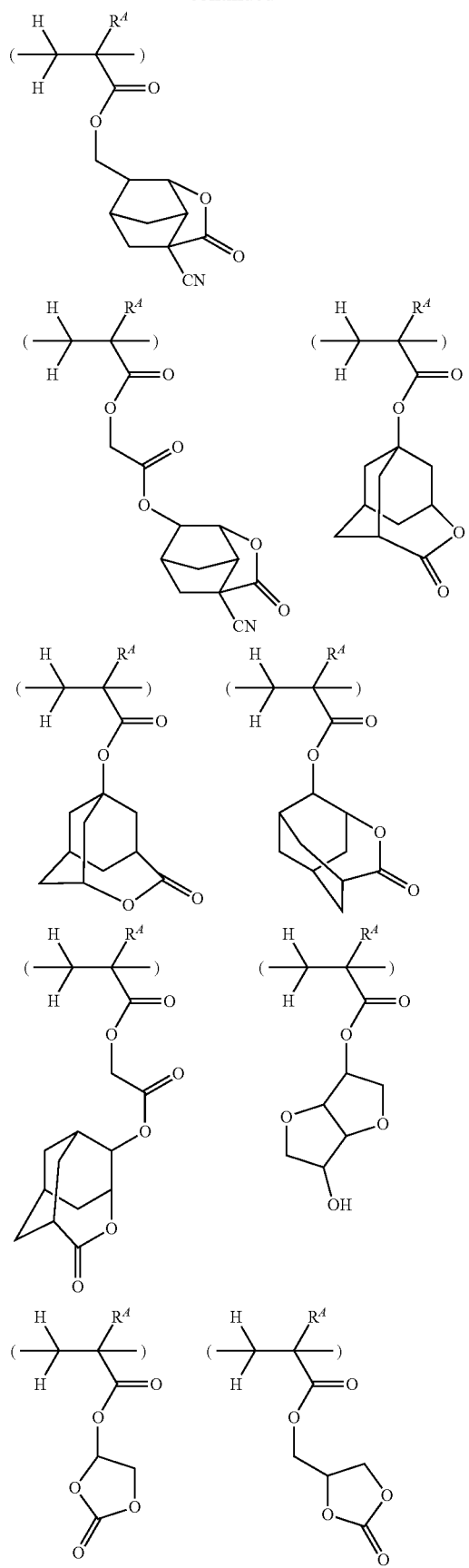
148
-continued
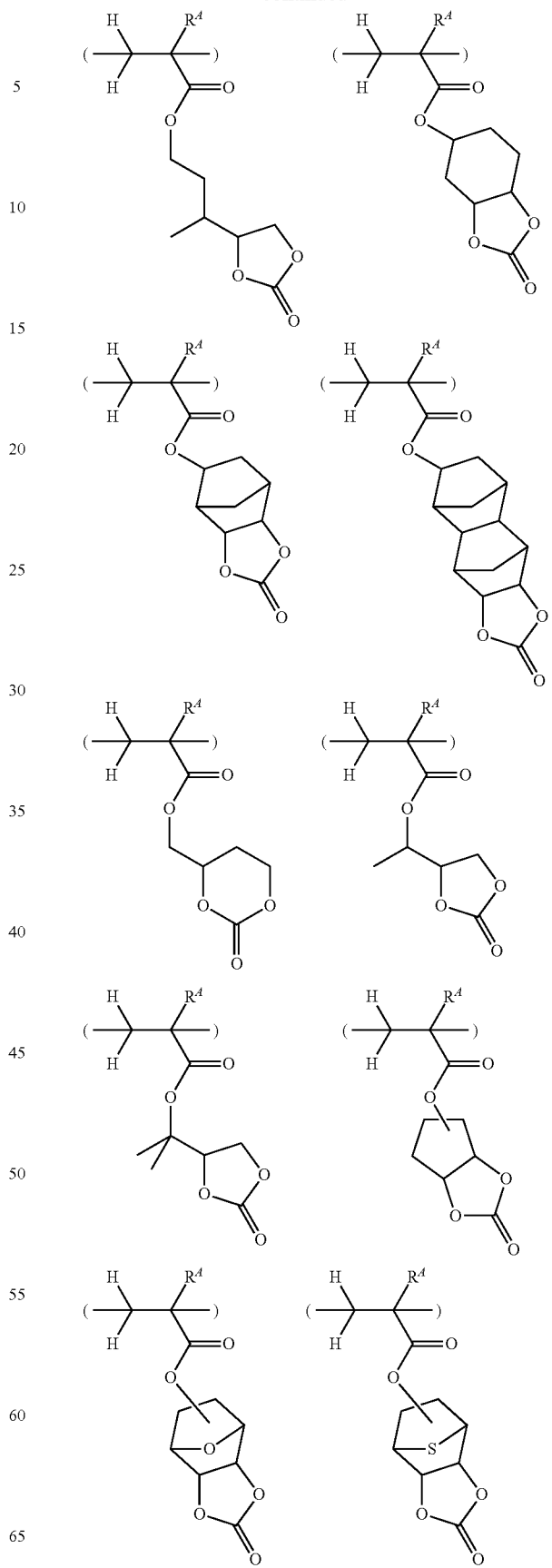

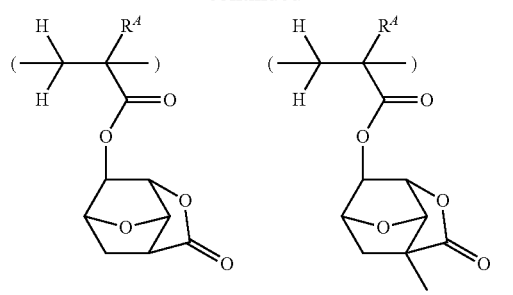
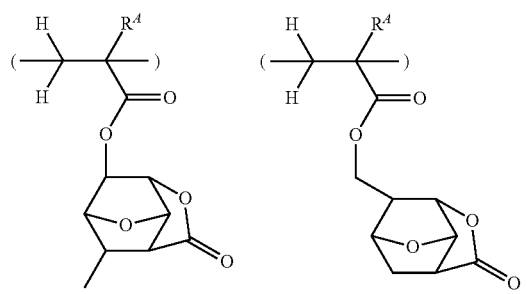
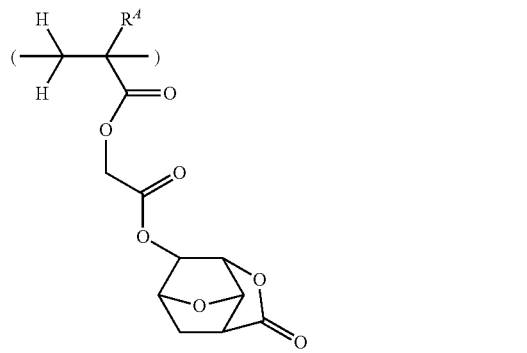
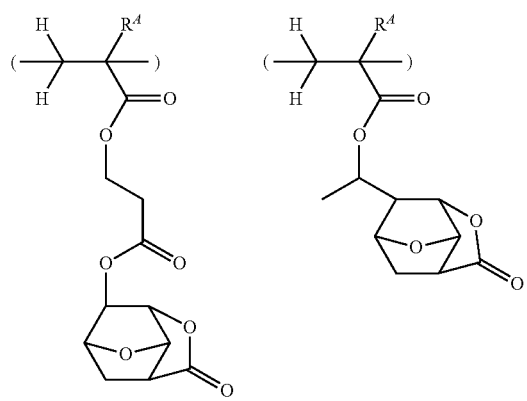
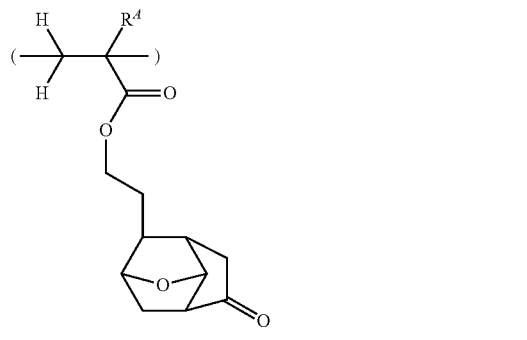
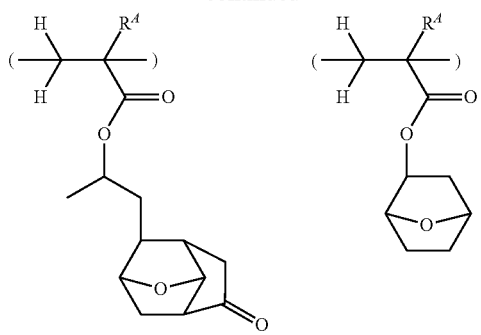
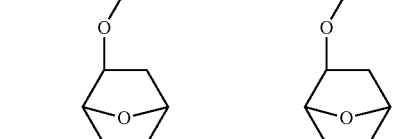
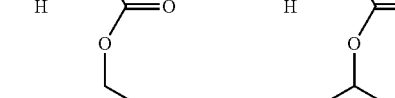
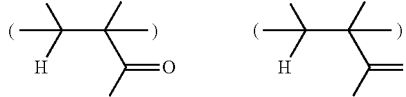
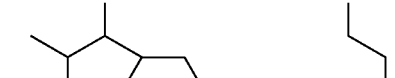
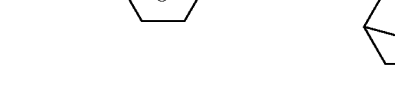

151
-continued
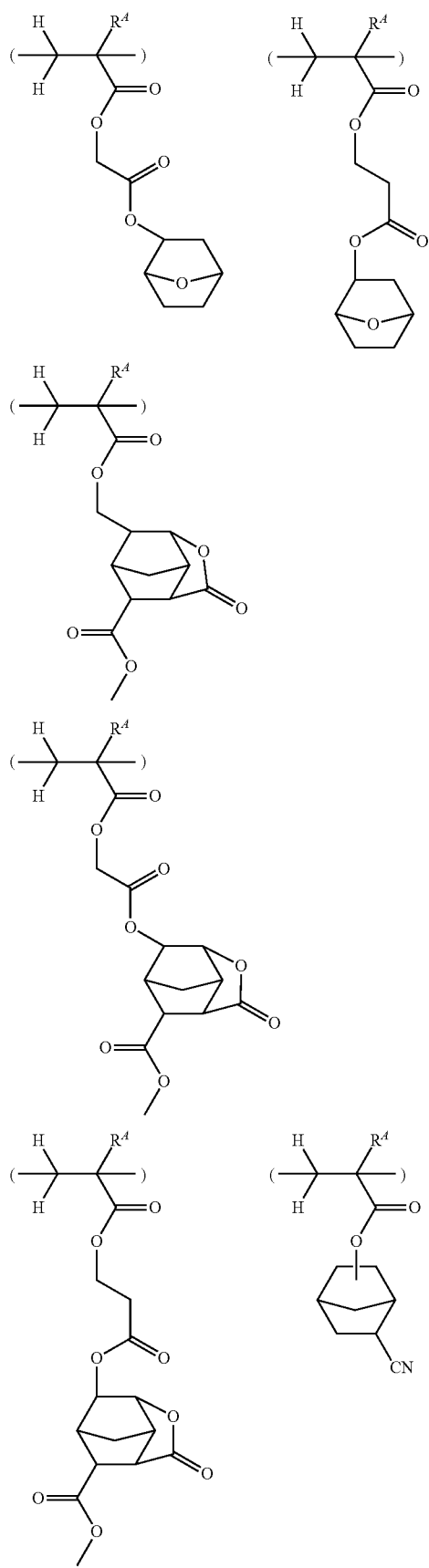
152
-continued
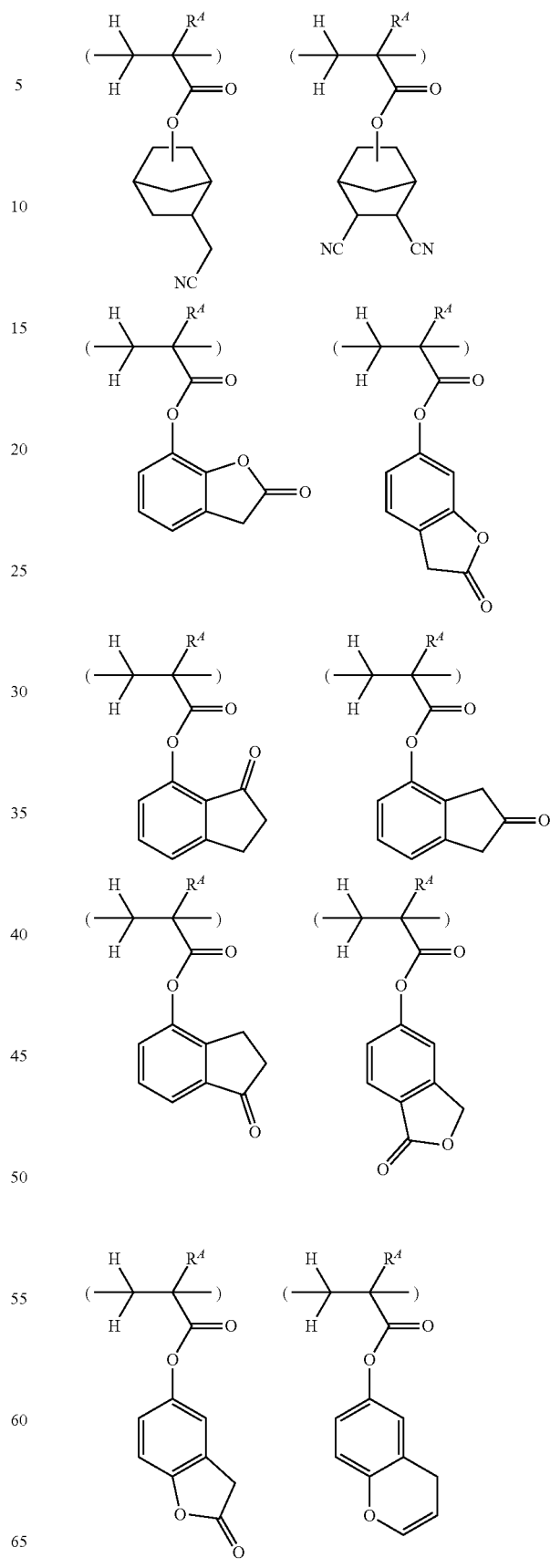

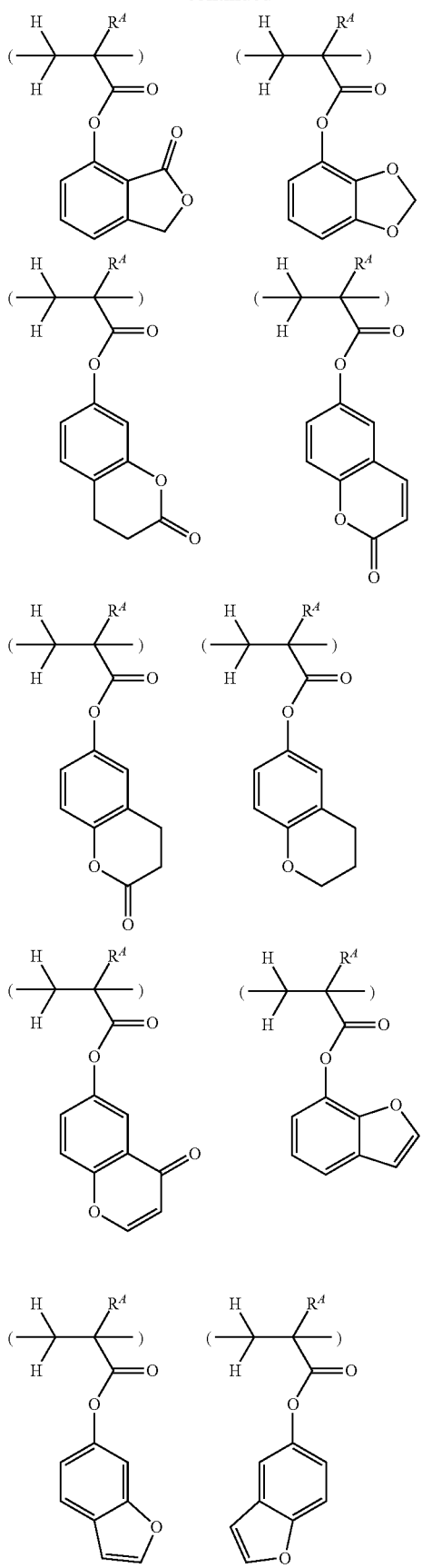
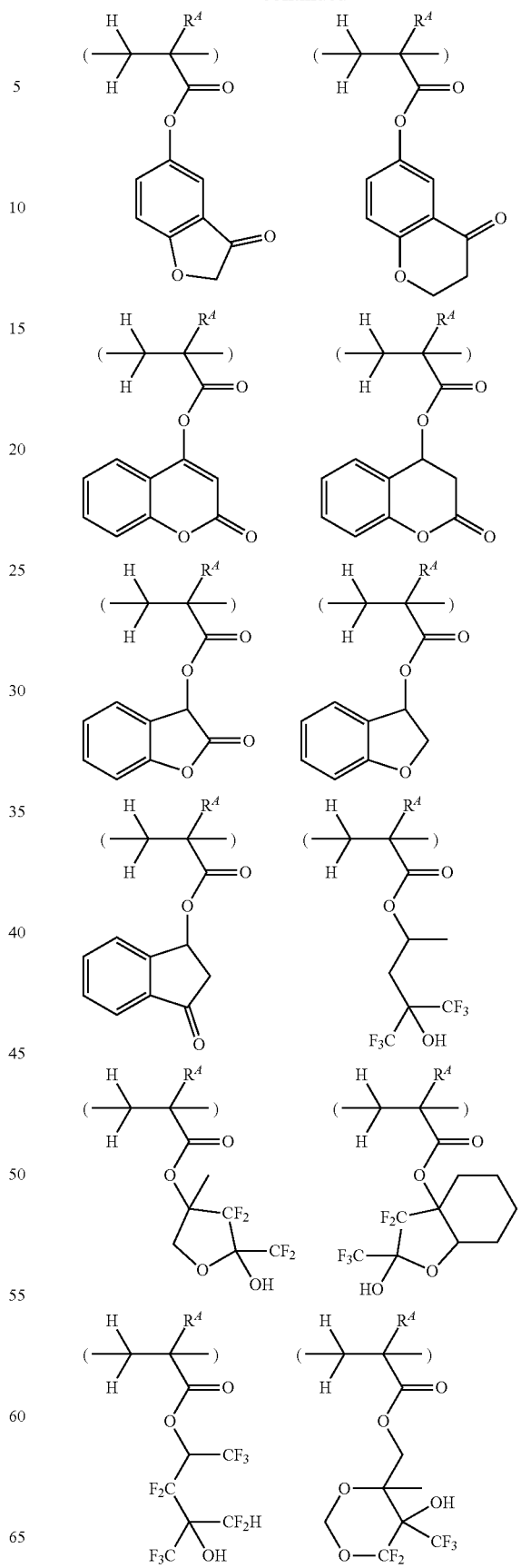

155
-continued
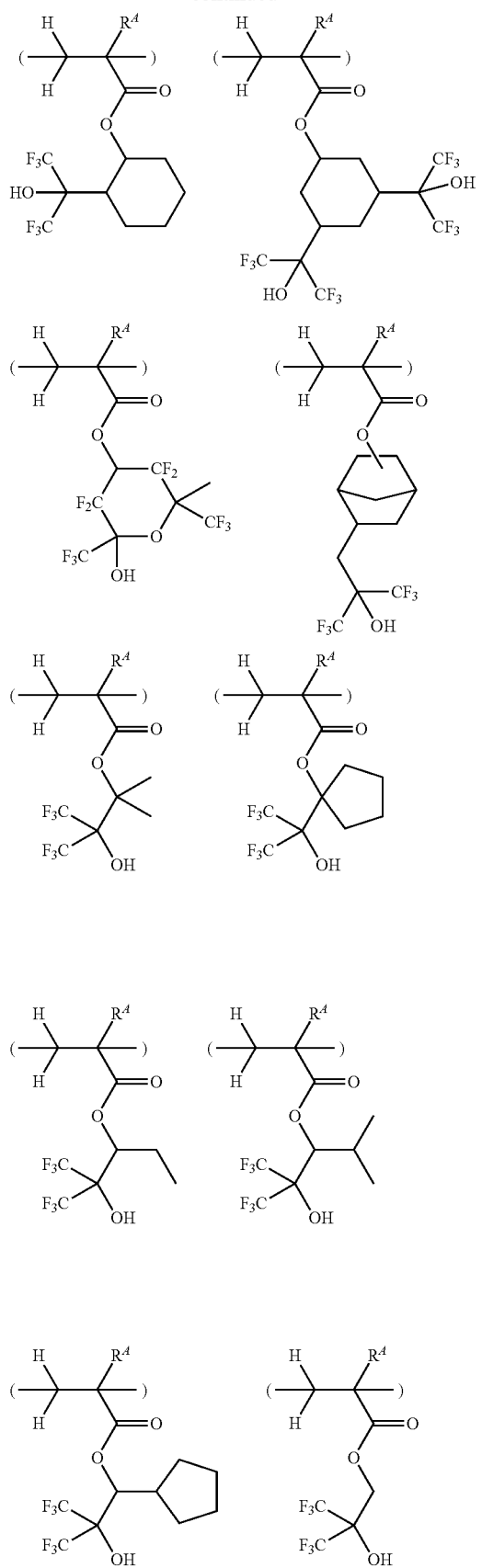
156
-continued
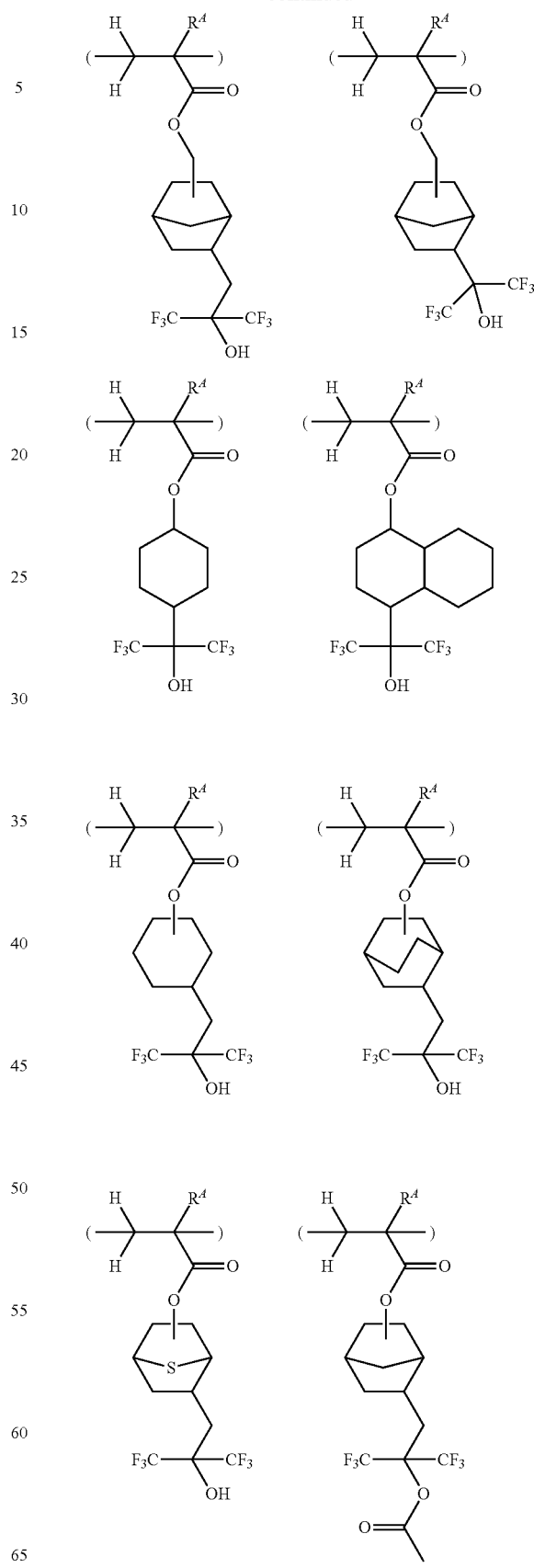

-continued
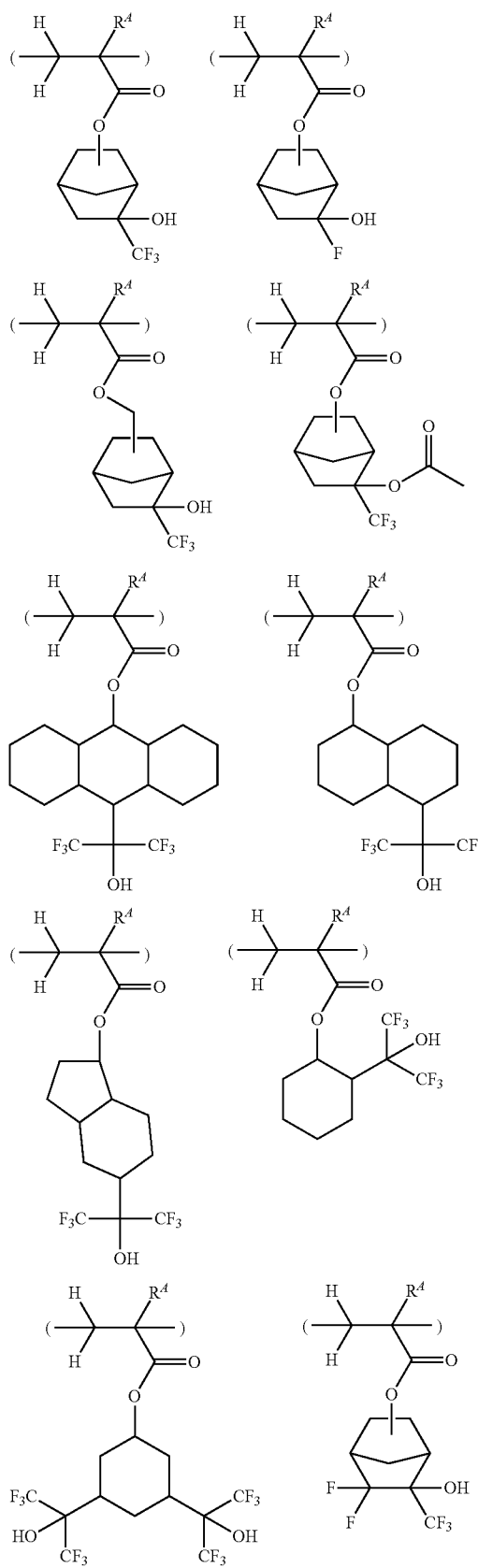
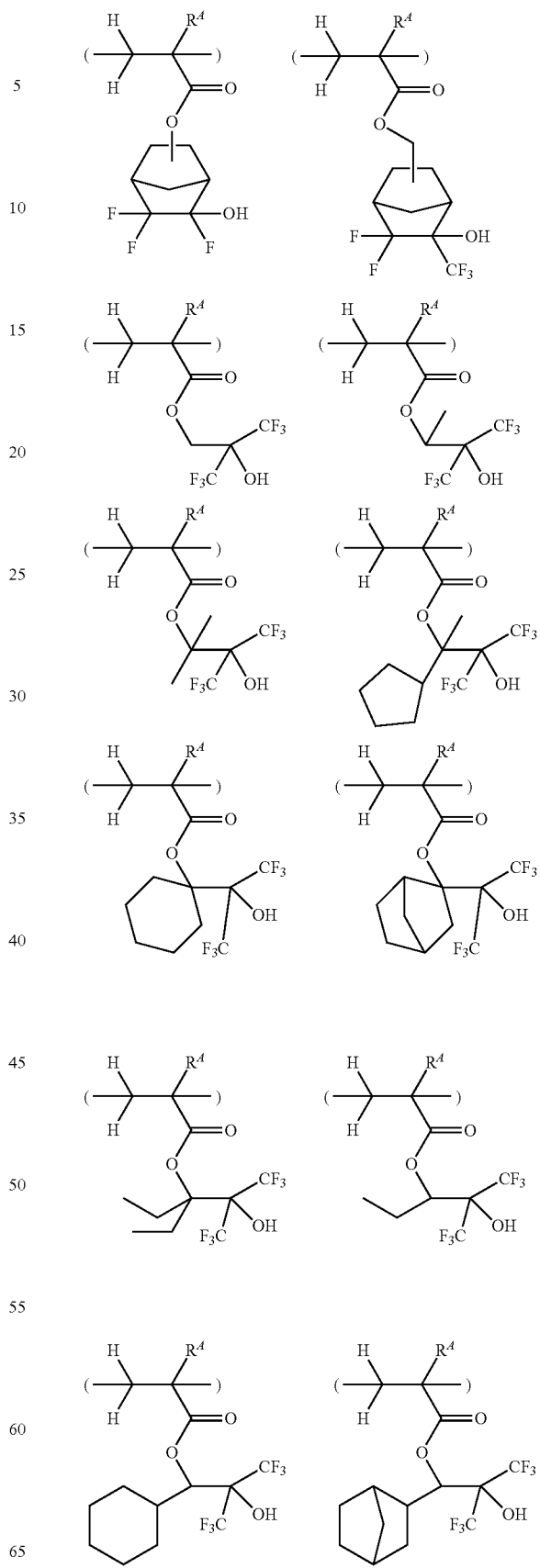

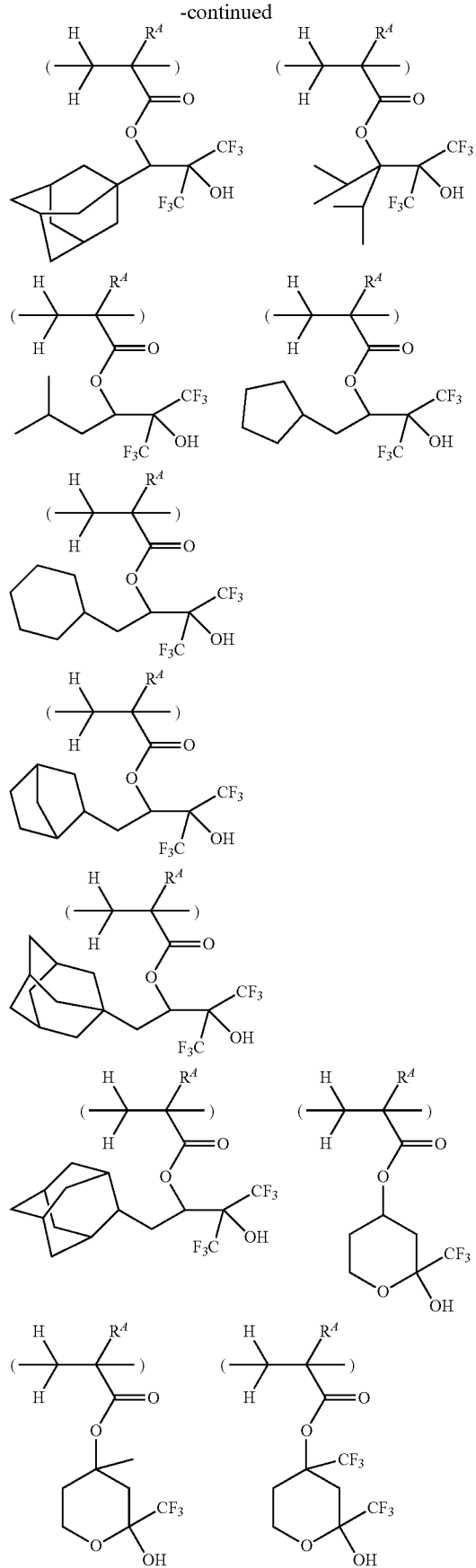
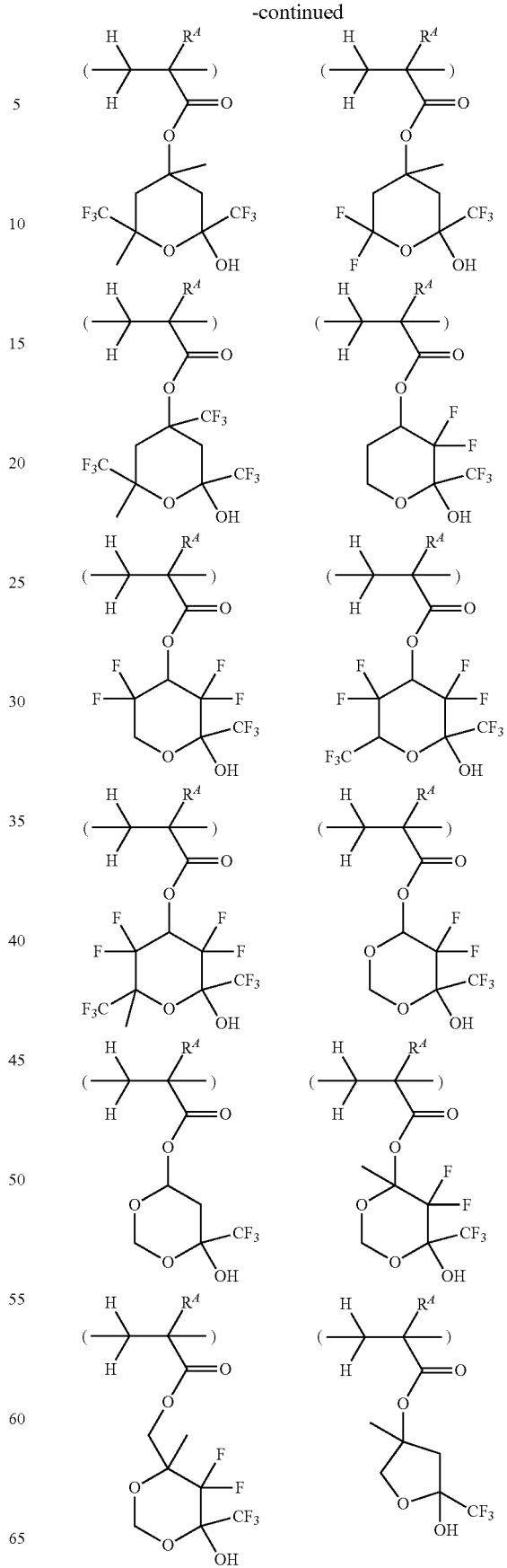

161
-continued
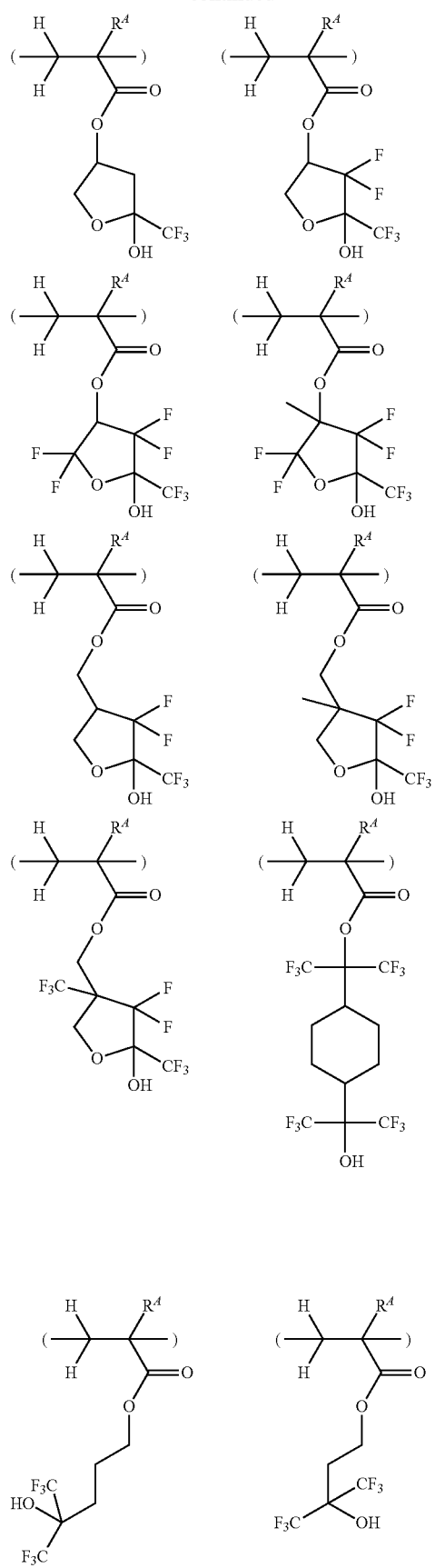
162
-continued
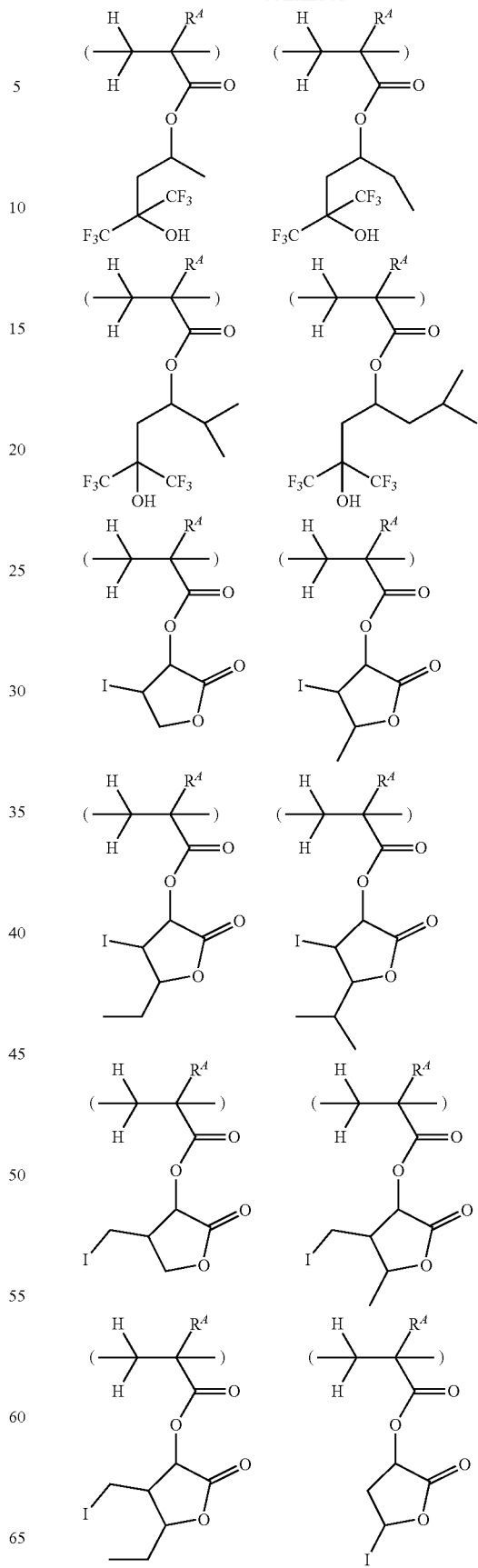

-continued

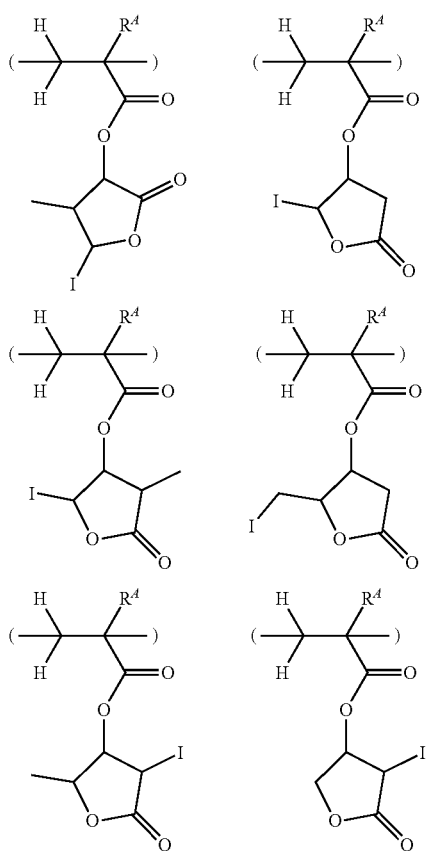

The polymer may further comprise recurring units (f) derived from indene, benzofuran, benzothiophene, acenaphthylene, chromone, coumarin, and norbornadiene, or derivatives thereof. Examples of suitable monomers from which recurring units (f) are derived are given below, but not limited thereto.

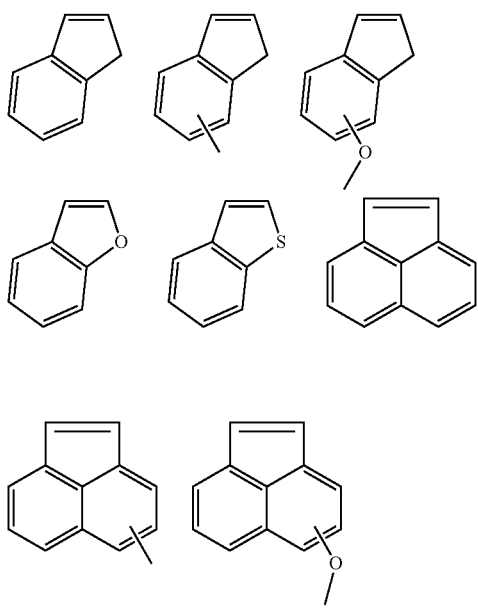

-continued

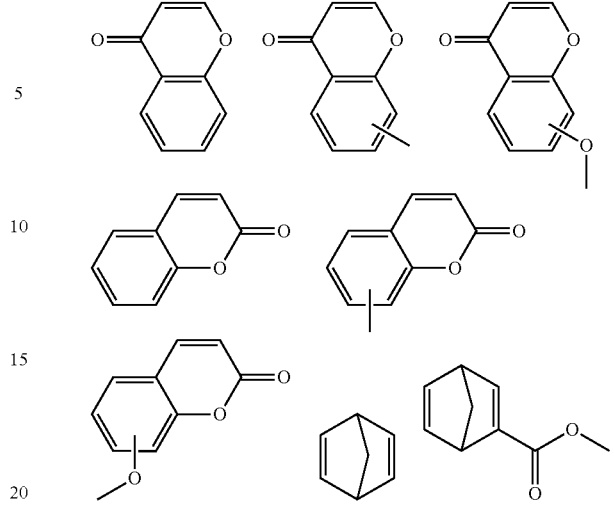

The polymer may further comprise recurring units (g) derived from indane, vinylpyridine or vinylcarbazole.

While the polymer comprises reclining units (a), (b), (c), (d1), (d2), (e), (f) and (g), a fraction of units is: preferably $0<a<1.0$, $0<b<1,0$, $0<c<1.0$, $0\le d1\le 0.8$, $0\le d2\le 0.8$, $0\le e\le 0.8$, $0\le f\le 0.8$, and $0\le g\le 0.4$;

more preferably $0.05\le a\le 0.9$, $0.09\le b\le 0.55$, $0.01\le c\le 0.4$, $0\le d1\le 0.7$, $0\le d2\le 0.7$, $0\le d1+d2\le 0.7$, $0\le e\le 0.7$, $0\le f\le 0.7$, and $0\le g\le 0.3$;

even more preferably $0.1\le a\le 0.8$, $0.1\le b\le 0.45$, $0\le d1\le 0.6$, $0\le d2\le 0.6$, $0\le d1+d2\le 0.4$, $0\le e\le 0.6$, $0\le f\le 0.6$, and $0\le g\le 0.2$. Notably, $c=c1+c2+c3$, meaning that unit (c) is a least one of units (c1) to (c3) and $a+b+c+d1+d2+e+f+g=1.0$.

The polymer should preferably have a weight average molecular weight (Mw) int the range of 1,000 to 500,000, and more preferably 3.000 to 100,000, as measured by GPC versus polystyrene standards using tetrahydrofitran (THF) or N,N-dimethylformamide (DMF) solvent. A polymer having the range of Mw provides sufficient etching resistance and eliminates the risk of resolution lowering from a failure to establish a difference in dissolution rate before and after exposure.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influence of Mw/Mn becomes stronger as the pattern rule becomes finer. Therefore, the polymer should preferably have a narrow dispersity (Mw/Mn) of 1.0 to 2.0 in order to provide a resist composition suitable for micropatterning to a small feature size.

The polymer may be synthesized by any desired methods, for example, by dissolving monomers corresponding to the foregoing recurring units in an organic solvent, adding a radical polymerization initiator thereto, and heating for polymerization. Examples of the organic solvent which can be used for polymerization include toluene, benzene, tetrahydrofuran (THF), diethyl ether, dioxane, cyclohexane, cyclopentane, methyl ethyl ketone (MEK), propylene glycol monomethyl ether acetate (PGMEA), and γ-butyrolactone (GBL). Examples of the polymerization initiator used herein include 2,2'-azobisisobutyronitrile (AIBN), 2,2'-azobis(2,4-dimethylvaleronitrile), dimethyl 2,2-azobis(2-methylpropionate), 1,1-azobis(1-acetoxy-1-phenylethane), benzoyl peroxide, and lauroyl peroxide. The initiator is preferably added in an amount of 0.01 to 25 mol % based on the total of monomers. Preferably, the polymerization temperature is 50 to 150° C., more preferably 60 to 100° C., and the reaction time is 2 to 24 hours, more preferably 2 to 12 hours, in view of production efficiency.

The polymerization initiator may be fed to the reactor either by adding the initiator to the monomer solution and feeding the solution to the reactor, or by dissolving the initiator in a solvent to form an initiator solution and feeding the initiator solution and the monomer solution independently to the reactor. Because of a possibility that in the standby duration, the initiator generates a radical which triggers polymerization reaction to form a ultra-high-molecular-weight polymer, it is preferred from the standpoint of quality control, to prepare the monomer solution and the initiator solution separately and add them dropwise. The acid labile group that has been incorporated in the monomer may be kept as such, or polymerization may be followed by protection or partial protection. During the polymer synthesis, any known chain transfer agent such as dodecyl mercaptan or 2-mercaptoethanol may be added for molecular weight control purpose. The amount of chain transfer agent added is preferably 0.01 to 20 mol % based on the total of monomers.

Where a monomer having a hydroxyl group is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, one method is by dissolving hydroxystyrene or hydroxyvinylnaphthalene and other monomers in an organic solvent, adding a radical polymerization initiator thereto, and heating the solution for polymerization. In an alternative method, acetoxystyrene or acetoxyvinylnaphthalene is used instead, and after polymerization, the acetoxy group is deprotected by alkaline hydrolysis, for thereby converting the polymer product to polyhydroxystyrene or polyhydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The amounts of monomers in the monomer solution may be determined appropriate so as to provide the preferred fractions of recurring units.

It is now described how to use the polymer obtained by the above preparation method. The reaction solution resulting from polymerization reaction may be used as the final product. Alternatively, the polymer may be recovered in powder form through a purifying step such as re-precipitation step of adding the reaction solution to a poor solvent and letting the polymer precipitate as powder, after which the polymer powder is used as the final product. It is preferred from the standpoints of operation efficiency and consistent quality to handle a polymer solution which is obtained by dissolving the powder polymer resulting from the purifying step in a solvent, as the final product. The solvents which can be used herein are described in JP-A 2008-111103, paragraphs [0144]-[0145] (U.S. Pat. No. 7,537,880). Exemplary solvents include ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone (GBL); and high-boiling alcohols such as diethylene glycol, propylene glycol, glycerol, 1,4-butanediol, and 1,3-butanediol, which may be used alone or in admixture.

The polymer solution preferably has a polymer concentration of 0.01 to 30% by weight, more preferably 0.1 to 20% by weight.

Prior to use, the reaction solution or polymer solution is preferably filtered through a filter. Filtration is effective for consistent quality because foreign particles and gel which can cause defects are removed.

Suitable materials of which the filter is made include fluorocarbon, cellulose, nylon, polyester, and hydrocarbon base materials. Preferred for the filtration of a resist composition are filters made of fluorocarbons commonly known as Teflon®, hydrocarbons such as polyethylene and polypropylene, and nylon. While the pore size of the filter may be selected appropriate to comply with the desired cleanness, the filter preferably has a pore size of up to 100 nm, more preferably up to 20 nm. A single filter may be used or a plurality of filters may be used in combination. Although the filtering method may be single pass of the solution, preferably the filtering step is repeated by flowing the solution in a circulating manner. In the polymer preparation process, the filtering step may be carried out any times, in any order and in any stage. The reaction solution as polymerized or the polymer solution may be filtered, preferably both are filtered.

The polymer component may be a blend of two or more polymers which differ in compositional ratio, Mw or Mw/Mn.

Chemically Amplified Resist Composition

Another embodiment of the invention is a chemically amplified resist composition comprising (A) the polymer defined herein as a base polymer, and optionally (B) an organic solvent. If necessary, the resist composition may farther comprise (C) a photoacid generator, (D) a quencher, (E) a surfactant which is insoluble or substantially insoluble in water and soluble in an alkaline developer and/or a surfactant which is insoluble or substantially insoluble in water and an alkaline developer, and (F) another component.

(B) Organic Solvent

The organic solvent used as component (B) is not particularly limited as long as the foregoing and other components are soluble therein. Suitable solvents include ketones such as cyclopentanone, cyclohexanone, and methyl-2-n-pentyl ketone; alcohols such as 3-methoxybutanol, 3-methyl-3-methoxybutanol, 1-methoxy-2-propanol, and 1-ethoxy-2-propanol; keto-alcohols such as diacetone alcohol (DAA), ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate butyl acetate, methyl 3-methoxypropionate, ethyl 3-ethoxypropionate tert-butyl acetate, tert-butyl propionate, and propylene glycol mono-tert-butyl ether acetate; and lactones such as γ-butyrolactone (GBL), and mixtures thereof. When a polymer containing an acid labile group of acetal form is used, a high-boiling alcohol solvent may be added for accelerating the deprotection reaction of acetal, for example, diethylene glycol, propylene glycol, glycerol, 1,4-butanediol or 1,3-butanediol.

Of the foregoing organic solvents, it is recommended to use 1-ethoxy-2-propanol, PGMEA, cyclohexanone, GBL, DAA and mixtures thereof because the base polymer (A) is most soluble therein.

The organic solvent is preferably added in an amount of 200 to 5,000 parts by weight, and more preferably 400 to 3,000 parts by weight per 80 parts by weight of the base polymer.

(C) Photoacid Generator

The chemically amplified resist composition may comprise (C) a photoacid generator. The PAG is not particularly limited as long as it is capable of generating an acid upon exposure to high-energy radiation. The preferred PAG is a sulfonium salt having the formula (1).

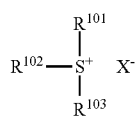

(1)

In formula (1), $R^{101}$, $R^{102}$ and $R^{103}$ are each independently a $C_1$-$C_{20}$ hydrocarbyl group which may contain a heteroatom. Any two of $R^{101}$, $R^{102}$ and $R^{103}$ may bond together to form a ring with the sulfur atom to which they are attached. The hydrocarbyl group may be saturated or unsaturated and straight, branched or cyclic. Examples thereof are as exemplified above for $R^{31}$ to $R^{35}$ in formulae (c4) and (c5). Examples of the cation in the sulfonium salt of formula (1) are as exemplified above for the sulfonium cation having formula (c4).

In formula (1), $X^-$ is an anion selected from the formulae (1A) to (1D).

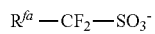

(1A)

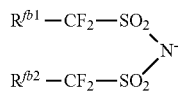

(1B)

(1C)

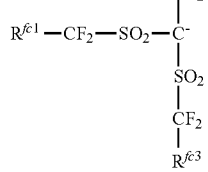

(1D)

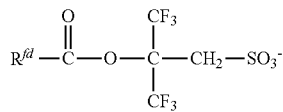

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for $R^{105}$ in formula (1A').

Of the anions having formula (1A), anions having the formula (1A') are preferred.

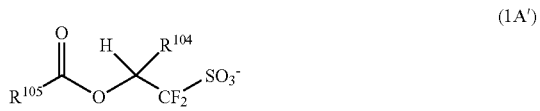

(1A')

In formula (1A'), $R^{104}$ is hydrogen or trifluoromethyl, preferably trifluoromethyl.

$R^{105}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The hydrocarbyl group $R^{105}$ may be saturated or unsaturated and straight, branched or cyclic. Examples thereof include alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, and icosanyl; cyclic saturated hydrocarbyl groups such as cyclopentyl, cyclohexyl, 1-adamantyl, 2-adamantly, 1-adamantylmethyl, norbornyl, norbornylmethyl, tricyclodecanyl, tetracyclododecanyl, tetracyclododecanylmethyl, and dicyclohexylmethyl; unsaturated aliphatic hydrocarbyl groups such as allyl and 3-cyclohexertyl; aryl groups such as phenyl, 1-naphthyl and 2-naphthyl; and aralkyl groups such as benzyl and diphenylmethyl. Of these, aliphatic groups are preferred as $R^{105}$. In the foregoing groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety. Examples of the heteroatom-containing hydrocarbyl group include tetrahydrofturyl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl, With respect to the synthesis of the sulfonium salt having an anion of formula (1A'), reference may be made to JP-A 2007-145797, JP-A 2008-106045, JP-A 12009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

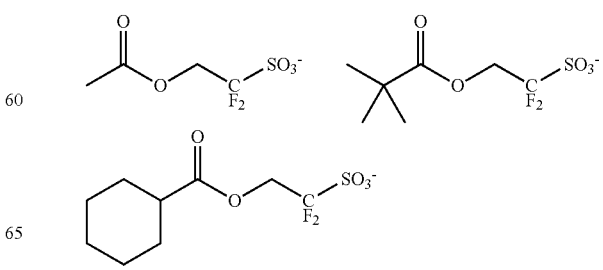

-continued
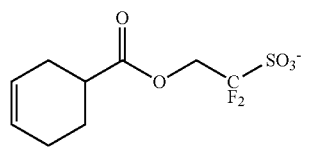
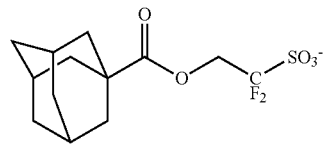
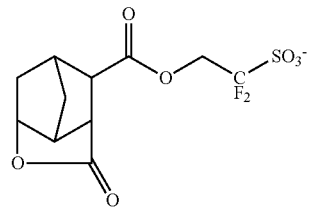
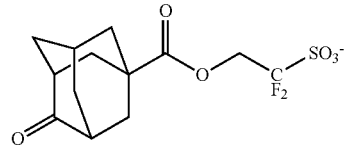
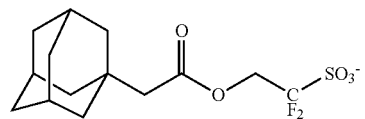
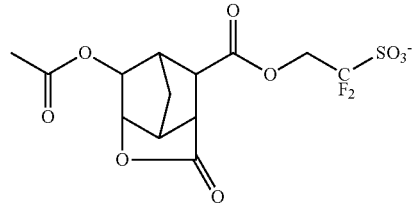
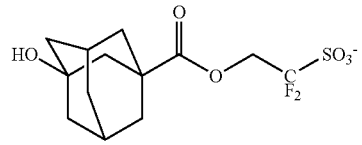
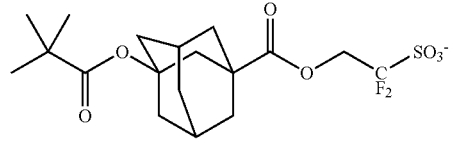
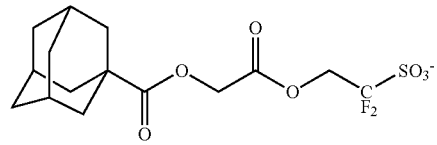
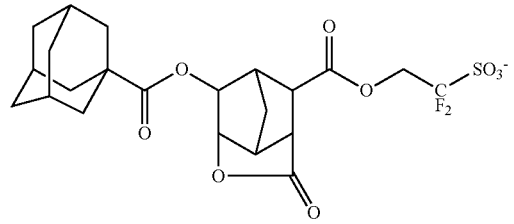
-continued
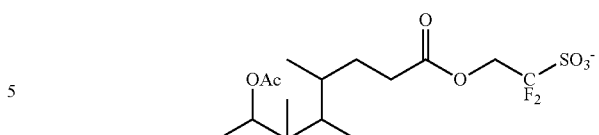
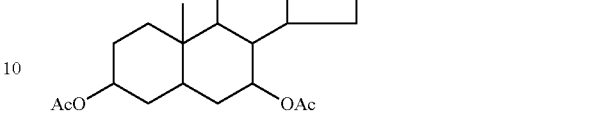
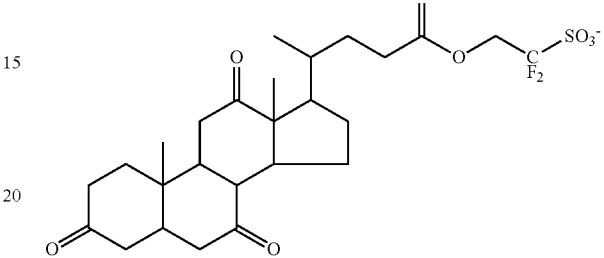
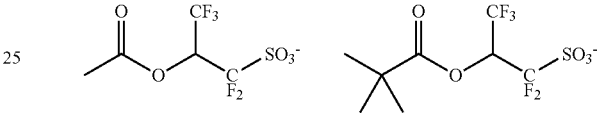
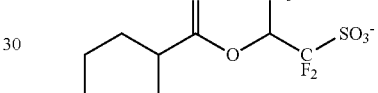
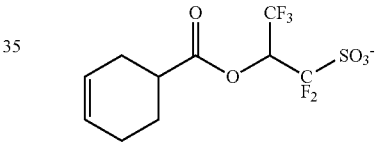
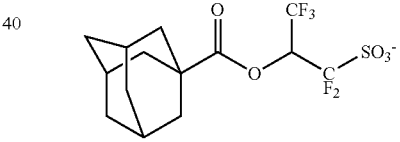
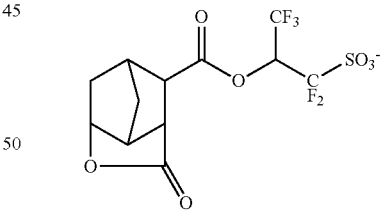
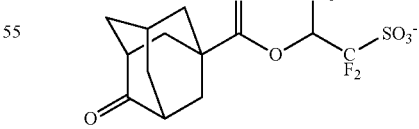
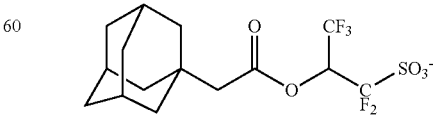

-continued

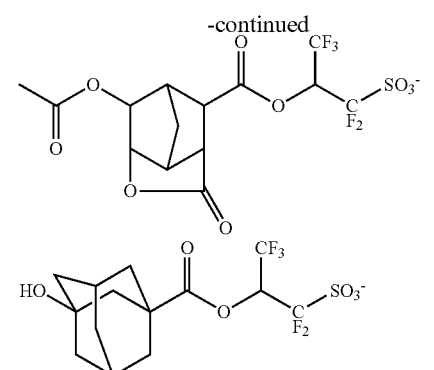
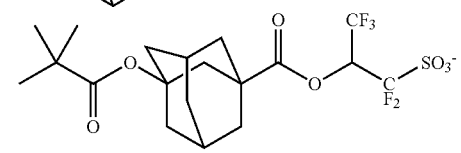
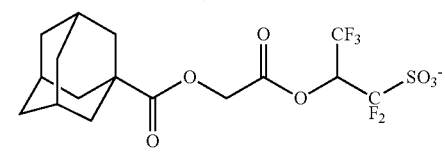
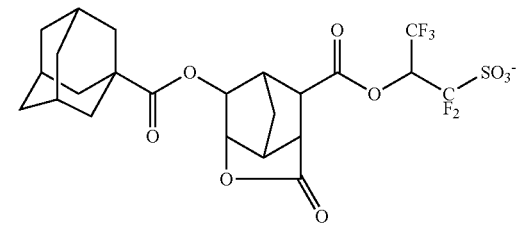
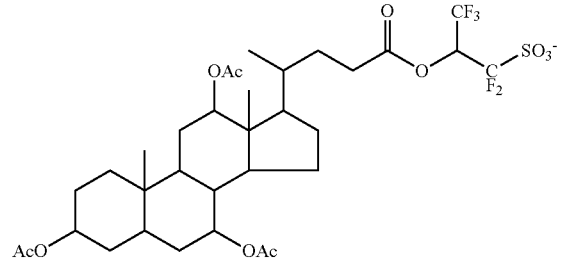
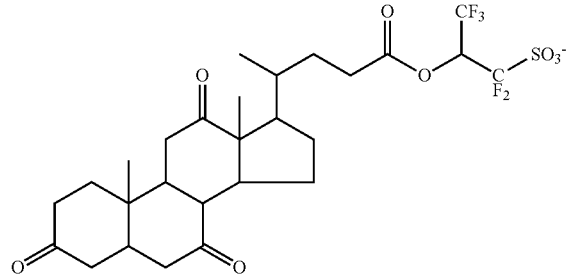

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified above for $R^{105}$ in formula (1A'). Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—$N^-$—$SO_2$—$CF_2$— to which they are attached. It is preferred that a combination of $R^{fb1}$ and $R^{fb2}$ be a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for $R^{105}$. Preferably $R^{fc1}$, $R^{fc2}$ and $R^{fc3}$ are fluorine or $C_1$-$C_4$ straight fluorinated alkyl groups. Also, $R^{fc1}$, $R^{fc2}$ and $R^{fc3}$ may bond together to form a ring with the linkage: —$CF_2$—$SO_2$—$C^-$—$SO_2$—$CF_2$— to which they are attached. It is preferred that a combination of $R^{fc1}$ and $R^{fc2}$ be a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic. Examples thereof are as exemplified above for $R^{105}$.

With respect to the synthesis of the sulfonium salt having an anion of formula (1D), reference may be made to JP-A 2010-215608 and JP-A 2014-133723.

Examples of the anion having formula (1D) are shown below, but not limited thereto.

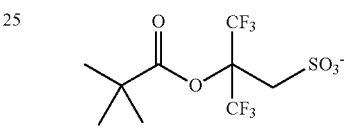
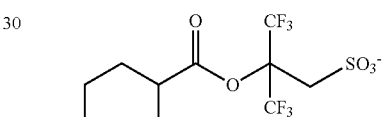
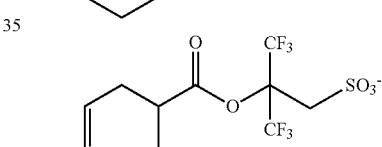
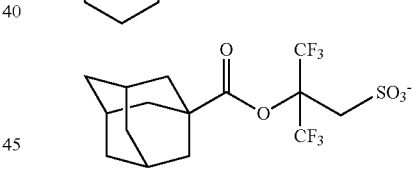
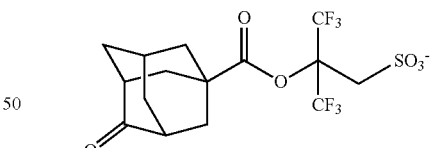
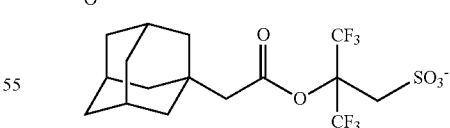
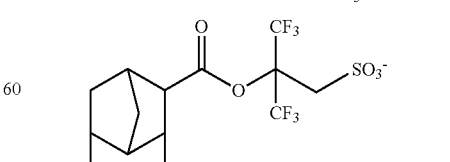
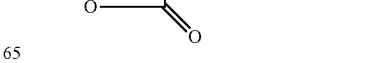

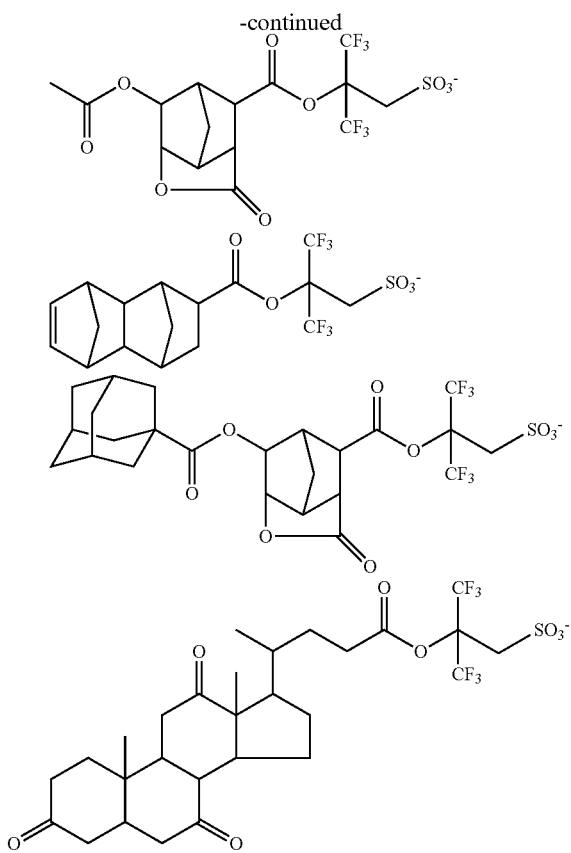

Notably, the compound having the anion of formula (1D) does not have fluorine at the α-position relative to the sulfo group, but two trifluoromethyl groups at the β-position. For this reason, it has a sufficient acidity to sever the acid labile groups in the base polymer. Thus the compound is an effective PAG.

Also a compound having the formula (2) is preferred as the PAG (C).

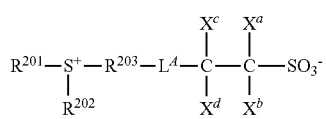 (2)

In formula (2), $R^{201}$ and $R^{202}$ are each independently a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Examples of the ring are as exemplified above as the ring that $R^{31}$ and $R^{32}$, taken together, form with the sulfur atom in formula (c4).

The hydrocarbyl groups $R^{201}$ and $R^{202}$ may be saturated or unsaturated and straight, branched or cyclic. Examples thereof include alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2.6}$]decanyl, and adamantyl; and aryl groups such as phenyl, naphthyl and anthracenyl. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety.

The hydrocarbylene group $R^{203}$ may be saturated or unsaturated and straight, branched or cyclic. Examples thereof include alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl hexadecane-1,16-diyl, and heptadecane-1,17-diyl; cyclic saturated hydrocarbylene groups such as cyclopentanediyl, cyclohexanediyl, norboraanediyl and adamantmediyl; and arylene groups such as, phenylene, methylphenylene, ethylphenylene, n-propylphenylene, isopropylphenylene, n-butylphenylene, isobutylphenylene, sec-butylphenylene, tert-butylphenylene, naphthylene, methylphphthylene, ethylnaphthylene, n-propylnaphthylene, isopropyluaphthylene, n-butylnaphthylene, isobutylnaphthylene, sec-butylnaphthylene, and tert-butylnaphthylene. To these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety. Of the heteroatoms, oxygen is preferred.

In formula (2), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for the hydrocarbylene group $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

Of the PAGs having formula (2), those having formula(2') are preferred.

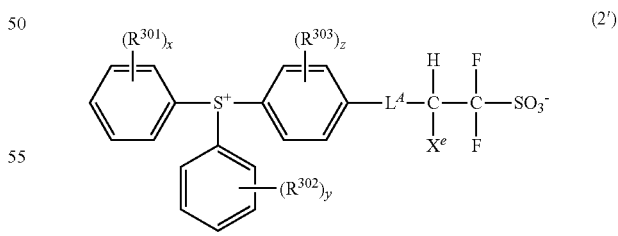 (2')

In formula (2'), $L^A$ is as defined above. $X^e$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{105}$. The subscripts x and y are each independently an integer of 0 to 5, and z is an integer of 0 to 4.

Examples of the PAG having formula (2) include those described as the PAG having formula (2) in JP-A 2017-026980.

Of the foregoing PACs, those having an anion of formula (1A') or (1D) are especially preferred because of reduced acid diffusion and high solubility in the resist solvent. Also those having an anion of formula (2') are especially preferred because of extremely reduced acid diffusion.

Also onium salts having the formulae (3-1) and (3-2) may be used as the PAG.

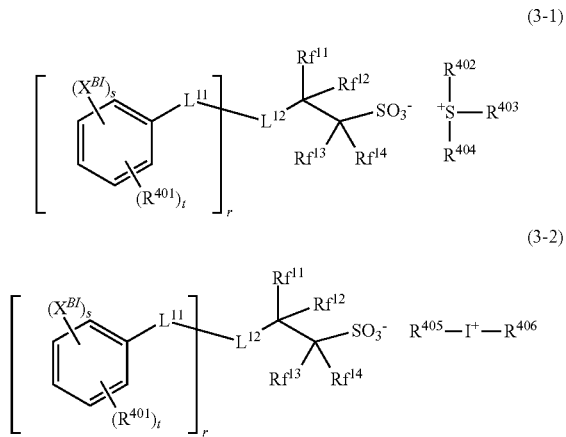

In formulae (3-1) and (3-2), r is an integer of 1 to 3, s is an integer of 1 to 5, t is to an integer of 0 to 3, and 1≤s+t≤5. Preferably, s is an integer of 1 to 3, more preferably 2 or 3, and t is an integer of 0 to 2.

$X^{BI}$ is iodine or bromine, and may be identical or different when s is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when r=1, or a $C_1$-$C_{20}$ tri- or tetravalent linking group when r=2 or 3. The linking group may contain an oxygen, sulfur or nitrogen atom.

In formulae (3-1) and (3-2). $R^{401}$ is hydroxyl, carboxyl, fluorine, chlorine, bromine, amino group, or a $C_1$-$C_{20}$ saturated hydrocarbyl, $C_1$-$C_{20}$ saturated hydrocarbyloxy, $C_2$-$C_{10}$ saturated hydrocarbyloxycarbonyl, $C_2$-$C_{20}$ saturated hydrocarbylcarbonyloxy, or $C_1$-$C_{20}$ saturated hydrocarbylsulfonyloxy group, which may contain fluorine, chlorine, bromine, hydroxyl, amino or ether bond, or —$NR^{401A}$—C(=O)—$R^{401B}$ or —$NR^{401A}$—C(=O)—O—$R^{401B}$. $R^{401A}$ is hydrogen, or a $C_1$-$C_6$ saturated hydrocarbyl group which may contain halogen, hydroxy, $C_1$-$C_6$ saturated hydrocarbyloxy. $C_2$-$C_6$ saturated hydrocarbylcarbonyl or $C_2$-$C_6$ saturated hydrocarbylcarbonyloxy moiety. $R^{401B}$ is a $C_1$-$C_{16}$ aliphatic hydrocarbyl group or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be identical or different when t is 2 or 3.

Of these, $R^{401}$ is preferably hydroxyl, —$NR^{401A}$—C(=O)—$R^{401B}$, —$NR^{401A}$—C(=O)—O—$R^{401B}$, fluorine, chlorine, bromine, methyl or methoxy.

$Rf^1$ to $Rf^4$ are each independently hydrogen, fluorine or trifluoromethyl, at least one of $Rf^1$ to $Rf^4$ is fluorine or trifluoromethyl. $Rf^1$ and $Rf^2$, taken together, may form a carbonyl group. More preferably, both $Rf^3$ and $Rf^4$ are fluorine.

$R^{402}$, $R^{403}$, $R^{404}$, $R^{405}$ and $R^{406}$ are each independently a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl groups, $C_3$-$C_{20}$ cycloalkyl groups, $C_2$-$C_{12}$ alkenyl groups, $C_2$-$C_{12}$ alkynyl groups, $C_6$-$C_{20}$ aryl groups, and $C_7$-$C_{12}$ aralkyl groups. In these groups, some or all hydrogen may be substituted by a hydroxyl, carboxyl, halogen, cyano, nitro, mercapto, sultone, sulfone or sulfonium salt-containing moiety, or some carbon may be replaced by an ether bond, ester bond, carbonyl, amide bond, carbonate or sulfonic acid ester bond. Any two of $R^{402}$, $R^{403}$ and $R^{404}$ may bond together to form a ring with the sulfur atom to which they are attached. Examples of the ring are as exemplified above as the ring that $R_{101}$ and $R^{102}$, taken together, form with the sulfur atom in formula (1).

Examples of the cation in the sulfonium salt having formula (3-1) are as exemplified above as the sulfonium cation having formula (c4). Examples of the cation in the iodonium salt having formula (3-2) are as exemplified above as the iodonium cation having formula (c5).

Examples of the anion in the onium salts having formulae (3-1) and (3-2) include those exemplified as the anion in the onium salts having formula (3-1) and (3-2) in JP-A 2018-197853, and analogous anions wherein iodine is replaced by bromine.

When used, the PAG (C) is preferably added in an amount of 0.1 to 40 parts, and more preferably 0.5 to 20 parts by weight per 80 parts by weight of the base polymer (A). As long as the amount of the PAG is in the range, good resolution is achievable and the risk of foreign particles being formed after development or during stripping of resist film is avoided. The PAG may be used alone or in admixture.

(D) Quencher

The resist composition may further comprise (D) a quencher or acid diffusion regulator. As used herein, the quencher refers to a compound capable of trapping the acid generated by the PAG in the resist composition to prevent the acid from diffusing to the unexposed region, for thereby forming the desired pattern.

Onium salts having the formulae (4-1) and (4-2) are useful as the quencher (D).

In formula (4-1), $R^{q1}$ is hydrogen or a $C_1$-$C_{40}$ hydrocarbyl group which may contain a heteroatom, exclusive of the hydrocarbyl group in which the hydrogen atom bonded to the carbon atom at α-position of the sulfone group is substituted by fluorine, or fluoroalkyl. In formula (4-2). $R^{q2}$ is hydrogen or a $C_1$-$C_{40}$ hydrocarbyl group which may contain a heteroatom.

Examples of the hydrocarbyl group $R^{q1}$ include alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; cyclic saturated hydrocarbyl groups such as cyclopentyl, cycklexyl, cyclopentyhnethyl, cyclopentylethyl, cyclopentylbutyl, cyclohexylmethyl, cyclohexylethyl, cyclohexylbutyl, norbornyl tricycle [5.2.1.0$^{2,6}$]decanyl, and adamantyl; and aryl groups such as phenyl, naphthyl and anthracenyl. In these groups, some or all hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety.

Examples of the hydrocarbyl group $R^{q2}$ include those exemplified above for $R^{q1}$ and fluoroalkyl groups such as trifluoromethyl and trifluoroethyl, and fluorinated aryl groups such as pentafluorophenyl and 4-trifluoromethylphenyl.

Examples of the anion in the onium sail having formula (4-1) are shown below, but not limited thereto.

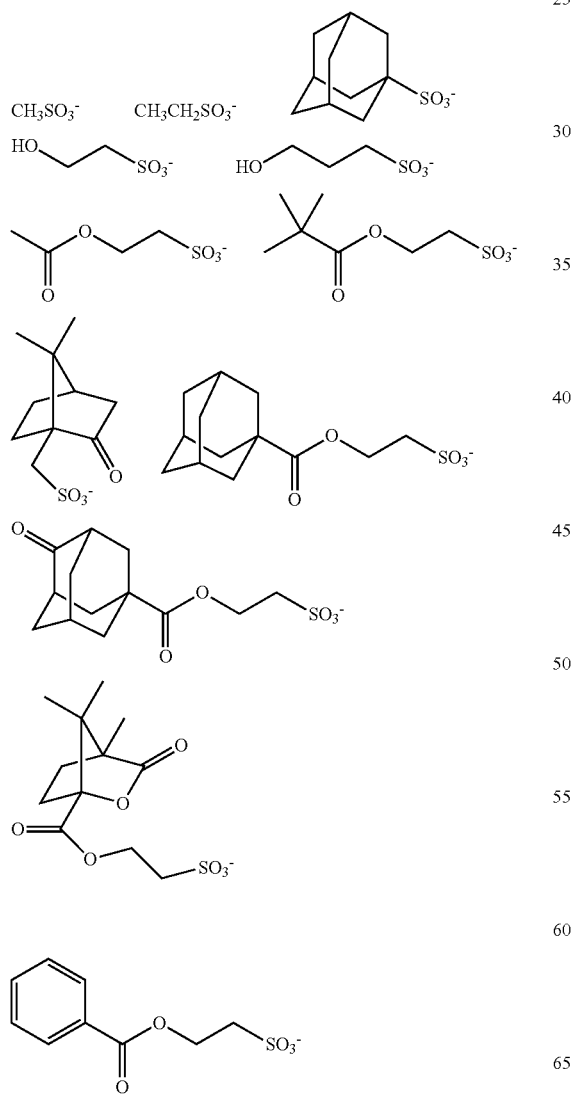

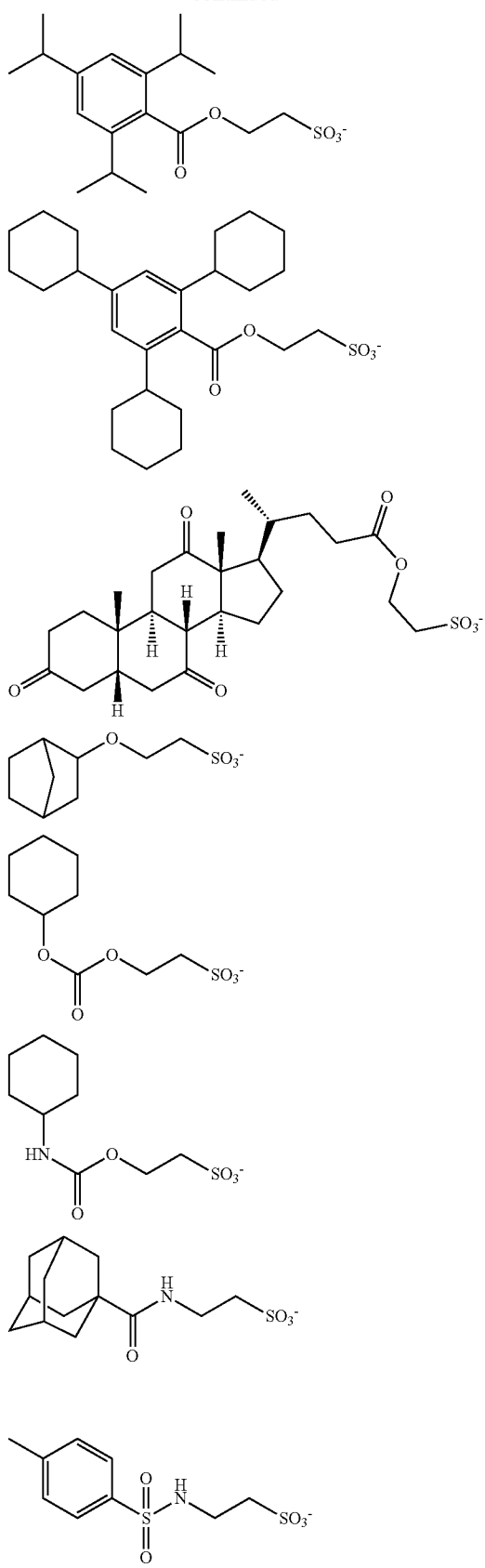

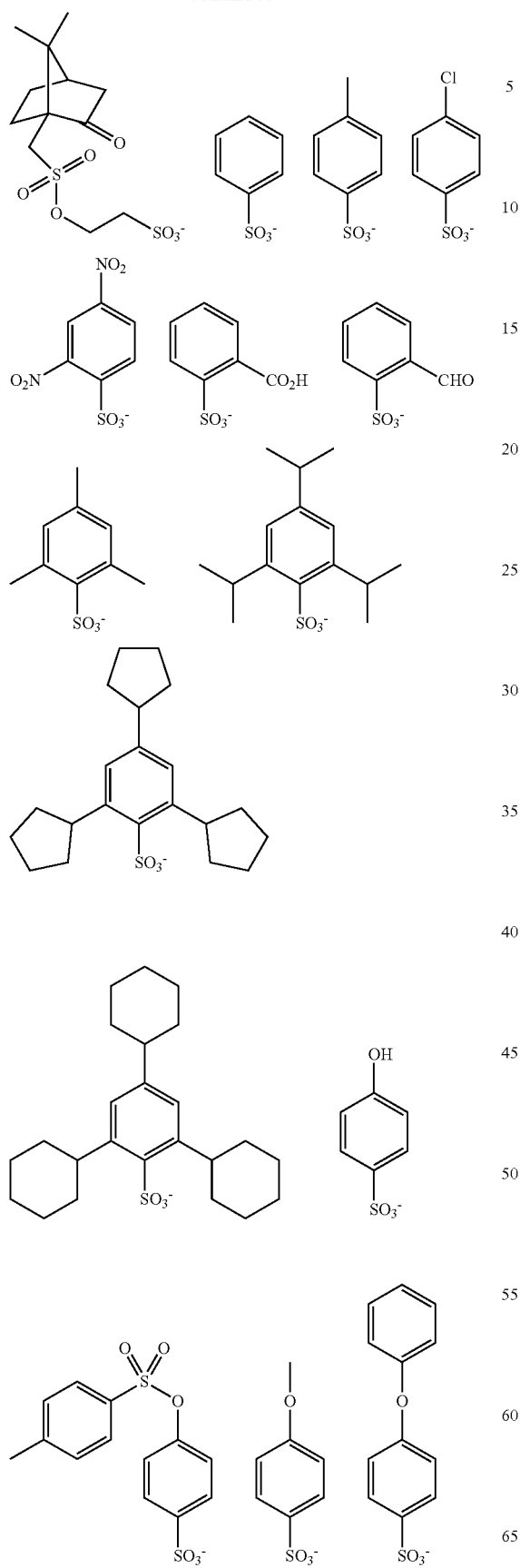
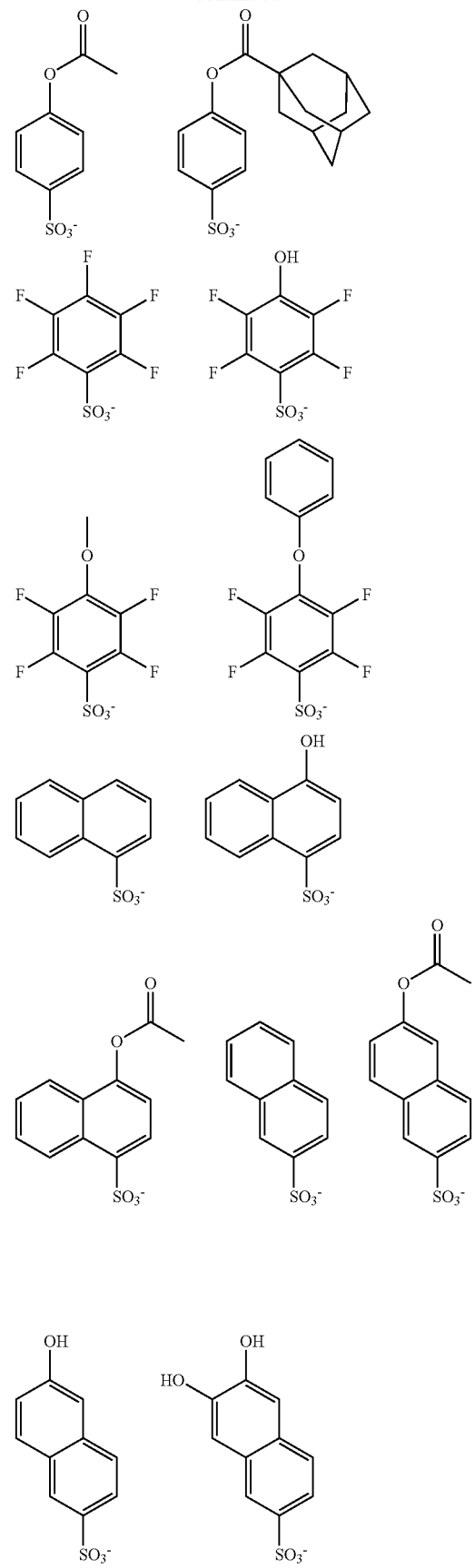

-continued
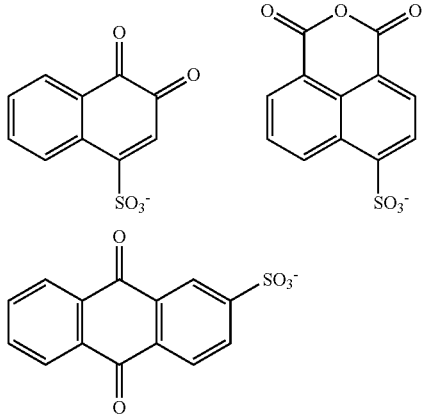
Examples of the anion in the onium salt having formula (4-2) are shown below, but not limited thereto.
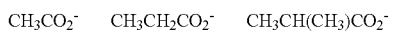
$CH_3CO_2^-$   $CH_3CH_2CO_2^-$   $CH_3CH(CH_3)CO_2^-$
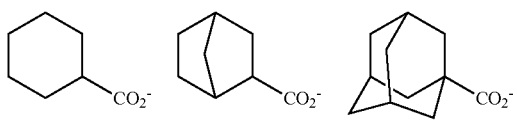
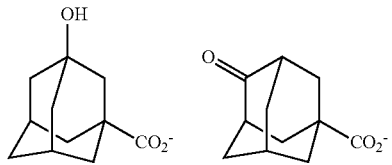
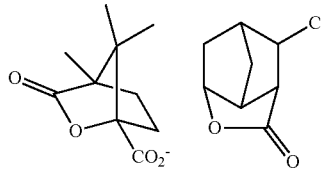
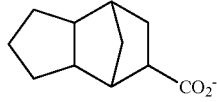
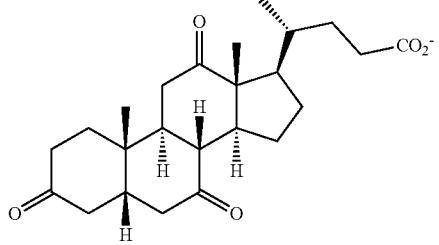
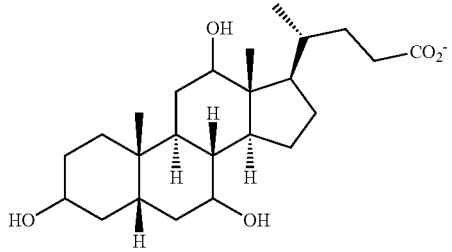
-continued
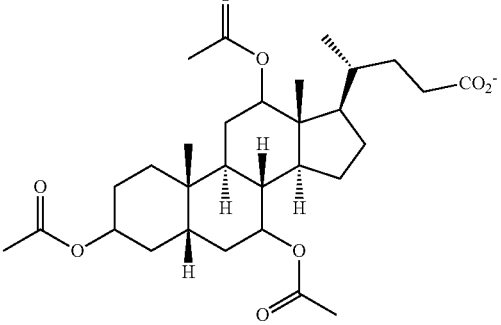
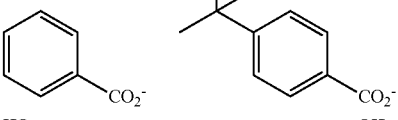
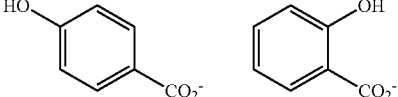
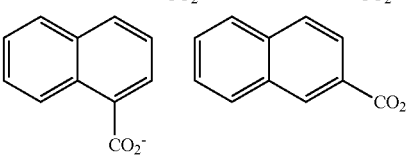
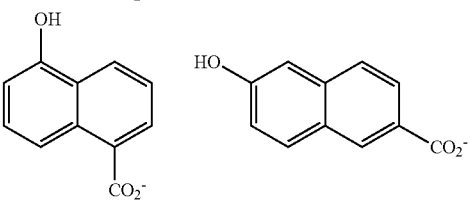
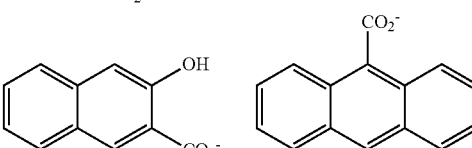
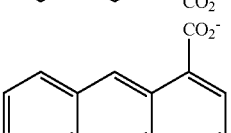
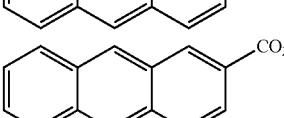
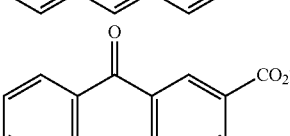
$CF_3CO_2^-$   $CF_3CH_2CO_2^-$   $CF_3CF_2CO_2^-$   $CF_3C(CF_3)(OH)CO_2^-$
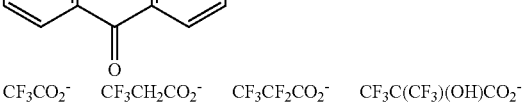
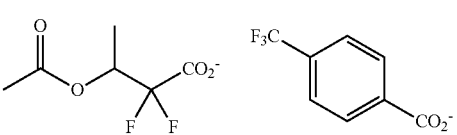

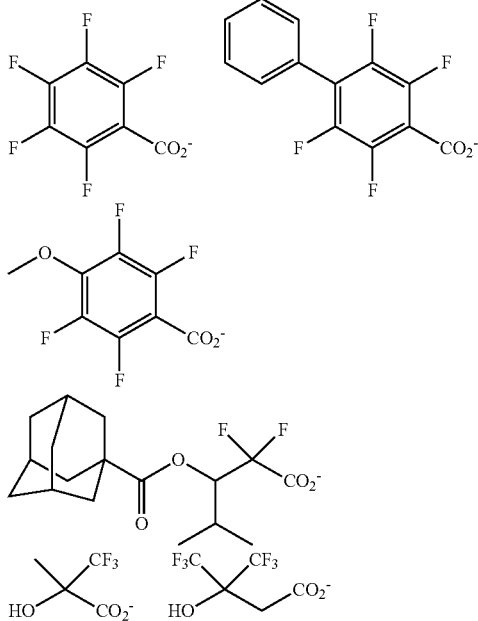

In formulae (4-1) and (4-2), Mq⁺ is an onium cation, which is preferably selected from cations having the formulae (4a), (4b) and (4c).

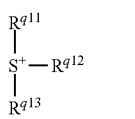 (4a)

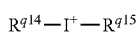 (4b)

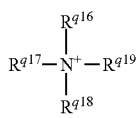 (4c)

In formulae (4a) to (4c), $R^{q11}$ to $R^{q19}$ are each independently a $C_1$-$C_{40}$ hydrocarbyl group which may contain a heteroatom. A pair of $R^{q11}$ and $R^{q12}$ may bond together to form a ring with the sulfur atom to which they are attached. A pair of $R^{q16}$ and $R^{q17}$ may bond together to form a ring with the nitrogen atom to which they are attached. Examples of the hydrocarbyl group are as exemplified above for $R^{31}$ to $R^{35}$ in formulae (c4) and (c5).

Examples of the onium cation represented Mq⁺ are shown below, but not limited thereto.

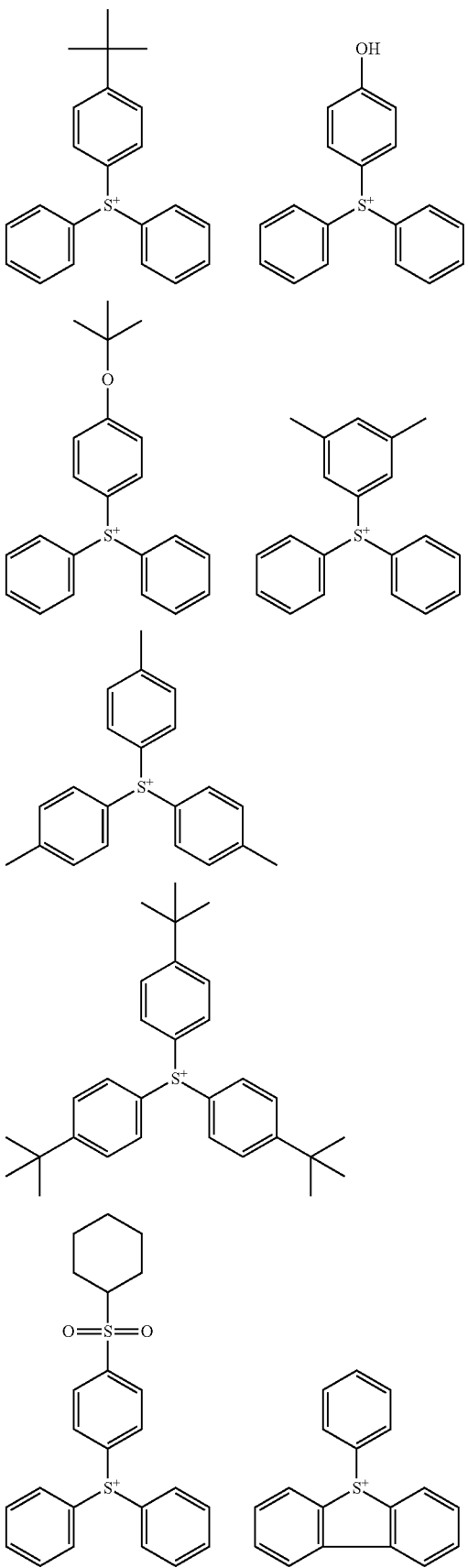

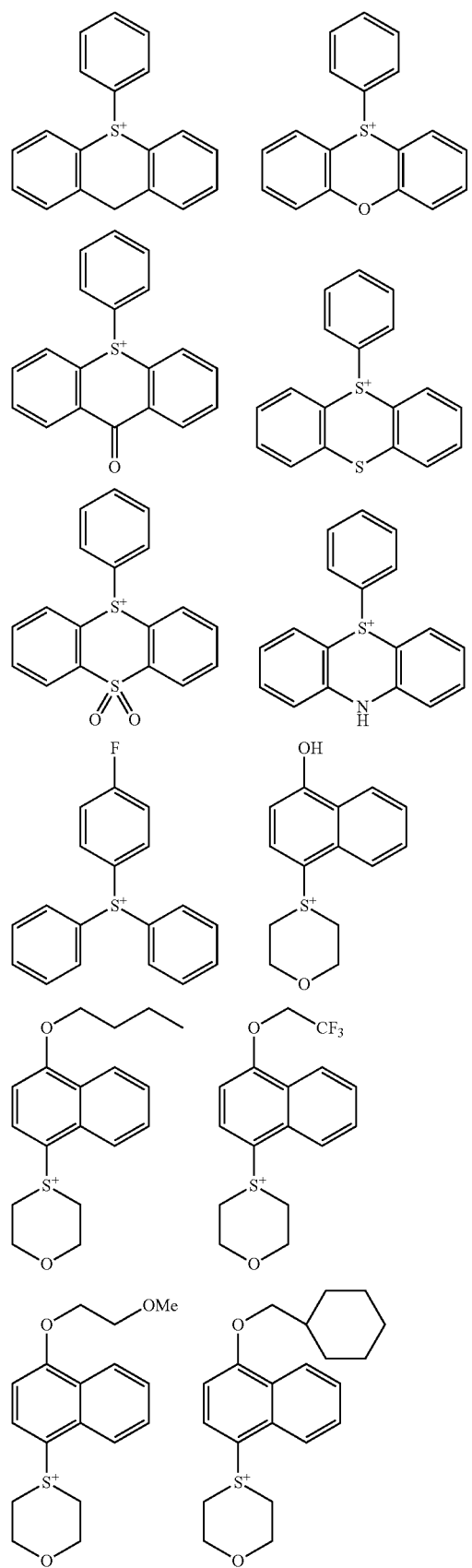
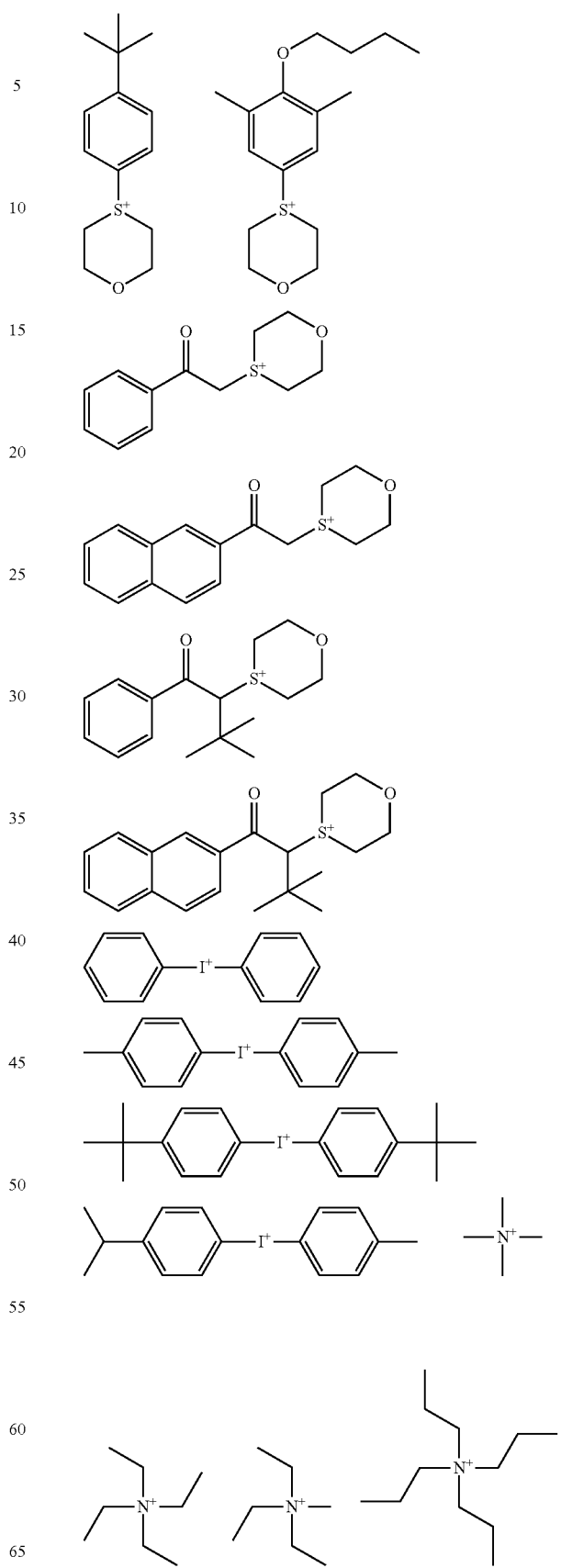

-continued

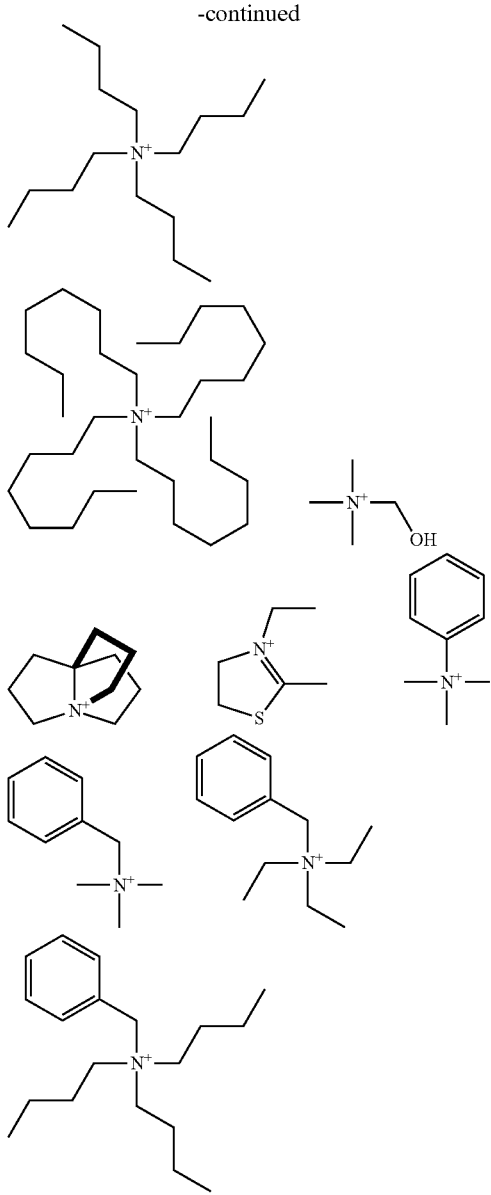

Examples of the minim salt having formula (4-1) or (4-2) include arbitrary combinations of onions with cations, both, as exemplified above. These onium salts may be readily prepared by ion exchange reaction using any well-known organic, chemistry technique. For the ion exchange reaction, reference may be made to JP-A 2007-14.5797, for example.

The onium salt having formula (4-1) or (4-2) functions as a quencher in the chemically amplified resist composition because the counter anion of the onium salt is a conjugated base of a weak acid. As used herein, the weak acid indicates an acidity insufficient to deprotect an acid labile group from an acid labile group-containing unit in the base polymer. The onium salt having formula (4-1) or (4-2) functions as a quencher when used in combination with an onium salt type PAG having a conjugated base of a strong acid (typically a sulfonic acid which is fluorinated at α-position) as the counter anion. In a system using a mixture of an onium salt capable of generating a strong acid (e.g., α-position fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an minim salt having a strong acid anion is formed. In this course, the strong acid is exchanged into the weak acid having a low catalysis, incurring apparent deactivation of the acid for enabling to control acid diffusion.

If a PAG capable of generating a strong acid is an onium salt, an exchange from the strong acid generated upon exposure to high-energy radiation to a weak acid as above can take place, but it rarely happens that the weak acid generated upon exposure to high-energy radiation collides with the unreacted onium salt capable of generating a strong acid to induce a salt exchange. This is because of a likelihood of an onium cation forming an ion pair with a stronger acid anion.

When the onium salt having formula (4-1) or (4-2) is used as the quencher (D), the amount of the onium salt used is preferably 0.1 to 20 parts by weight, more preferably 0.1 to 10 parts by weight per 80 parts by weight of the base polymer (A). As long as the amount of component (D) is in the range, a satisfactory resolution is available without a substantial lowering of sensitivity. The onium salt having formula (4-1) or (4-2) may be used alone or in admixture.

Also nitrogen-containing compounds may be used as the quencher (D). Suitable nitrogen-containing compounds include primary, secondary and tertiary amine compounds, specifically amine compounds having a hydroxyl group, ether bond, ester bond, lactone ring, cyano group city sulfonate bond, as described in JP-A 2008-111103, paragraphs [0146]-[0164] (U.S. Pat. No. 7,537,880), and primary or secondary amine compounds protected with a carbamate group, as described in JP 3790649.

A sulfonic acid sulfonium salt having a nitrogen-containing substituent may also be used as the nitrogen-containing compound. This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595 and JP-A 2012-046501, for example.

When the nitrogen-containing compound is used as the quencher (D), the amount of the nitrogen-containing compound used is preferably 0.001 to 12 parts by weight, more preferably 0.01 to 8 parts by weight per 80 parts by weight of the base polymer (A). The nitrogen-containing compound may be used alone or in admixture.

(E) Surfactant

The resist composition may further include (E) a surfactant which is insoluble or substantially insoluble in water and soluble in alkaline developer, and/or a surfactant which is insoluble or substantially insoluble in water and alkaline developer. For the surfactant, reference should be made to those compounds described in JP-A 2010-215608 and JP-A 2011-016746.

While many examples of the surfactant which is insoluble or substantially insoluble in water and alkaline developer are described in the patent documents cited herein, preferred examples are surfactants FC-4430 (3M), Olfine® E1004 (Nissin Chemical Co., Ltd.), Surflon® S-381, KH-20 and KH30 (AGC Seimi. Chemical Co., Ltd.). Partially fluorinated oxetane ring-opened polymers having the formula. (surf-1) are also useful.

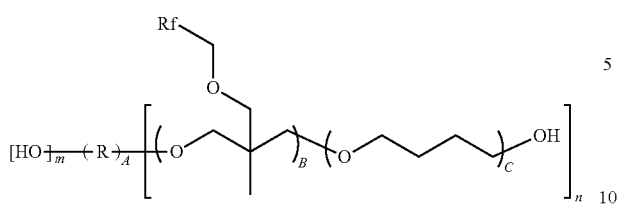

(surf-1)

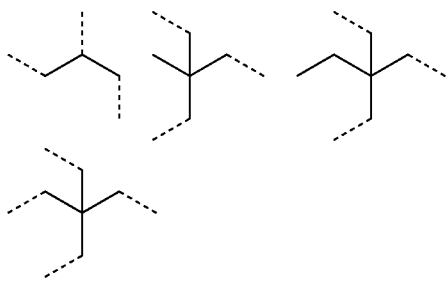

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent aliphatic groups include ethylene, 1,4-butylene, 1,2-propylene, 2,2-dimethyl-1,3-propylene and 1,5-pentylene. Exemplary tri- and tetra-valent groups are shown below.

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl and preferably trifluoromethyl. The letter in is an integer of 0 to 3n is an integer of 1 to 4, and the sum of m and n, which represents the valence of R, is an integer of 2 to 4. "A" is equal to 1, B is an integer of 2 to 25, and C is an integer of 0 to 10. Preferably, B is an integer of 4 to 20, and C is 0 or 1. Note that the formula (surf-1) does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water sliding.

Suitable polymeric surfactants include those containing recurring units of at least one type selected from the formulae (5A) to (5E).

(5A)

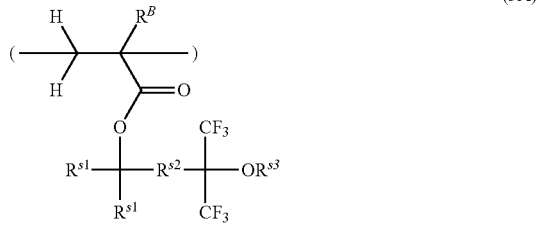

(5B)

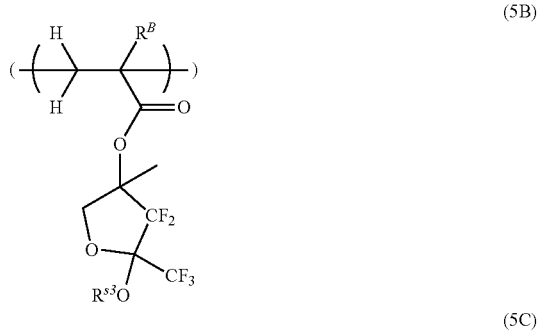

(5C)

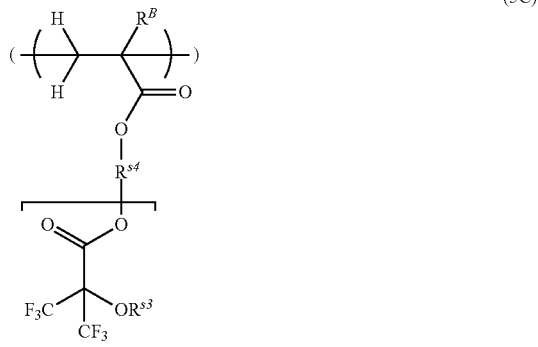

(5D)

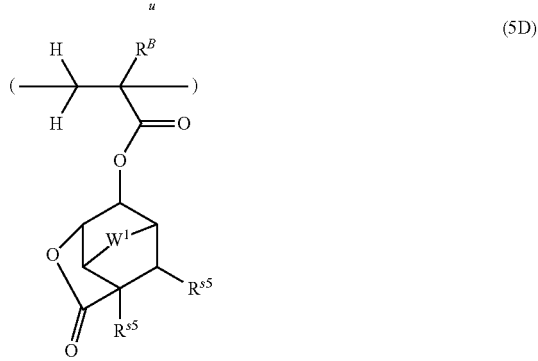

(5E)

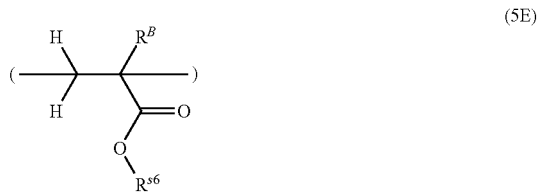

Herein, $R^B$ is hydrogen, fluorine, methyl or trifluoromethyl. $W^1$ is —$CH_2$—, —$CH_2CH_2$— or —O—, or two separate —H. $R^{s1}$ is each independently hydrogen or a $C_1$-$C_{10}$ hydrocarbyl group. $R^{s2}$ is a single bond or a $C_1$-$C_5$ straight or brandied hydrocarbylene group. $R^{s3}$ is each independently hydrogen, a $C_1$-$C_{15}$ hydrocarbyl or fluorinated hydrocarbyl group, or an acid labile group. When $R^{s3}$ is a hydrocarbyl or fluorinated hydrocarbyl group, an ether bond (—O—) or carbonyl moiety (—C(=O)—) may intervene in a carbon-carbon bond. $R^{s4}$ is a $C_1$-$C_{20}$ (u+1)-valent hydrocarbon or fluorinated hydrocarbon group, and u is an integer of 1 to 3. $R^{s5}$ is each independently hydrogen or a group having the formula: —C(=O)—O—$R^{sa}$ wherein $R^{sa}$ is a $C_1$-$C_{20}$ fluorinated hydrocarbyl group. $R^{s6}$ is a $C_1$-$C_{15}$ hydrocarbyl or fluorinated hydrocarbyl group in which an ether bond (—O—) or carbonyl moiety (—C(=O)—) may intervene in a carbon-carbon bond.

The hydrocarbyl group represented by $R_{s1}$ is preferably saturated and may be straight, branched or cyclic. Examples thereof include alkyl groups such as methyl, ethyl, n-propyl, isopropyl, n-butyl, isobutyl, sec-butyl, tert-butyl, n-pentyl, n-hexyl, n-heptyl, n-octyl, n-nonyl, and n-decyl, and cyclic saturated hydrocarbyl groups such as cyclopropyl, cyclobutyl, cyclopentyl, cyclohexyl, adamantyl, and norbornyl. Inter alia, $C_1$-$C_6$ hydrocarbyl groups are preferred.

The hydrocarbylene group represented by $R^{s2}$ is preferably saturated and may be straight, branched or cyclic. Examples thereof include methylene, ethylene, propylene, butylene and pentylene.

The hydrocarbyl group represented by $R^{s3}$ or $R^{s6}$ may be saturated or unsaturated and straight, branched or cyclic. Examples thereof include saturated hydrocarbyl groups, and aliphatic unsaturated hydrocarbyl groups such as alkenyl and alkynyl groups, with the saturated hydrocarbyl groups being preferred. Suitable saturated hydrocarbyl groups include those exemplified for the hydrocarbyl group represented by $R^{s1}$ as well as n-undecyl, n-dodecyl, tridecyl, tetradecyl, and pentadecyl. Examples of the fluorinated hydrocarbyl group represented by $R^{s3}$ or $R^{s6}$ include the foregoing hydrocarbyl groups in which some or all carbon-bonded hydrogen atoms are substituted by fluorine atoms. In these groups, an ether bond (—O—) or carbonyl moiety (—C(=O)—) may intervene in a carbon-carbon bond as mentioned above.

Examples of the acid labile group represented by $R^{s3}$ include groups of the above formulae (AL-1) to (AL-3), trialkylsilyl groups in winch each alkyl moiety has 1 to 6 carbon atoms, and $C_4$-$C_{20}$ oxo-containing alkyl groups.

The (u+1)-valent hydrocarbon or fluorinated hydrocarbon group represented by $R^{s4}$ may be straight, branched or cyclic and examples thereof include the foregoing hydrocarbyl or fluorinated hydrocarbyl groups from which the number (u) of hydrogen atoms are eliminated.

The fluorinated hydrocarbyl group represented by $R^{sa}$ is preferably saturated and may be straight, branched or cyclic. Examples thereof include the foregoing hydrocarbyl groups in which some or all hydrogen atoms are substituted by fluorine atoms. Illustrative examples include trifluoromethyl, 2,2,2-trifluomethyl, 3,3,3-trifluoro-1-propyl, 3,3,3-trifluoro-2-propyl, 2,2,3,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl.

Examples of the recurring units having formulae (5A) to (5E) are shown below, but not limited thereto. Herein $R^B$ is as defined above.

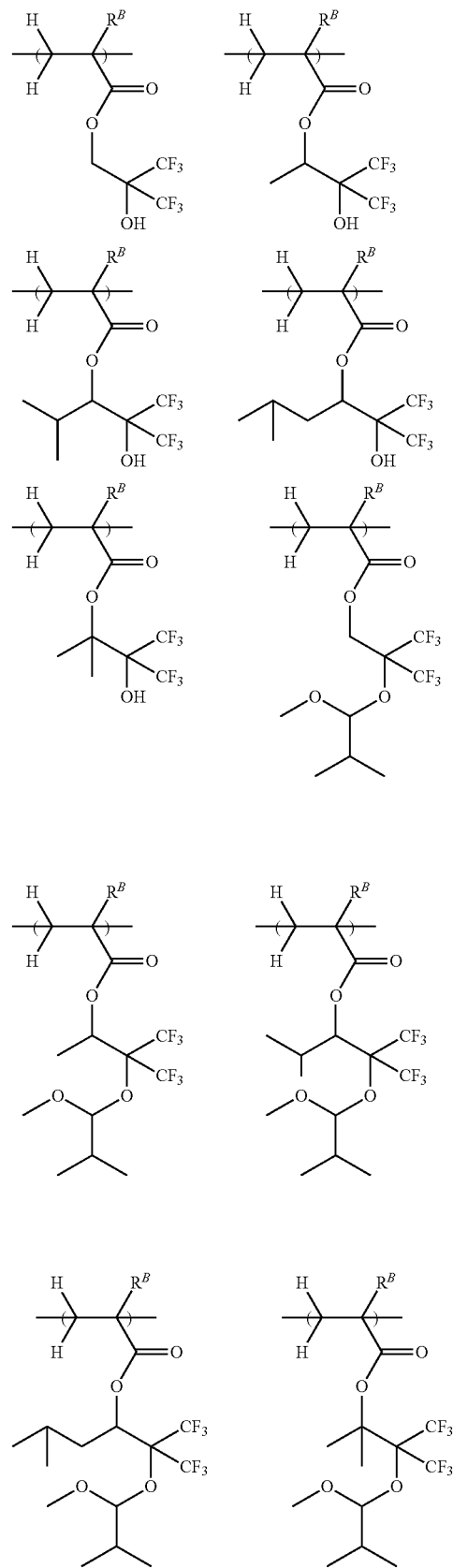

-continued
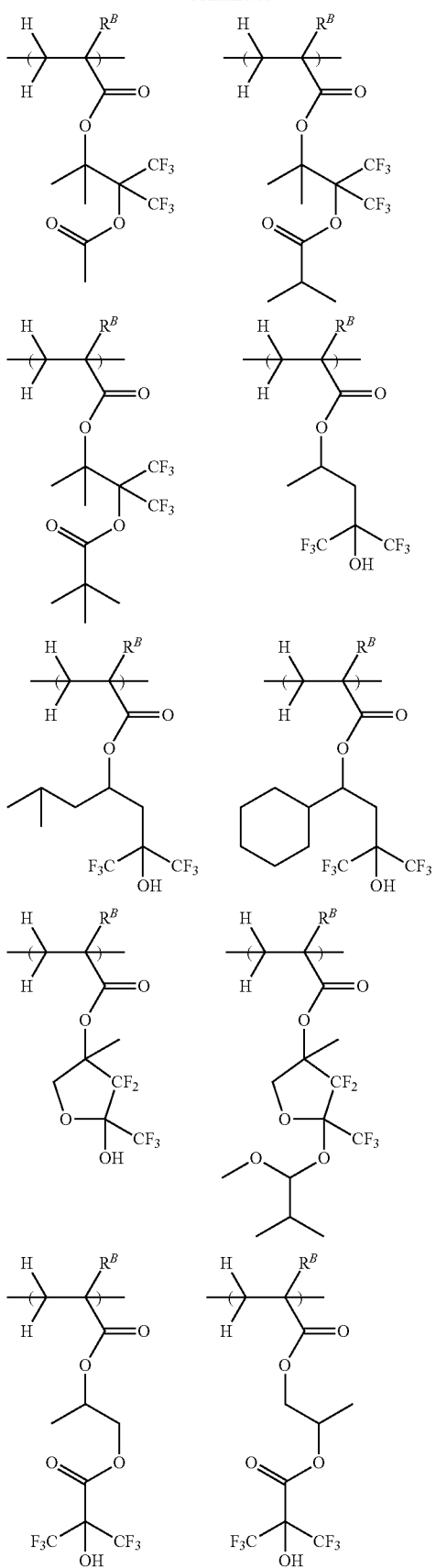
-continued
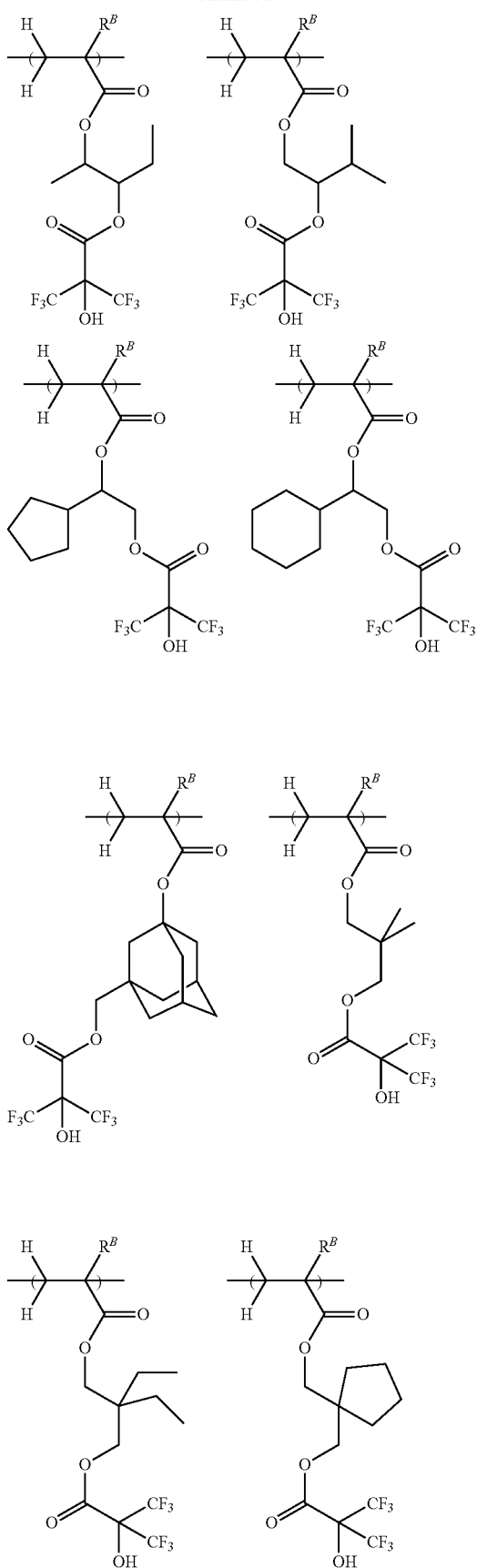

195
-continued
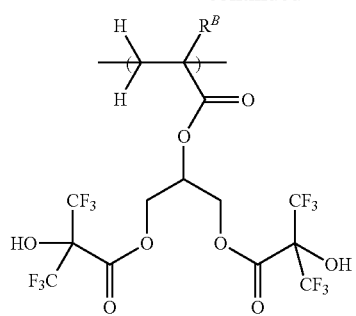
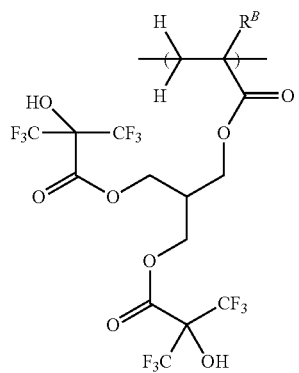
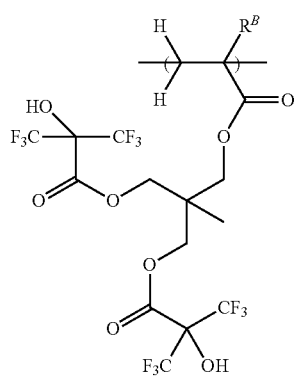
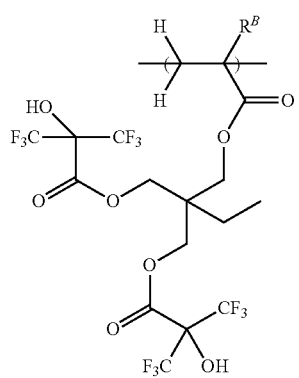
196
-continued
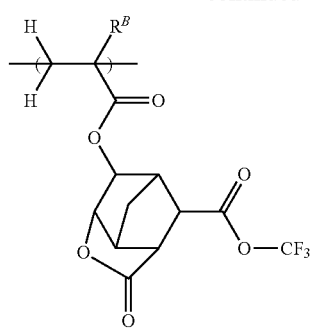
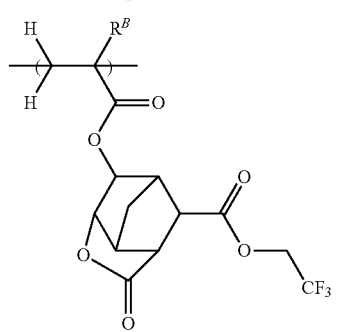
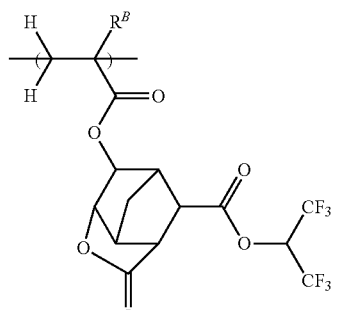
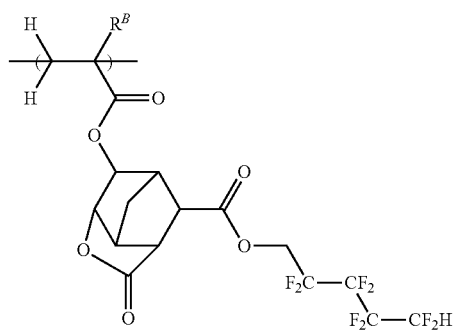
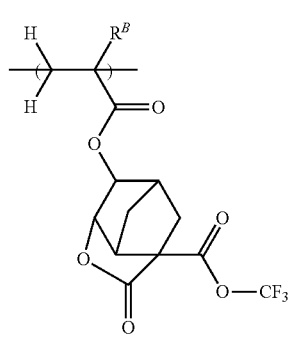

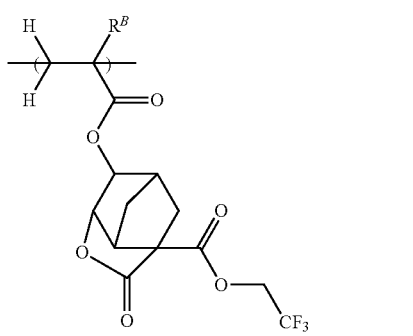
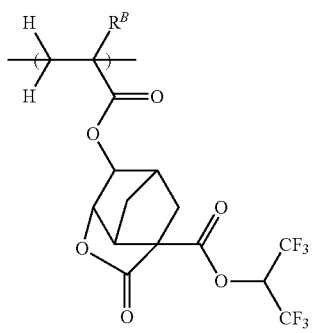
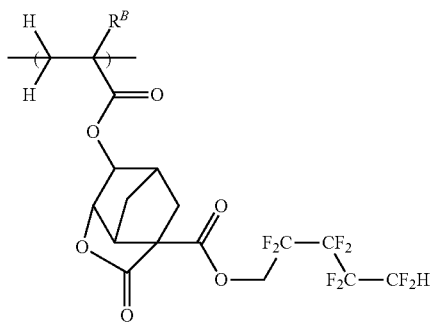
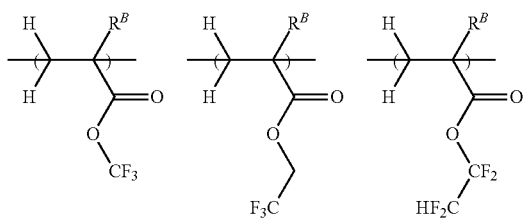
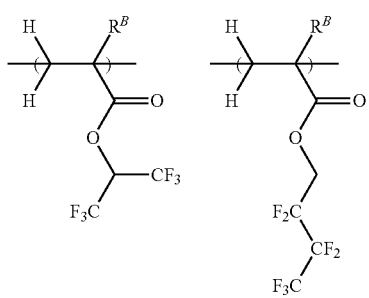
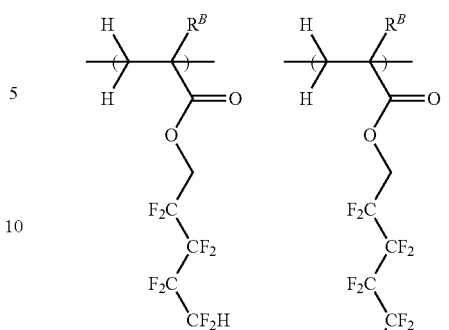
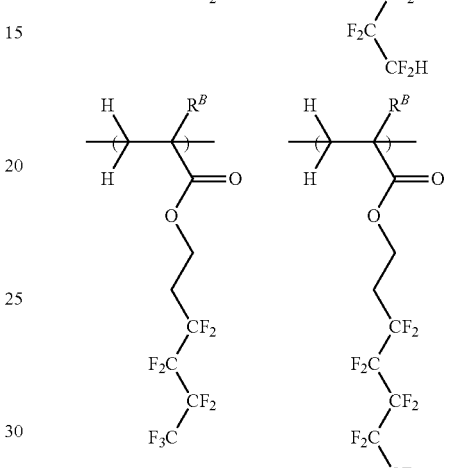
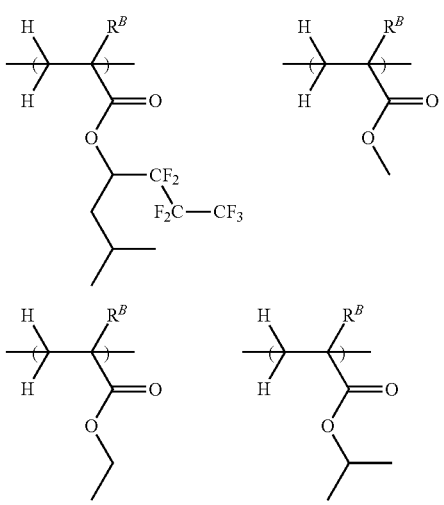
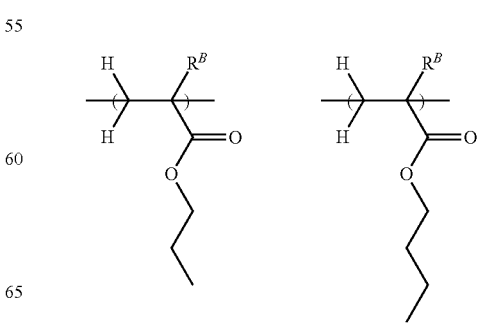

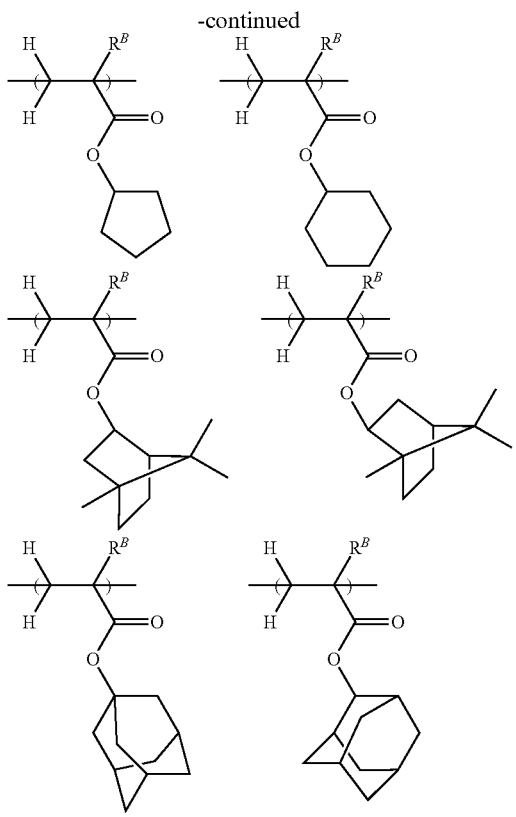

The polymeric surfactant may further contain recurring units other than the recurring units having formulae (5A) to (5E). Typical other recurring units are those derived from methacrylic acid and α-trifluoromethylacrylic acid derivatives. In the polymeric surfactant, the content of the recurring units having formulae (5A) to (5E) is preferably at least 20 mol %, more preferably at least 60 mol %, most preferably 100 mol % of the overall recurring units.

The polymeric surfactant preferably has a Mw of 1,000 to 500,000, more preferably 3,000 to 100,000 and a Mw/Mn of 1.0 to 2.0, more preferably 1.0 to 1.6.

The polymeric surfactant may be synthesized by any desired method, for example, by dissolving an unsaturated bond-containing monomer or monomers providing recurring units having formula (5A) to (5E) and optionally other recurring units in an organic solvent, adding a radical initiator, and heating for polymerization. Suitable organic solvents used herein include toluene, benzene, THF, diethyl ether, and dioxane. Examples of the polymerization initiator used herein include AIBN, 2,2'-azobis(2,4-dimethylvaleronitrile), dimethyl 2,2-azobis(2-methylpropionate), benzoyl peroxide, and lauroyl peroxide. Preferably the reaction temperature is 50 to 100° C. and the reaction time is 4 to 24 hours. The acid labile group that has been incorporated in the monomer may be kept as such, or the polymer may be protected or partially protected therewith at the end of polymerization.

During the synthesis of polymeric surfactant, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

When the resist composition contains a surfactant (E), the amount thereof is preferably 0.1 to 50 parts by weight, and more preferably 0.5 to 10 parts by weight per 80 parts by weight of the base polymer (A). At least 0.1 part of the surfactant is effective in improving the receding contact angle with water of the resist film at its surface. Up to 50 parts of the surfactant is effective in forming a resist film having a low rate of dissolution in a developer and capable of maintaining the height of a fine pattern formed therein.

(F) Other components

The resist composition may further comprise (F) another component, for example, a compound which is decomposed with an acid to generate another acid (i.e. acid amplifier compound), an organic acid derivative, a fluorinated alcohol, and a compound having a Mw of up to 3,000 which changes its solubility in developer under the action of an acid (i.e., dissolution inhibitor). Specifically, the acid amplifier compound is described in JP-A 2009-269953 and JP-A 2010-215608 and preferably used in an amount of 0 to 5 parts, more preferably 0 to 3 parts by weight per 80 parts by weight of the base polymer (A). An extra amount of the acid amplifier compound can make the acid diffusion control difficult and cause degradations to resolution and pattern profile. With respect to the remaining additives, reference should be made to JP-A 2009-269953 and JP-A 2010-215608.

Process

A further embodiment of the invention is a pattern forming process using the resist composition defined above. A pattern may be formed from the resist composition using any well-known lithography process. The preferred process includes the steps of applying the resist composition to form a resist film on a substrate, exposing the resist film to high-energy radiation, and developing the exposed resist film in a developer. Any desired steps may be added to the process if necessary.

The substrate used herein may be a substrate for integrated circuitry fabrication, e.g., Si, $SiO_2$, SiN, SiON, TiN, WSi, BPSG, SOG, organic antireflective film, etc. or a substrate for mask circuitry fabrication, e.g., Cr, CrO, CrON, $MoSi_2$, $SiO_2$, etc., The resist composition is applied onto a substrate by a suitable coating technique such as spin coating. The coating is prebaked on a hot plate preferably at a temperature of 60 to 150° C. for 1 to 10 minutes, more preferably at 80 to 140° C. for 1 to 5 minutes. The resulting resist film preferably has a thickness of 0.05 to 2 μm.

Then the resist film is exposed patternwise to high-energy radiation, for example, i-line, KrF or ArF excimer laser, EUT or EB. On use of KrF excimer laser, ArF excimer laser or EUV of wavelength 13.5 nm, the resist film is exposed through a mask having a desired pattern, preferably in a dose of 1 to 200 μC/cm², more preferably 10 to 100 μC/cm². On use of EB, a pattern may be written directly or through a mask having the desired pattern, preferably in a dose of 1 to 300 μC/cm², more preferably 10 to 200 μC/cm².

The exposure may be performed by conventional lithography whereas the immersion lithography of holding a liquid having a refractive index of at least 1.0 between the resist film and the projection lens may be employed if desired. The liquid is typically water, and in this case, a protective film which is insoluble in water may be formed on the resist film.

While the water-insoluble protective film serves to prevent any components from being leached out of the resist film and to improve water sliding on the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

After the exposure, the resist film may be baked (PEB), for example, on a hotplate at 60 to 150° C. for 1 to 5 minutes, preferably at 80 to 140° C. for 1 to 3 minutes.

The resist film is then developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

Any desired step may be added to the pattern forming process. For example, after the resist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

Also, a double patterning process may be used for pattern formation. The double patterning process includes a trench process of processing an underlay to a 1:3 trench pattern by a first step of exposure and etching, shifting the position, and forming a 1:3 trench pattern by a second step of exposure, for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, negative tone development may also be used. That is, an organic solvent may be used instead of the aqueous alkaline solution as the developer for developing and dissolving away the unexposed region of the resist film.

The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLES

Synthesis Examples, Examples and Comparative Examples are given below by way of illustration and not by way of limitation. The abbreviation "pbw" is parts by weight. For all polymers, Mw and Mn are determined by GPC versus polystyrene standards using THF or DMF solvent. Analysis is made by IR spectroscopy and $^1$H-NMR spectroscopy using analytic instruments as shown below.

IR: NICOLET 6700 by Thermo Fisher Scientific, Inc.

$^1$H-NMR: ECA-500 by JEOL Ltd.

[1] Synthesis of Monomers

Synthesis Example 1-1

Synthesis of Monomer a1

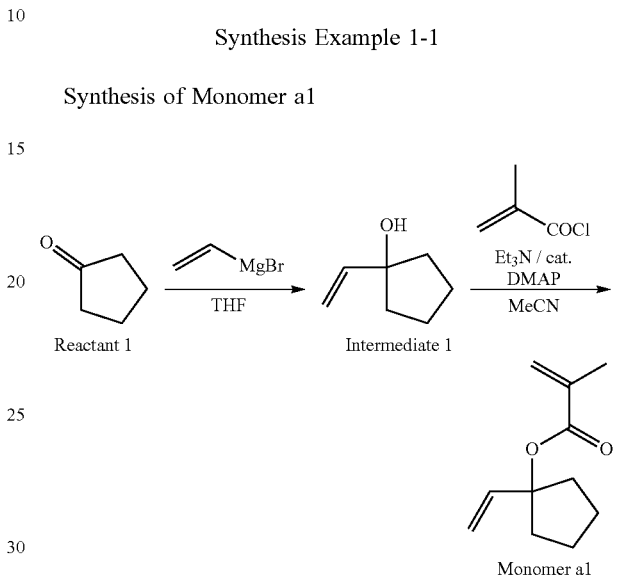

(1) Synthesis of Intermediate 1

In nitrogen atmosphere, a Grignard reagent was prepared using 53 g of magnesium, 257 g of vinyl bromide, and 700 mL of THF. While the internal temperature was kept below 50° C., a solution of 168 g of Reactant 1 in 100 mL THF was added dropwise to the Grignard reagent. The solution was stirred for 2 hours at an internal temperature of 50° C. The reaction solution was ice cooled, after which a mixture of 220 g of ammonium chloride and 1,320 g 3.0 wt % hydrochloric acid aqueous solution was added dropwise to quench the reaction. 500 mL of hexane was added to the solution, followed by ordinary aqueous workup, solvent stripping, and vacuum distillation. There was obtained 149 g of Intermediate 1 as colorless transparent oily matter (yield 66%).

(2) Synthesis of Monomer a1

In nitrogen atmosphere, 136 g of methacrylic chloride was added dropwise to a solution of 114 g of Intermediate 1,152 g of triethylamine, 12.2 g of dimethylaminopyridine, and 400 mL of acetonitrile at an internal temperature below 20° C. The solution was aged for 3 hours at an internal temperature of 45° C. The reaction solution was ice cooled, after which 200 mL of saturated sodium hydrogen carbonate solution was added dropwise to quench the reaction. This was followed by extraction with 500 mL of hexane, ordinary aqueous workup, solvent stripping, and vacuum distillation. There was obtained 144 g of Monomer a1 as colorless transparent oily matter (yield 79%).

Monomer a1 was analyzed by IR and $^1$H-NMR spectroscopy, with the data shown below.

IR (D-ATR): ν=3088, 2960, 2876, 1771, 1637, 1451, 1415, 1377, 1331, 1304, 1158, 1008, 936, 815, 655 cm$^{-1}$ $^1$H-NMR (600 MHz in DMSO-d6):

δ=6.13 (1H, dd), 5.95 (1H, s), 5.60 (1H, s), 5.10 (1H, d), 5.05 (1H, d), 2.08 (2H, m), 1.85 (2H, m), 1.83 (3H, s), 1.65 (4H, m) ppm Synthesis Example 1-2

Synthesis of Monomer a2

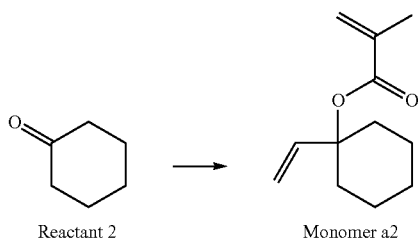

Reactant 2    Monomer a2

Synthesis was performed by the same procedure as Synthesis Example 1-1 aside from using Reactant 2 instead of Reactant 1. There was obtained Monomer a2 colorless transparent oily matter (two-step yield 58%).

Monomer a2 was analyzed by IR and $^1$H-NMR spectroscopy, with the data shown below.

IR (D-ATR): ν=3420, 3088, 2935, 2862, 2673, 2482, 1717, 1638, 1507, 1488, 1450, 1416, 1401, 1376, 1328, 1302, 1277, 1250, 1173, 1133, 1072, 1008, 935, 909, 861, 847, 813, 653, 581, 550, cm$^{-1}$ $^1$H-NMR (600 MHz in DMSO-d6):

δ=6.07 (1H, dd), 5.98 (1H, s), 5.60 (1H, s), 5.12 (1H, d), 5.07 (1H, d), 2.15 (2H, m), 1.85 (3H, s), 1.52 (7H, m), 1.25 (1H, m) ppm Synthesis Example 1-3

Synthesis of Monomer a3

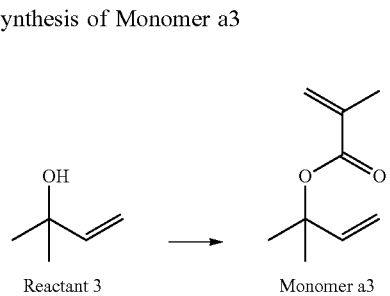

Reactant 3    Monomer a3

Synthesis was performed by the same procedure as Synthesis Example 1-1 (2) aside from using Reactant 3 instead of Intermediate 1. There was obtained Monomer a3 as colorless transparent oily matter (yield 77%).

Monomer a3 was analyzed by IR and $^1$H-NMR spectroscopy, with the data shown below.

IR (D-ATR): ν=3091, 2981, 2930, 1717, 1638, 1471, 1453, 1415, 1379, 1365, 1329, 1304, 1265, 1243, 1160, 1127, 1008, 937, 850, 814, 685, 653 cm$^{-1}$ $^1$H-NMR (600 MHz in DMSO-d6):

δ=6.06 (1H, dd), 5.95 (1H, s), 5.60 (1H s) 5.17 (1H, d) 5.05 (1H, d), 1.83 (3H, s), 1.49 (6H, s) ppm Synthesis Example 1-4

Synthesis of Monomer a4

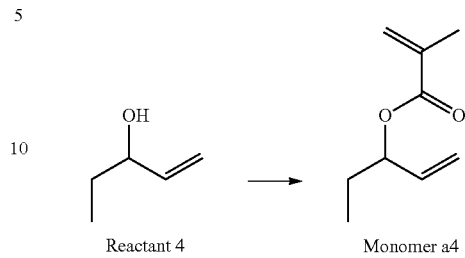

Reactant 4    Monomer a4

Synthesis was performed by the same procedure as Synthesis Example 1-1 (2) aside from using Reactant 4 instead of Intermediate 1. There was obtained Monomer a4 as colorless transparent oily matter (yield 64%).

Monomer a4 was analyzed by IR and $^1$H-NMR spectroscopy, with the data shown below.

IR (D-ATR): ν=3090, 2972, 2938, 2881, 1720, 1639, 1455, 1402, 1381, 1344, 1318, 1294, 1166, 1140, 1080, 1060, 1009, 990, 932, 888, 814, 652, 600 cm$^{-1}$ $^1$H-NMR (600 MHz in DMSO-d6):

δ=6.03 (1H, s), 5.84 (1H, ddd), 5.67 (1H, s), 5.21 (1H, dd), 5.17 (1H, dt), 5.14 (1H, dd), 1.88 (3H, s), 1.64 (2H, dt), 0.85 (3H, t) ppm Synthesis Example 1-5

Synthesis of Monomer a5

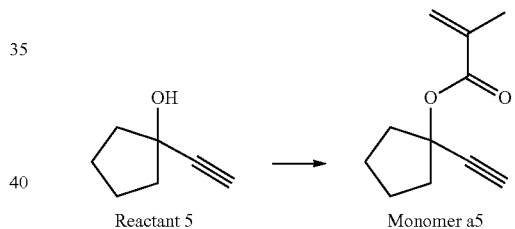

Reactant 5    Monomer a5

Synthesis was performed by the same procedure as Synthesis Example 1-1 (2) aside from using Reactant 5 instead of Intermediate 1. There was obtained Monomer a5 as colorless transparent oily matter (yield 72%).

Monomer a5 was analyzed by IR and $^1$H-NMR spectroscopy, with the data shown below.

IR (D-ATR): ν=3271, 2960, 2877, 2117, 1724, 1637, 1451, 1402, 1378, 1330, 1301, 1153, 1057, 1009, 972, 945, 902, 863, 815, 660, 511, 482 cm$^{-1}$ $^1$H-NMR (600 MHz in DMSO-d6):

δ=5.98 (1H, s), 5.66 (1H, s), 2.18 (2H, m), 2.07 (2H, m), 1.85 (3H, s), 1.69 (4H, m) ppm Synthesis Example 1-6

Synthesis of Monomer a6

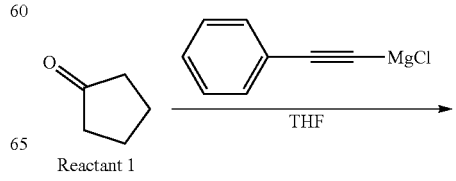

Reactant 1

-continued

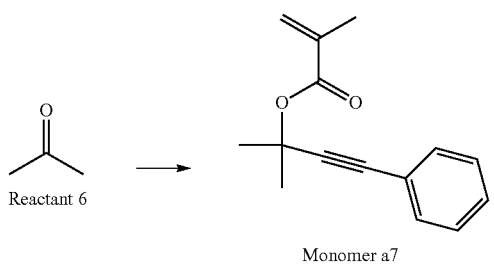

Monomer a6

(1) Synthesis of Intermediate 2

In nitrogen atmosphere, a Grignard reagent was prepared using 250 g of a THF solution of 2.0 mol/L ethylmagnesium chloride, 51 g of ethynylbenzene, and 50 mL of THF. While the internal temperature was kept below 50° C., a solution of 38 g of Reactant 1 in 40 mL of THF was added dropwise to the Grignard reagent. The solution was stirred for 2 hours at an internal temperature of 50° C. The reaction solution was ice cooled, after which a mixture of 50 g of ammonium chloride and 300 g of 3.0 wt % hydrochloric acid aqueous solution was added dropwise to quench the reaction. 300 mL of toluene was added to the solution, followed by ordinary aqueous workup, solvent stripping, and vacuum distillation. There was obtained 76 g of Intermediate 2 as colorless transparent oily matter (yield 91%).

(2) Synthesis of Monomer a6

Synthesis was performed by the same procedure as Synthesis Example 1-1 (2) aside from using Intermediate 2 instead of Intermediate 1. There was obtained Monomer a6 as colorless transparent oily matter (yield 94%).

Monomer a6 was analyzed by IR and $^1$H-NMR spectroscopy, with the data shown below.

IR (D-ATR): v=3056, 2959, 2875, 2232, 1723, 1637, 1599, 1573, 1491, 1444, 1401, 1377, 1327, 1299, 1151, 1070, 1008, 969, 944, 862, 815, 757, 692, 651, 535 cm$^{-1}$ $^1$H-NMR (600 MHz in DMSO-d6):

δ=7.37 (5H, m), 6.02 (1H, s), 5.68 (1H, s), 2.27 (2H, m), 2.17 (2H, m), 1.87 (3H, s), 1.75 (4H, m) ppm Synthesis Example 1-7

Synthesis of Monomer a7

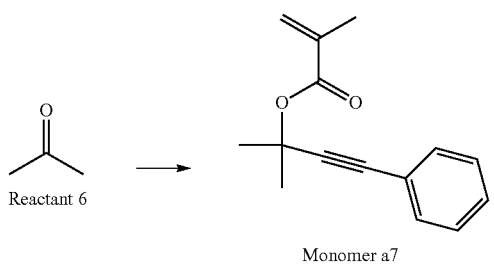

Monomer a7

Synthesis was performed by the same procedure as Synthesis Example 1-6 aside from using Reactant 6 instead of Reactant 1. There was obtained Monomer a7 as colorless transparent oily matter (two-step yield 91%).

Monomer a7 was analyzed by IR and $^1$H-NMR spectroscopy, with the data shown below.

IR (D-ATR): v=3057, 2987, 2928, 1723, 1638, 1599, 1491, 1468, 1444, 1401, 1381, 1363, 1327, 1293, 1175, 1123, 1070, 1007, 965, 941, 884, 858, 815, 757, 692, 652, 569, 549, 509 cm$^{-1}$ $^1$H-NMR (600 MHz in DMSO-d6):

δ=7.37 (5H, m), 6.01 (1H, s), 5.68 (1H, s), 1.87 (3H, s), 1.74 (6H, m) ppm

[2] Synthesis of polymers

Monomers of a1 to a7 and the following monomers were used in the synthesis of polymers.

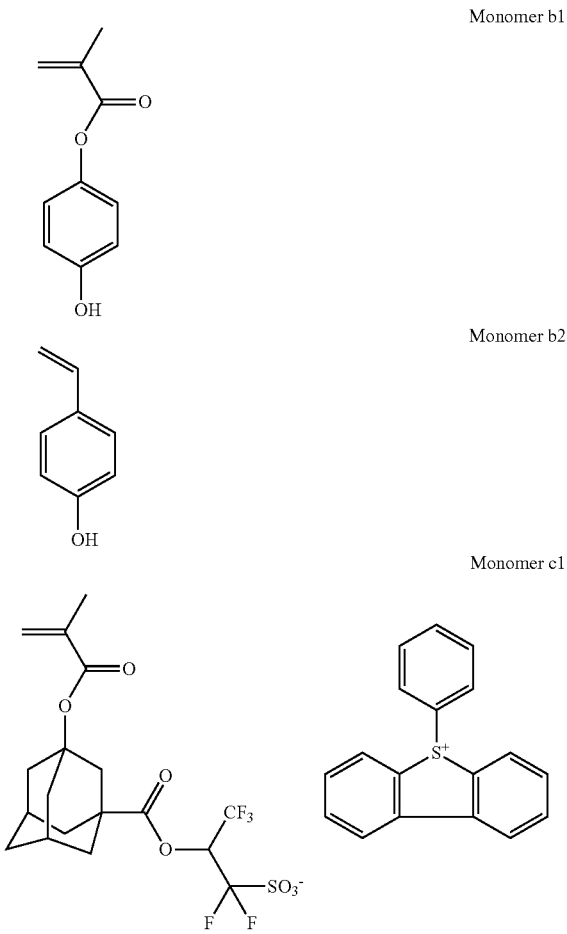

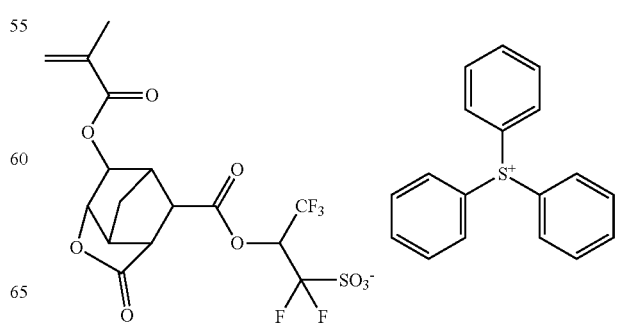

-continued

Monomer d1
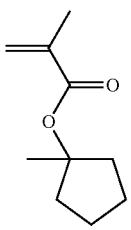

Monomer d2
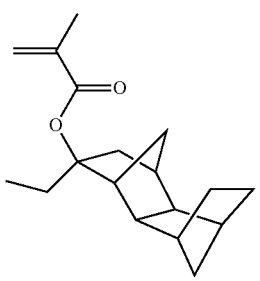

Monomer d3
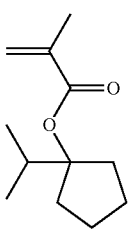

Monomer d4
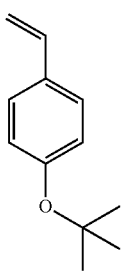

Monomer e1
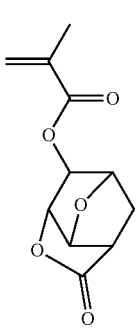

Monomer e2
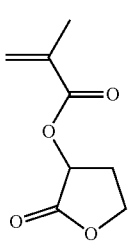

Example 1-1

Synthesis of Polymer P-1

In a funnel under nitrogen atmosphere, 42.0 g of Monomer c1, 37.8 g of Monomer a1, 20.3 g of Monomer b1, 8.75 g of dimethyl 2,2'-azobis(2-methylpropionate) (V-601 by Wako Pure Chemical industries, Ltd.), and 175 g of MEK were combined to form a monomer/initiator solution. A flask nitrogen atmosphere was charged with 58 g of MEK, which was heated at 80° C. with stirring. With stirring, the monomer/initiator solution was added dropwise to the flask over 4 hours. After the completion of dropwise addition, the polymerization solution was continuously stirred for 2 hours while maintaining the temperature of 80° C. The polymerization solution was cooled to room temperature, whereupon it was added dropwise to 2,000 g of hexane with vigorous stirring. The precipitate was collected by filtration, washed twice with 600 g of hexane, and vacuum dried at 50° C. for 20 hours, obtaining Polymer P-1 in white powder form (amount 97.7 g, yield 98%). On GPC analysis, Polymer P-1 had a Mw of 10,800 and a Mw/Mn of 1.84.

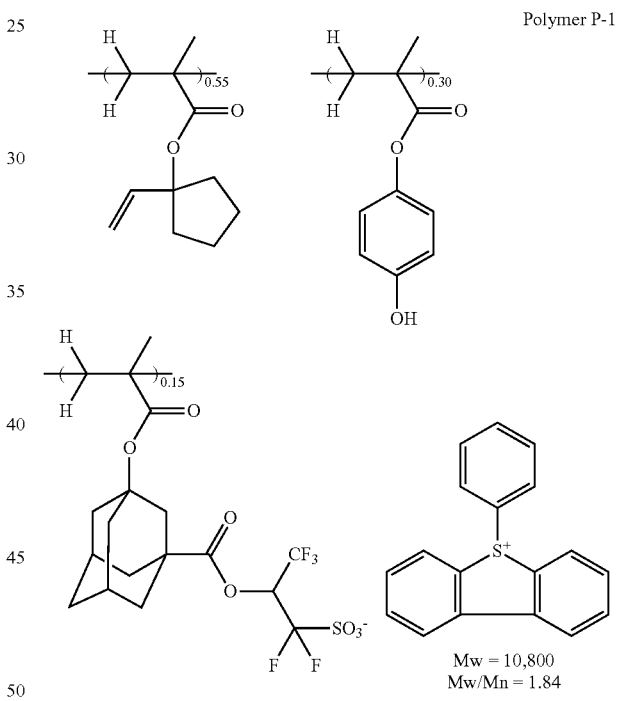

Polymer P-1
Mw = 10,800
Mw/Mn = 1.84

Examples 1-2 to 1-20 and Comparative Examples 1-1 to 1-7

Synthesis of Polymers P-2 to P-20 and CP-1 to CP-7

Polymers as shown in Tables 1 and 2 were synthesized by the same procedure as in Example 1-1 aside from changing the type and amount of monomers.

TABLE 1

| Example | Polymer | Unit (a) (mol %) | Unit (b) (mol %) | Unit (c) (mol %) | Unit (e) (mol %) | (mol %) | Mw | Mw/Mn |
|---|---|---|---|---|---|---|---|---|
| 1-1 | P-1 | a1 (55) | b1 (0) | c1 (15) | — | — | 10,800 | 1.84 |

TABLE 1-continued

| Example | Polymer | Unit (a) (mol %) | Unit (b) (mol %) | Unit (c) (mol %) | Unit (e) (mol %) | (mol %) | Mw | Mw/Mn |
|---|---|---|---|---|---|---|---|---|
| 1-2 | P-2 | a2 (55) | b1 (30) | c1 (15) | — | — | 11,000 | 1.88 |
| 1-3 | P-3 | a3 (55) | b1 (30) | c1 (15) | — | — | 9,900 | 1.87 |
| 1-4 | P-4 | a4 (55) | b1 (30) | c1 (15) | — | — | 10,200 | 1.83 |
| 1-5 | P-5 | a5 (55) | b1 (30) | c1 (15) | — | — | 10,500 | 1.88 |
| 1-6 | P-6 | a6 (55) | b1 (30) | c1 (15) | — | — | 9,800 | 1.91 |
| 1-7 | P-7 | a7 (55) | b1 (30) | c1 (15) | — | — | 11,000 | 1.93 |
| 1-8 | P-8 | a1 (55) | b2 (30) | c1 (15) | — | — | 10,400 | 1.85 |
| 1-9 | P-9 | a1 (55) | b1 (30) | c2 (15) | — | — | 10,200 | 1.86 |
| 1-10 | P-10 | a1 (30) | b2 (30) | c1 (10) | d1 (30) | — | 1,600 | 1.92 |
| 1-11 | P-11 | a1 (30) | b2 (30) | c1 (10) | d3 (30) | — | 10,700 | 1.88 |
| 1-12 | P-12 | a6 (30) | b2 (30) | c1 (10) | d1 (30) | — | 10,200 | 1.90 |
| 1-13 | P-13 | a1 (30) | b1 (20) | c1 (10) | d2 (10) | e1 (30) | 10,300 | 1.84 |
| 1-14 | P44 | a1 (30) | b1 (20) | c1 (10) | d2 (10) | e2 (30) | 9,900 | 1.86 |
| 1-15 | P-15 | a7 (30) | b2 (30) | c7 (15) | d4 (25) | — | 10,000 | 1.92 |
| 1-16 | P-16 | a3 (20) | b1 (20) | c1 (10) | d4 (20) | e1 (30) | 10,400 | 1.93 |
| 1-17 | P-17 | a3 (35) | b1 (20) | c2 (15) | d4 (10) | e1 (20) | 10.800 | 1.88 |
| 1-18 | P-18 | a6 (35) | b1 (20) | c1 (15) | d4 (10) | e1 (20) | 10,200 | 1.85 |
| 1-19 | P-19 | a4 (30) | b2 (20) | c1 (15) | d3 (25) | e2 (10) | 10,500 | 1.84 |
| 1-20 | P-20 | a7 (25) | b1 (30) | c2 (15) | d4 (30) | — | 9,700 | 1.90 |

The components in Tables 3 and 4 are identified below.

Solvent:
 PGMEA (propylene glycol monomethyl ether acetate)
 DAA (diacetone alcohol)

Photoacid generator: PAG-1 and PAG-2

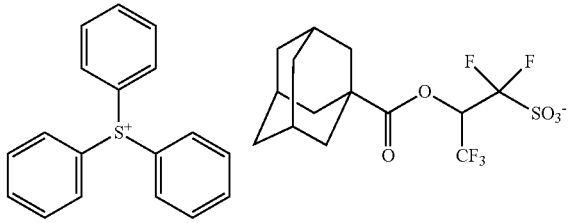

PAG-1

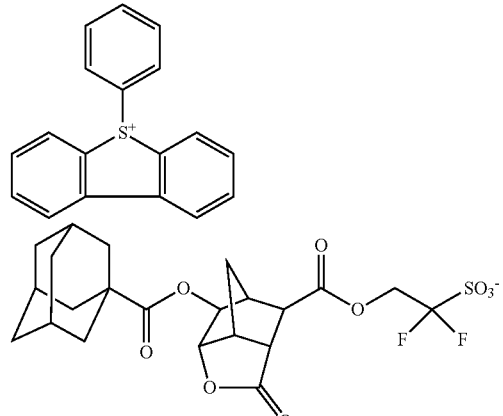

PAG-2

TABLE 2

| Comparative Example | Polymer | Unit (a) (mol %) | Unit (b) (mol %) | Unit (c) (mol %) | Unit (d) (mol %) | Unit (e) (mol %) | Mw | Mw/Mn |
|---|---|---|---|---|---|---|---|---|
| 1-1 | CP-1 | — | b1 (30) | c1 (15) | d1 (55) | — | 10,300 | 1.89 |
| 1-2 | CP-2 | — | b2 (30) | c1 (15) | d1 (55) | — | 10,200 | 1.85 |
| 1-3 | CP-3 | a1 (55) | — | c1 (15) | — | e1 (30) | 10,700 | 1.87 |
| 1-4 | CP-4 | — | b1 (20)) | c1 (10) | d1 (10) d4 (30) | e1 (30) | 10,100 | 1.89 |
| 1-5 | CP-5 | — | b1 (35) | c1 (15) | d2 (30) | e1 (20) | 10,300 | 1.85 |
| 1-6 | CP-6 | — | b1 (20) | — | d1 (40) d2 (20) | e2 (20) | 9,800 | 1.81 |
| 1-7 | CP-7 | — | b2 (40) | — | d1 (60) | — | 9,700 | 1.82 |

[3] Preparation of Resist Compositions

Examples 2-1 to 2-22 and Comparative Examples 2-1 to 2-7

Resist compositions were prepared by dissolving a polymer (Polymers P-1 to P-20 or CP-1 to CP-7), photoacid generator (PAG-1, PAG-2), and quencher (Q-1, Q-2) in a solvent containing 100 ppm of surfactant FC-4430 (3M) in accordance with the formulation shown in Tables 3 and 4, and filtering the solution through a Teflon® filter with a pore size of 0.2 μm.

Quencher: Q-1 and Q-2

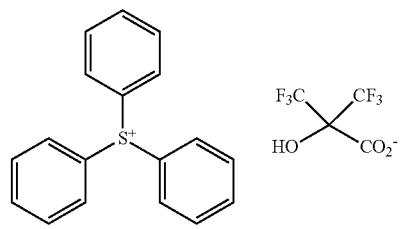

Q-1

-continued

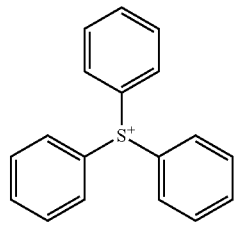

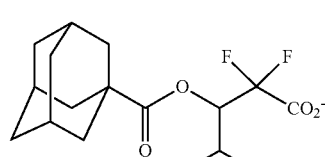

Q-2

TABLE 3

| Example | Resist composition | Polymer (pbw) | PAG (pbw) | Quencher (pbw) | Solvent 1 (pbw) | Solvent 2 (pbw) |
|---|---|---|---|---|---|---|
| 1-1 | R-1 | P-1 (80) | — | Q-1 (7.8) | PGMEA (2,000) | DAA (400) |
| 1-2 | R-2 | P-2 (80) | — | Q-1 (7.8) | PGMEA (2,000) | DAA (400) |
| 1-3 | R-3 | P-3 (80) | — | Q-1 (7.8) | PGMEA (2,000) | DAA (400) |
| 1-4 | R-4 | P-4 (80) | — | Q-1 (7.8) | PGMEA (2,000) | DAA (400) |
| 1-5 | R-5 | P-5 (80) | — | Q-1 (7.8) | PGMEA (2,000) | DAA (400) |
| 1-6 | R-6 | P-6 (80) | — | Q-1 (7.8) | PGMEA (2,000) | DAA (400) |
| 1-7 | R-7 | P-7 (80) | — | Q-1 (7.8) | PGMEA (2,000) | DAA (400) |
| 1-8 | R-8 | P-1 (80) | PAG-1 (12) | Q-1 (8.0) | PGMEA (2,000) | DAA (400) |
| 1-9 | R-9 | P-8 (80) | — | Q-1 (8.0) | PGMEA (2,000) | DAA (400) |
| 1-10 | R-10 | P-9 (80) | — | Q-1 (8.0) | PGMEA (2,000) | DAA (400) |
| 1-11 | R-11 | P-10 (80) | — | Q-1 (8.0) | PGMEA (2,000) | DAA (400) |
| 1-12 | R-12 | P-11 (80) | — | Q-1 (7.8) | PGMEA (2,000) | DAA (400) |
| 1-13 | R-13 | P-12 (80) | — | Q-1 (8.0) | PGMEA (2,000) | DAA (400) |
| 1-14 | R-14 | P-13 (80) | — | Q-1 (8.0) | PGMEA (2,000) | DAA (400) |
| 1-15 | R-15 | P-14 (80) | — | Q-1 (7.8) | PGMEA (2,000) | DAA (400) |
| 1-16 | R-16 | P-12 (80) | PAG-2 (10) | Q-1 (8.0) | PGMEA (2,000) | DAA (400) |
| 1-17 | R-17 | P-15 (80) | — | Q-1 (8.0) | PGMEA (2,000) | DAA (400) |
| 1-18 | R-18 | P-16 (80) | — | Q-1 (7.8) | PGMEA (2,000) | DAA (400) |
| 1-19 | R-19 | P-17 (80) | — | Q-1 (8.0) | PGMEA (2,000) | DAA (400) |
| 1-20 | R-20 | P-18 (80) | — | Q-1 (8.0) | PGMEA (2,000) | DAA (400) |
| 1-21 | R-21 | P-19 (80) | — | Q-1 (7.8) | PGMEA (2,000) | DAA (400) |
| 1-22 | R-22 | P-20 (80) | — | Q-2 (8.0) | PGMEA (2,000) | DAA (400) |

TABLE 4

| Comparative Example | Resist composition | Polymer (pbw) | PAG (pbw) | Quencher (pbw) | Solvent 1 (pbw) | Solvent 2 (pbw) |
|---|---|---|---|---|---|---|
| 1-1 | CR-1 | CP-1 (80) | — | Q-1 (8.0) | PGMEA (2,000) | DAA (400) |
| 1-2 | CR-2 | CP-2 (80) | — | Q-1 (8.0) | PGMEA (2,000) | DAA (400) |
| 1-3 | CR-3 | CP-3 (80) | — | Q-1 (8.0) | PGMEA (2,000) | DAA (400) |

TABLE 4-continued

| Comparative Example | Resist composition | Polymer (pbw) | PAG (pbw) | Quencher (pbw) | Solvent 1 (pbw) | Solvent 2 (pbw) |
|---|---|---|---|---|---|---|
| 1-4 | CR-4 | CP-4 (80) | — | Q-1 (8.0) | PGMEA (2,000) | DAA (400) |
| 1-5 | CR-5 | CP-5 (80) | — | Q-1 (8.0) | PGMEA (2,000) | DAA (400) |
| 1-6 | CR-6 | CP-6 (80) | PAG-1 (30) | Q-2 (8.0) | PGMEA (2,000) | DAA (400) |
| 1-7 | CR-7 | CP-7 (80) | PAG-2 (25) | Q-1 (7.8) | PGMEA (2,000) | DAA (400) |

[4] EB lithography test

Examples 2-1 to 2-22 and Comparative Examples 2-1 to 2-7

An antireflective coating solution (DUV-42, Nissan Chemical Corp.) was coated on a silicon substrate and baked at 200° C. for 60 seconds to form an ARC of 61 nm thick. Each of the resist compositions (R-1 t R-22, CR-1 to CR-7) was spin coated on the ARC and prebaked on a hotplate at 100° C. for 60 seconds to form a resist film of 45 nm thick. Using an EB lithography system ELS-F125 (Elionix Co., Ltd accelerating voltage 125 kV), the resist film was exposed to EB through a mask bearing a contact hole (CH) pattern with a hole size of 24 nm and a pitch of 48 nm (on-wafer size) while varying the dose from 50 μC/cm² at a step of 1 μC/cm². The resist film was baked (PEB) at the temperature shown in Table 5 for 60 seconds. The resist film was then puddle developed in a 2.38 wt % TMAH aqueous solution for 30 seconds, rinsed with deionized water, and spin dried, yielding a positive resist pattern.

The CH pattern after development was observed under CD-SEM S9380 (Hitachi High Technologies Corp.) whereupon sensitivity and CDU were evaluated as follows. The optimum dose Eop (μC/cm²) which provided a CH pattern with a hole size of 24 nm and a pitch of 48 nm was determined as an index of sensitivity. A smaller dose value indicates a higher sensitivity. For the CH pattern formed by exposure at the optimum dose Eop, the hole size was measured at 10 areas subject to an identical dose of shot (9 contact holes per area), from which a 3-fold value (3σ) of standard deviation (σ) was determined and reported as CDU. A smaller value of 3σ indicates a CH pattern having improved CDU.

The results are shown in Table 5.

TABLE 5

| | | Resist composition | PEB temp. (° C.) | Sensitivity (μC/cm²) | CDU (nm) |
|---|---|---|---|---|---|
| Example | 2-1 | R-1 | 95 | 190 | 4.1 |
| | 2-2 | R-2 | 95 | 195 | 4.1 |
| | 2-3 | R-3 | 95 | 195 | 4.0 |
| | 2-4 | R-4 | 95 | 200 | 4.2 |
| | 2-5 | R-5 | 95 | 195 | 4.3 |
| | 2-6 | R-6 | 95 | 190 | 4.0 |
| | 2-7 | R-7 | 100 | 185 | 4.2 |
| | 2-8 | R-8 | 100 | 175 | 4.3 |
| | 2-9 | R-9 | 95 | 180 | 4.1 |
| | 2-10 | R-10 | 100 | 190 | 4.1 |
| | 2-11 | R-11 | 95 | 195 | 4.0 |
| | 2-12 | R-12 | 95 | 190 | 4.2 |
| | 2-13 | R-13 | 100 | 185 | 4.1 |
| | 2-14 | R-14 | 95 | 180 | 4.0 |
| | 2-15 | R-15 | 100 | 185 | 4.1 |
| | 2-16 | R-16 | 95 | 185 | 4.1 |
| | 2-17 | R-17 | 95 | 185 | 4.2 |
| | 2-18 | R-18 | 100 | 190 | 4.1 |
| | 2-19 | R-19 | 100 | 190 | 4.1 |
| | 2-20 | R-20 | 95 | 185 | 4.2 |
| | 2-21 | R-21 | 100 | 200 | 4.0 |
| | 2-22 | R-22 | 95 | 185 | 4.1 |
| Comparative Example | 2-1 | CR-1 | 105 | 230 | 4.6 |
| | 2-2 | CR-2 | 110 | 235 | 4.5 |
| | 2-3 | CR-3 | 95 | 205 | 4.7 |
| | 2-4 | CR-4 | 110 | 230 | 4.6 |
| | 2-5 | CR-5 | 110 | 230 | 4.7 |
| | 2-6 | CR-6 | 115 | 255 | 5.2 |
| | 2-7 | CR-7 | 110 | 250 | 5.0 |

It is evident from Table 5 that the resist compositions comprising, polymers within the scope of the invention exhibit a high sensitivity and improved CDU.

Japanese Patent Application No. 2019-175739 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer consisting of recurring units having an acid labile group containing a multiple bond, recurring units having a phenolic hydroxyl group, recurring units adapted to generate an acid upon exposure, and recurring units having the formula (d1) or (d2), wherein the recurring units having an acid labile group containing a multiple bond have the formula (a):

wherein $R^A$ is each independently hydrogen, fluorine, methyl or trifluoromethyl, $X^1$ is a single bond, phenylene group, naphthylene group or (backbone)-C(=O)-O-$X^{11}$-, $X^{11}$ is a $C_1$-$C_{10}$ aliphatic hydrocarbylene group which may contain a hydroxyl moiety, ether bond, ester bond or lactone ring, or a phenylene or naphthylene group, $A^{L1}$ is an acid labile group having the formula (a1) or (a2):

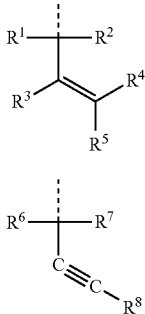

(a1)

(a2)

wherein $R^1$ to $R^8$ are each independently hydrogen or a $C_1$-$C_{20}$ hydrocarbyl group which may contain a heteroatom, with the proviso that not both $R^1$ and $R^2$ are hydrogen at the same time and not both $R^6$ and $R^7$ are hydrogen at the same time, a pair of $R^1$ and $R^2$, $R^1$ and $R^3$, $R^3$ and $R^4$, $R^4$ and $R^5$, $R^6$ and $R^7$, or $R^6$ and $R^8$ may bond together to form an aliphatic ring with the carbon atom(s) to which they are attached or the carbon atoms to which they are attached and the intervening carbon atom, wherein the recurring units adapted to generate an acid upon exposure have the formula (c1), (c2) or (c3):

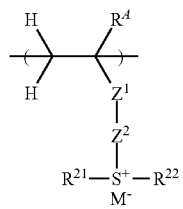

(c1)

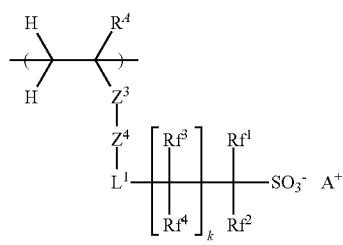

(c2)

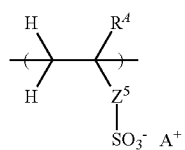

(c3)

wherein $R^A$ is each independently hydrogen, fluorine, methyl or trifluoromethyl, $Z^1$ is a single bond or phenylene group, $Z^2$ is a single bond, —C(=O)—O—$Z^{21}$—, —C(=O)—NH—$Z^{21}$— or —O—$Z^{21}$—, —$Z^{21}$— is a $C_1$-$C_6$ aliphatic hydrocarbylene group, phenylene group or a divalent group obtained from combination thereof, which may contain a carbonyl moiety, ester bond, ether bond or hydroxyl moiety, $Z^3$ is a single bond, phenylene, naphthylene, or (backbone)-C(=O)—O—$Z^{31}$—, $Z^{31}$ is a $C_1$-$C_{10}$ aliphatic hydrocarbylene group which may contain a hydroxyl moiety, ether bond, ester bond or lactone ring, or phenylene or naphthylene group, $Z^4$ is a single bond or —$Z^{41}$—C(=O)—O—, $Z^{41}$ is a $C_1$-$C_{20}$ hydrocarbylene group which may contain a heteroatom, $Z^5$ is a single bond, methylene, ethylene, phenylene, fluorinated phenylene, —C(=O)—O—$Z^{51}$—, —C(=O)—NH—$Z^{51}$— or —O—$Z^{51}$—, $Z^{51}$ is a $C_1$-$C_6$ aliphatic hydrocarbylene group or phenylene group, which may contain a carbonyl moiety, ester bond, ether bond or hydroxyl moiety, $R^{21}$ and $R^{22}$ are each independently a $C_1$-$C_{20}$ hydrocarbyl group which may contain a heteroatom, $R^{21}$ and $R^{22}$ may bond together to form a ring with the sulfur atom to which they are attached, $L^1$ is a single bond, ether bond, ester bond, carbonyl group, sulfonic acid ester bond, carbonate bond or carbamate bond, $Rf^1$ and $Rf^2$ are each independently fluorine or a $C_1$-$C_6$ fluoroalkyl group, $Rf^3$ and $Rf^4$ are each independently hydrogen, fluorine or a $C_1$-$C_6$ fluoroalkyl group, $M^-$ is a non-nucleophilic counter ion, $A^+$ is an onium cation, and k is an integer of 0 to 3, wherein $A^+$ is a cation having the formula (c4) or (c5):

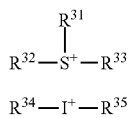

(c4)

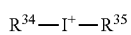

(c5)

wherein $R^{31}$, $R^{32}$ and $R^{33}$ are each independently a $C_1$-$C_{20}$ hydrocarbyl group which may contain a heteroatom, $R^{31}$ and $R^{32}$ may bond together to form a ring with the sulfur atom to which they are attached, $R^{34}$ and $R^{35}$ are each independently a $C_1$-$C_{20}$ hydrocarbyl group which may contain a heteroatom,

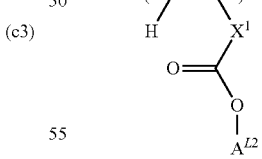

(d1)

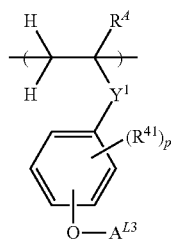

(d2)

wherein $R^A$ is each independently hydrogen, fluorine, methyl or trifluoromethyl, $X^1$ is a single bond, phenylene group, naphthylene group or (backbone)-C(=O)—O—$X^{11}$—, $X^{11}$ is a $C_1$-$C_{10}$ aliphatic hydrocarbylene group which may contain a hydroxyl moiety, ether bond, ester bond or lactone ring, or a phenylene or naphthylene group, $Y^1$ is a single bond or (backbone)-C(=O)—O—, $A^{L2}$ and $A^{L3}$ are each independently an acid labile group free of multiple bond, $R^{41}$ is halogen, cyano, a $C_1$-$C_{20}$ hydrocarbyl group which may contain a heteroatom, $C_1$-$C_{20}$ hydrocarbyloxy group which may contain a heteroatom, $C_2$-$C_{20}$ hydrocarbylcarbonyl group which may contain a heteroatom, $C_2$-$C_{20}$ hydrocarbylcarbonyloxy group which may contain a heteroatom, or $C_2$-$C_{20}$ hydrocarbyloxycarbonyl group which may contain a heteroatom, and p is an integer of 0 to 4.

2. The resist composition of claim 1 wherein the recurring units having a phenolic hydroxyl group have the formula (b):

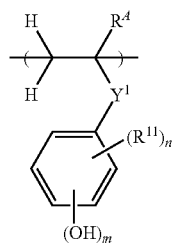

(b)

wherein $R^A$ is each independently hydrogen, fluorine, methyl or trifluoromethyl, $Y^1$ is a single bond or (backbone)-C(=O)—O—, $R^{11}$ is halogen, cyano, a $C_1$-$C_{20}$ hydrocarbyl group which may contain a heteroatom, $C_1$-$C_{20}$ hydrocarbyloxy group which may contain a heteroatom, $C_2$-$C_{20}$ hydrocarbylcarbonyl group which may contain a heteroatom, $C_2$-$C_{20}$ hydrocarbylcarbonyloxy group which may contain a heteroatom, or $C_2$-$C_{20}$ hydrocarbyloxycarbonyl group which may contain a heteroatom, m is an integer of 1 to 4, n is an integer of 0 to 4, and $1 \leq m+n \leq 5$.

3. The resist composition of claim 1, further comprising an organic solvent.

4. The resist composition of claim 1, further comprising a photoacid generator.

5. The resist composition of claim 1, further comprising a quencher.

6. The resist composition of claim 1, further comprising a surfactant which is insoluble or substantially insoluble in water and soluble in an alkaline developer and/or a surfactant which is insoluble or substantially insoluble in water and an alkaline developer.

7. A process for forming a pattern comprising the steps of applying the resist composition of claim 1 to a substrate to form a resist film thereon, exposing the resist film to high-energy radiation, and developing the exposed resist film in a developer.

8. The process of claim 7 wherein the high-energy radiation is i-line, KrF excimer laser, ArF excimer laser, EB, or EUV of wavelength 3 to 15 nm.

9. The resist composition of claim 1 wherein the fraction of recurring units (a), (b), (c), (d1) and (d2) is $0<a<1.0$, $0<b<1.0$, $0<c<1.0$, $0 \leq d1 \leq 0.8$, $0 \leq d2 \leq 0.8$, $d1+d2>0$ and $a+b+c+d1+d2=1.0$.

10. The resist composition of claim 9 wherein the fraction of recurring units (a), (b) and (c) is $0.05 \leq a \leq 0.9$, $0.09 \leq b \leq 0.55$, and $0.01 \leq c \leq 0.4$.

* * * * *